United States Patent
Yamazaki et al.

(10) Patent No.: US 8,586,197 B2
(45) Date of Patent: Nov. 19, 2013

(54) COMPOSITE MATERIAL, LIGHT EMITTING ELEMENT, LIGHT EMITTING DEVICE AND ELECTRONIC APPLIANCE USING THE COMPOSITE MATERIAL

(75) Inventors: Shunpei Yamazaki, Setagaya (JP); Hisao Ikeda, Isehara (JP); Satoshi Seo, Kawasaki (JP); Junichiro Sakata, Atsugi (JP); Yuji Iwaki, Isehara (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 1019 days.

(21) Appl. No.: 11/884,548

(22) PCT Filed: Feb. 21, 2006

(86) PCT No.: PCT/JP2006/303807
§ 371 (c)(1),
(2), (4) Date: Aug. 17, 2007

(87) PCT Pub. No.: WO2006/093171
PCT Pub. Date: Sep. 8, 2006

(65) Prior Publication Data
US 2008/0136325 A1   Jun. 12, 2008

(30) Foreign Application Priority Data

Feb. 28, 2005 (JP) ................. 2005-053297
Jun. 8, 2005 (JP) ................. 2005-167624
Jul. 4, 2005 (JP) ................. 2005-194497

(51) Int. Cl.
*H01L 51/54* (2006.01)
*C09K 11/06* (2006.01)

(52) U.S. Cl.
USPC ...... 428/690; 428/917; 252/301.16; 313/504; 313/506

(58) Field of Classification Search
None
See application file for complete search history.

(56) References Cited

U.S. PATENT DOCUMENTS

| | | | |
|---|---|---|---|
| 6,396,209 B1 | 5/2002 | Kido et al. | |
| 6,541,129 B1 | 4/2003 | Kawamura et al. | |
| 7,485,376 B2 * | 2/2009 | Suzuri et al. | 428/690 |
| 7,732,808 B2 | 6/2010 | Ikeda et al. | |
| 8,080,934 B2 | 12/2011 | Kido et al. | |
| 8,101,857 B2 | 1/2012 | Kido et al. | |
| 2001/0046611 A1 | 11/2001 | Kido et al. | |
| 2003/0129449 A1 * | 7/2003 | Parton et al. | 428/690 |
| 2003/0143430 A1 | 7/2003 | Kawamura et al. | |
| 2003/0189401 A1 | 10/2003 | Kido et al. | |
| 2005/0084712 A1 * | 4/2005 | Kido et al. | 428/690 |
| 2005/0098207 A1 | 5/2005 | Matsumoto et al. | |
| 2005/0106419 A1 | 5/2005 | Endoh et al. | |
| 2005/0173700 A1 * | 8/2005 | Liao et al. | 257/40 |
| 2006/0008740 A1 | 1/2006 | Kido et al. | |
| 2006/0082294 A1 | 4/2006 | Kawamura et al. | |
| 2007/0182317 A1 | 8/2007 | Kido et al. | |
| 2010/0096627 A1 | 4/2010 | Ikeda et al. | |
| 2010/0207518 A1 | 8/2010 | Ikeda et al. | |
| 2012/0118350 A1 | 5/2012 | Kido et al. | |
| 2012/0132895 A1 | 5/2012 | Kido et al. | |

FOREIGN PATENT DOCUMENTS

| | | |
|---|---|---|
| EP | 1 011 155 | 6/2000 |
| EP | 1 029 909 | 8/2000 |
| EP | 1351558 A | 10/2003 |
| EP | 1524706 A | 4/2005 |
| EP | 1617493 A | 1/2006 |
| EP | 1 722 602 | 11/2006 |
| JP | 09-063771 | 3/1997 |
| JP | 10-092581 | 4/1998 |
| JP | 10-265773 | 10/1998 |
| JP | 11-307259 | 11/1999 |
| JP | 2000-182774 | 6/2000 |
| JP | 2000-309566 | 11/2000 |
| JP | 2001-316338 | 11/2001 |
| JP | 2003-272860 A | 9/2003 |
| JP | 2005-026121 | 1/2005 |
| JP | 2005-123095 A | 5/2005 |
| JP | 2005-251639 | 9/2005 |
| JP | 2006-024791 A | 1/2006 |
| KR | 2003-0077476 A | 10/2003 |

(56) References Cited

OTHER PUBLICATIONS

Machine generated translation for JP 10-265773, which was published Oct. 1998.*
Machine generated translation for JP 2001-316338, which was published Nov. 2001.*
Chemistry of Materials, (2004), vol. 16, pp. 4711-4714.*
Search Report (Application No. 06714930.2) Dated Sep. 23, 2009.
International Search Report (Application No. PCT/JP2006/303807) dated Apr. 4, 2006.
Written Opinion (Application No. PCT/JP2006/303807) dated Apr. 4, 2006.
Yang.Y et al., "Polyaniline As a Transparent Electrode for Polymer Light-Emitting Diodes:Lower Operating Voltage and Higher Effciency,", Appl. Phys. Lett. (Applied Physics Letters), Mar. 7, 1994, vol. 64, No. 10, pp. 1245-1247.
Chinese Office Action (Application No. 200910165594.0) dated Mar. 9, 2011.
Korean Office Action (Application No. 2007-7020078) Dated Jan. 21, 2013.

* cited by examiner

*Primary Examiner* — Dawn Garrett
(74) *Attorney, Agent, or Firm* — Eric J. Robinson; Robinson Intellectual Property Law Office, P.C.

(57) ABSTRACT

A composite material includes an organic compound represented by the following general formula (1) and an inorganic compound, where, in the general formula (1), $R^1$ to $R^{24}$ is identical to or different from one another, and represent any of hydrogen, an alkyl group, an alkoxy group, an aryl group, and an arylalkyl group. A light emitting element includes the composite material and a light emitting device and an electronic appliance includes the light emitting element. The composite material has an excellent carrier transporting property and an excellent carrier injecting property with respect to the organic compound along with high visible light transmittance. By utilizing the composite material, a current excitation type light emitting element requiring low driving voltage and having excellent light emitting efficiency is obtained. By using the light emitting element, a light emitting device consuming low power and an electronic appliance including the light emitting device is provided.

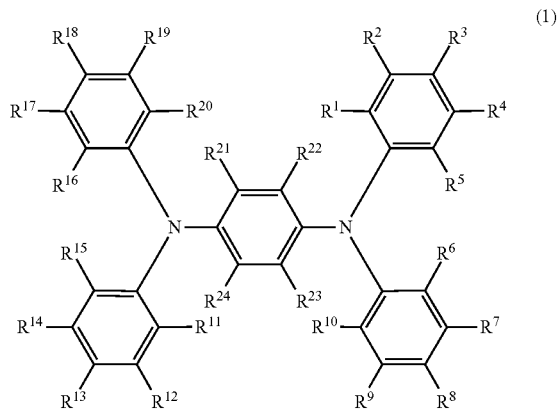

(1)

25 Claims, 76 Drawing Sheets

- Light Emitting Element of present invention 61
- ◇ Comparative Light Emitting Element 62
- △ Comparative Light Emitting Element 63

COMPOSITE MATERIAL, LIGHT EMITTING ELEMENT, LIGHT EMITTING DEVICE AND ELECTRONIC APPLIANCE USING THE COMPOSITE MATERIAL

TECHNICAL FIELD

The present invention relates to a composite material formed using an organic compound and an inorganic compound, which has an excellent carrier transporting property and an excellent carrier injecting property to the organic compound along with high visible light transmittance. In addition, the present invention relates to a current excitation type light emitting element using the compound material, and further relates to a light emitting device having the light emitting element and an electronic appliance having the light emitting element.

BACKGROUND ART

In recent years, research and development of a light emitting element using a light emitting organic compound, have been actively carried out. In a basic structure of such a light emitting element, a layer containing a light emitting organic compound is sandwiched between a pair of electrodes. By applying voltage to the light emitting element, electrons and holes are respectively injected in the layer containing the light emitting organic compound from the pair of electrodes, and thus current flows through the light emitting element. Then, by recombining these carriers (electrons and holes), the light emitting organic compound is excited, and light is emitted when returning to a ground state from the excited state. In accordance with the above mentioned mechanism, the light emitting element is referred to as a current excitation type light emitting element. Further, as kinds of excited states produced by an organic compound, there are a singlet excited state and a triplet excited state. Light emission from the singlet excited state is referred to as fluorescence and light emission from the triplet excited state is referred to as phosphorescence.

Such a light emitting element can be thinly manufactured with lightweight using an organic thin film with a thickness of about 0.1 μm, and this is a great advantage. Since time from injecting carries to emitting light is about several micro seconds or less, one feature of the light emitting element is that the light emitting element has extremely high response speed. It is thought that these characteristics are preferable for a flat panel display element. In addition, such a light emitting element is formed in a film form, by forming a light emitting element with a large area, light emission in a sheet form can be easily obtained. These characteristics are difficult to be obtained in a point light source typified by an incandescent filament lamp or an LED, or in a linear light source typified by a fluorescent lamp, and therefore, the light emitting element can be highly utilized as a light source in a sheet form, which can be applied to lighting and the like.

As mentioned above, there are high expectations for application of a current excitation type light emitting element using a light emitting organic compound, in a light emitting device, lighting, and the like. However, the current excitation type light emitting element still has many problems. As one of the problems, reduction in power consumption can be given. In order to reduce the power consumption, it is important to reduce driving voltage of a light emitting element. Since light emission intensity of such a current excitation type light emitting element is determined based on the amount of current flowing through the light emitting element, in order to reduce driving voltage, it is necessary to feed a large amount of current at low voltage.

As a method for reducing driving voltage, an attempt of providing a buffer layer between an electrode and a layer containing a light emitting organic compound has been carried out in the past. For example, it is known that by providing a buffer layer formed using polyaniline (PANI) doped with camphorsulfonic acid, between indium tin oxide (ITO) and a light emitting layer, driving voltage can be reduced (e.g., see Non Patent Document 1). It is explained that this is because the PANI has an excellent carrier injecting property with respect to the light emitting layer. Further, in Non Patent Document 1, it is assumed that the PANI, which is the buffer layer, is a part of an electrode.

However, as disclosed in Non Patent Document 1, the PANI has a problem that transmittance is decreased when a thickness of the PANI is increased. Specifically, it is reported that when a thickness of the PANI is set to be about 250 nm, the transmittance is less than 70%. That is, since a material used for a buffer layer itself has a problem in transmittance, light generated inside of an element cannot be extracted efficiently.

According to Patent Document 1, an attempt of increasing luminance for current density, i.e., current efficiency has been carried out by connecting light emitting elements (which are described as light emitting units in Patent Document 1) in series. In the Patent Document 1, a layer in which an organic compound and metal oxide (concretely, vanadium oxide and rhenium oxide) are mixed, is applied in a connection portion of the light emitting elements, which connected in series. It is considered that this layer can inject holes and electrons to a light emitting unit.

However, as seen from an embodiment mode of the present invention, in the mixed layer of the organic compound and the metal oxide, which is disclosed in the Patent Document 1, a large absorption peak is generated not only in an infrared region but also in the vicinity of 500 nm, and therefore, there is a problem in a light transmitting property. Accordingly, light generated inside of an element cannot be extracted efficiently, thereby reducing light emitting efficiency of the element.

[Non Patent Document 1]: Y. Yang et al., Applied Physics Letters, vol. 64 (10), 1245-1247 (1994)
[Patent Document 1]: Japanese Patent Application Laid-Open No. 2003-272860

DISCLOSURE OF INVENTION

In view of the above problems, the present inventors are dedicated to research and development to solve these problems, and as a result, they have succeeded in the development. One object of the present invention is to provide a composite material formed using an organic compound and an inorganic compound, which has an excellent carrier transporting property and an excellent carrier injecting property with respect to the organic compound along with an excellent light transmitting property. Also, another object of the present invention is to provide a current excitation type light emitting element having an excellent light emitting efficiency and requiring low driving voltage by applying the above mentioned composite material to the light emitting element. In addition, another object of the present invention is to provide a light emitting device requiring much less power by using the light emitting element and an electronic appliance including the light emitting device.

The present invention provides a composite material solving the above mentioned problems, a light emitting element using the composite material, a light emitting device using the light emitting element, and an electronic appliance using the light emitting device. In an aspect of the present invention, the composite material can be largely classified into three types based on an organic compound contained in the composite material. A first composite material includes an organic compound represented by the following general formula (1) and an inorganic compound.

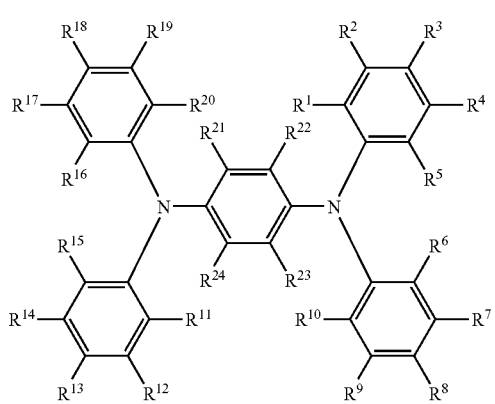

(1)

(In the general formula (1), $R^1$ to $R^{24}$ may be identical to or different from one another, and represent any of hydrogen, an alkyl group, an alkoxy group, an aryl group, and an arylalkyl group.)

A second composite material includes an organic compound represented by the following general formula (2) and an inorganic compound.

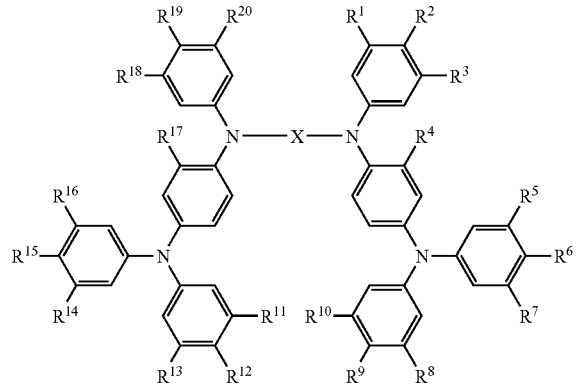

(2)

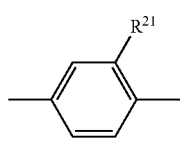

(2-1)

(2-2)

(2-3)

(2-4)

(2-5)

(2-6)

(In the general formula (2), X represents any one of aromatic hydrocarbon groups represented by structural formulas (2-1) and (2-3) to (2-6), and by general formula (2-2). $R^1$ to $R^{20}$ may be identical to or different from one another, and represent any of hydrogen, an alkyl group, an alkoxy group, and an aryl group. $R^{21}$ represents alkyl group)

A third composite material includes an organic compound represented by the following general formula (3) and an inorganic compound.

(3)

(In the general formula (3), $R^1$ to $R^9$ may be identical to or different from one another, and represent any of hydrogen, an alkyl group, an alkoxy group, and an aryl group.)

In one aspect of the present invention, a light emitting element includes a layer containing the above described composite material. In still another aspect of the present invention, a light emitting device includes the above mentioned light emitting element, and an electronic appliance includes the above mentioned light emitting device.

The present invention can provide a composite material, a light emitting element, a light emitting device, and an electronic appliance having excellent characteristics shown below. Specifically, in accordance with the present invention, by compositing an organic compound and an inorganic compound, a composite material having an excellent carrier transporting property and an excellent carrier injecting property with respect to the organic compound can be obtained. In addition, a composite material having high visible light transmittance can be provided. Further, by applying a composite material of the present invention, a current excitation type light emitting element requiring low driving voltage and having excellent light emitting efficiency can be provided. Furthermore, by using the above described light emitting element, a light emitting device requiring much less power and an electronic appliance including the light emitting device can be provided.

BEST MODE FOR CARRYING OUT THE INVENTION

Figure 1A:
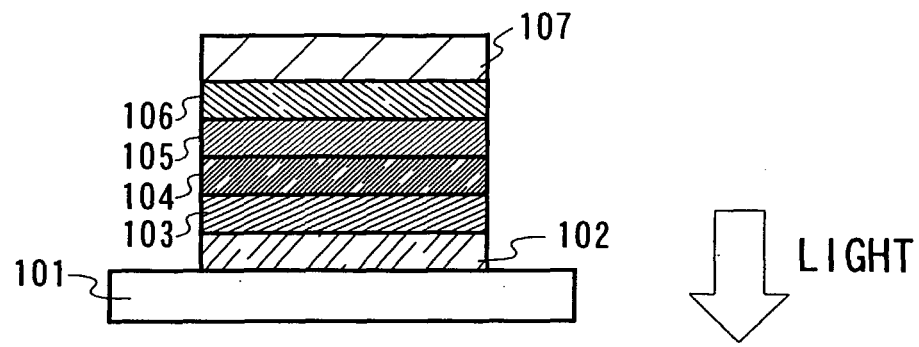
FIGS. 1A to 1C are cross sectional views explaining light emitting elements of the present invention.

The embodiment modes according to the present invention will hereinafter be described with reference to the accompanying drawings. The present invention should not be interpreted as being limited to the description of the embodiment modes to be given below and the scope of claims. It is easily understood by those skilled in the art that the embodiment modes and details herein disclosed can be modified in various ways without departing from the purpose and the scope of the invention. The present invention should not be interpreted as being limited to the description of the embodiment modes to be given below. As described above, the present invention provides a composite material formed by using an organic compound and an inorganic compound, a light emitting element using the composite material, a light emitting device including the light emitting element, and an electronic appliance including the light emitting element. The present invention will hereinafter be described in detail in accordance with embodiment modes.

Embodiment Mode 1

In this embodiment mode, composite materials used for a light emitting element of the present invention, materials used for manufacturing the composite materials, in particular, organic compounds, and the like will be described. As set forth above, composite materials used for a light emitting element of the present invention can be largely classified into three types based on organic compounds to be contained in the composite materials, and the three types of composite materials will be described below respectively. The organic compounds included in these three types of composite materials, can be respectively represented by the following general formulas (1), (2), and (3).

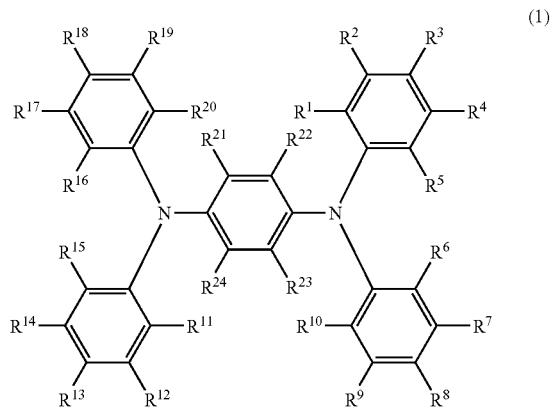

(1)

(In the general formula (1), $R^1$ to $R^{24}$ may be identical to or different from one another, and represent any of hydrogen, an alkyl group, an alkoxy group, an aryl group, and an arylalkyl group.)

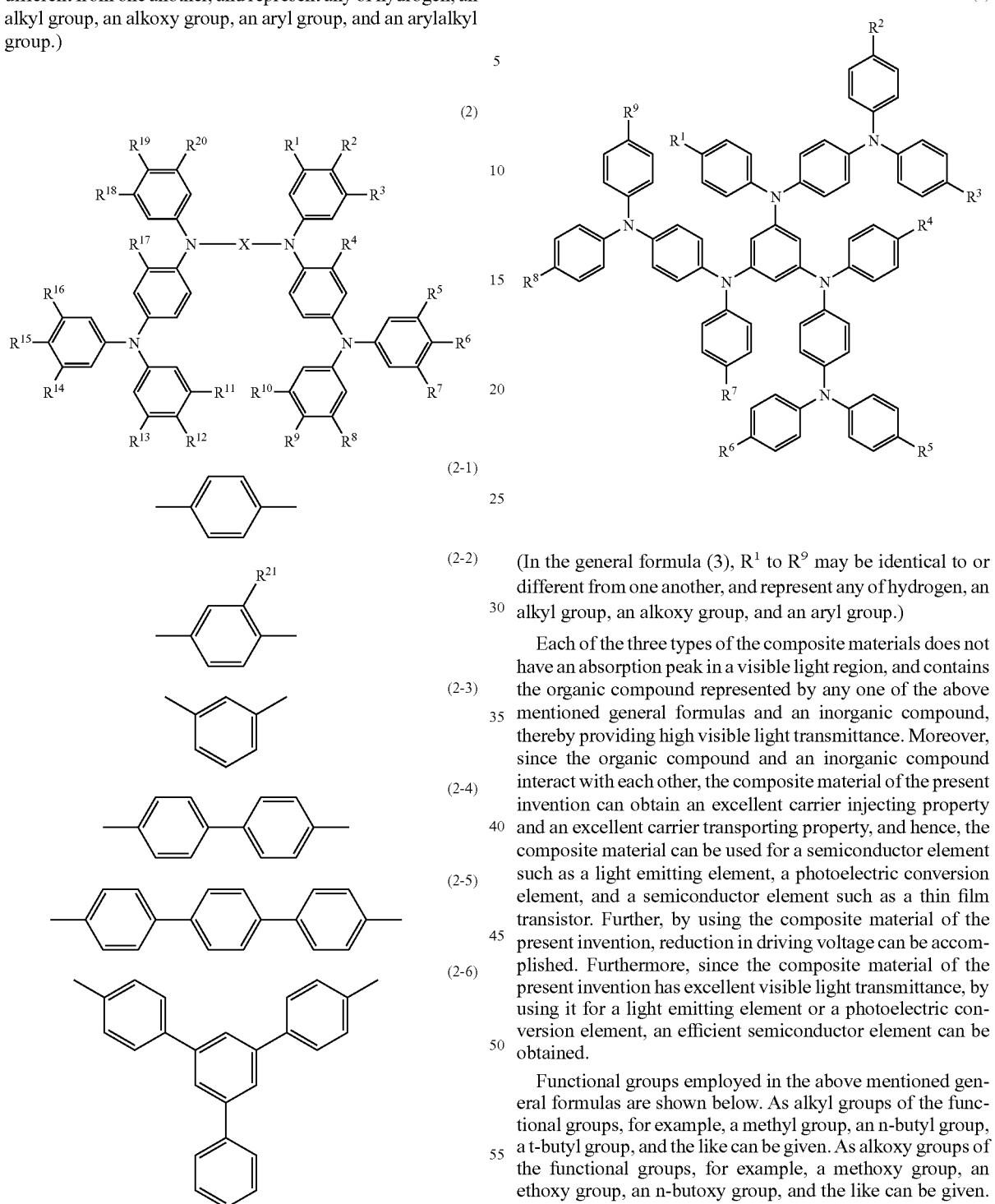

(In the general formula (2), X represents any one of aromatic hydrocarbon groups represented by structural formulas (2-1) to (2-6). $R^1$ to $R^{20}$ may be identical to or different from one another, and represent any of hydrogen, an alkyl group, an alkoxy group, and an aryl group.)

(In the general formula (3), $R^1$ to $R^9$ may be identical to or different from one another, and represent any of hydrogen, an alkyl group, an alkoxy group, and an aryl group.)

Each of the three types of the composite materials does not have an absorption peak in a visible light region, and contains the organic compound represented by any one of the above mentioned general formulas and an inorganic compound, thereby providing high visible light transmittance. Moreover, since the organic compound and an inorganic compound interact with each other, the composite material of the present invention can obtain an excellent carrier injecting property and an excellent carrier transporting property, and hence, the composite material can be used for a semiconductor element such as a light emitting element, a photoelectric conversion element, and a semiconductor element such as a thin film transistor. Further, by using the composite material of the present invention, reduction in driving voltage can be accomplished. Furthermore, since the composite material of the present invention has excellent visible light transmittance, by using it for a light emitting element or a photoelectric conversion element, an efficient semiconductor element can be obtained.

Functional groups employed in the above mentioned general formulas are shown below. As alkyl groups of the functional groups, for example, a methyl group, an n-butyl group, a t-butyl group, and the like can be given. As alkoxy groups of the functional groups, for example, a methoxy group, an ethoxy group, an n-butoxy group, and the like can be given. Further, with respect to an aryl group, it may have a substituent, and for example, a phenyl group, a p-tolyl group, a 4-biphenylyl group, a 3,5-diphenylphenyl group, a 4-(4-methoxyphenyl)phenyl group, and the like can be given. As arylalkyl groups, 2-phenyl-2-propyl group, and the like can be given.

As organic compounds represented by the above mentioned general formulas (1), (2), and (3), there are may compounds. Specific compounds are shown by structural formulas below.

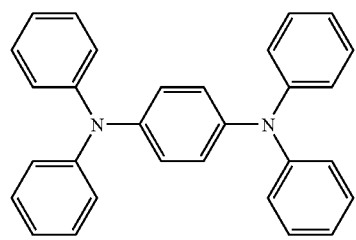 (11)
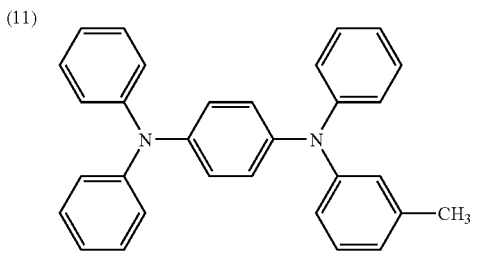 (12)
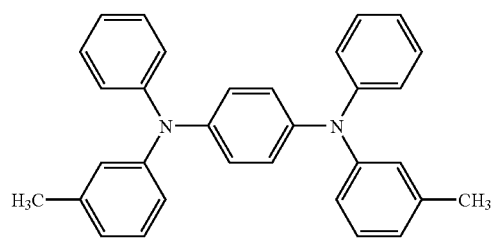 (13)
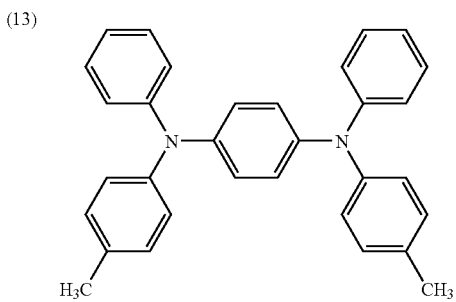 (14)
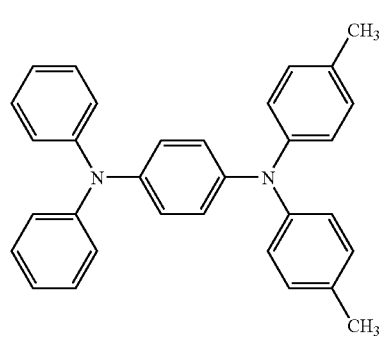 (15)
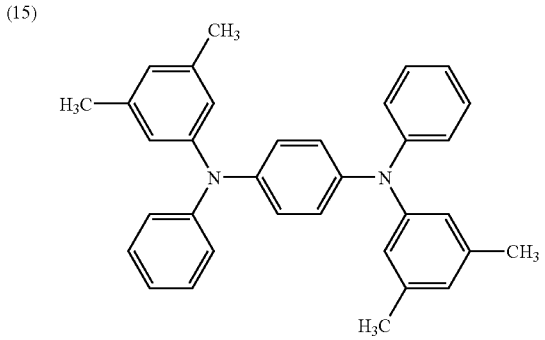 (16)
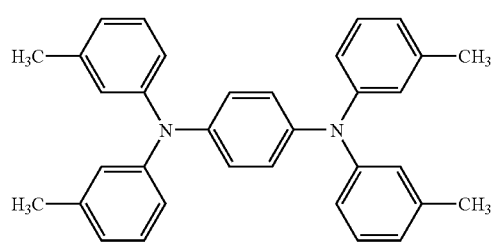 (17)
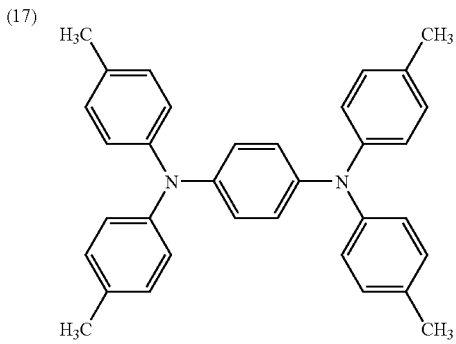 (18)
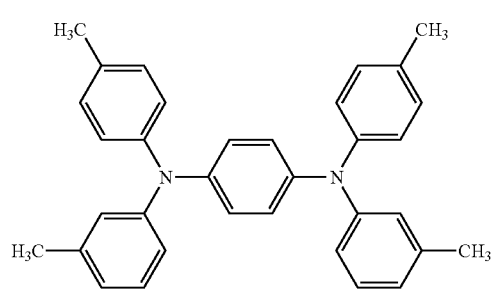 (19)
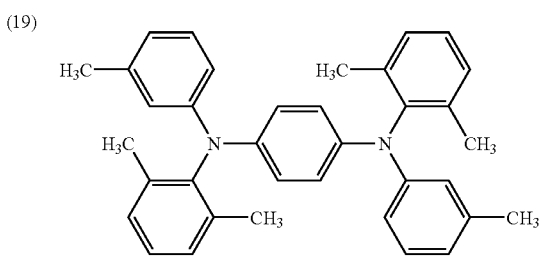 (20)

-continued
(21) 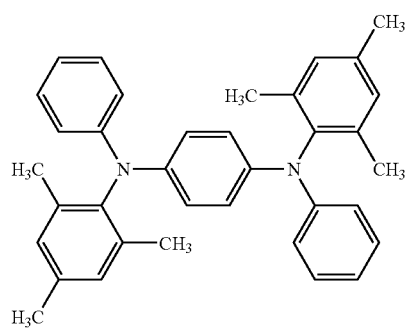
(22) 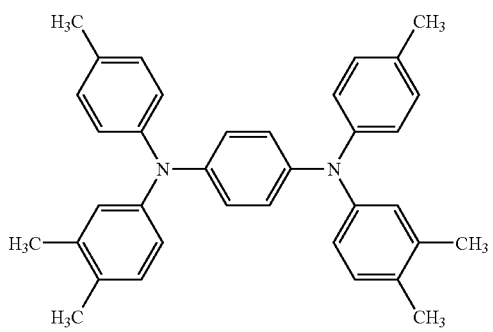
(23) 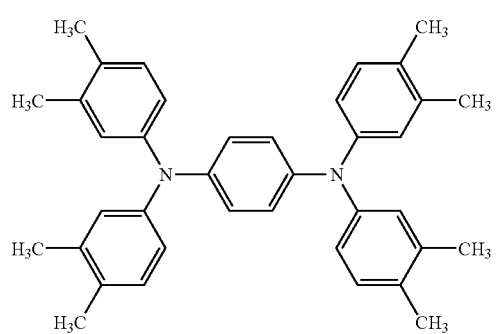
(24) 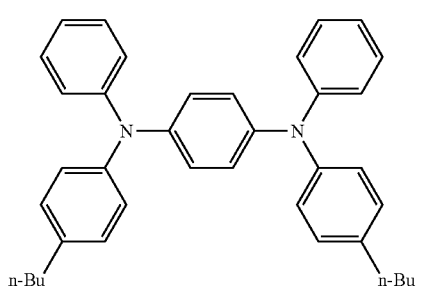
(25) 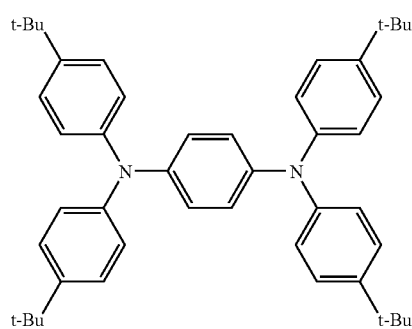
(26) 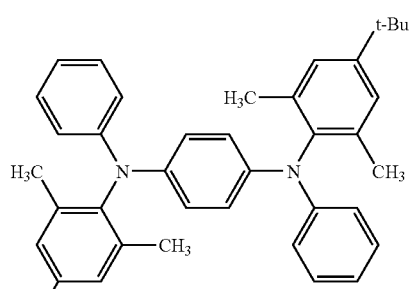
(27) 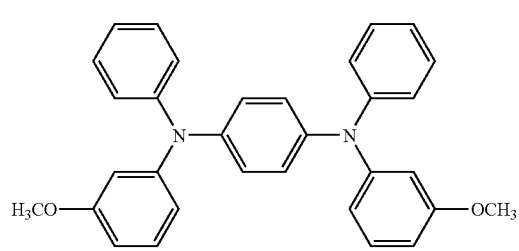
(28) 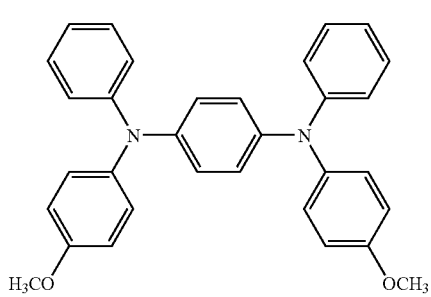
(29) 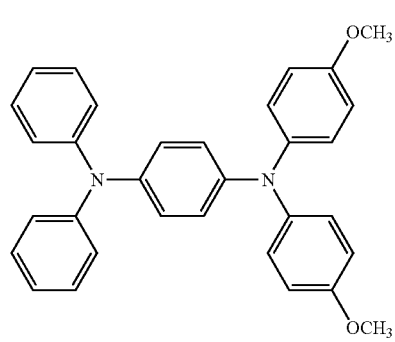
(30) 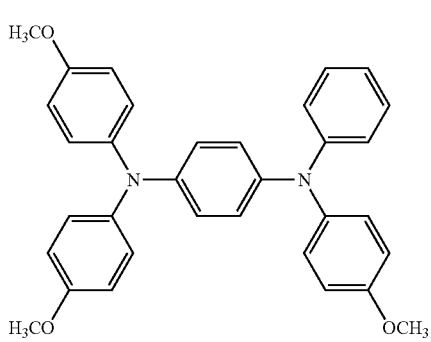

-continued
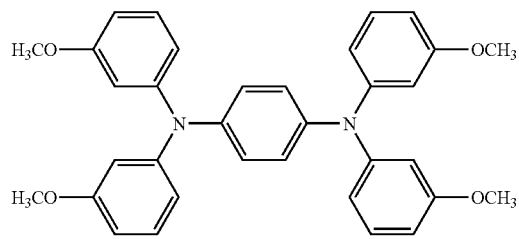
(31)
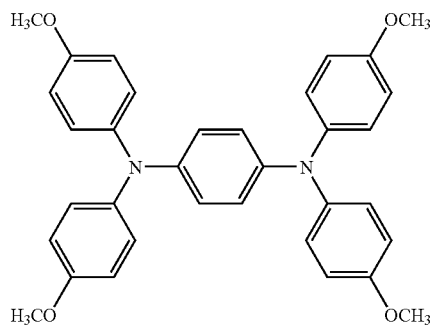
(32)
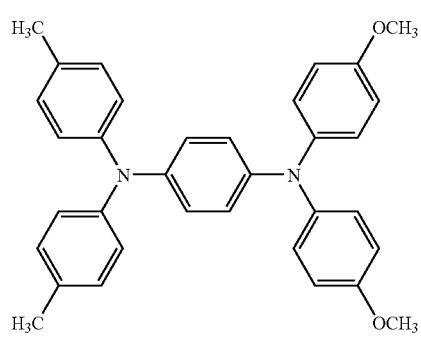
(33)
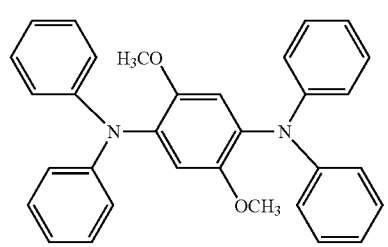
(34)
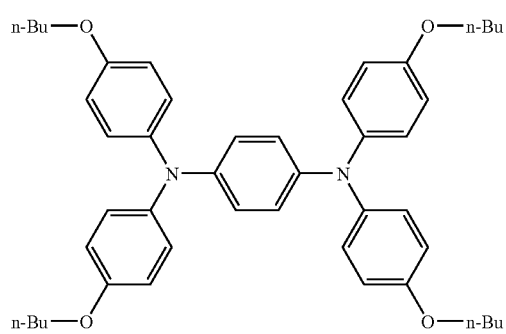
(35)
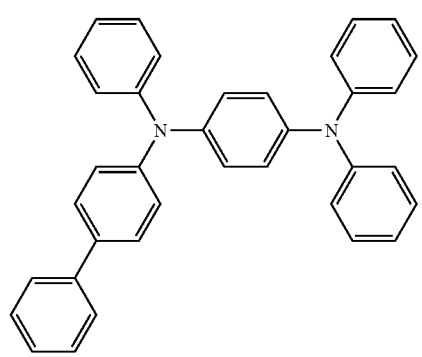
(36)
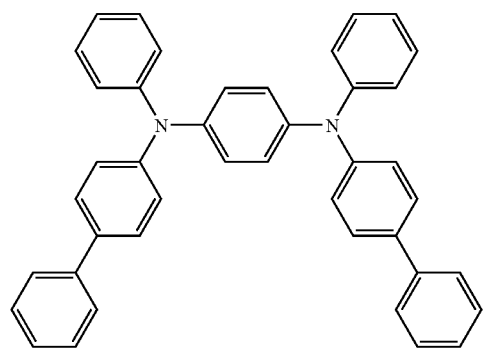
(37)
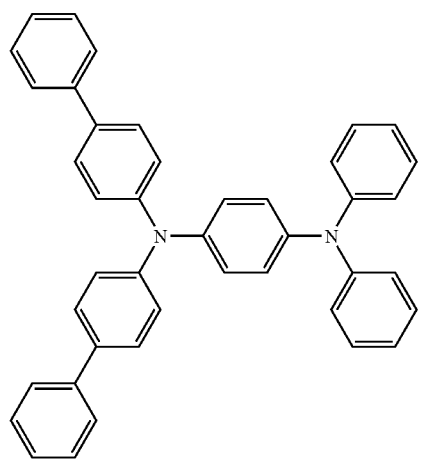
(38)

-continued
(39)
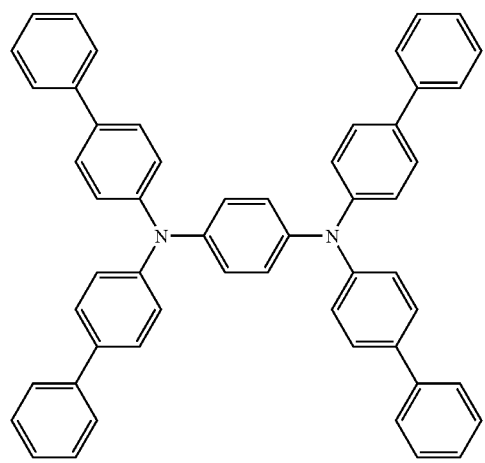
(40)
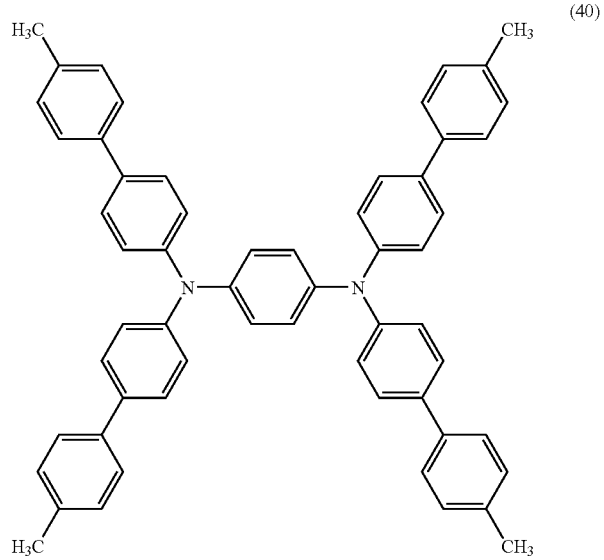
(41)
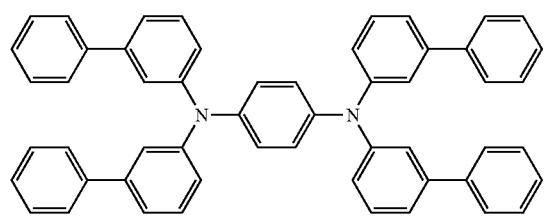
(42)
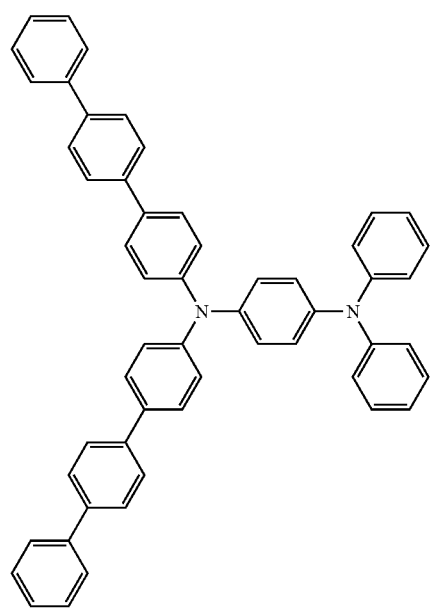
(43)
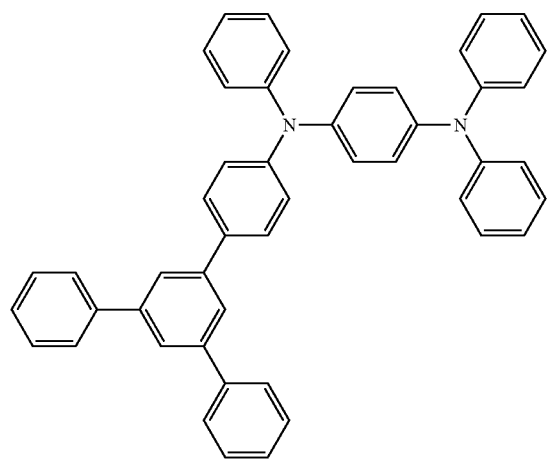
(44)
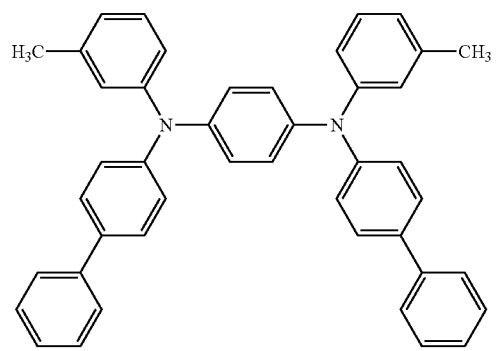

-continued
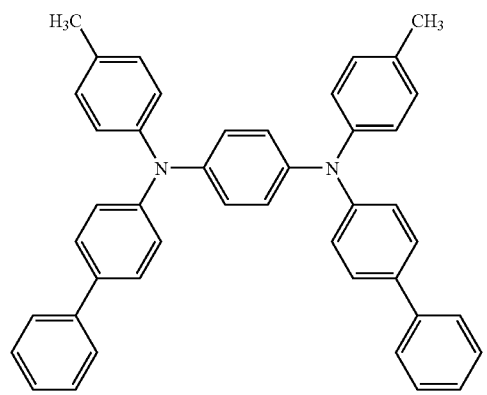
(45)
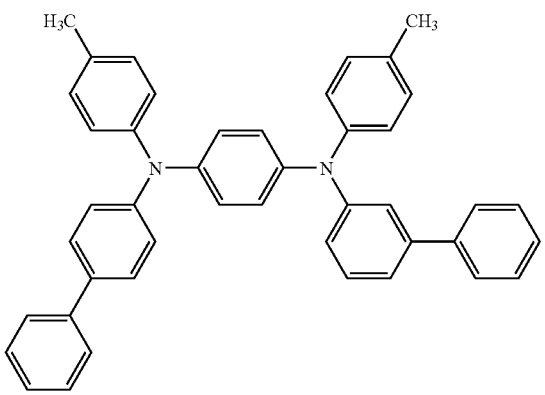
(46)
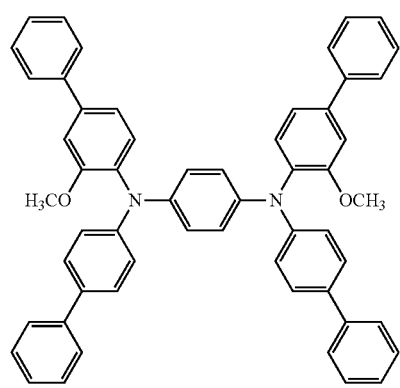
(47)
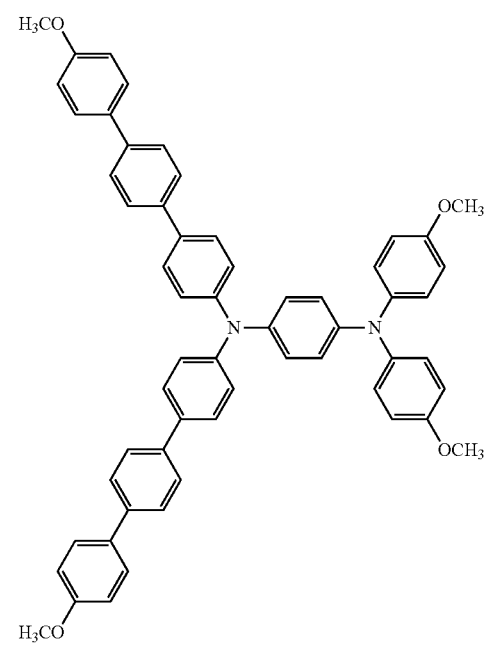
(48)
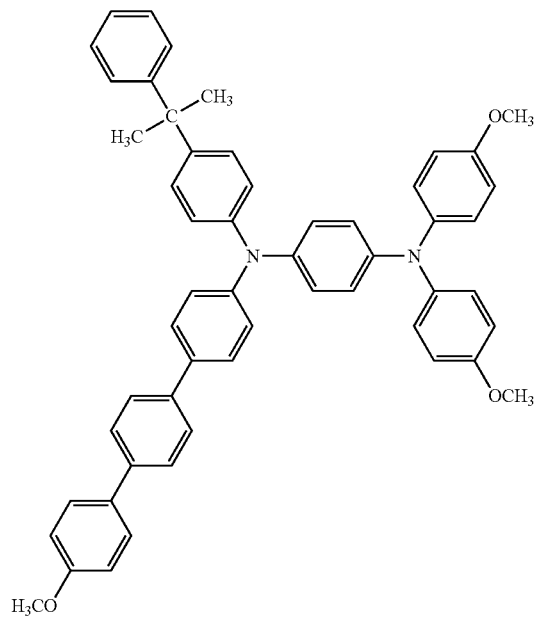
(49)
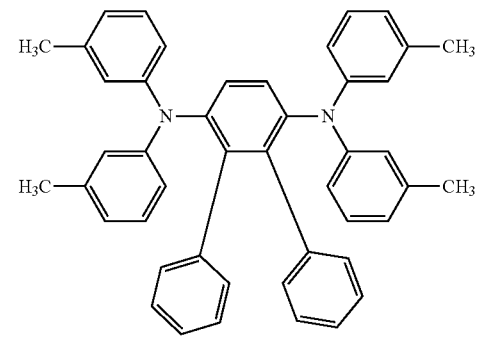
(50)

-continued
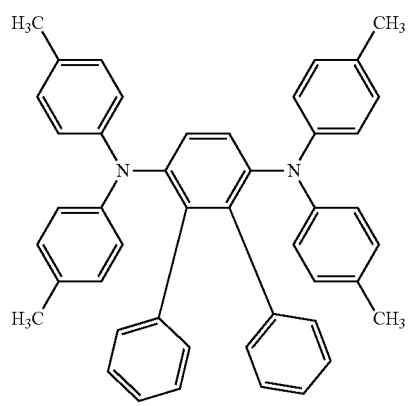
(51)
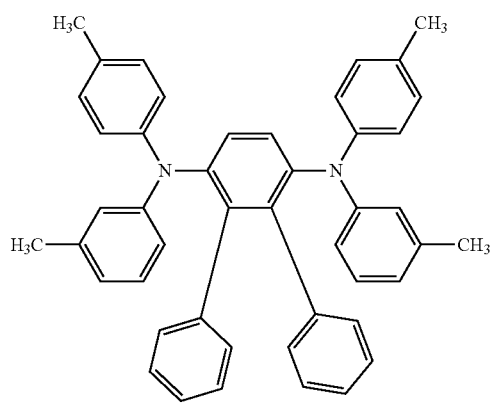
(52)
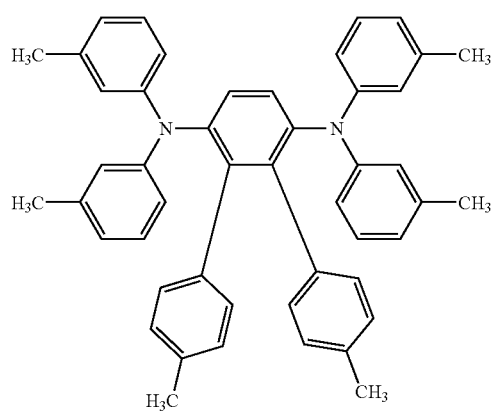
(53)
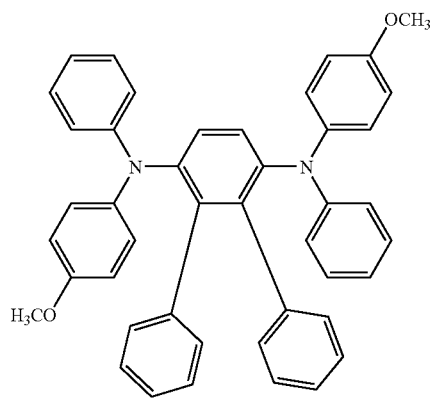
(54)
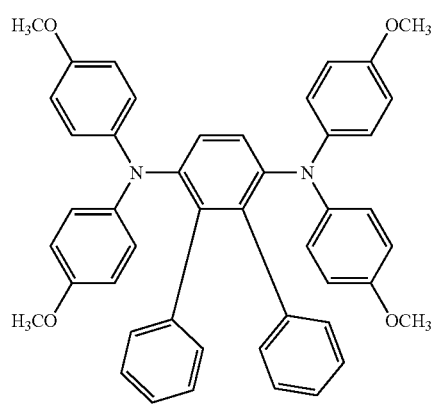
(55)
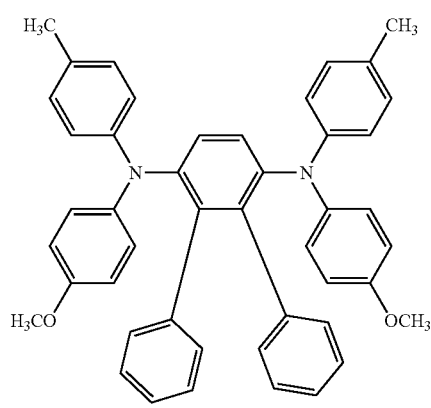
(56)
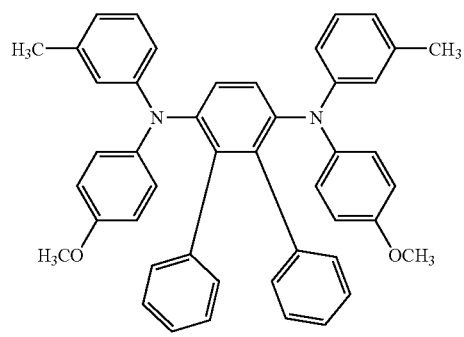
(57)
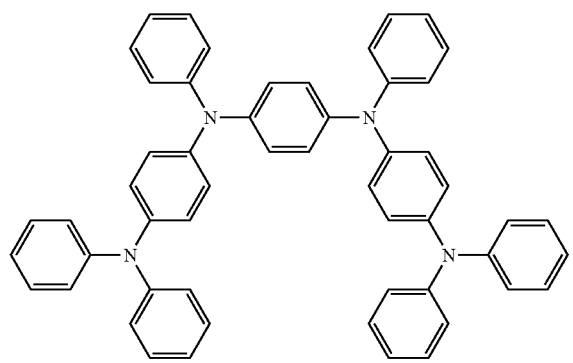
(58)

-continued
(59)
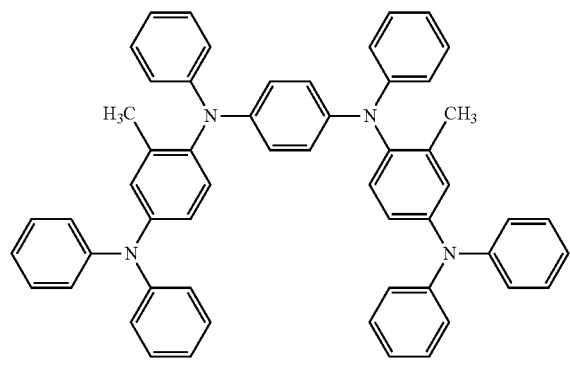
(60)
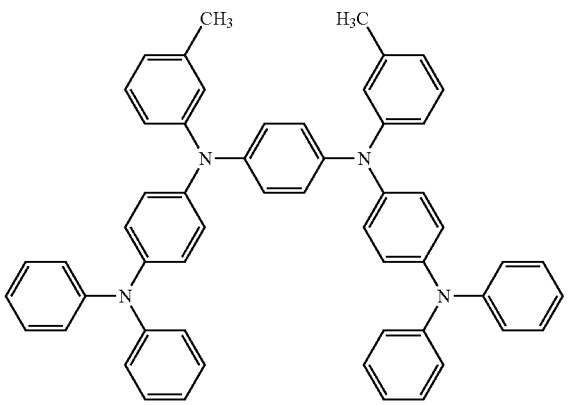
(61)
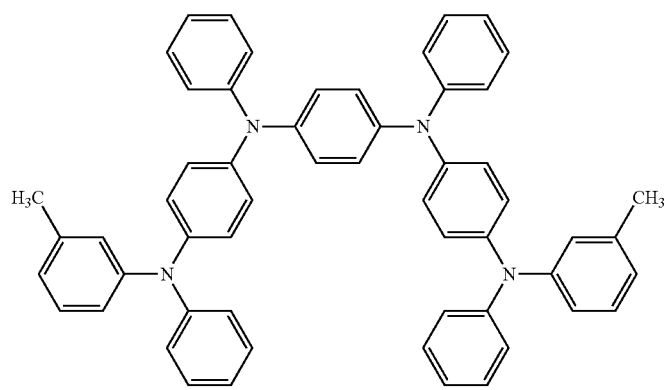
(62)
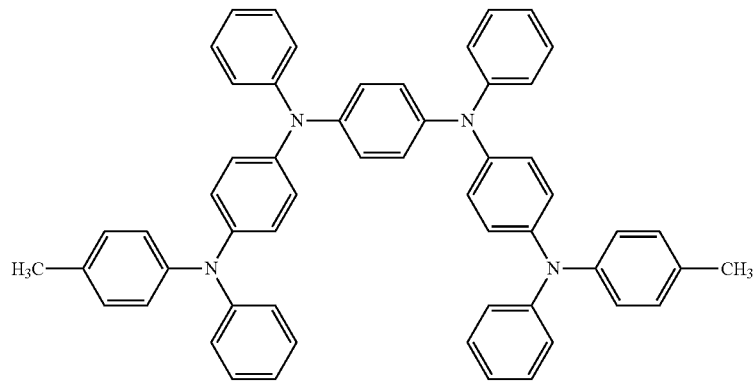
(63)
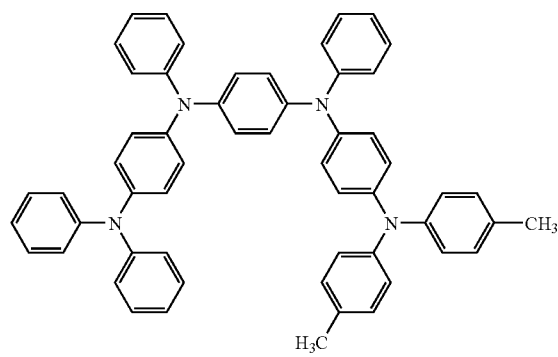
(64)
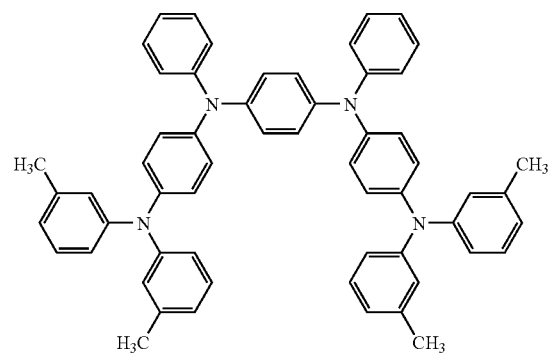

-continued
(65)
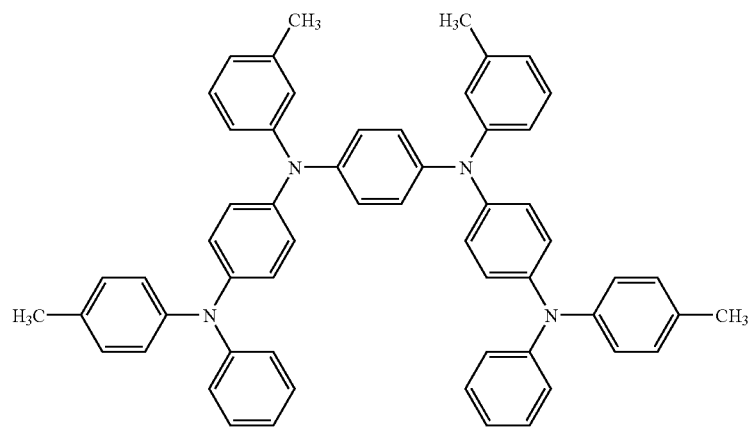
(66)
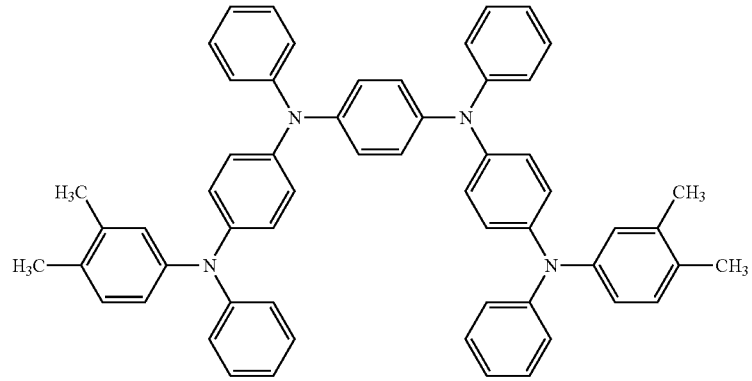
(67)
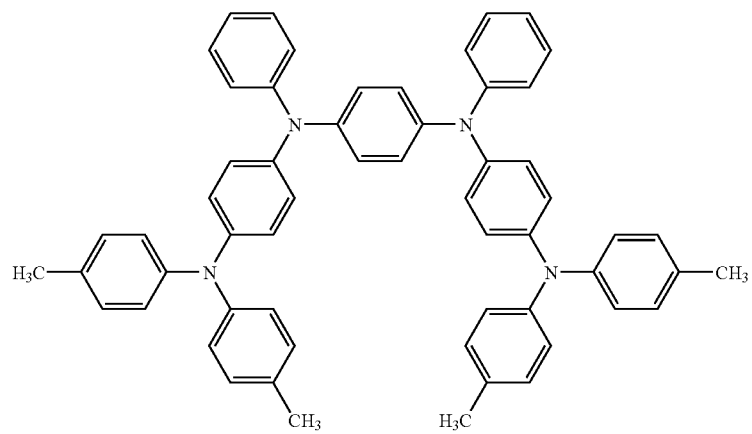
(68)
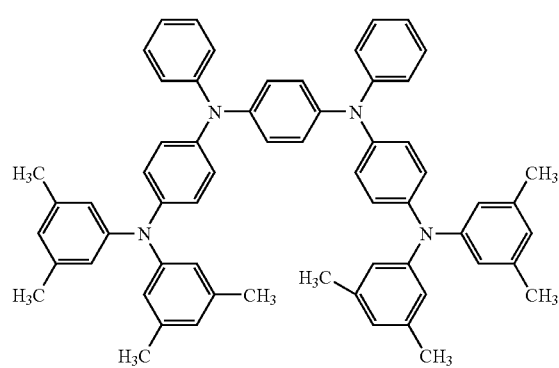
(69)
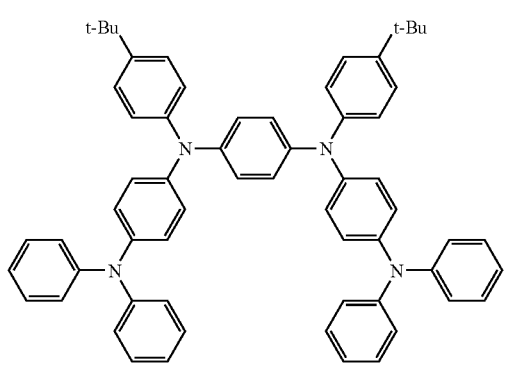

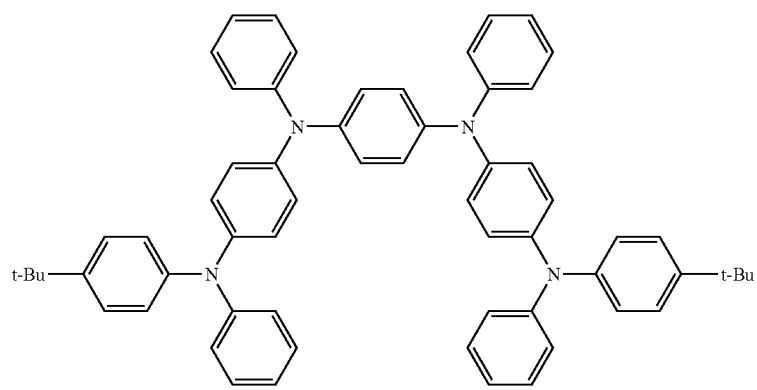
(70)
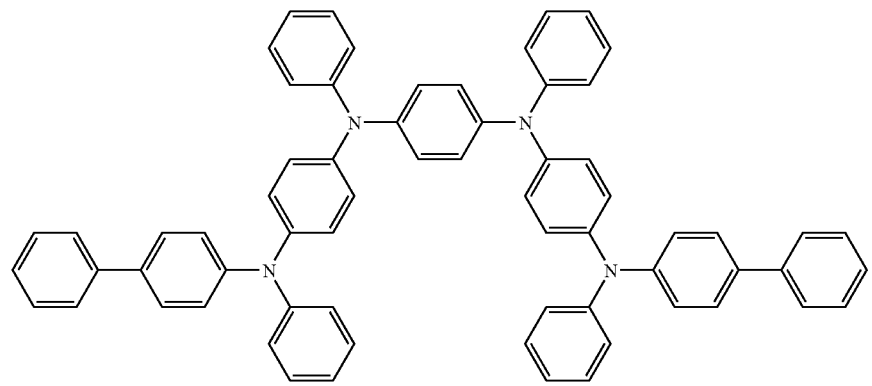
(71)
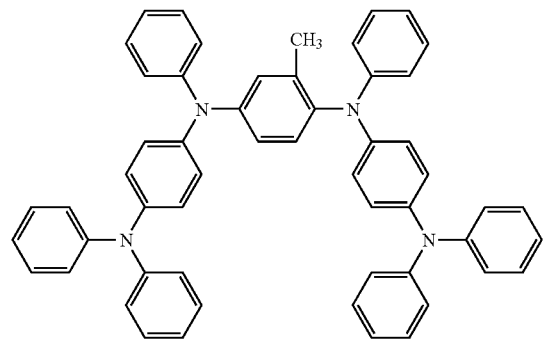
(72)
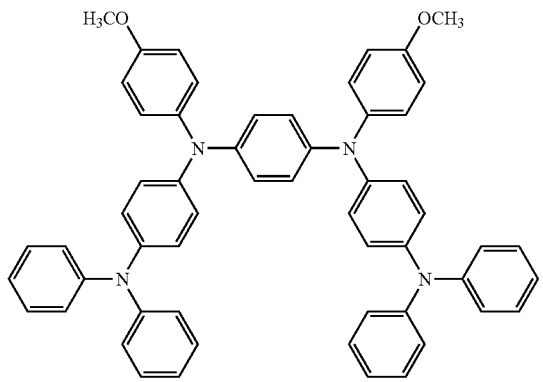
(73)
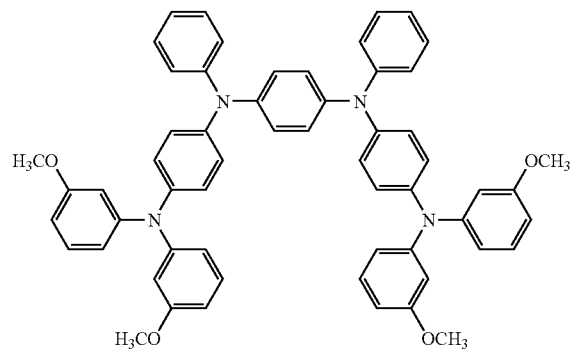
(74)
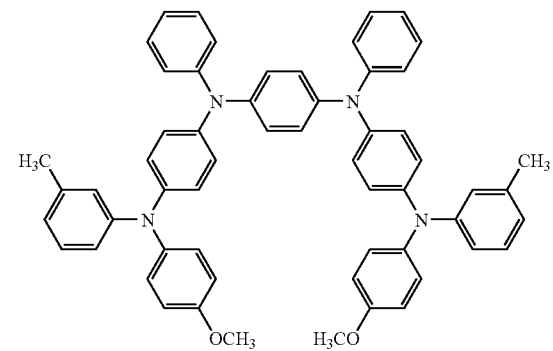
(75)

-continued
(76)
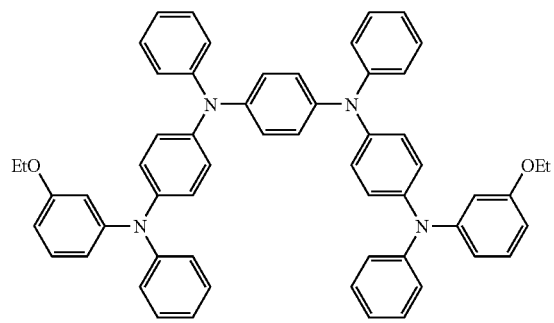
(77)
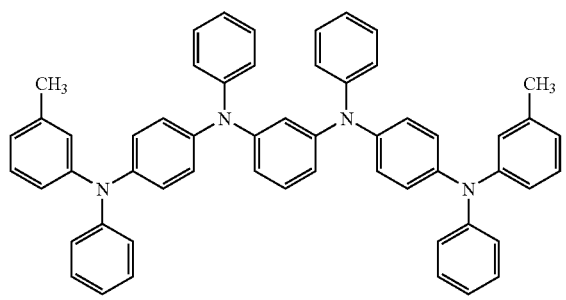
(78)
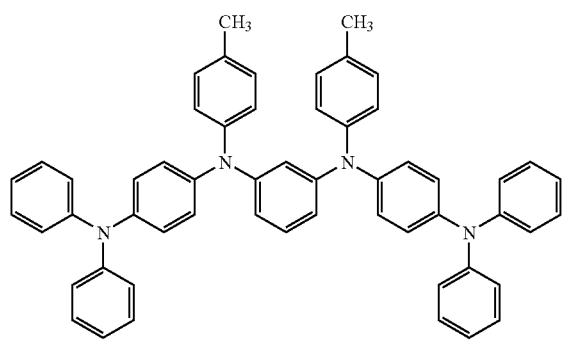
(79)
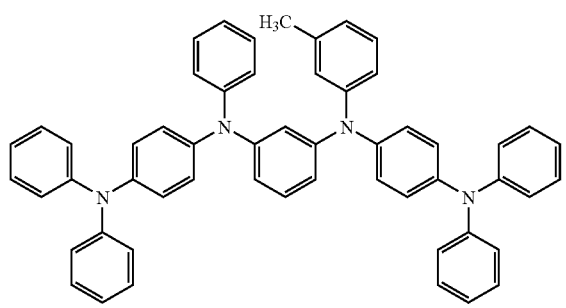
(80)
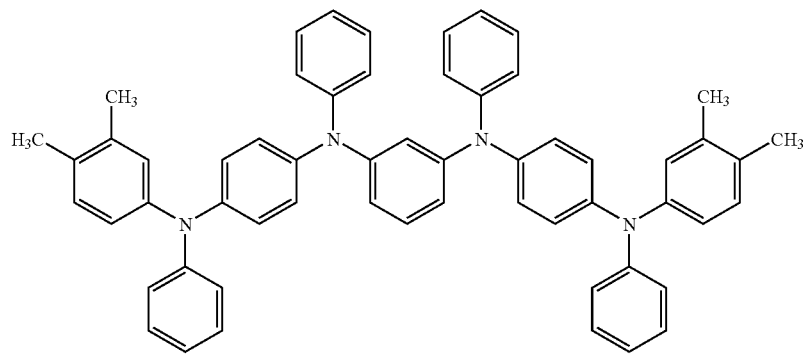
(81)
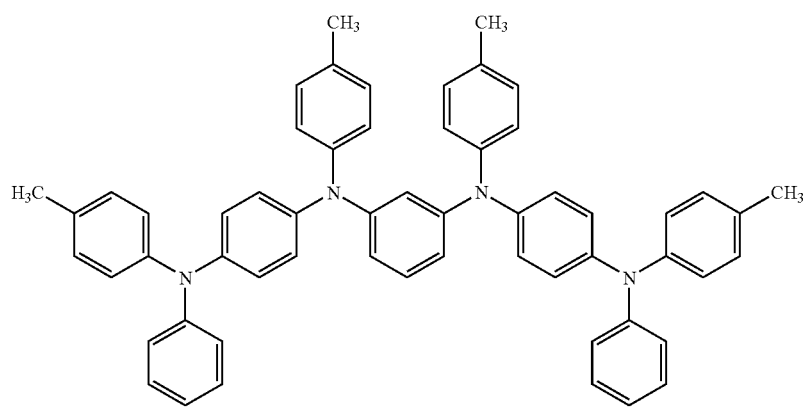

-continued
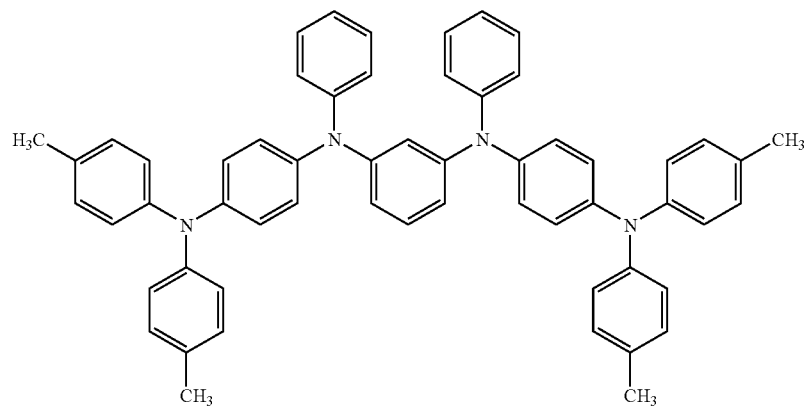
(82)
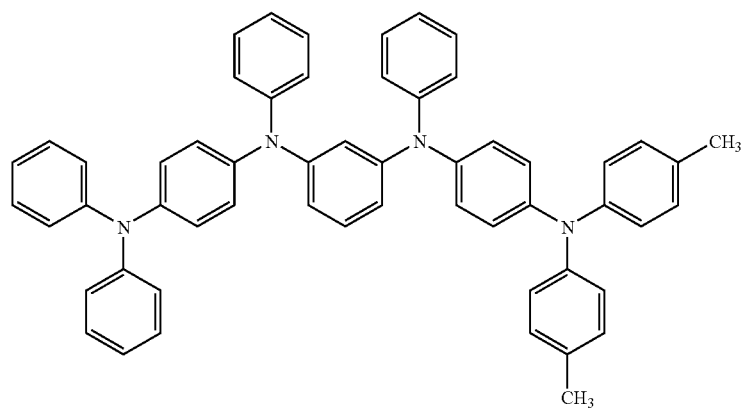
(83)
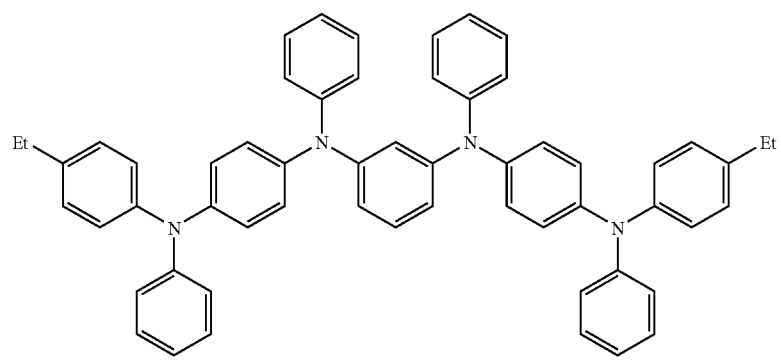
(84)
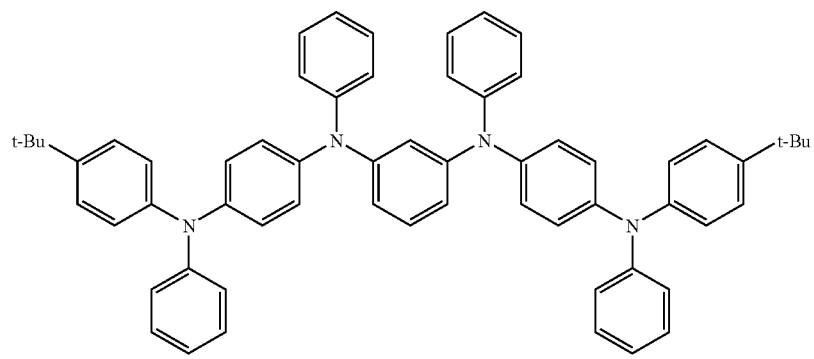
(85)

(86)
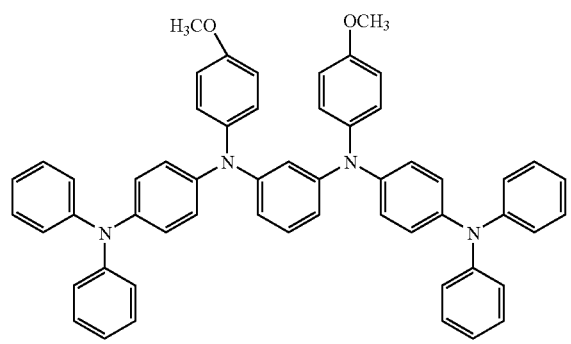
(87)
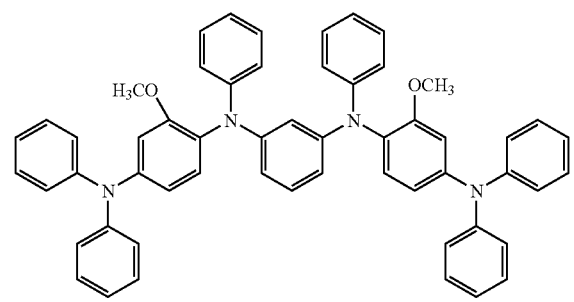
(88)
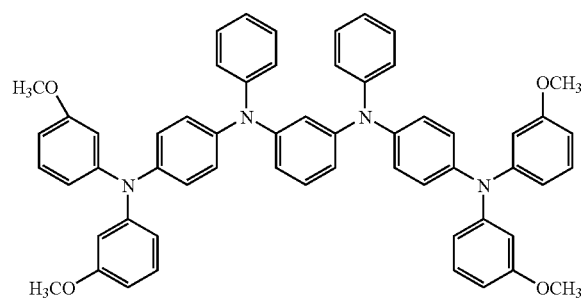
(89)
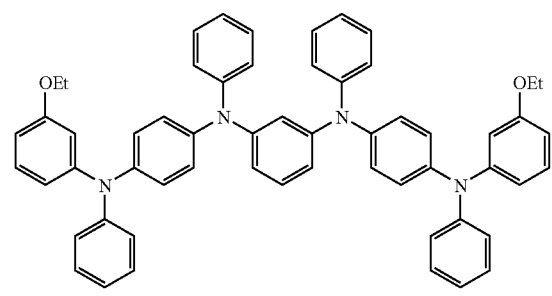
(90)
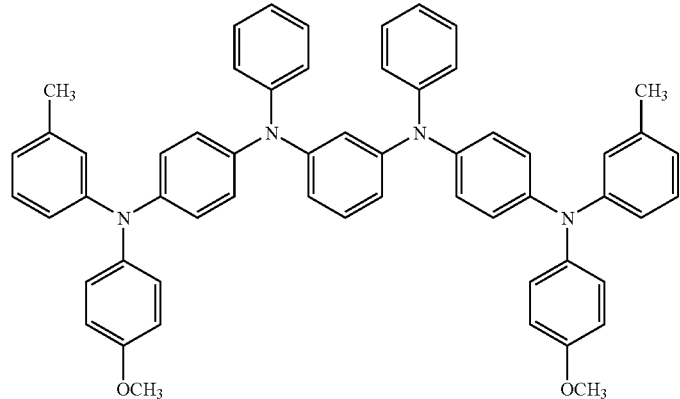
(91)
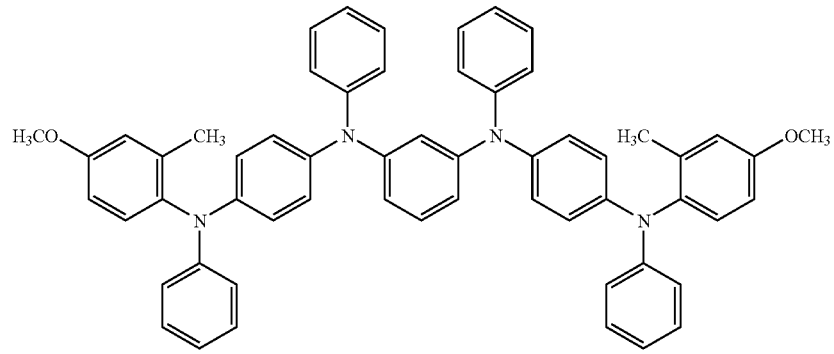

(92)
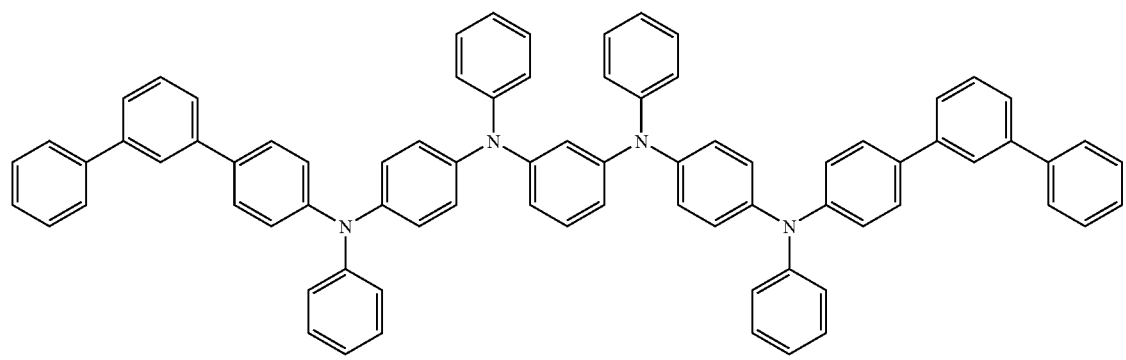
(93)
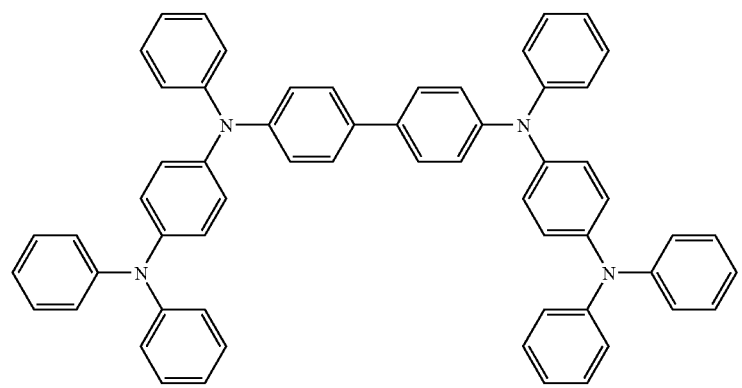
(94)
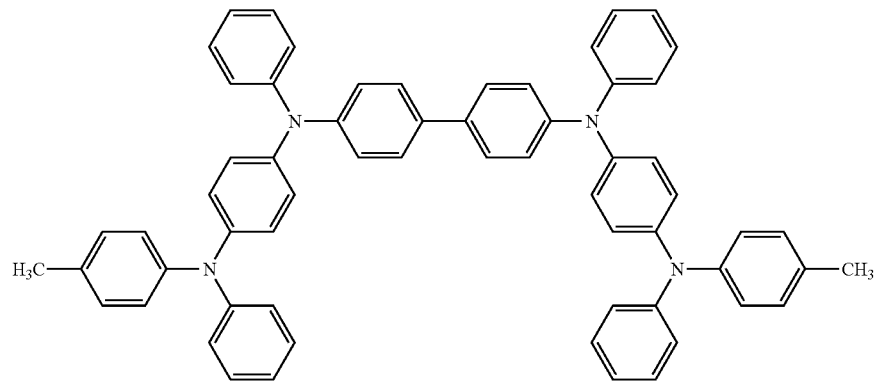
(95)
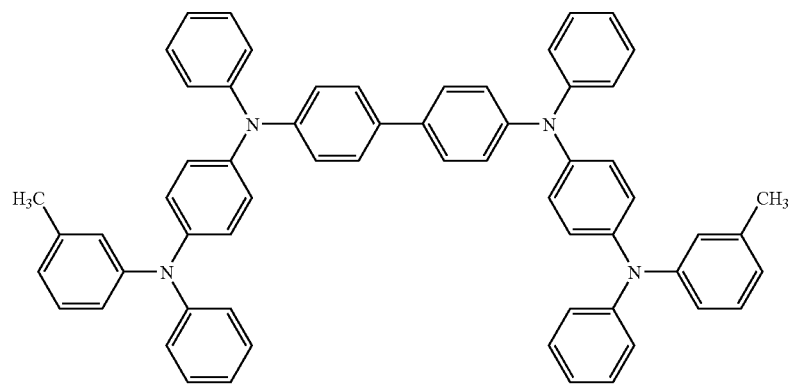

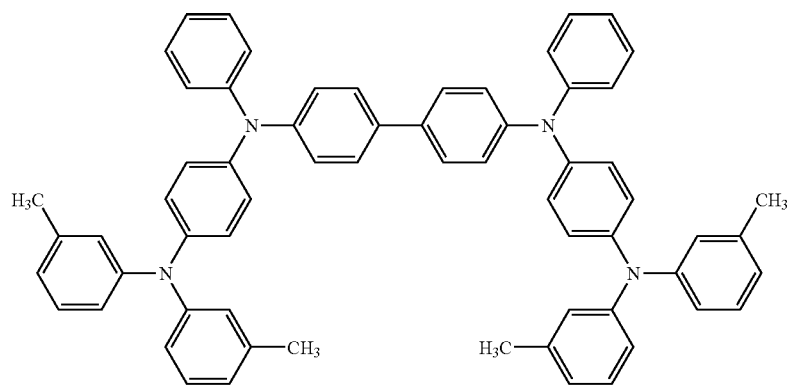
(96)
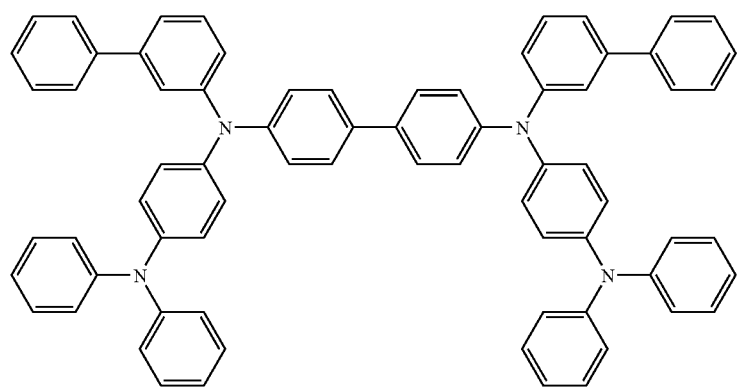
(97)
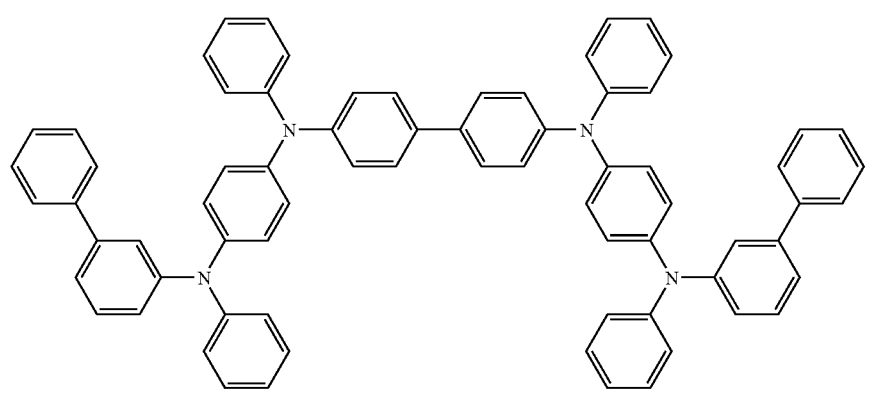
(98)
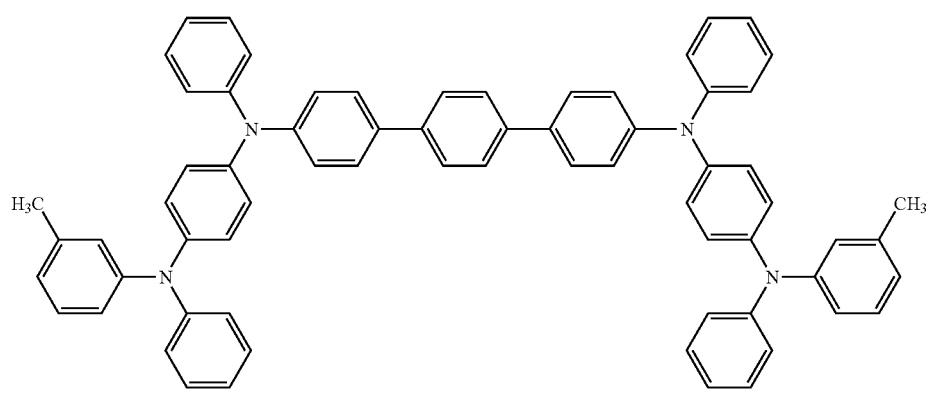
(99)

(100)
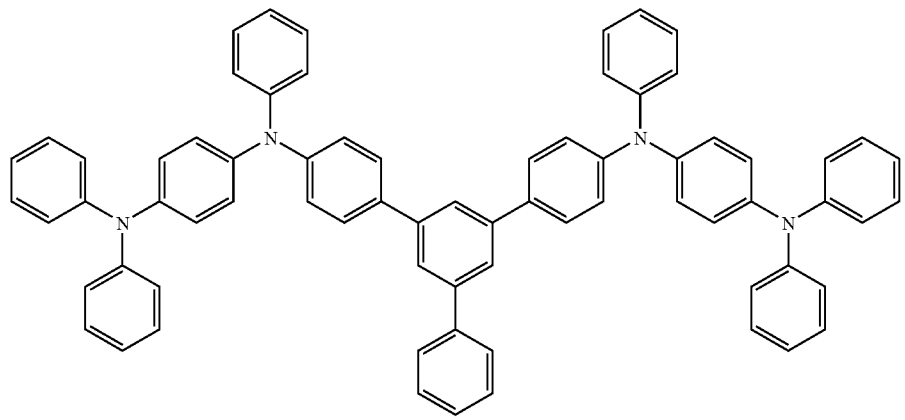
(101)
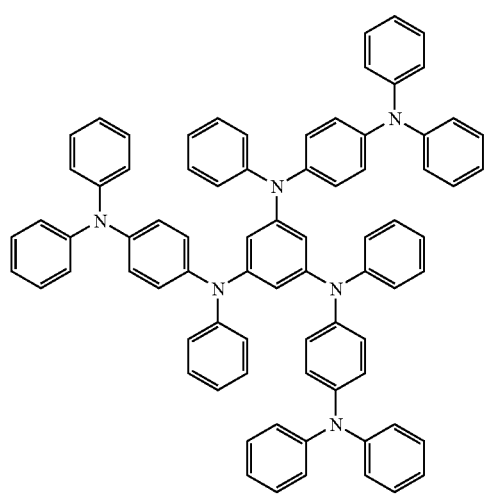
(102)
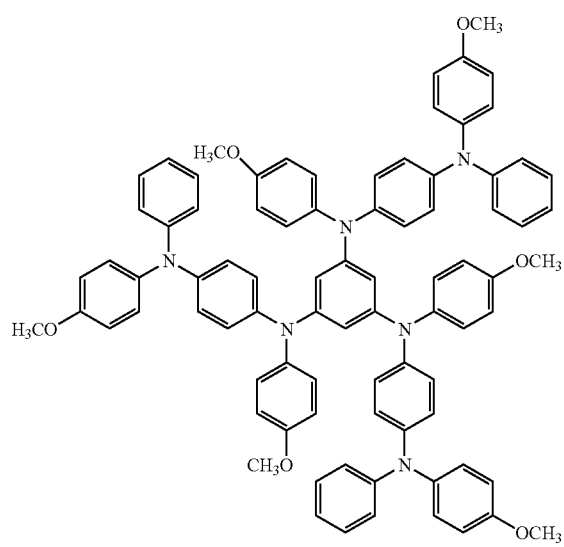
(103)
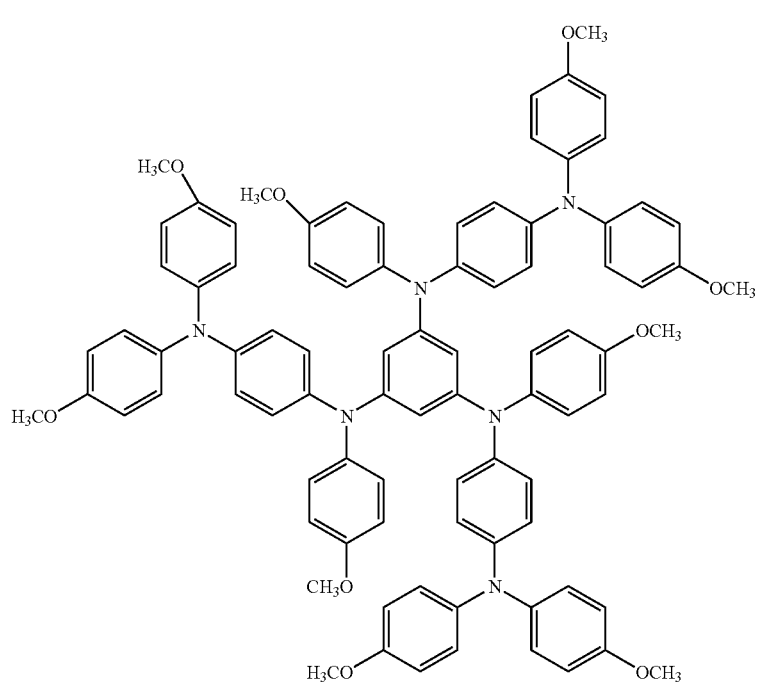

-continued (104)

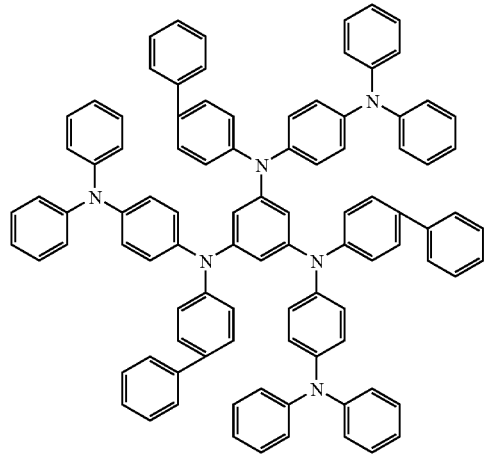

(105)

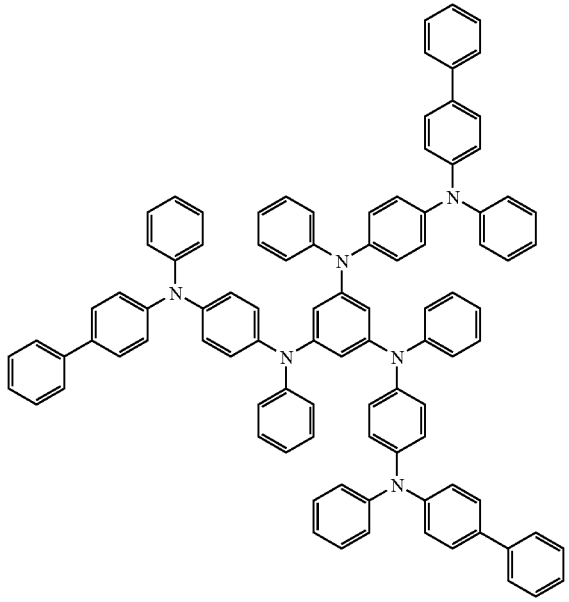

The specific compounds corresponding to the general formulas (1) to (3) are represented by the above mentioned structural formulas. As specific examples of organic compounds represented by the general formula (1), organic compounds represented by the structural formulas (11) to (57) can be given. As specific examples of organic compounds represented by the general formula (2), organic compounds represented by the structural formulas (58) to (100) can be given. Further, as organic compounds represented by the general formula (3), specifically, organic compounds represented by the structural formulas (101) to (105) can be given.

Among the specific organic compounds represented by the structural formulas (58) to (100), which correspond to organic compounds represented by the general formula (2), the organic compounds represented by the structural formulas (58) to (71) and the structural formulas (73) to (76) are organic compounds in which X is the structural formula (2-1). Further, in the organic compound represented by the structural formula (72), X is the structural formula (2-2). In the organic compounds represented by the structural formulas (77) to (92), X is the structural formula (2-3).

In the organic compounds represented by the structural formulas (93) to (98), X of the general formula (2) is the structural formula (2-4). In the organic compound represented by the structural formula (99), X is the structural formula (2-5). Further, in the organic compound represented by the structural formula (100), X is the structural formula (2-6).

As an inorganic compound used for a composite material of the present invention, transition metal oxide is preferable. Specifically, titanium oxide, zirconium oxide, hafnium oxide, vanadium oxide, niobium oxide, tantalum oxide, chromium oxide, molybdenum oxide, tungsten oxide, manganese oxide, rhenium oxide, and the like can be given. In particular, since vanadium oxide, molybdenum oxide, tungsten oxide, and rhenium oxide have excellent electron accepting properties, they are preferable. Among them, in particular, molybdenum oxide is stable even under atmospheric air, and therefore, it is easily handled and is more preferable.

A method for manufacturing a composite material of the present invention is not particularly limited regardless of a wetting method and a drying method so long as a composite material having no absorption spectrum in a visible light region is formed by the method, however, an evaporation method is preferable since patterning with the use of a shadow mask is easily carried out. For example, a composite material of the present invention can be preferably formed by co-evaporation of an organic compound and an inorganic compound. Moreover, among the transition metal oxide described above, since molybdenum oxide is easily evaporated in vacuum, when forming a composite material including molybdenum oxide, the composite material is preferably formed by co-evaporation from the viewpoint of a manufacturing process.

Embodiment Mode 2

In this embodiment mode, examples of laminated structures of a light emitting element of the present invention will be described. The light emitting element of the present invention has a plurality of layers between a pair of electrodes. The plurality of layers are laminated by combining a layer made from a substance having an excellent carrier injecting property and a layer made from a substance having an excellent carrier transporting property such that a light emitting region is formed apart from the electrodes, that is, recombination of carries occurs away from the electrodes.

One example of a light emitting element of the present invention will hereinafter be described with reference to FIG. 1A. In this embodiment mode, a light emitting element includes a first electrode 102, a first layer 103, a second layer 104, a third layer 105, and a fourth layer 106 which are sequentially laminated over the first electrode 102, and a second electrode 107 provided over the fourth layer 106. In this embodiment mode, the first electrode 102 serves as an anode and the second electrode 107 serves as a cathode.

This light emitting element is formed over a substrate 101 which is used as a supporting body of the light emitting element. As the substrate 101, for example, glass, plastic, or the like can be used. Further, a material other than the above mentioned materials may be used as the substrate 101 as long as it serves as a supporting body of the light emitting element in steps of manufacturing the light emitting element. As the first electrode 102, various kinds of metal, alloys, electrical conductive compounds, and the like, can be used.

For example, indium tin oxide (ITO), indium tin oxide containing silicon or silicon oxide, indium zinc oxide (IZO), indium tin oxide containing tungsten oxide and zinc oxide (IWZO), and the like can be given. These conductive metal oxide films are generally formed by sputtering. For example, indium zinc oxide (IZO) can be formed by sputtering using a target in which 1 to 20 wt % zinc oxide is mixed in indium oxide. Also, indium tin oxide containing tungsten oxide and zinc oxide (IWZO) can be formed by sputtering using a target in which 0.5 to 5 wt % tungsten oxide and 0.1 to 1 wt % zinc oxide are added to indium oxide. In addition, gold (Au), platinum (Pt), nickel (Ni), tungsten (W), chromium (Cr), molybdenum (Mo), iron (Fe), cobalt (Co), titanium (Ti), copper (Cu), palladium (Pd), aluminum (Al), aluminum-silicon (Al—Si), aluminum-titanium (Al—Ti), aluminum-silicon-copper (Al—Si—Cu), nitride of a metal material (e.g., TiN), and the like can be used for the first electrode 102. When the first electrode is used as an anode, the first electrode is preferably formed using a material having a high work function (4.0 eV or more) among the above mentioned materials. In the light emitting element of the present invention, a material of the first electrode 102 is not limited to a material having a high work function, and a material having a low work function can also be used.

The first layer 103 contains a composite material of the present invention. As shown in Embodiment Mode 1, the composite material of the present invention contains an organic compound having any of the structures represented by the general formulas (1) to (3), and an inorganic compound. Since the composite material of the present invention has high carrier density, it has an excellent carrier injecting property along with an excellent carrier transporting property. In this embodiment mode, the composite material of the present invention serves as a hole injecting layer. Further, the first layer 103 may include not only a single layer structure but also a structure in which two or more layers are laminated.

The second layer 104 is formed using a substance having a strong hole transporting property, for example, an aromatic amine (i.e., including a benzene ring-nitrogen bond) compound such as: 4,4'-bis[N-(1-naphthyl)-N-phenylamino]biphenyl (abbreviation: α-NPD or NPB); N,N'-bis(3-methylphenyl)-N,N'-diphenyl-[1,1'-biphenyl]-4,4'-diamine (abbreviation: TPD); 4,4',4''-tris(N,N-diphenylamino) triphenylamine (abbreviation: TDATA); and 4,4',4''-tris[N-(3-methylphenyl)-N-phenylamino]triphenylamine (abbreviation: MTDATA). The substances given here are mainly substances having hole transporting mobility of $10^{-6}$ cm$^2$/Vs or more. Further, other substance may be used so long as it is a substance of which a hole transporting property is stronger than an electro transporting property. Further, the second layer 104 may include not only a single layer structure but also a structure in which two or more layers formed using the above mentioned substances are laminated.

The third layer 105 is a layer containing a substance having a strong light emitting property. For example, the third layer 105 is formed by freely combining a substance having a strong light emitting property such as N,N'-dimethylquinacridone (abbreviation: DMQd), N,N'-diphenylquinacridone (abbreviation: DPQd), 3-(2-benzothiazoyl)-7-diethylamino coumarin (abbreviation: coumarin 6), and bis[2,3-bis(4-fluorophenyl) quinoxalinato]iridium (acetylacetonato) (abbreviation: Ir(Fdpq)$_2$(acac)) and a substance having a strong carrier transporting property, which is difficult to be crystallized, such as tris(8-quinolinolato) aluminum (abbreviation: Alq$_3$) and 9,10-di(2-naphthyl) anthracene (abbreviation: DNA). Further, since Alq$_3$ and DNA are substances which also have strong light emitting properties, each of which may be independently used as the third layer 105.

The fourth layer 106 is formed using a substance having a strong electron transporting property, for example, a metal complex having a quinoline skeleton or a benzoquinoline skeleton such as tris(8-quinolinolato) aluminum (abbreviation: Alq$_3$), tris(4-methyl-8-quinolinolato) aluminum (abbreviation: Almq$_3$), bis(10-hydroxybenzo[h]-quinolinato) beryllium (abbreviation: BeBq$_2$), and bis(2-methyl-8-quinolinolato)(4-phenylphenolato) aluminum (abbreviation: BAlq), or the like. In addition, a metal complex having oxazole ligand or thiazole ligand such as bis[2-(2-hydroxyphenyl)-benzoxazolato]zinc (abbreviation: Zn(BOX)$_2$) and bis[2-(2-hydroxyphenyl)-benzothiazolato]zinc (abbreviation: Zn(BTZ)$_2$) can also be used.

In addition to the above mentioned metal complexes, 2-(4-biphenylyl)-5-(4-tert-butylphenyl)-1,3,4-oxadiazole (abbreviation: PBD); 1,3-bis[5-(p-tert-butylphenyl)-1,3,4-oxadiazole-2-yl]benzene (abbreviation: OXD-7); 3-(4-tert-butylphenyl)-4-phenyl-5-(4-biphenylyl)-1,2,4-triazole (abbreviation: TAZ); 3-(4-tert-butylphenyl)-4-(4-ethylphenyl)-5-(4-biphenylyl)-1,2,4-triazole (abbreviation: p-EtTAZ); bathophenanthroline (abbreviation: BPhen); bathocuproin (abbreviation: BCP); and the like can also be used as a substance having a strong hole transporting property.

The substances mentioned here are mainly substances having electron mobility of $10^{-6}$ cm$^2$/Vs or more. Further, a substance other than the above mentioned substances may be used for the fourth layer 106 so long as it is a substance of which an electron transporting property is stronger than a hole transporting property. Furthermore, the fourth layer 106 may include not only a single layer structure but also a structure in which two or more layers are laminated.

As a substance for forming the second electrode 107, metal, an alloy, an electroconductive compound each having a low work function (3.8 eV or less), or a mixture thereof can be used. Specifically, an element belonging to group 1 or group 2 of the periodic table, that is, alkali metal such as lithium (Li) and cesium (Cs), alkali earth metal such as magnesium (Mg), calcium (Ca), and strontium (Sr), and an alloy containing these elements (such as Mg:Ag, and Al:Li) can be given as a cathode material.

Alternatively, by interposing a layer having a function of promoting injection of electrons between the second electrode 107 and a light emitting layer, various conductive materials such as Al, Ag, ITO, and indium tin oxide containing silicon can be used for the second electrode 107, regardless of the level of a work function. As the layer having a function of promoting injection of electrons, an alkali metal compound or an alkali earth metal compound, such as lithium fluoride (LiF), cesium fluoride (CsF) and calcium fluoride (CaF$_2$), can be used. In addition, a layer made from a substance having an electron transporting property, which contains alkali metal or alkali earth metal, for example, Alq$_3$ containing magnesium (Mg), or the like can be used.

A method for forming the first layer 103, the second layer 104, the third layer 105, and the fourth layer 106 is not particularly limited. These layers may be formed using a method other than evaporation. For example, these layers may be formed by using ink-jet, spin coating, or the like. Further, they may be formed by using different methods for each electrode or each layer.

In the light emitting element in accordance with the present invention having the above described structure, when current flows through the light emitting element due to difference in potential generated between the first electrode 102 and the second electrode 107, holes and electrons are recombined at the third layer 105, which contains a substance having a strong light emitting property, and thus light is emitted. That is, a light emitting region is formed in the third layer 105. Further, the entire third layer 105 is not necessary to serve as the light emitting region. For example, the light emitting region may be formed only in a part of the third layer 105 at the side of the second layer 104 or the side of the fourth layer 106.

Light generated in the light emitting region is emitted to an external portion through one of both of the first electrode 102 and the second electrode 107. Therefore, one of both of the first electrode 102 and the second electrode 107 is/are formed using a substance having a light transmitting property. When only the first electrode 102 is formed using a substance having a light transmitting property, light generated in the light emitting region is emitted through the first electrode 102 and the substrate, as shown in FIG. 1A.

Figure 1B:
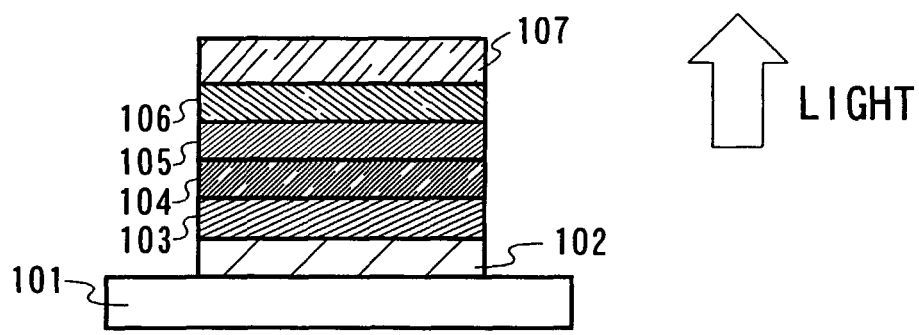
Figure 1C:
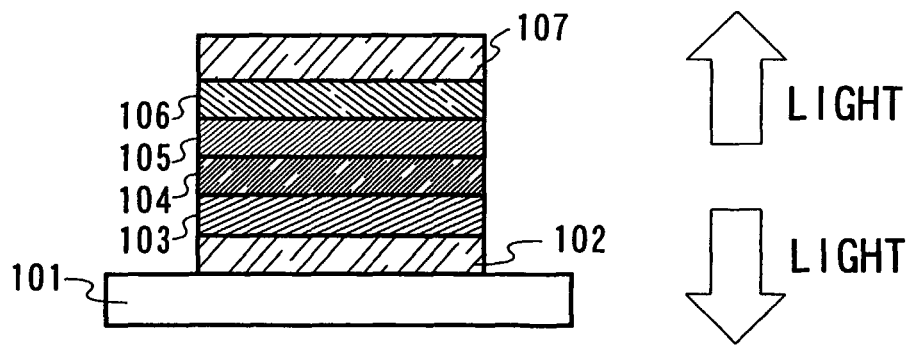

On the other hand, when only the second electrode 107 is formed using a substance having a light transmitting property, light generated in the light emitting region is emitted through the second electrode 107 from the opposite side of the substrate, as shown in FIG. 1B. When the first electrode 102 and the second electrode 107 are both formed using a substance having a light transmitting property, light generated in the light emitting region is emitted through both the first electrode 102 and the second electrode 107 from both the substrate side and the opposite side of the substrate, as shown in FIG. 1C.

Further, a structure of layers provided between the first electrode 102 and the second electrode 107 is not limited to the above described structure. A structure different from the above described structure may also be employed so long as it has a region where holes and electrons are recombined at a portion away from the first electrode 102 and the second electrode 107 so as to prevent optical quenching caused due to proximity of the light emitting region and metal, and also has a layer containing a composite material of the present invention.

That is, a laminated structure of layers provided between the first and second electrodes, is not particularly limited, and layers formed using a substance having a strong electron transporting property, a substance having a strong hole transporting property, a substance having a strong electron injecting property, a substance having a strong hole injecting property, a substance having a bipolar property (i.e., a substance having both a strong electron transporting property and a strong hole transporting property), and the like, may be freely provided in combination with a layer containing a composite material of the present invention. Moreover, a layer formed using a silicon oxide film and the like may be provided over the first electrode 102 to control a position of carrier recombination.

Figure 2:
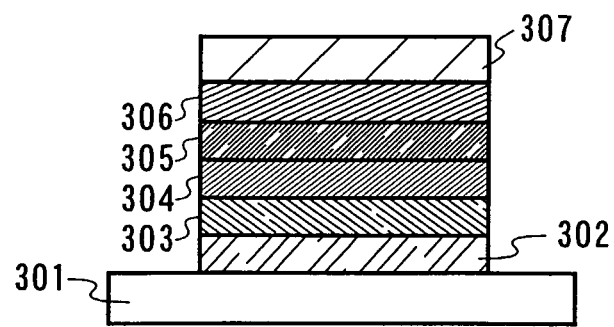
FIG. 2 is a cross sectional view explaining a light emitting element of the present invention.

A light emitting element shown in FIG. 2 is formed by sequentially laminating a first layer 303 formed using a substance having a strong electron transporting property, a second layer 304 formed using a substance having a strong light emitting property, a third layer 305 formed using a substance having a strong hole transporting property, a fourth layer 306 formed using a composite material of the present invention, and a second electrode 307 serving as an anode, over a first electrode 302 serving as a cathode. Further, reference numeral 301 is a substrate.

In this embodiment mode, a light emitting element is manufactured over a substrate made from glass, plastic, or the like. By providing the plurality of light emitting elements as described above over one substrate, a passive matrix light emitting device can be manufactured. Further, a light emitting element may be manufactured over, for example, a thin film transistor (TFT) array substrate, instead of the substrate made from glass, plastic, or the like. This allows to manufacture an active matrix light emitting device which controls drive of a light emitting element by a TFT. Further, a structure of a TFT is not particularly limited, and either a staggered TFT or a inversely staggered TFT may be used. With respect to a driving circuit formed over the TFT array substrate, the driving circuit may be formed using an N-type TFT and a P-type TFT, or either an N-type TFT or a P-type TFT.

The light emitting element of the present invention has a layer containing a composite material shown in Embodiment Mode 1. Since holes are generated in a layer containing a composite material of the present invention, the layer has an excellent hole injecting property, making it possible to reduce driving voltage. The layer containing a composite material of the present invention has an excellent conducting property, and therefore, increase in driving voltage of the light emitting element can be suppressed even though a thickness of the layer is increased. Consequently, by increasing the thickness of the layer containing the composite material, short circuiting between upper and lower electrodes can be prevented. As a result, defects due to dust which is generated in a manufacturing process can be inhibited, which allows to improve yield.

Increasing a thickness of the layer containing a composite material of the present invention can prevent short-circuiting caused by damage and the like, and hence, a light emitting element with high reliability can be obtained. For example, as compared to a conventional light emitting element, in which a thickness between electrodes is 100 to 150 nm, a thickness between electrodes of a light emitting element using a composite material of the present invention, can be set to be 100 to 500 nm, and more preferably, 200 to 500 nm.

Since the layer containing a composite material of the present invention does not have an absorption peak in a visible light region, the layer has excellent visible light transmittance, and therefore, light generated in a light emitting region can be emitted to an external portion efficiently. Thus, light emitting efficiency can be improved as compared with the conventional one. Furthermore, since the layer containing a composite material of the present invention has a high carrier density, the layer can make ohmic contact to the electrodes. That is, contact resistance of the light emitting element with respect to the electrodes, is low. Therefore, a material for the electrodes can be freely selected regardless of a work function and the like. As a consequence, material choices for an electrode can be widened.

Since the layer containing a composite material of the present invention can be formed by vacuum evaporation, when a layer containing a light emitting substance is formed by vacuum evaporation, both of the layers can be formed in the same vacuum apparatus without exposing to atmospheric air. That is, a light emitting element can be formed in vacuum. Thus, dust can be prevented from attaching to the layers in a manufacturing process, making it possible to increase the yield. Furthermore, since the layer containing a composite material of the present invention includes both an organic material and an inorganic material, stress generated between electrodes and a layer containing a light emitting substance can be reduced. Moreover, the present embodiment mode can be freely combined with other embodiment modes.

Embodiment Mode 3

Figure 3A:
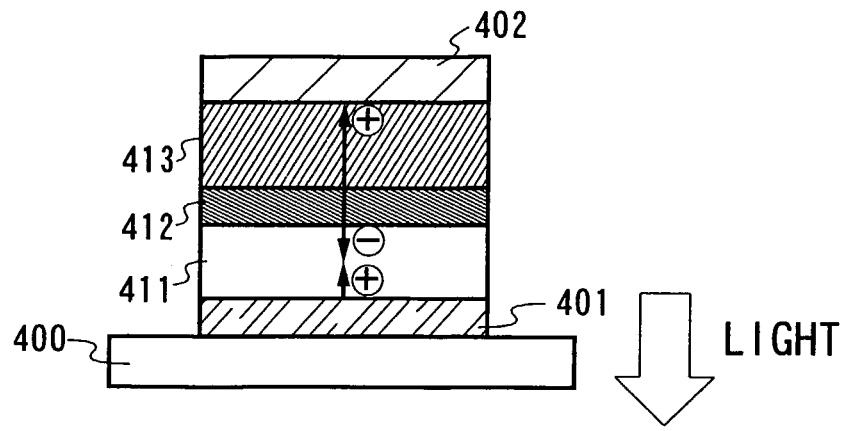
FIGS. 3A to 3C are cross sectional views explaining light emitting elements of the present invention.

In this embodiment mode, the light emitting element having a different structure from the light emitting elements shown in Embodiment Mode 2 will be described with reference to FIGS. 3A to 3C and FIGS. 4A to 4C. In this embodiment mode, a layer containing a composite material of the present invention can be provided to be in contact with an electrode serving as a cathode. FIG. 3A shows an example of a structure of a light emitting element of the present invention. The light emitting element has a structure in which a first layer 411, a second layer 412, and a third layer 413 are laminated between a first electrode 401 and a second electrode 402. In this embodiment mode, the first electrode 401 serves as an anode and the second electrode 402 serves as a cathode.

The first electrode 401 and the second electrode 402 can employ the same structure as Embodiment Mode 2. The first layer 411 contains a substance having a strong light emitting property, the second layer 412 contains one compound selected from substances having an electron donating property and a compound having a strong electron transporting property, and the third layer 413 contains a composite material described in Embodiment Mode 1. As a substance having an electron donating property, which is included in the second layer 412, alkali metal, alkali earth metal, or oxide or salt thereof is preferably used. Specifically, lithium, cesium, calcium, lithium oxide, calcium oxide, barium oxide, cesium carbonate, and the like can be given.

In the above mentioned structure, as shown in FIG. 3A, by applying voltage to the light emitting element, electrons are transferred in the vicinity of an interface between the second layer 412 and the third layer 413 to generate electrons and holes. The second layer 412 transports electrons to the first layer 411 while the third layer 413 transports holes to the second electrode 402. That is, a combination of the second layer 412 and the third layer 413 serves as a carrier generating layer.

It can be said that the third layer 413 serves to transport holes to the second electrode 402. In addition, the third layer 413 exhibits extremely strong hole injecting and transporting properties and has high visible light transmittance, and hence, reduction in extraction efficiency of light emission, which is caused by increasing a thickness of the film, can be prevented. Therefore, in the case of FIG. 3A, when the second electrode 402 is formed by sputtering, damage to the first layer 411 including a substance having a light emitting property can be reduced.

The light emitting element of the present invention has different variations on its structure by changing materials of the first electrode 401 and the second electrode 402. Schematic views of the different variations are shown in FIGS. 3B and 3C and FIGS. 4A to 4C. Further, the same reference numerals used in FIG. 3A are also used in FIGS. 3B and 3C and FIGS. 4A to 4C. Reference numeral 400 represents a substrate for supporting a light emitting element of the present invention.

Figure 3B:
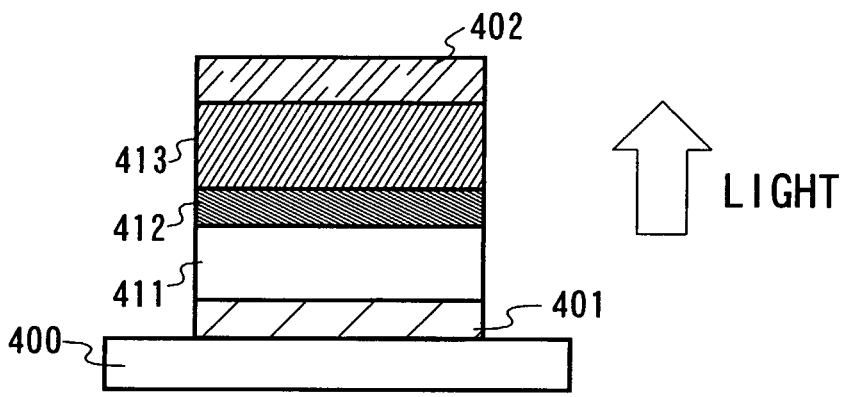
Figure 3C:
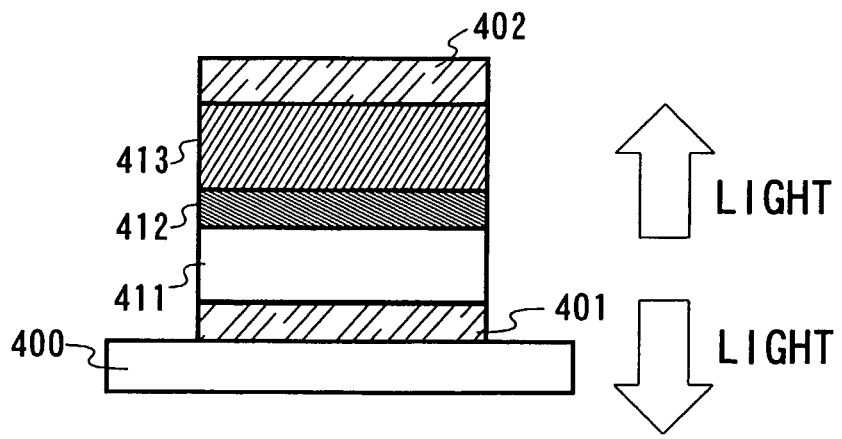

FIGS. 3A to 3C show examples in each of which the first layer 411, the second layer 412, and the third layer 413 are laminated over the substrate 400 in this order. When the first electrode 401 has a light transmitting property and the second electrode 402 has a light shielding property (in particular, a light reflecting property), light can be emitted through the substrate 400 as shown in FIG. 3A. Alternatively, when the first electrode 401 has a light shielding property (in particular, a light reflecting property) and the second electrode 402 has a light transmitting property, light can be emitted through the opposite side of the substrate 400, as shown in FIG. 3B. Also, when the first electrode 401 and the second electrode 402 both have light transmitting properties, light can be emitted both through the substrate 400 and the opposite side of the substrate 400, as shown in FIG. 3C.

Figure 4A:
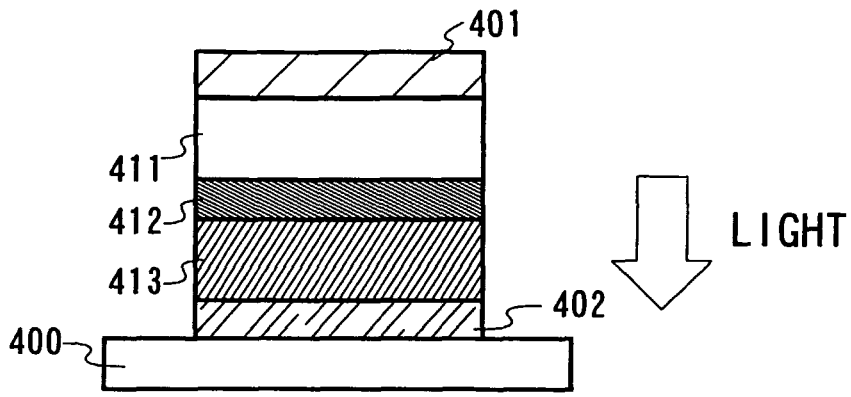
FIGS. 4A to 4C are cross sectional views explaining light emitting elements of the present invention.
Figure 4B:
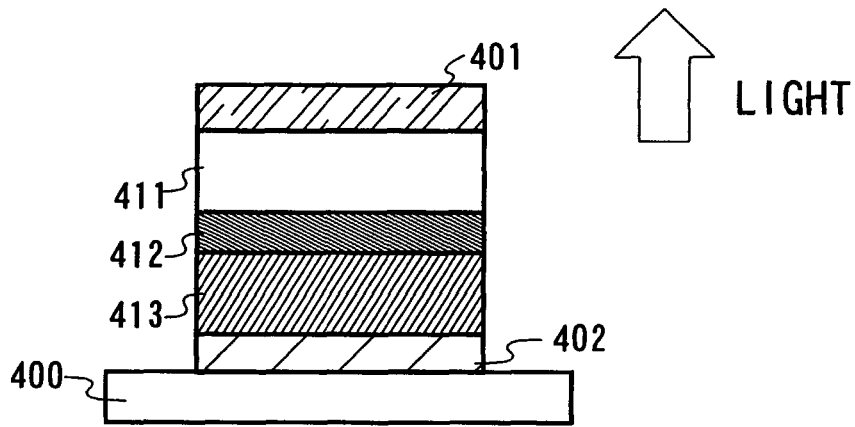
Figure 4C:
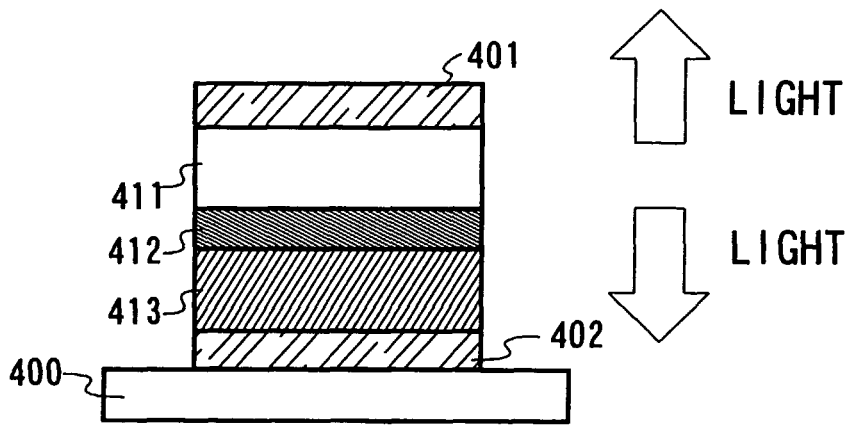

FIGS. 4A to 4C show examples in each of which the third layer 413, the second layer 412, and the first layer 411 are laminated over the substrate 400 in this order. When the first electrode 401 has a light shielding property (in particular, a light reflecting property) and the second electrode 402 has a light transmitting property, light can be emitted through the substrate 400, as shown in FIG. 4A. Alternatively, when the first electrode 401 has a light transmitting property and the second electrode 402 has a light shielding property (in particular, a light reflecting property), light can be emitted through the opposite side of the substrate 400, as shown in FIG. 4B. Further, when both the first electrode 401 and the second electrode 402 are formed to have light transmitting properties, light can be emitted both through the substrate 400 and the opposite side of the substrate 400, as shown in FIG. 4C.

Furthermore, as shown in FIGS. 3A to 3C, after forming the first electrode 401, the first layer 411, the second layer 412, and the third layer 413 may be sequentially laminated over the first electrode 401, and then the second electrode 402 may be formed thereover. Alternatively, as shown in FIGS. 4A to 4C, after forming the second electrode 402, the third layer 413, the second layer 412, and the first layer 411 may be sequentially laminated over the second electrode 402, and then the first electrode 401 may be formed thereover. When forming a light emitting element of the present embodiment mode, a known method can be employed regardless of a wetting method and a drying method. Moreover, the present embodiment mode can be freely combined with other embodiment modes.

Embodiment Mode 4

Figure 5A:
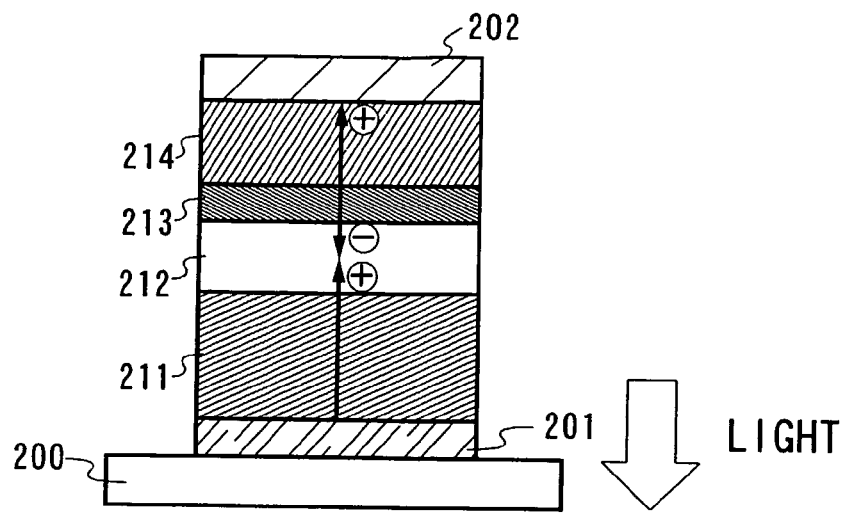
FIGS. 5A to 5C are cross sectional views explaining light emitting elements of the present invention.

A light emitting element having a different structure from those of the light emitting elements shown in Embodiment Mode 2 and Embodiment Mode 3 will be described with reference to FIGS. 5A to 5C and FIGS. 6A to 6C. In a structure shown in this embodiment mode, a layer containing a composite material of the present invention can be provided to be in contact with two electrodes of a light emitting element. FIG. 5A shows an example of a structure of a light emitting element in accordance with this embodiment mode. A first layer 211, a second layer 212, a third layer 213, and a fourth layer 214 are laminated between a first electrode 201 and a second electrode 202.

In this embodiment mode, the first electrode 201 serves as an anode and the second electrode 202 serves as a cathode. The same structures shown in Embodiment Mode 2 can be used for the first electrode 201 and the second electrode 202. The first layer 211 is a layer containing a composite material of the present invention described in Embodiment Mode 1. The second layer 212 is a layer containing a substance having a strong light emitting property.

The third layer 213 is a laser containing one compound selected from substances having electron donating properties and a compound having a strong electron transporting property. The fourth layer 214 is a layer containing a composite material of the present invention described in Embodiment Mode 1. As a substance having an electron donating property, which is included in the third layer 213, alkali metal, alkali earth metal, or oxide or salt thereof is preferably used. Specifically, lithium, cesium, calcium, lithium oxide, calcium oxide, barium oxide, cesium carbonate, and the like can be given.

In the above mentioned structure, as shown in FIG. 5A, by applying voltage to the light emitting element, electrons are transferred in the vicinity of an interface between the third layer 213 and the fourth layer 214 to generate electrons and holes. The first layer 213 transports electrons to the second layer 212 while the fourth layer 214 transports holes to the second electrode 202. That is, a combination of the third layer 213 and the fourth layer 214 serves as a carrier generating layer. Also, it can be said that the fourth layer 214 serves to transport holes to the second electrode 202.

In addition, the first layer 211 and the fourth layer 214 exhibit extremely strong hole injecting and transporting properties. Therefore, in the light emitting element of the present embodiment mode, a thickness of the first layer 211 at the side of the anode and a thickness of the fourth layer 214 at the side of the cathode can be extremely increased, and hence, short-circuiting of the light emitting element can further be prevented effectively. In the case of FIG. 5A, when the second electrode 202 is formed by sputtering, damage to the second layer 212 including a substance having a light emitting property can be reduced. Furthermore, by forming the first layer 211 and the fourth layer 214 using a same material on the both sides of the second layer having a function of emitting light, an effect of inhibiting stress distortion can be expected.

Figure 5B:
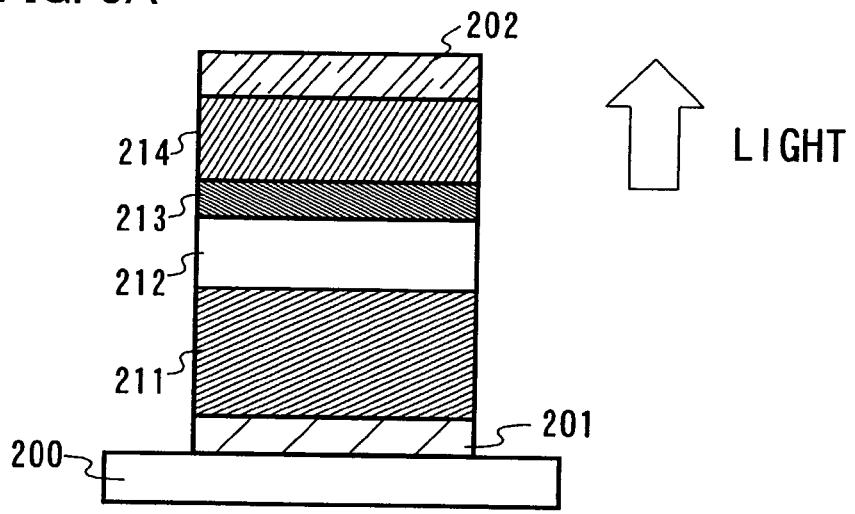
Figure 5C:
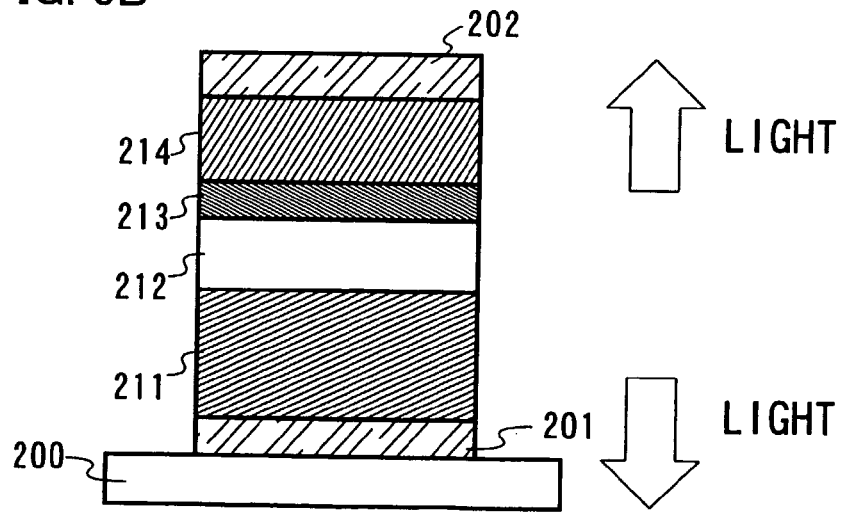

The light emitting element of the present invention has different variations on its structure by changing materials of the first electrode 201 and the second electrode 202. Schematic views of the different variations are shown in FIGS. 5B and 5C and FIGS. 6A to 6C. Further, reference numerals used in FIG. 5A are also used in FIGS. 5B and 5C and FIGS. 6A to 6C. Reference numeral 200 represents a substrate for supporting a light emitting element of the present invention. FIGS. 5A to 5C show examples in each of which the first layer 211, the second layer 212, the third layer 213, and the fourth layer 214 are laminated over the substrate 200 in this order.

When the first electrode 201 has a light transmitting property and the second electrode 202 has a light shielding property (in particular, a light reflecting property), light can be emitted through the substrate 200 as shown in FIG. 5A. Alternatively, when the first electrode 201 has a light shielding property (in particular, a light reflecting property) and the second electrode 202 has a light transmitting property, light can be emitted through the opposite side of the substrate 200, as shown in FIG. 5B. Also, when the first electrode 201 and the second electrode 202 both have light transmitting properties, light can be emitted both through the substrate 200 and the opposite side of the substrate 200, as shown in FIG. 5C.

Figure 6A:
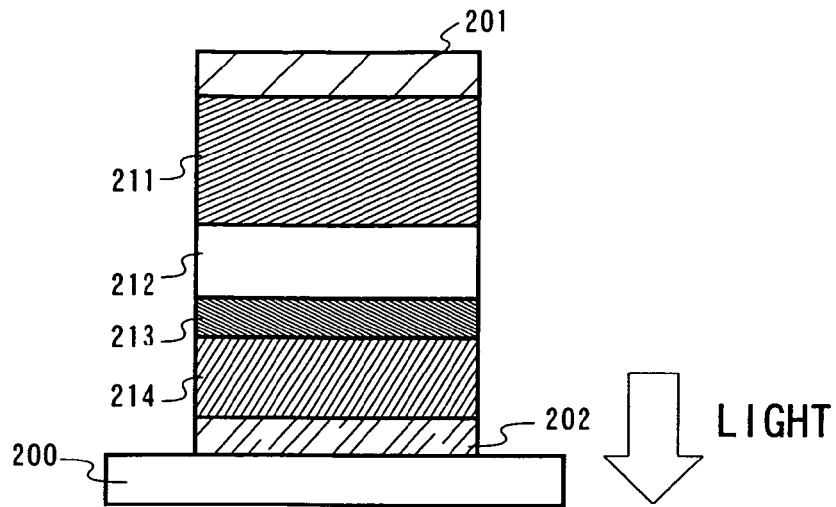
FIGS. 6A to 6C are cross sectional views explaining light emitting elements of the present invention.
Figure 6B:
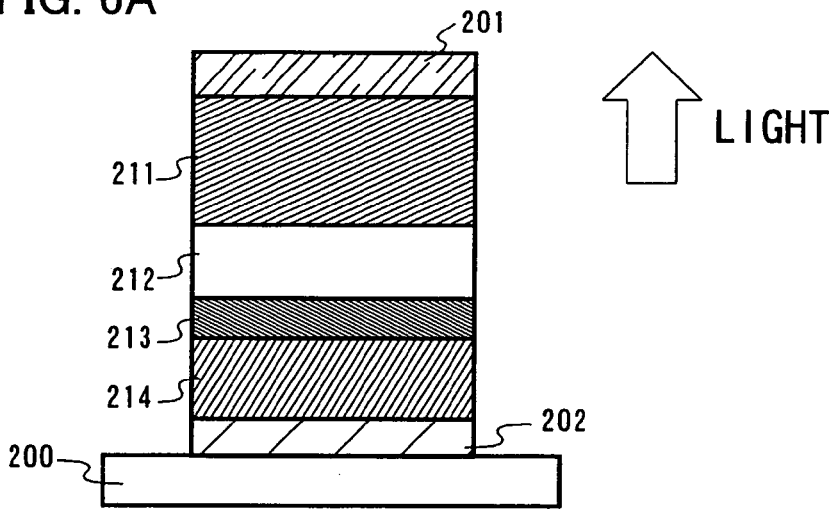
Figure 6C:
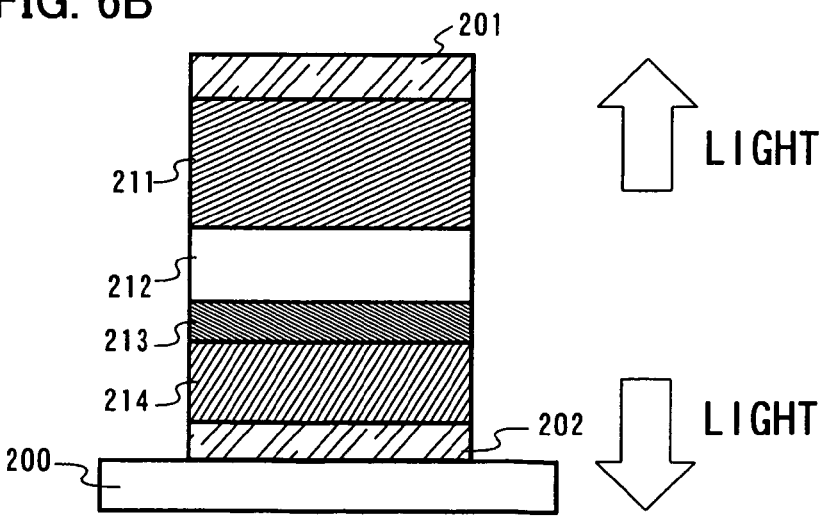

FIGS. 6A to 6C show examples in each of which the fourth layer 214, the third layer 213, the second layer 212, and the first layer 211 are laminated over the substrate 200 in this order, as different from FIGS. 5A to 5C. When the first electrode 201 has a light shielding property (in particular, a light reflecting property) and the second electrode 202 has a light transmitting property, light can be emitted through the substrate 200, as shown in FIG. 6A. Alternatively, when the first electrode 201 has a light transmitting property and the second electrode 202 has a light shielding property (in particular, a light reflecting property), light can be emitted through the opposite side of the substrate 200, as shown in FIG. 6B. Further, when both of the first electrode 201 and the second electrode 202 are formed to have light transmitting properties, light can be emitted both through the substrate 200 and the opposite side of the substrate 200, as shown in FIG. 6C.

Further, it is possible to employ a structure in which the first layer 211 contains one compound selected from substances having electron donating properties and a compound having a strong electron transporting property, the second layer 212 contains a substance having a light emitting property, the third layer 213 contains a composite material described in Embodiment Mode 1, and the fourth layer 214 contains one compound selected from substances having electron donating properties and a compound having a strong electron transporting property. Furthermore, after forming the first electrode 201, the first layer 211, the second layer 212, the third layer 213, and the fourth layer 214 may be sequentially laminated over the first electrode 201, and then the second electrode 202 may be formed thereover. Alternatively, after forming the second electrode 202, the fourth layer 214, the third layer 213, the second layer 212, and the first layer 211 may be sequentially laminated over the second electrode 202, and then the first electrode 201 may be formed thereover. When forming a light emitting element of the present embodiment mode, a known method can be employed regardless of a wetting method and a drying method. Moreover, the present embodiment mode can be freely combined with other embodiment modes.

Embodiment Mode 5

Figure 7:
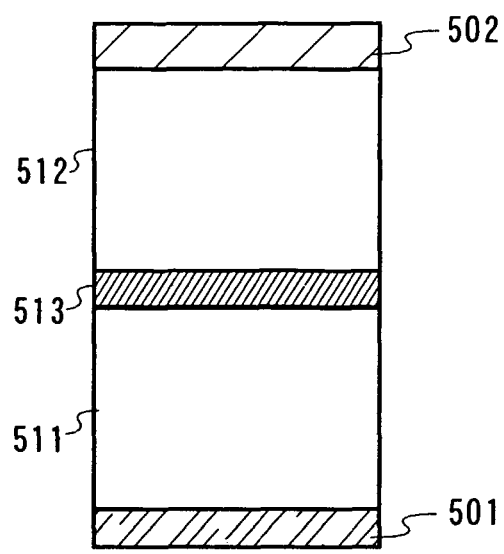
FIG. 7 is a diagram explaining a light emitting element of the present invention.

In this embodiment mode, a light emitting element having a structure different from the structures shown in Embodiment Mode 2 and Embodiment Mode 4 will be described. A light emitting element having a structure in which a plurality of light emitting units are laminated, is shown in this embodiment mode. The present embodiment mode shows a case where a composite material of the present invention is used for a charge generating layer in the light emitting element. That is, a so-called tandem light emitting element in which a plurality of light emitting units are laminated, is shown in this embodiment mode with reference to FIG. 7. In FIG. 7, two light emitting units are laminated between a first electrode and a second electrode.

In FIG. 7, a first light emitting unit 511 and a second light emitting unit 512 are laminated between a first electrode 501 and a second electrode 502. A charge generating layer 513 is interposed between the first light emitting unit 511 and the second light emitting unit 512. The first electrode 501 and the second electrode 502 can be formed by using a known material. The first light emitting unit 511 and the second light emitting unit 512 can include a known structure, respectively.

The charge generating layer 513 contains a composite material of the present invention described in Embodiment Mode 1. Since the composite material of the present invention has high visible light transmittance, and therefore, transmittance of light generated in the first light emitting unit and the second light emitting unit can be increased, making it possible to improve an extraction efficiency of light to an external portion. Further, the charge generating layer 513 may be formed by combining a composite material of the present invention and a known material. For example, as shown in Embodiment Mode 3, the charge generating layer 513 may be formed by combining a layer made from a composite material of the present invention and a layer containing one compound selected from substances having electron donating properties and a compound having a strong electron transporting property. Further, the charge generating layer 513 may be formed using a combination of a layer formed using a composite material of the present invention and a transparent conductive film.

The light emitting element including two light emitting units, is described in this embodiment mode. Further, a light emitting element in which three or more light emitting units are laminated, can of course be formed using a composite material of the present invention, in the same manner as the present embodiment mode. For example, a light emitting-element in which three light emitting units are laminated, is formed by laminating a first light emitting unit, a first charge generating layer, a second light emitting unit, a second charge generating layer, and a third light emitting unit in this order. A composite material of the present invention may be included in any one or both of the first charge generating layer and the second charge generating layer. Furthermore, the present embodiment mode can be freely combined with other embodiment modes.

Embodiment Mode 6

Figure 8A:
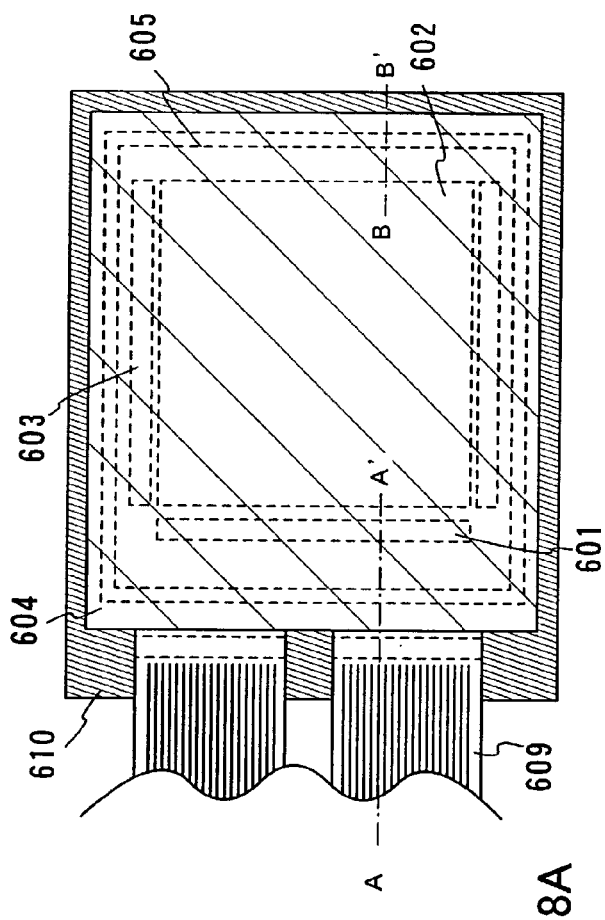
FIG. 8A is a top view and FIG. 8B is a cross sectional view explaining a light emitting device of the present invention.
Figure 8B:
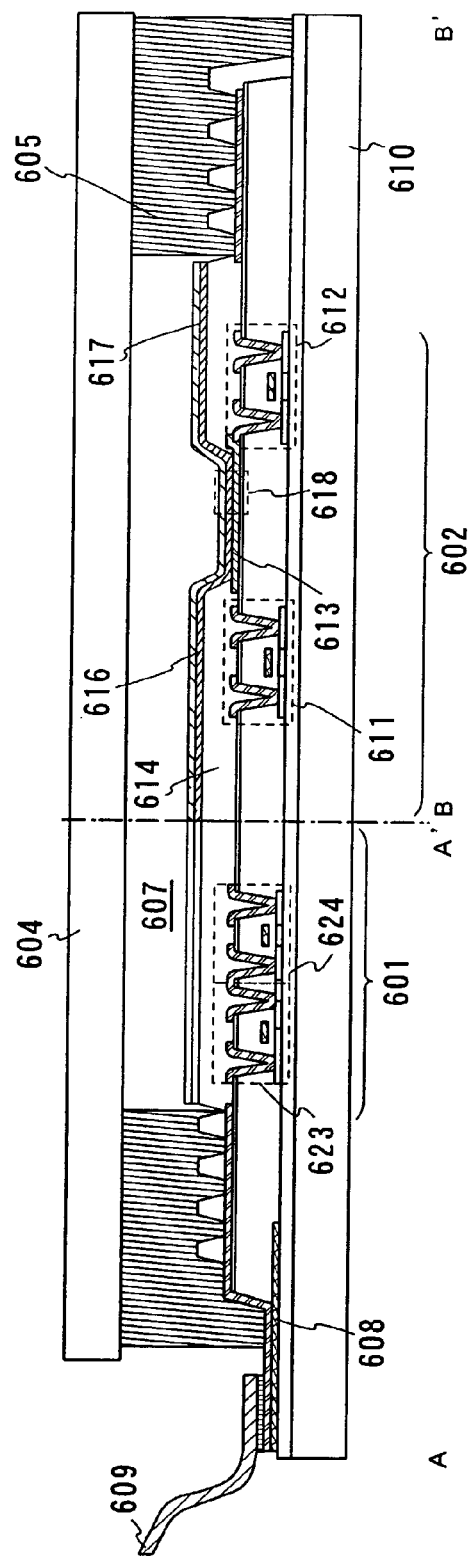

In this embodiment mode, a light emitting device having a light emitting element of the present invention will be described. In this embodiment mode, a light emitting device having a light emitting element of the present invention in a pixel portion, will be described with reference to FIGS. 8A and 8B. FIG. 8A is a top view of the light emitting device, and FIG. 8B is a cross sectional view along a line A-A' and a line B-B' in FIG. 8A. A portion 601 surrounded by a dotted line is a driver circuit portion (a source side driver circuit), a portion 602 surrounded by another dotted line is a pixel portion, and a portion 603 surrounded by another dotted line is a driver circuit portion (a gate side driver circuit). In addition, reference numeral 604 denotes a sealing substrate and reference numeral 605 denotes a sealing material. The inside surrounded by the sealing material 605 is an interspace 607.

A leading wiring 608 is a wiring for transmitting signals to be input to the source side driver circuit 601 and the gate side driver circuit 603, and receives signals such as a video signal, a clock signal, a start signal, and a reset signal from an FPC (flexible printed circuit) 609 as an external input terminal. Although only the FPC is shown here, a printed wiring board (PWB) may be attached to the FPC. The category of the light emitting device in the present specification includes not only a light emitting device but also a light emitting device to which an FPC or a PWB is attached.

Next, a cross sectional structure of the light emitting device will be described with reference to FIG. 8B. The driver circuit portion and the pixel portion are formed over an element substrate 610. In FIG. 8B, the source side driver circuit 601 of the driver circuit portion and one pixel in the pixel portion 602 are shown. In the source side driver circuit 601, a CMOS circuit in which an n-channel TFT 623 and a p-channel TFT 624 are combined, is formed. The driver circuit constituted by TFTs may be formed with a known CMOS circuit, PMOS circuit, or NMOS circuit.

Although this embodiment mode describes the case that driver circuits are formed over the same substrate, the driver circuits are not necessarily formed over the same substrate, and the driver circuits can be formed outside the substrate. The pixel portion 602 includes plural pixels. Each of the pixels includes a switching TFT 611, a current controlling TFT 612, and a first electrode 613 electrically connected to a drain of the current controlling TFT 612. An insulator 614 is formed to cover an end portion of the first electrode 613. Here, a positive photosensitive acrylic resin film is used to form the insulator 614.

In addition, an upper or lower end portion of the insulator 614 is made to have a curved surface with a curvature in order to improve the coverage. For example, in the case of using positive photosensitive acrylic as a material of the insulator 614, it is preferable that only the upper end portion of the insulator 614 be made to have a curved surface with a curvature radius (0.2 μm to 3 μm). Besides, as the insulator 614, it is possible to use a negative photosensitive material which is insoluble in an etchant by light and a positive photosensitive material which is soluble in an etchant by light.

Over the first electrode 613, a layer 616 containing a light emitting substance and a second electrode 617 are formed. Here, in this embodiment mode, it is preferable to use a material having a high work function as a material to be used for the first electrode 613 which functions as an anode. For example, it is possible to use a laminated layer of a titanium nitride film and a film mainly containing aluminum, and a three-layered structure of a titanium nitride film, a film mainly containing aluminum, and a titanium nitride film, and the like, in addition to a single layer such as an ITO film, an indium tin oxide film containing silicon, an indium oxide film containing zinc oxide, a titanium nitride film, a chromium film, a tungsten film, a Zn film, or a Pt film. When a laminated structure is employed, it has a low resistance as a wiring, and favorable ohmic contact can be made.

The layer 616 containing the light emitting substance also contains a composite material of the present invention described in Embodiment Mode 1. Since the light emitting element has the layer containing the composite material of the present invention, driving voltage of the light emitting element can be reduced, and hence, power consumption of a light emitting device can be reduced. Moreover, the light emitting element of the present invention has high light emitting efficiency so that the power consumption can further be reduced.

By utilizing a composite material of the present invention, a thickness between electrodes of a light emitting element can be increased, making it possible to prevent short-circuiting caused by dust, damage and the like. As a consequence, a highly reliable light emitting device can be obtained, thereby improving manufacturing yield of the light emitting device. As a material, which can be used in combination with a composite material of the present invention described in Embodiment Mode 1, a known method can be used, and concretely, a jow molecular weight material, an intermediate molecular weight material (including oligomer and dendrimer), or a high molecular weight material may be used.

As a material used for the second electrode (cathode) 617 formed over the layer 616 containing the light emitting substance, it is preferable to use a material having a low work function (e.g., Al, Ag, Li, Ca, an alloy or a compound thereof such as MgAg, MgIn, AlLi, $CaF_2$, LiF, and calcium nitride). When light generated in the layer 616 containing the light emitting substance passes through the second electrode 617, a laminated layer of a thin metal film with a thin thickness and a transparent conductive film (such as ITO, indium oxide containing zinc oxide, indium tin oxide containing silicon, or zinc oxide (ZnO)) may be used as the second electrode (cathode) 617.

In the light emitting element, the sealing substrate 604 and the element substrate 610 are attached to each other with the sealing material 605, and thus, a structure can be obtained, in which a light emitting element 618 is provided in the interspace 607 surrounded by the element substrate 610, the sealing substrate 604, and the sealing material 605. There is a case in that the interspace 607 is filled with the sealing material 605, in addition to a case in that the interspace 607 is filled with an inert gas (such as nitrogen or argon). It is preferable to use an epoxy resin for the sealing material 605. A material which hardly transmits water and oxygen is preferable.

Further, as a material used for the sealing substrate 604, a plastic substrate formed using FRP (fiberglass-reinforced plastics), PVF (polyvinyl fluoride), Mylar®, polyester, acrylic, or the like can be used as well as a glass substrate and a quartz substrate. As mentioned above, the light emitting device which has the light emitting element in accordance with the present invention can be obtained.

Figure 10:
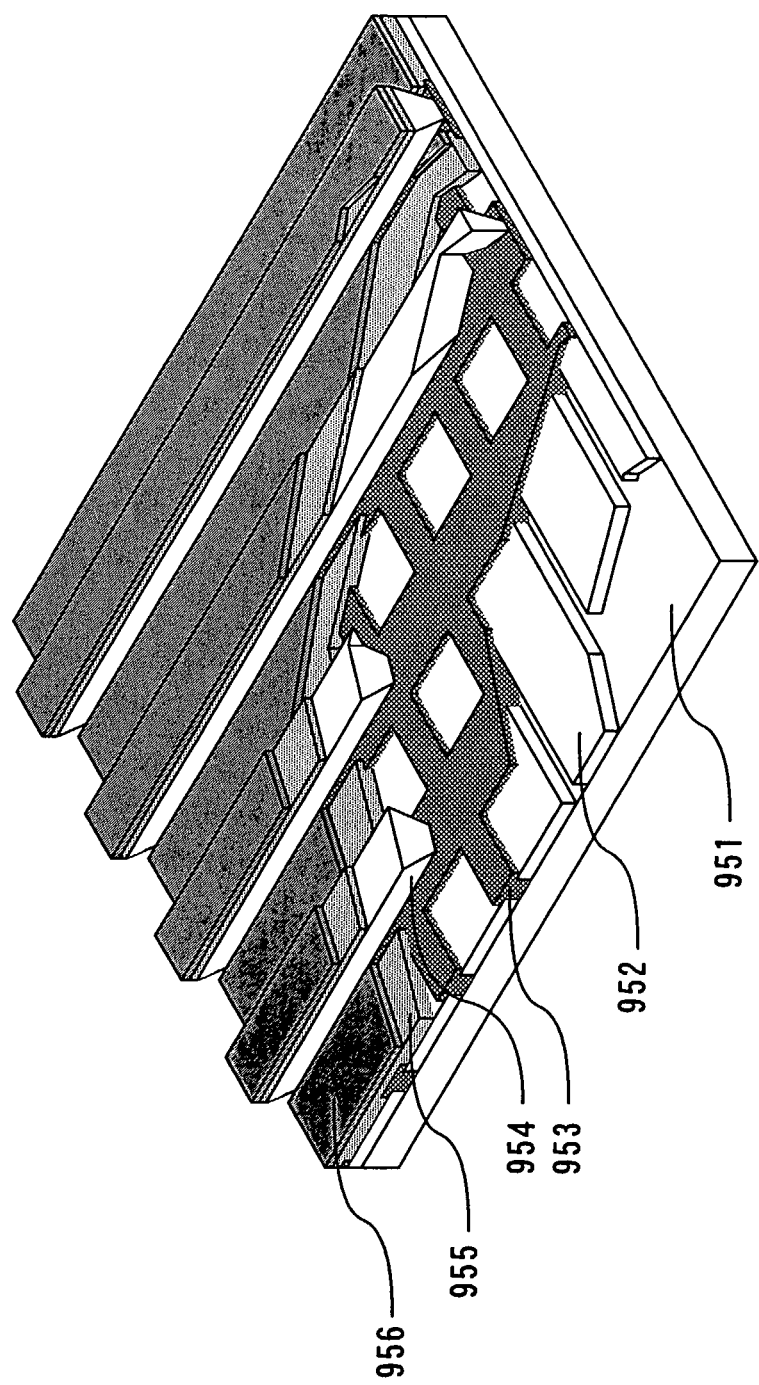
FIG. 10 is a diagram explaining a light emitting device.

In this embodiment mode, an active matrix light emitting device in which driving of a light emitting element is controlled by a transistor is described above. Alternatively, a passive matrix light emitting device in which a light emitting element is driven without particularly providing a driving element such as a transistor, can be manufactured. FIG. 10 shows a perspective view of a passive light emitting device manufactured in accordance with the present invention. In FIG. 10, over a substrate 951, a layer 955 containing a light emitting substance is provided between an electrode 952 and an electrode 956. An edge of the electrode 952 is covered with an insulating layer 903, and a partition wall layer 954 is provided over the insulating layer 953.

The partition wall layer 954 has a slope such that the width between one sidewall of the partition wall layer and the other side wall thereof is gradually narrowed toward a surface of the substrate. That is, a cross section in a narrow side direction of the partition wall layer 954 has a trapezoidal form, and a lower side (which faces the same direction as a surface direction of the insulating layer 953, and is in contact with the insulating layer 953) is shorter than an upper side (which faces the same direction as the surface direction of the insulating layer 953, and is not in contact with the insulating layer 953). By providing the partition wall layer 954 in such a manner, defects in a light emitting element due to static charge and the like can be prevented. Also, in the passive light emitting device, including a light emitting element of the present invention, which is driven at low driving voltage, allows to drive it at low power consumption.

Embodiment Mode 7

This embodiment mode will describe electronic appliances each including a light emitting device shown in Embodiment Mode 6 as a part thereof. Each of electronic appliances of the present invention includes a composite material described in Embodiment Mode 1 and has a display portion consuming much less power. Each of the electronic appliances has a highly reliable display portion in which short-circuiting due to dust, damage, and the like can be inhibited.

As electronic appliances of the present invention, for example, a camera such as a video camera and a digital camera, a goggle type display, a navigation system, a sound reproduction device (such a car audio or an audio component), a personal computer, a game machine, a portable information terminal s(such as a mobile computer, a mobile phone, a portable game machine, and an electronic book), an image reproduction device utilizing a recording medium (such as a device which can reproduce a recording medium such as a digital versatile disk (DVD) and is equipped with a display device capable of displaying the image), and the like can be given.

Figure 9A:
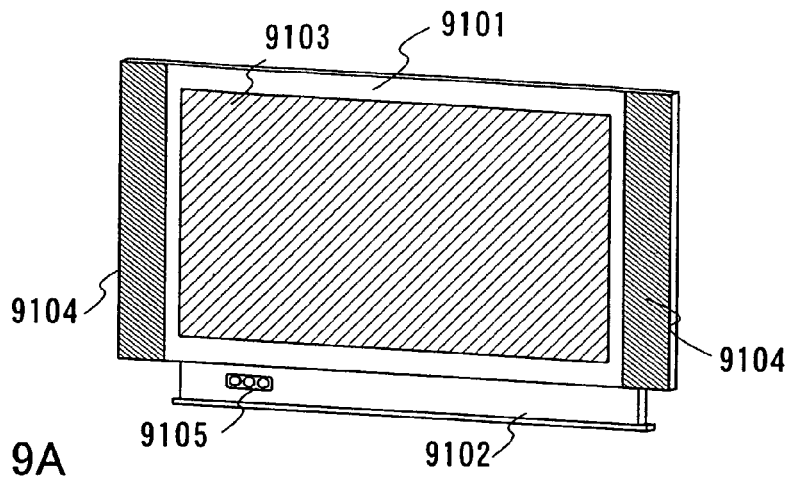
FIGS. 9A to 9E are diagrams explaining electronic appliances in accordance with the present invention.

Specific examples of these electronic appliances are shown in FIGS. 9A to 9E. FIG. 9A shows a television receiver which includes a casing 9101, a supporting stand 9102, a display portion 9103, speaker portions 9104, a video input terminal 9105, and the like. The television receiver is manufactured by using a light emitting device of the present invention for the display portion 9103. By using the light emitting device of the present invention, a television receiver having a display portion requiring much less power along with high reliability, can be provided. It is to be noted that the category of the television receiver includes all types of information display devices, e.g., a display device for a computer, one for TV broadcast reception, one for advertisement display, and so on.

Figure 9B:
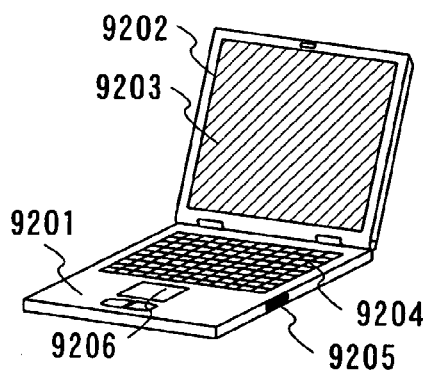

FIG. 9B shows a computer which includes a main body 9201, a casing 9202, a display portion 9203, a keyboard 9204, an external connection port 9205, a pointing mouse 9206, and the like. The computer is manufactured by using a light emitting device of the present invention for the display portion 9203. By using the light emitting device of the present invention, a computer having a display portion requiring much less power along with high reliability, can be provided.

Figure 9C:
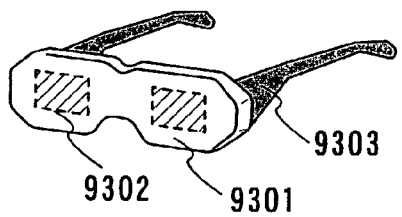

FIG. 9C shows a goggle-type display which includes a main body 9301, a display portion 9302, arm portions 9303, and the like. The goggle-type display is manufactured by using a light emitting device of the present invention for the display portion 9302. By using the light emitting device of the present invention, a goggle-type display having a display portion requiring much less power along with high reliability, can be provided.

Figure 9D:
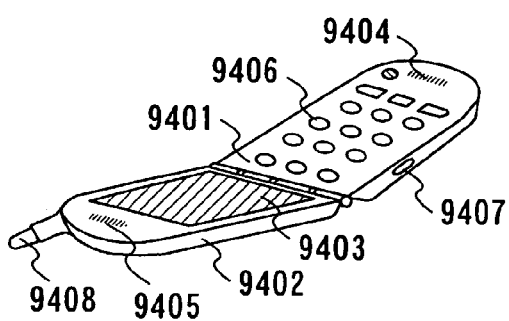

FIG. 9D shows a mobile phone which includes a main body 9401, a casing 9402, a display portion 9403, an audio input portion 9404, an audio output portion 9405, operation keys 9406, an external connection port 9407, an antenna 9408, and the like. The mobile phone is manufactured by using a light emitting device of the present invention for the display portion 9403. By using the light emitting device of the present invention, a mobile phone having a display portion requiring much less power along with high reliability, can be provided. In addition, the power consumption of the mobile phone can be suppressed by displaying white characters on a black background in the display portion 9403.

Figure 9E:
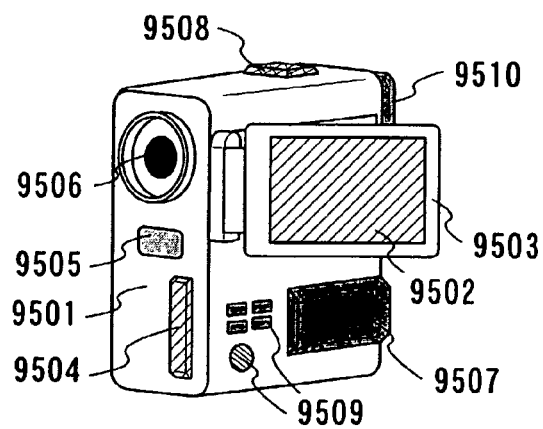

FIG. 9E shows a camera which includes a main body 9501, a display portion 9502, a casing 9503, an external connection port 9504, a remote control receiving portion 9505, an image receiving portion 9506, a battery 9507, an audio input portion 9508, operation keys 9509, an eyepiece portion 9510, and the like. The camera is manufactured by using a light emitting device of the present invention for the display portion 9502. By using the light emitting device of the present invention, a camera having a display portion requiring much less power along with high reliability, can be provided.

As set forth above, a light emitting device in accordance with the present invention can be applied in an extremely wide range, and the light emitting device can be applied to electronic appliances in various field. By using a light emitting device of the present invention, an electronic appliance having a display portion requiring much less power along with high reliability can be provided.

Embodiment 1

A manufacturing example of a composite material of the present invention will be described in Embodiment 1. Further, the present invention is not limited to embodiments, and the present invention is specified by the scope of claims. This is the same for Embodiment 2. In Embodiment 1, a manufacturing example of a composite material will be described in detail.

Manufacturing Example 1

DTDPPA+MoOx

First, a glass substrate was set to a substrate holder inside of a vacuum evaporation apparatus. Then, DTDPPA (N,N'-di(p- tolyl)-N,N'-diphenyl-p-phenylene diamine), which is represented by the structural formula (14), and molybdenum oxide (valence of molybdenum: VI) were independently poured in different resistance heating type evaporation sources. Under a vacuum condition where the pressure is reduced to about $10^{-4}$ Pa, a film was formed by using a composite material of the present invention by co-evaporation of DTDPPA and molybdenum oxide. In this case, DTDPPA was evaporated at a rate of 0.4 nm/s whereas molybdenum oxide, whose amount was 4 times less than the amount of the DTDPPA, was evaporated. The thickness of the film containing DTDPPA and molybdenum oxide was set to be 50 nm.

Figure 11A:
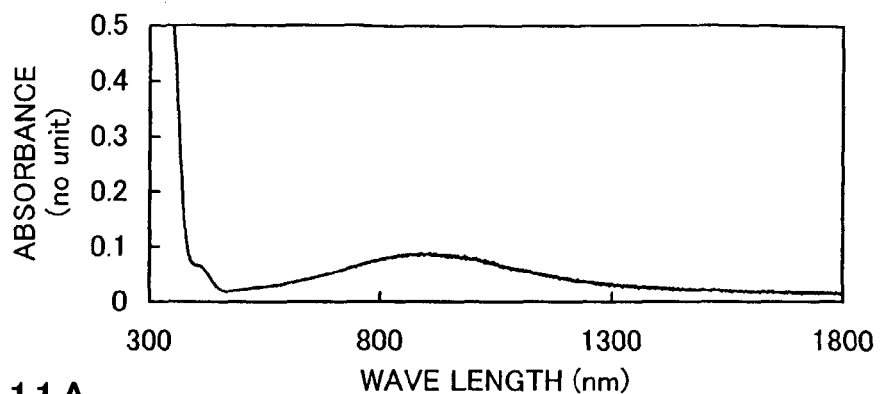
FIGS. 11A to 11D are graphs showing absorption spectrums of a composite material of the present invention.

A measurement result of an absorption spectrum of the composite material of the DTDPPA and molybdenum oxide is shown in FIG. 11A. As shown in FIG. 11A, prominent absorption is not observed in a visible light region (400 to 700 nm). Further, absorption which is not observed in a single film containing only DTDPPA or a single film containing only molybdenum oxide, is generated in the vicinity of 900 nm. This indicates generation of holes.

Manufacturing Example 2

DPAB+MoOx

Figure 11B:
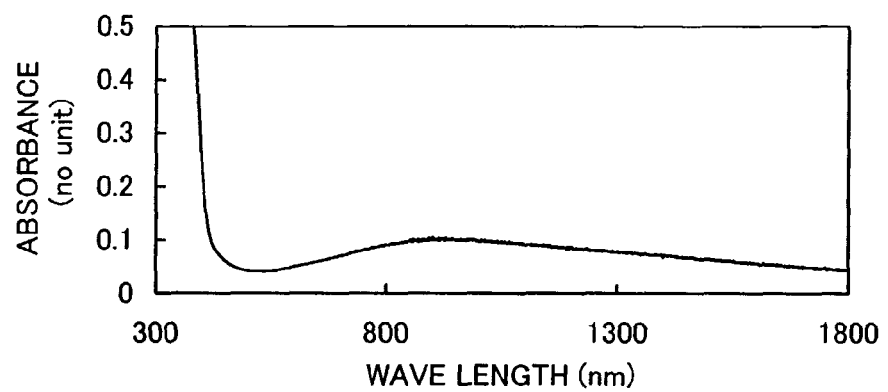

A composite material containing DPAB and molybdenum oxide was manufactured in the same manner as Manufacturing Example 1, with the exception that DPAB (4,4'-bis[N-(4-dipenylaminophenyl)-N-phenylamino]biphenyl), which is represented by the structural formula (93) was used as a substitute for DTDPPA of Manufacturing Example 1. A measurement result of an absorption spectrum of the composite material containing DPAB and molybdenum oxide is shown in FIG. 11B. As shown in FIG. 11B, prominent absorption is not observed in a visible light region (400 to 700 nm). Further, absorption which is not observed in a single film containing only DPAB or a single film containing only molybdenum oxide, is generated in the vicinity of 900 nm. This indicates generation of holes.

Manufacturing Example 3

DNTPD+MoOx

Figure 11C:
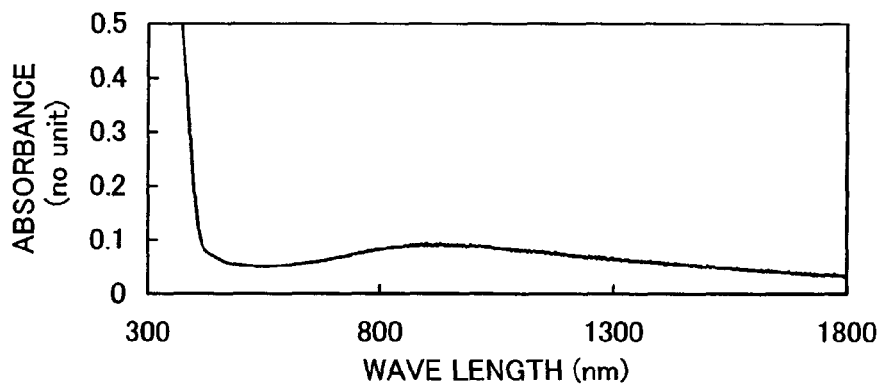

A composite material containing DNTPD and molybdenum oxide was manufactured in the same manner as Manufacturing Example 1, with the exception that DNTPD (4,4'-bis(N-{4-[N-(3-methylphenyl)-N-phenylamino]phenyl}-N-phenylamino) biphenyl), which is represented by the structural formula (96), was used as a substitute for DTDPPA of Manufacturing Example 1. A measurement result of an absorption spectrum of the composite material containing DNTPD and molybdenum oxide is shown in FIG. 11C. As shown in FIG. 11C, prominent absorption is not observed in a visible light region (400 to 700 nm). Further, absorption which is not observed in a single film containing only DNTPD or a single film containing only molybdenum oxide, is generated in the vicinity of 900 nm. This indicates generation of holes.

Manufacturing Example 4

DPA3B+MoOx

Figure 11D:
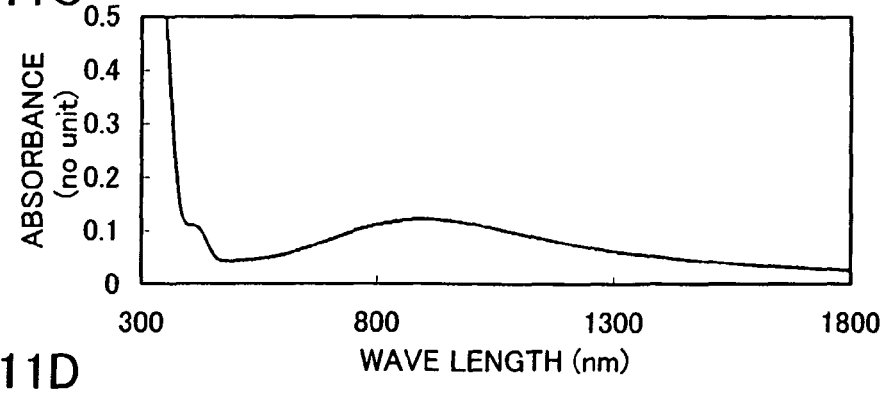

A composite material containing DPA3B and molybdenum oxide was manufactured in the same manner as Manufacturing Example 1, with the exception that DPA3B (1,3,5-tris[N-(4-diphenylaminophenyl)-N-phenylamino]benzene), which is represented by the structural formula (101), was used as a substitute for DTDPPA of Manufacturing Example 1. A measurement result of an absorption spectrum of the composite material containing DPA3B and molybdenum oxide is shown in FIG. 11D. As shown in FIG. 11D, prominent absorption is not observed in a visible light region (400 to 700 nm). Further, absorption which is not observed in a single film containing only DPA3B or a single film containing only molybdenum oxide, is generated in the vicinity of 900 nm. This indicates generation of holes.

Comparative Example

NPB+MoOx

Figure 12:
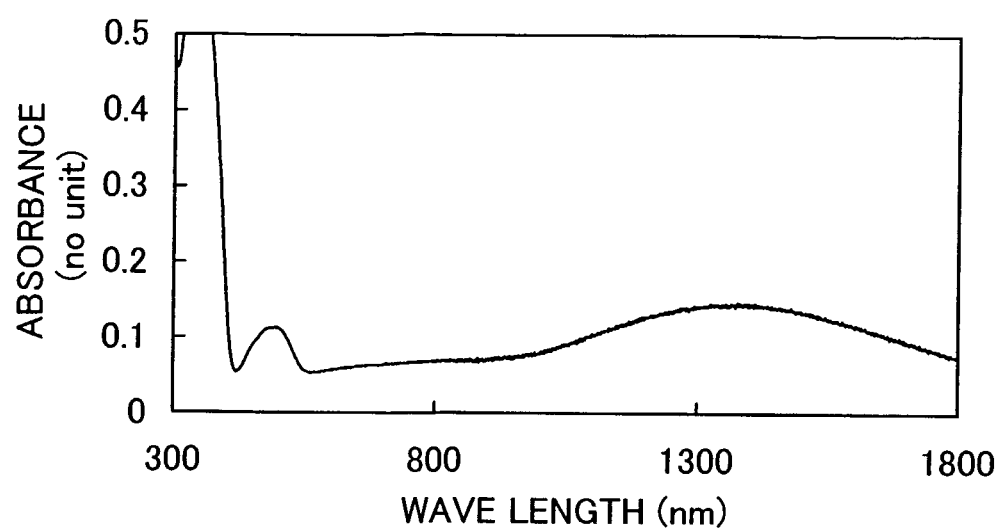
FIG. 12 is a graph showing an absorption spectrum of a comparative example.

A composite material containing NPB and molybdenum oxide was manufactured in the same manner as Manufacturing Example 1, with the exception that NPB was used as a substitute for DTDPPA of Manufacturing Example 1. A measurement result of an absorption spectrum of the composite material containing NPB and molybdenum oxide is shown in FIG. 12. As shown in FIG. 12, it was apparent that prominent absorption was observed in the vicinity of 500 nm where is a visible light region (400 to 700 nm). Further, absorption which was not observed in a single film containing only NPB or a single film containing only molybdenum oxide, is generated in the vicinity of 1,400 nm. This indicates generation of holes.

Figure 13:
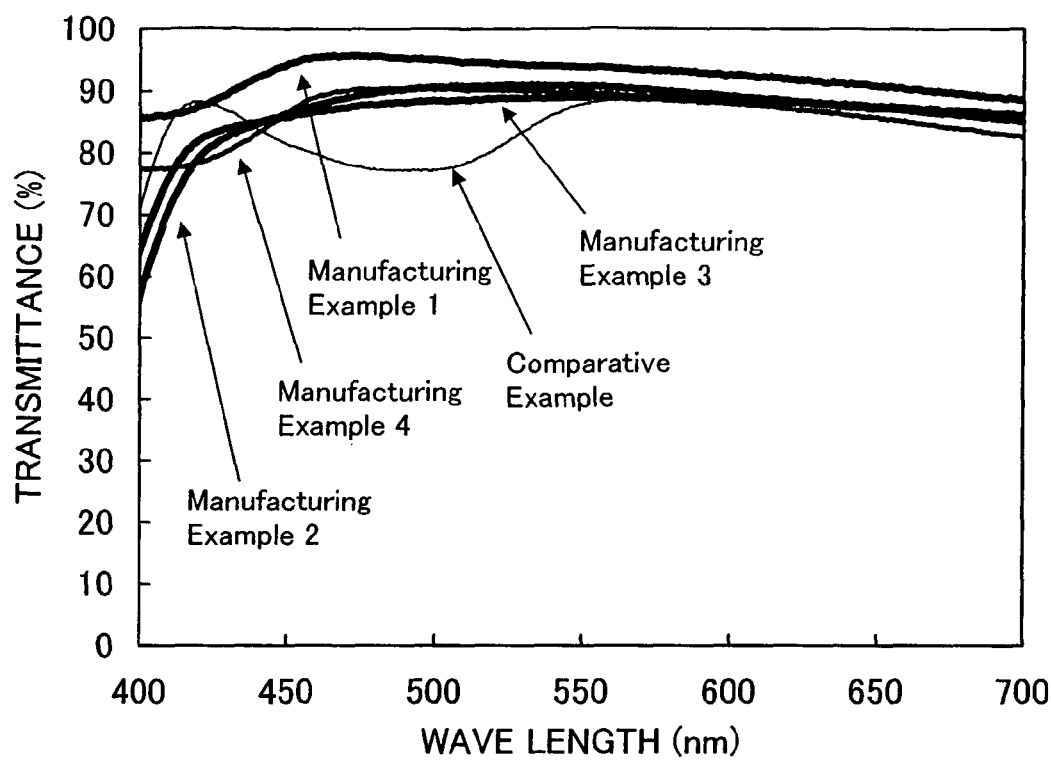
FIG. 13 is a graph showing transmittance of composite materials of the present invention.

Next, in order to compare Manufacturing Examples 1 to 4 to Comparative Example, FIG. 13 shows a graph in which absorbance shown by longitudinal axes of FIGS. 11A to 11D and FIG. 12 was converted into transmittance to be compared in the same graph. Further, in FIG. 13, a wavelength of a horizontal axis is limited in a visible light region (400 to 700 nm). As shown in FIG. 13, it is known that the transmittance in the visible light region of Manufacturing Examples 1 to 4 is about 90% or more. On the other hand, it is known that the transmittance of Comparative Example is reduced to 70 s % in the vicinity of 500 nm. In accordance with the above comparison, the composite material of the present invention has more excellent transmittance than that of the conventional composite materials.

Figure 26:
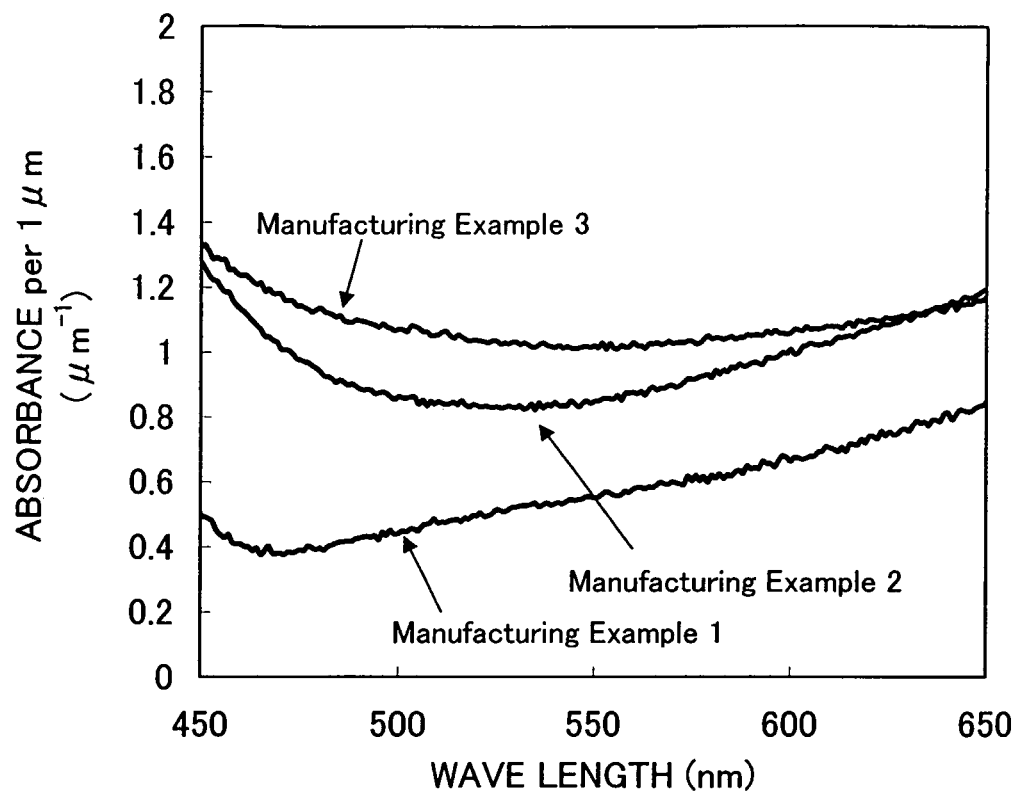
FIG. 26 is a graph showing absorbance for 1 μm of a composite material of the present invention.

Also, absorbance for 1 μm of Manufacturing Examples 1, 2 and 3 in blue (450 nm) to red (650 nm), is shown in FIG. 26. As shown in FIG. 26, it is known that the absorbance for 1 μm of each composite material of the present invention is 2 $\mu m^{-1}$ or less, and the absorbance is small in blue (450 nm) to red (650 nm). As a consequence, the composite materials of the present invention have high transmittance in the range of blue (450 nm), green (520 nm), and red (650 nm), and they are suitable for a full color display.

Embodiment 2

A light emitting element using a composite material of the present invention will be described in detail in Embodiment 2. In addition, an effect of the present invention will be described with comparative examples.

<<Light Emitting Element of the Present Invention>>

First, indium tin oxide containing silicon oxide was formed over a glass substrate by sputtering to form a first electrode. Further, the thickness of the first electrode was set to be 110 nm, and an area of the electrode was set to be 2 $mm^2$.

Next, the substrate over which the first electrode was formed, was set to a substrate holder provided inside of a vacuum evaporation apparatus such that a surface of the first electrode was faced downward. Thereafter, the inside of the vacuum evaporation apparatus was evacuated so that the pressure was reduced to be about $10^{-4}$ Pa, and then a layer including a composite material of the present invention was formed over the first electrode by co-evaporation of DNTPD, molybdenum oxide (valence of molybdenum: VI), and rubrene. The thickness of the layer including the composite material of the present invention, was set to be 120 nm. A mass ratio between DNTPD, molybdenum oxide (valence of molybdenum: VI), and rubrene was adjusted to be 1:0.5:0.02. Furthermore, the co-evaporation method is an evaporation method in which evaporation is simultaneously performed from a plurality of evaporation sources in one processing chamber.

Next, a film including NPB with a thickness of 10 nm was formed by evaporation using resistance heating to form a hole transporting layer. Further, a light emitting layer with a thickness of 37.5 nm was formed over the hole transporting layer by co-evaporation of $Alq_3$ and coumarin 6. A mass ratio between $Alq_3$ and coumarin 6 was adjusted to be 1:0.05 (=$Alq_3$: coumarin 6). Accordingly, coumarin 6 was dispersed in $Alq_3$.

Thereafter, an electron transporting layer was formed using $Alq_3$ over the light emitting layer by evaporation using resistance heating to have a thickness of 37.5 nm. Furthermore, an electron injecting layer with a thickness of 1 nm was formed using calcium fluoride on the electron transporting layer in the same manner as the electron transporting layer. Then, a second electrode with a thickness of 200 nm was formed using aluminum over the electron injecting layer by evaporation using resistance heating. Thus, a light emitting element of the present invention was manufactured.

<<Comparative Element 1>>

A comparative element 1 was manufactured in the same manner as the above described light emitting element of the present invention, with the exception that the layer including the composite material in the light emitting element of the preset invention as described above was substituted for a layer including a conventional composite material as described below. In this comparative element 1, the layer including the conventional composite material was formed over the first electrode by co-evaporation of NPB, molybdenum oxide (valence of molybdenum: VI), and rubrene. The thickness of the layer including the conventional composite material was set to be 120 nm. A mass ratio between NPB, molybdenum oxide (valence of molybdenum: VI), and rubrene was adjusted to be 1:0.33:0.01.

<<Comparative Element 2>>

As a comparative element 2, a light emitting element for comparison was manufactured without using a composite material. The comparative element 2 was manufactured in the same manner as the light emitting element of the present invention, with the exception that a film including CuPc with a thickness of 20 nm was formed as a substitute for the layer including the composite material in the light emitting element of the present invention, and a film including NPB with a thickness of 40 nm was formed as a hole transporting layer. Performance characteristics of the light emitting elements of the present invention, the comparative element 1, and the comparative element 2, were respectively measured. Further, the measurement was carried out while keeping room temperature (25° C.). Note that green light emission derived from coumarin 6 can be obtained in each element.

Figure 14:
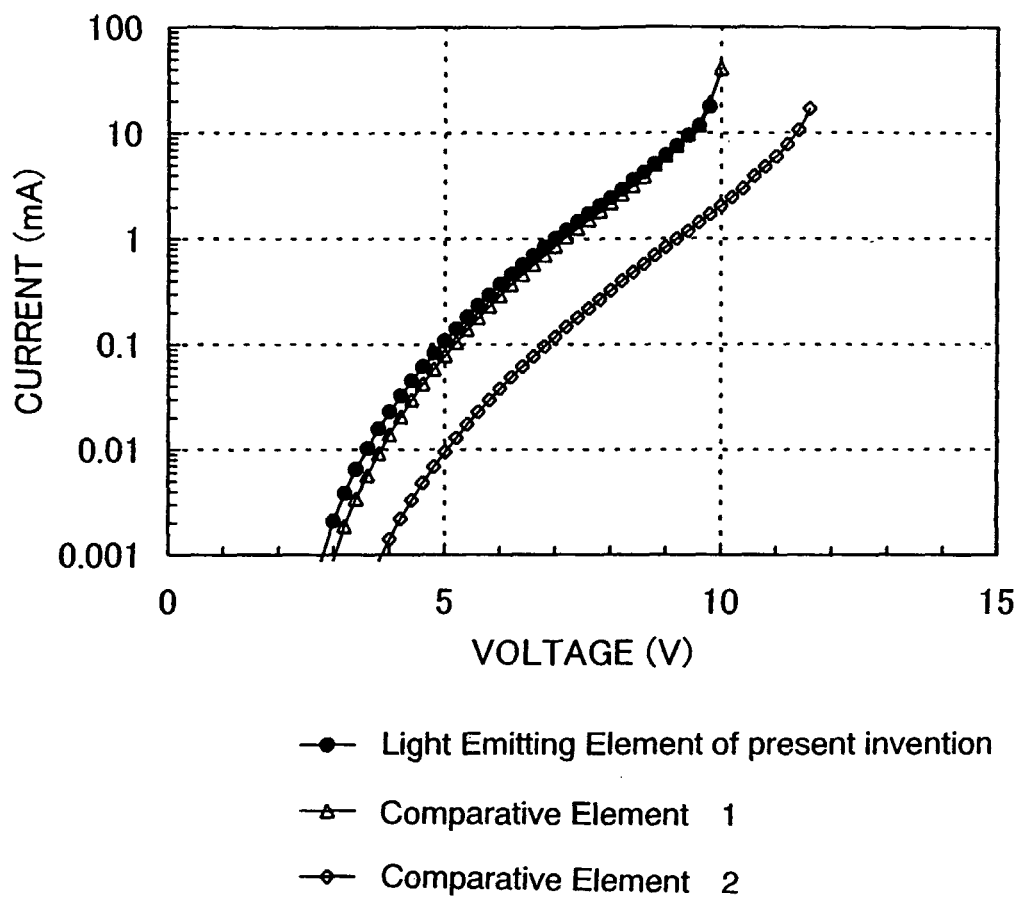
FIG. 14 is a graph showing current-voltage characteristics of light emitting elements.

Voltage-current characteristics of each light emitting element are shown in FIG. 14. As shown in FIG. 14, current flowed more easily through the light emitting element including the composite material of the present invention and the comparative element 1 including the conventional composite material as compared to the comparative element 2 including CuPc, which does not contain a composite material. This indicates that the composite material of the present invention has an excellent carrier transporting property and an excellent carrier injecting property with respect to an organic compound as well as the conventional composite material.

Figure 15:
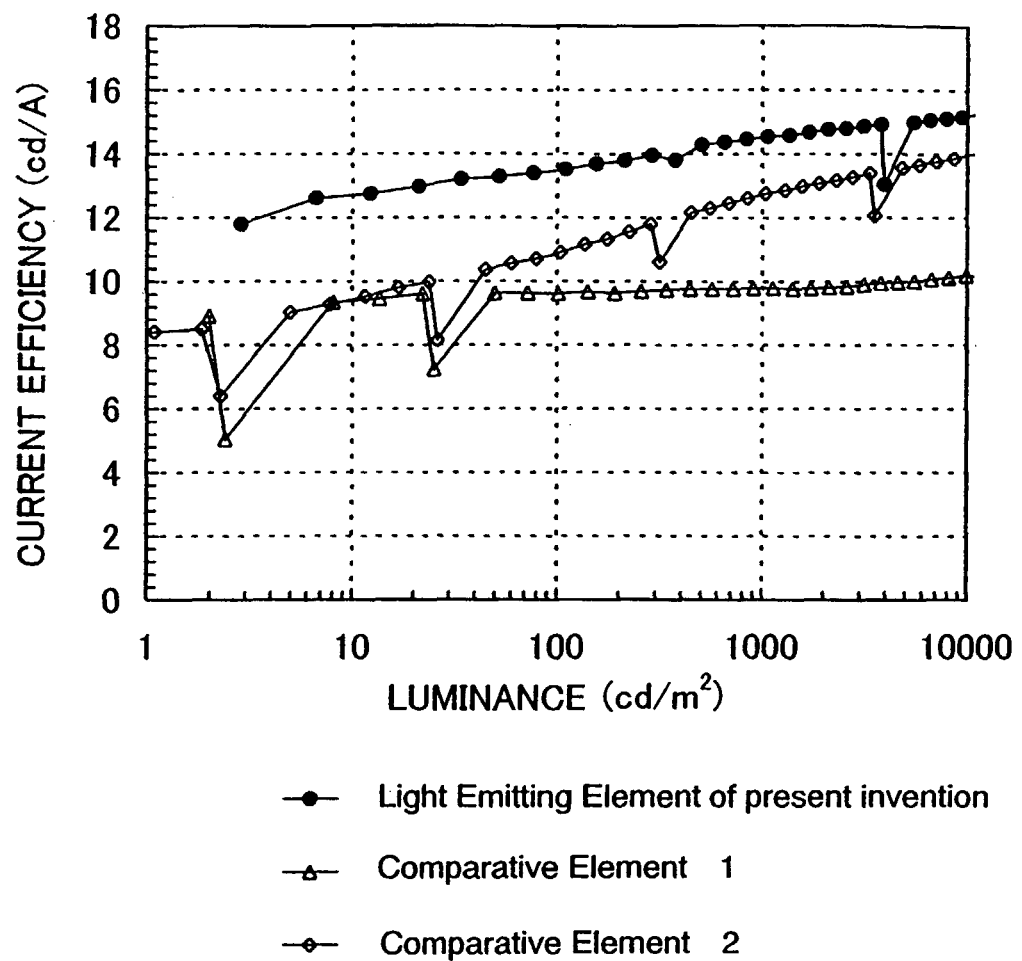
FIG. 15 is a graph showing luminance-current efficiency characteristics of light emitting elements.

Next, light emitting efficiency is compared by measuring luminance-current efficiency characteristics. Measurement results are shown in FIG. 15. It is known that current easily flowed through the light emitting element of the present invention as well as the comparative element 1 as mentioned above, however, the current efficiency (light emitting efficiency) showing output (luminance) with respect to the current highly of the light emitting element of the present invention exceeded the current efficiency of the comparative element 1. The light emitting element of the present invention used in this experiment emits green light. As described in Embodiment 1, however, it is thought that the conventional composite material had bad transmittance in the vicinity of 500 nm (a blue region to a green region), which results in reduction in light emitting efficiency of the comparative element 1.

Figure 16:
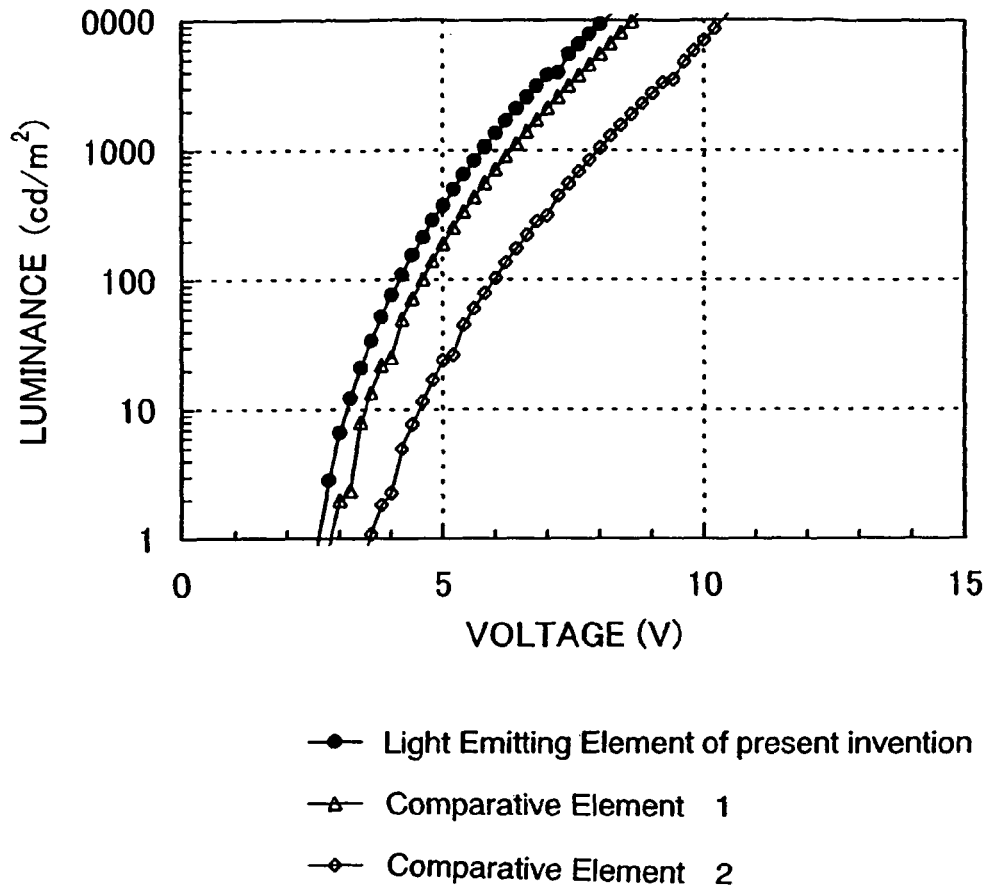
FIG. 16 is a graph showing voltage-luminance characteristics of light emitting elements.

On the other hand, the composite material of the present invention has an excellent light transmitting property, and therefore, it exhibits excellent light emitting efficiency. In order to further measure light emitting characteristics of the composite material of the present invention, voltage-luminance characteristics of the light emitting element of the present invention, the comparative element 1, and the comparative element 2, were measured. Measurement results are shown in FIG. 16. From the measurement results, the composite material of the present invention has an excellent carrier transporting property and an excellent carrier injecting property with respect to an organic compound, and further has an excellent light transmitting property. Furthermore, as shown in FIG. 16, the light emitting element of the preset invention has lowest driving voltage.

Embodiment 3

A case where a concentration of an inorganic compound included in a composite material of the present invention is changed will be described in this embodiment.

First, a first electrode was formed using indium tin oxide containing silicon oxide over a glass substrate. The thickness of the first electrode was set to be 110 nm, and an area of the electrode was set to be 2 $mm^2$.

Next, a layer containing a composite material of the prevent invention was formed over the first electrode by co-evaporation of DNTPD and molybdenum oxide.

Subsequently, a hole transporting layer was formed using NPB with a thickness of 10 nm by evaporation using resistance heating.

Further, a light emitting layer was formed with a thickness of 40 nm over the hole transporting layer by co-evaporation of $Alq_3$ and coumarin 6. A weight ratio between $Alq_3$ and coumarin 6 was adjusted to be 1:0.01 (=$Alq_3$:coumarin 6).

Thereafter, an electron transporting layer was formed using $Alq_3$ with a thickness of 30 nm over the light emitting layer by evaporation using resistance heating.

Further, an electron injecting layer was formed using lithium fluoride with a thickness of 1 nm over the electron transporting layer in the same manner as the electron transporting layer.

Then, a second electrode was formed using aluminum with a thickness of 200 nm over the electron injecting layer by evaporation using resistance heating. Thus, a light emitting element of the present invention was manufactured.

Further, in this embodiment, a plurality of light emitting elements each having a layer containing the composite material was formed such that each ratio between DNTPD and molybdenum oxide included in the layer containing the composite material was set to be 4 vol %, 7 vol %, 10 vol %, 13 vol %, and 16 vol %. The thicknesses of the respective layers containing the composite material of the light emitting elements were set to be 60 nm, 90 nm, 120 nm, and 150 nm based on the respective concentrations. That is, twenty kinds of light emitting elements were formed in total.

Figure 17:
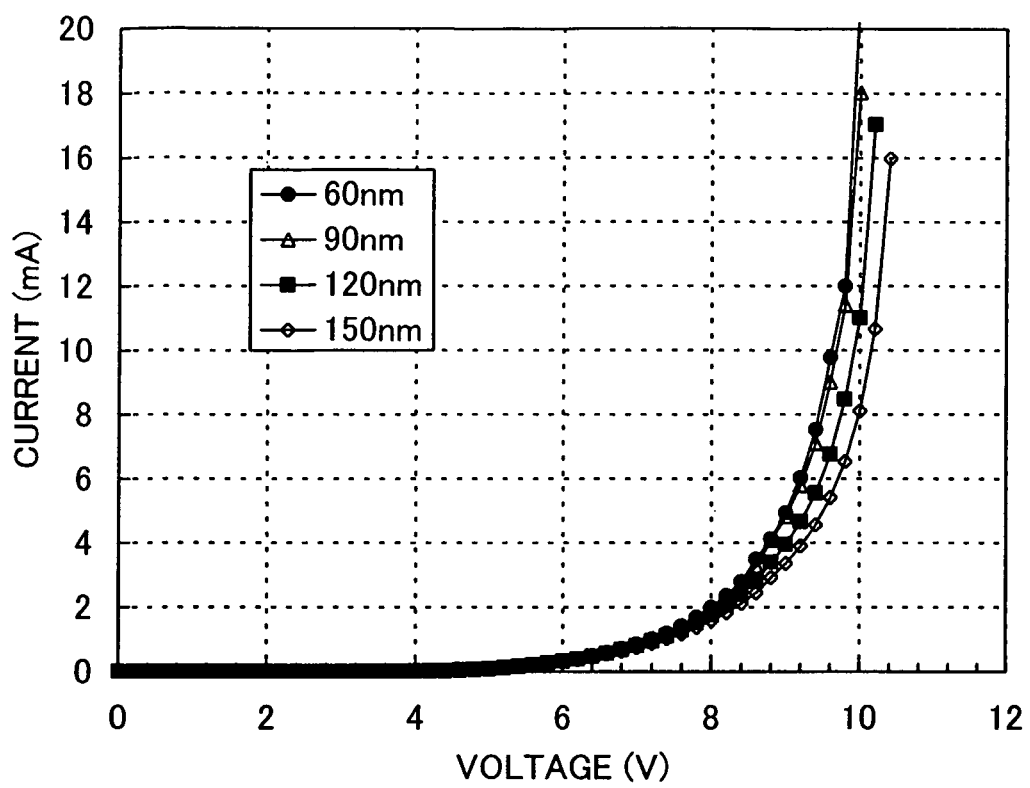
FIG. 17 is a graph showing current-voltage characteristics of light emitting elements.
Figure 18:
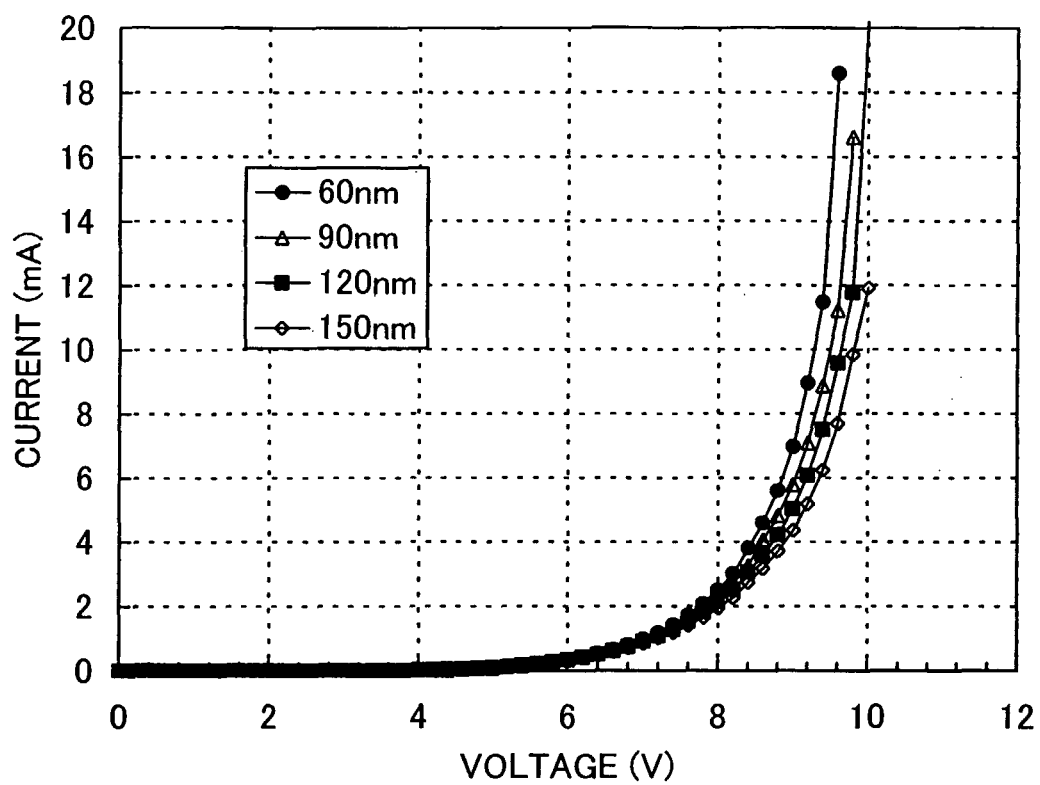
FIG. 18 is a graph showing current-voltage characteristics of light emitting elements.
Figure 19:
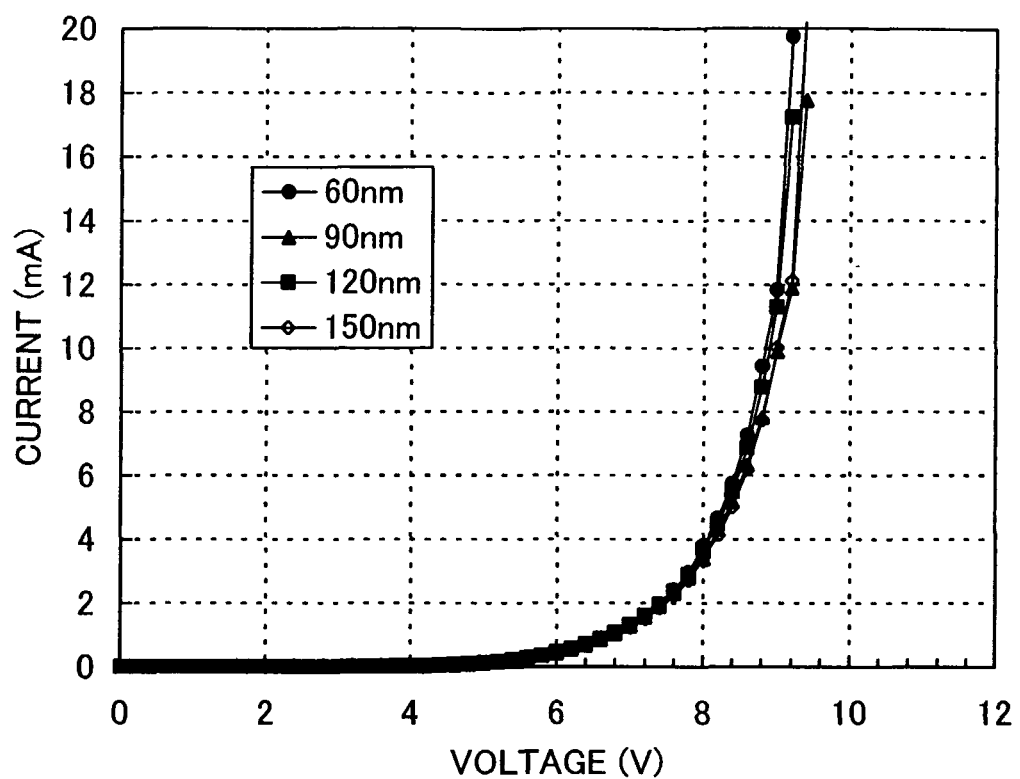
FIG. 19 is a graph showing current-voltage characteristics of light emitting elements.
Figure 20:
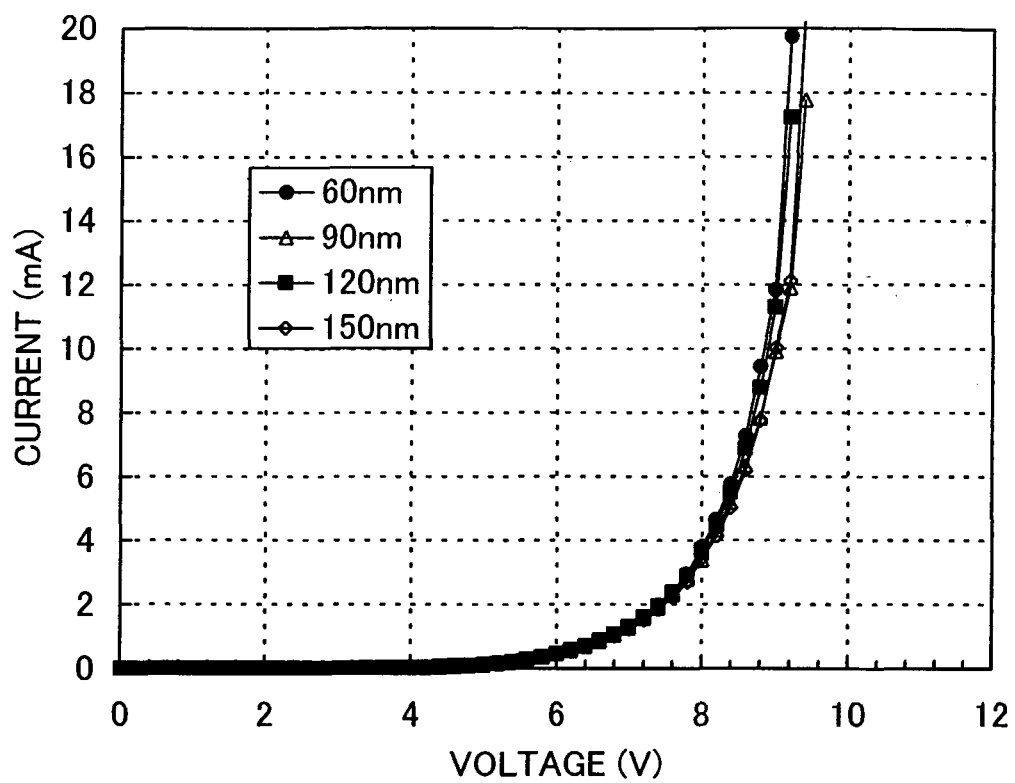
FIG. 20 is a graph showing current-voltage characteristics of light emitting elements.

Current-voltage characteristics of the light emitting elements manufactured in this embodiment are shown in FIGS. 17 to 20. FIG. 17 shows current-voltage characteristics in the case where the concentration of molybdenum oxide was 7 vol %. FIG. 18 shows current-voltage characteristics in the case where the concentration of molybdenum oxide was 10 vol %. FIG. 19 shows current-voltage characteristics in the case where the concentration of molybdenum oxide was 13 vol %. FIG. 20 shows current-voltage characteristics in the case where the concentration of molybdenum oxide was 16 vol %.

In the case where the concentration of molybdenum oxide was 7 vol %, the current-voltage characteristics were shifted toward a high voltage side with increase in thickness. Similarly, in the case where the concentration of molybdenum oxide was 10 vol %, the current-voltage characteristics were shifted toward a high voltage side with increase in thickness. However, in the case where the concentration of molybdenum oxide was 13 vol % or more, the current-voltage characteristics were not shifted toward a high voltage side with increase in thickness. Consequently, in the case where the concentration of molybdenum oxide is 13 vol % or more, the thickness of the layer containing the composite material can be freely set without increasing the driving voltage.

Figure 21:
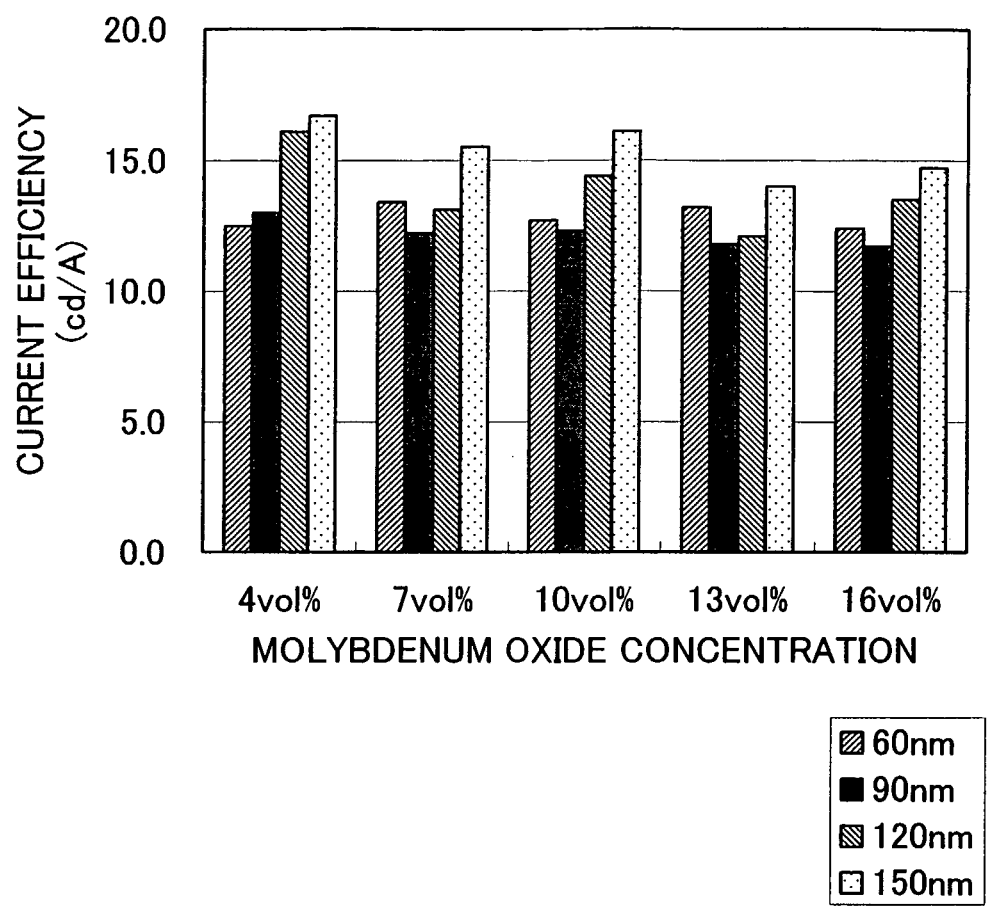
FIG. 21 is a graph showing current efficiency of light emitting elements.
Figure 22:
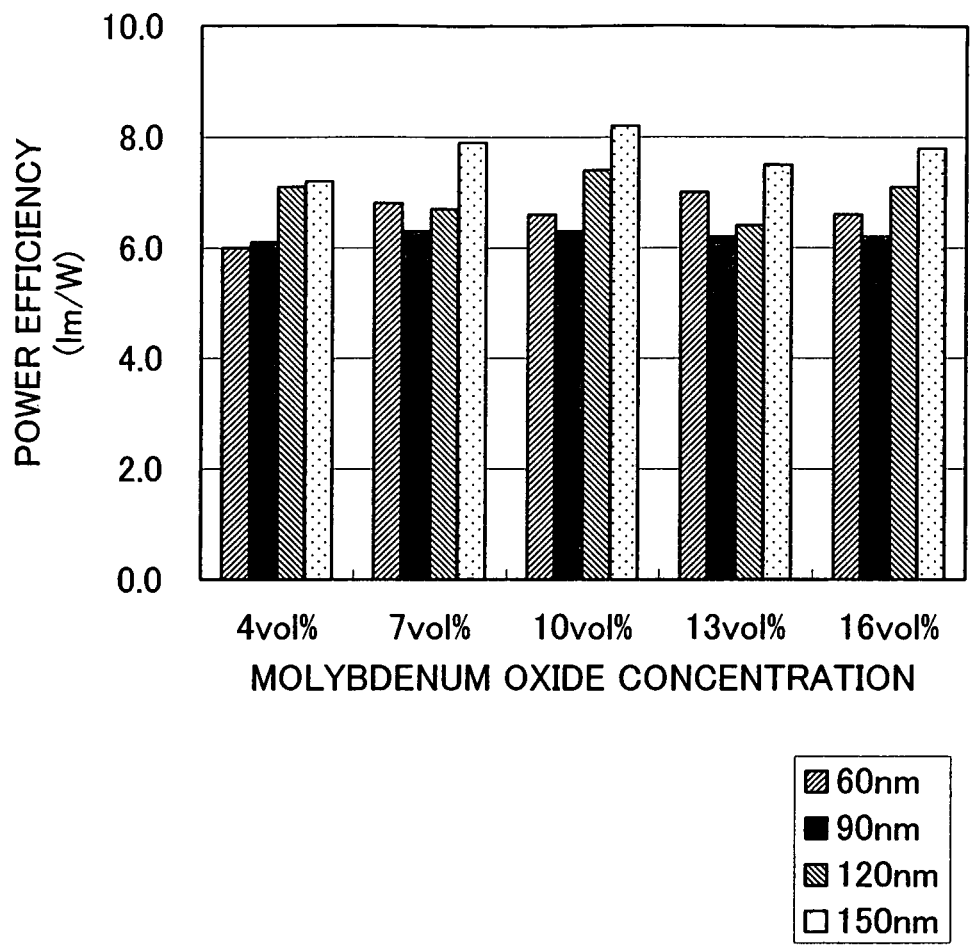
FIG. 22 is a graph showing power efficiency of light emitting elements.

In the light emitting elements manufactured in this embodiment, influence of the concentrations of the inorganic compound included in the layers containing the composite material was examined. Examination results are shown in FIG. 21 and FIG. 22. FIG. 21 shows concentration dependence of molybdenum oxide of the current efficiency. FIG. 22 shows concentration dependence of molybdenum oxide of the power efficiency. According to FIG. 21 and FIG. 22, it is known that in the light emitting elements of the present invention, the current efficiency and the power efficiency are hardly varied even when the concentrations of molybdenum oxide included in the layers containing the composite material are increased. That is, it is known that the current efficiency and the power efficiency are independent from the changes in concentration of an inorganic compound included in the composite material.

Embodiment 4

In this embodiment, current efficiency and power efficiency of light emitting elements were compared by changing a thickness of a layer containing a composite material of the present invention.

First, a first electrode was formed using indium tin oxide containing silicon oxide over a glass substrate by sputtering. The thickness of the first electrode was set to be 110 nm, and an area of the electrode was set to be 2 mm².

Next, a layer containing a composite material of the prevent invention was formed over the first electrode by co-evaporation of DNTPD and molybdenum oxide.

Subsequently, a hole transporting layer was formed using NPB by evaporation using resistance heating to have a thickness of 10 nm.

Further, a light emitting layer was formed with a thickness of 40 nm over the hole transporting layer by co-evaporation of Alq$_3$ and coumarin 6. A weight ratio between Alq$_3$ and coumarin 6 was adjusted to be 1:0.01 (=Alq$_3$: coumarin 6).

Thereafter, an electron transporting layer was formed using Alq$_3$ over the light emitting layer by evaporation using resistance heating to have a thickness of 30 nm.

Further, an electron injecting layer was formed using lithium fluoride over the electron transporting layer to have a thickness of 1 nm in the same manner as the electron transporting layer.

Then, a second electrode was formed using aluminum with a thickness of 200 nm over the electron injecting layer by evaporation using resistance heating. Thus, a light emitting element of the present invention was manufactured.

Further, in this embodiment, a plurality of light emitting elements each having a layer containing the composite material was formed such that each volume ratio between DNTPD and molybdenum oxide included in the layer containing the composite material was set to be 10 vol %, 13 vol %, and 16 vol %. The thicknesses of the respective layers containing the composite material were set to be 60 nm, 90 nm, 120 nm, 150 nm, 180 nm, 210 nm, and 240 nm based on the respective concentrations. That is, twenty one kinds of light emitting elements were formed in total.

Figure 23:
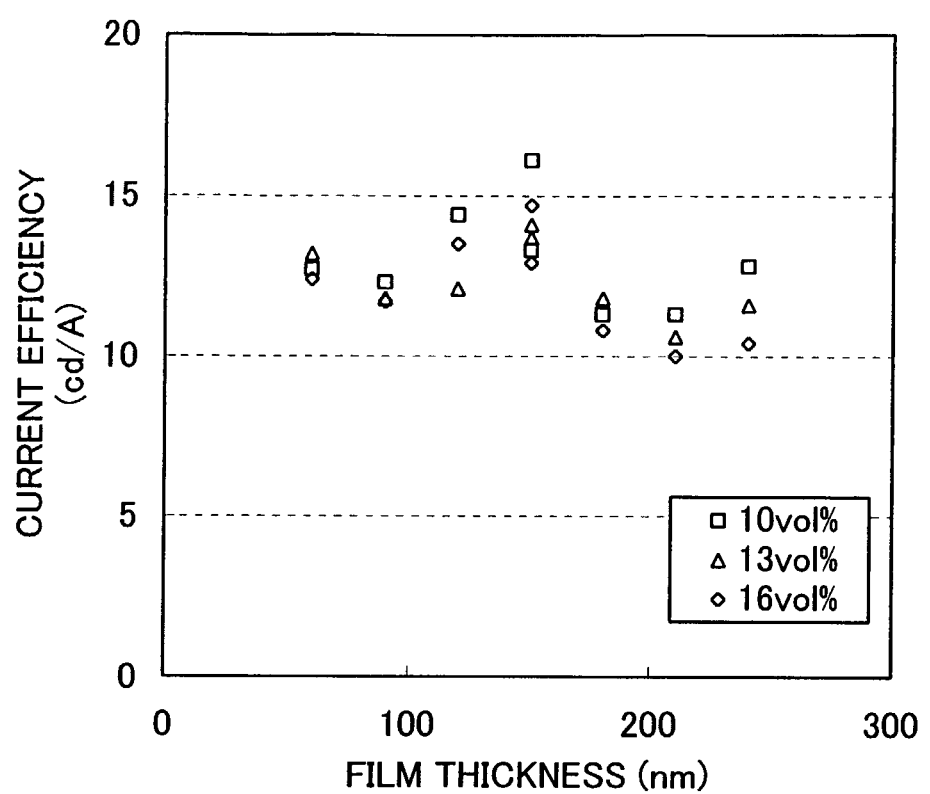
FIG. 23 is a graph showing current efficiency of light emitting elements.
Figure 24:
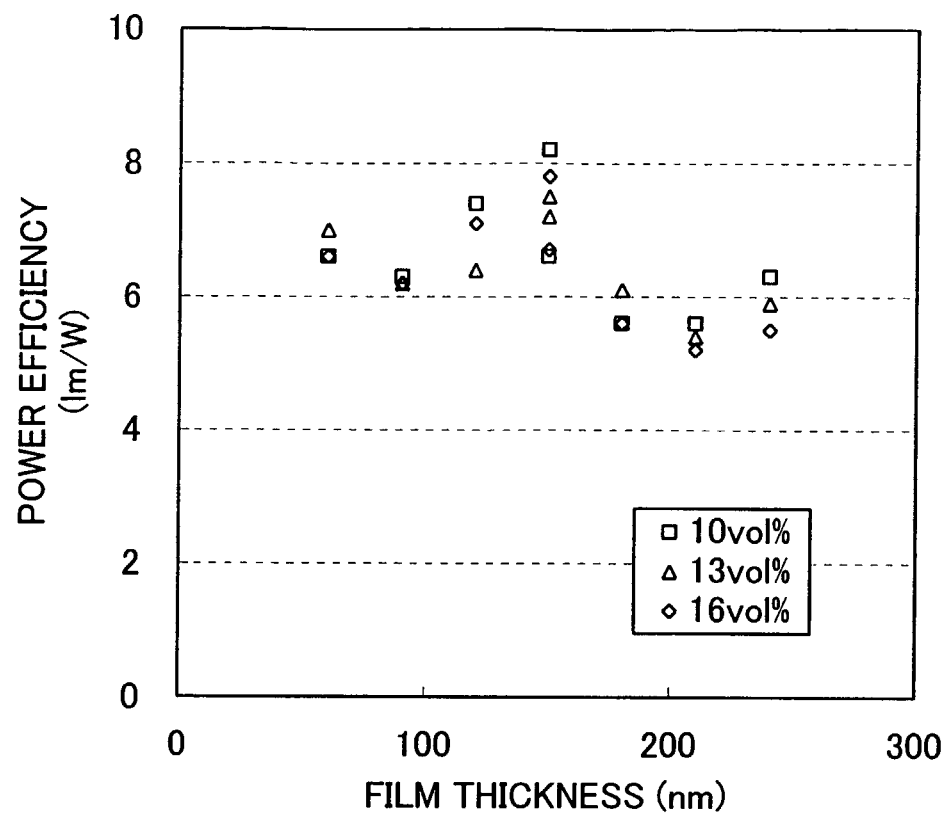
FIG. 24 is a graph showing power efficiency of light emitting elements.

Thickness dependence of current efficiency of the light emitting elements manufactured in this embodiment are shown in FIG. 23, while thickness dependence of power efficiency thereof are shown in FIG. 24. Both measurement results were obtained in the case of 10 mA/cm².

As shown in FIG. 23, the current efficiency was periodically changed in accordance with the changes in the film thickness. As shown in FIG. 24, the power efficiency was also periodically changed in accordance with the changes in the film thickness. These phenomena were also observed in each concentration of molybdenum oxide, and were independent from the concentrations of the inorganic compound included in the composite material. Accordingly, it is thought that the changes in current efficiency are caused due to an optical interference effect. It is also thought that the case where the layer containing the composite material had 150 nm in thickness can provide the most excellent current efficiency. Further, the similar dependency was also observed in the power efficiency, and it is thought that the case where the layer containing the composite material had 150 nm in thickness, provides the most excellent power efficiency.

Figure 25:
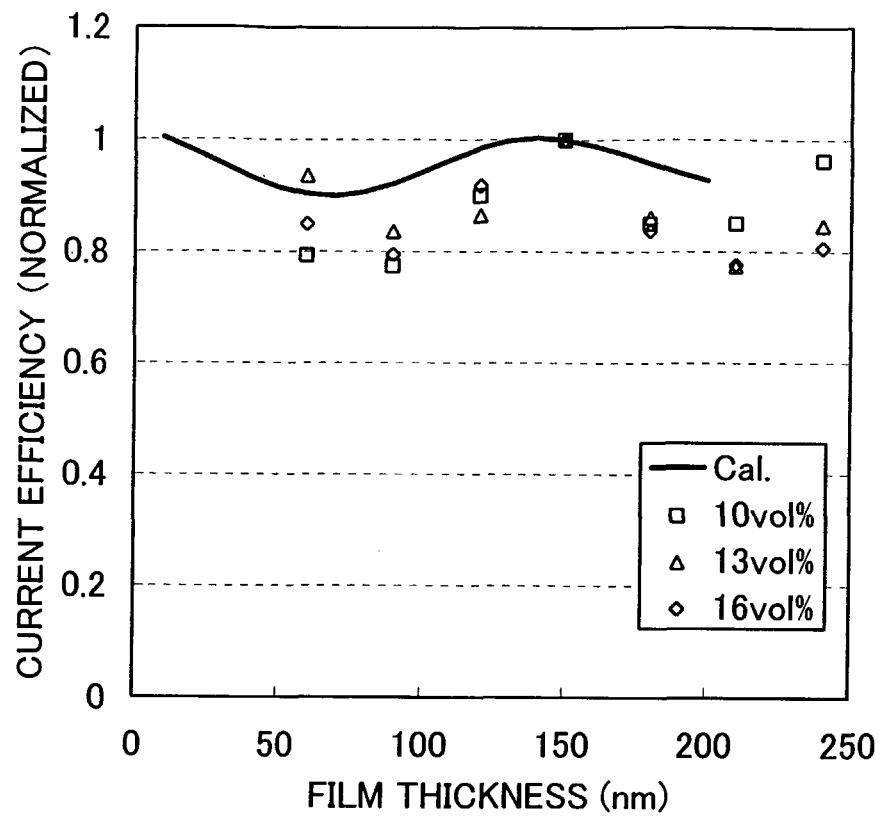
FIG. 25 is a graph showing current efficiency of a light emitting element and a calculation result.

A correlation of an optical calculation and an actual measurement value is shown in FIG. 25. In accordance with FIG. 25, it is known that the calculation result and the actual measurement value are almost similar to each other.

Comparative Example 1

First, a first electrode was formed using indium tin oxide containing silicon oxide over a glass substrate by sputtering. The thickness of the first electrode was set to be 110 nm, and an area of the electrode was set to be 2 mm².

Next, a layer containing NPB and molybdenum oxide was formed over the first electrode by co-evaporation of NPB and molybdenum oxide. The layer containing NPB and molybdenum oxide was formed such that a volume ratio between NPB and molybdenum oxide is 10 vol %. In a case of a comparative element 3, a thickness of the layer containing NPB and molybdenum oxide was set to be 120 nm. In a case of a comparative element 4, a thickness of the layer containing NPB and molybdenum oxide was set to be 150 nm.

Subsequently, a hole transporting layer was formed using NPB by evaporation using resistance heating to have a thickness of 10 nm.

Further, a light emitting layer was formed with a thickness of 40 nm over the hole transporting layer by co-evaporation of $Alq_3$ and coumarin 6. A weight ratio between $Alq_3$ and coumarin 6 was adjusted to be 1:0.01 (=$Alq_3$: coumarin 6).

Thereafter, an electron transporting layer was formed using $Alq_3$ with a thickness of 30 nm over the light emitting layer by evaporation using resistance heating.

Further, an electron injecting layer was formed using lithium fluoride with a thickness of 1 nm over the electron transporting layer in the same manner as the electron transporting layer.

Then, a second electrode was formed using aluminum with a thickness of 200 nm over the electron injecting layer by evaporation using resistance heating. In this manner, the comparative elements 3 and 4 were manufactured.

Table 1 shows current efficiency and power efficiency of the light emitting element of this embodiment in which the concentration of molybdenum oxide included in the layer containing the composite material was 13 vol % and the thickness of the layer containing the composite material was 150 nm, the comparative element 3, and the comparative element 4. Further, Table 1 shows measurement results in the case of 10 mA/cm$^2$.

TABLE 1

| | Organic compound | Thickness of layer containing composite material | Concentration of inorganic compound included in composite material (by volume) | Current efficiency (cd/A) | Power efficiency (lm/W) |
|---|---|---|---|---|---|
| Comparative element 3 | NPB | 120 nm | 10 vol % | 11.0 | 6.4 |
| Comparative element 4 | NPB | 150 nm | 10 vol % | 12.3 | 7.1 |
| Light emitting element of present invention | DNTPD | 150 nm | 13 vol % | 14.0 | 7.5 |

As shown in Table 1, it is known that the current efficiency and the power efficiency are improved by using the layer containing the composite material of the present invention. In addition, as compared to the case where the thickness of the layer containing the composite material of the light emitting element of the present invention is 150 nm and the case where the thickness of the layer containing the composite material of the comparative example 4 is 150 nm, the current efficiency and the power efficiency of the light emitting element of the present invention, are more improved. Accordingly, a light emitting element having high efficiency can be obtained by using the composite material of the present invention.

Embodiment 5

An electronic state of a layer containing a composite material of the present invention was measured in this embodiment.

Figure 27:
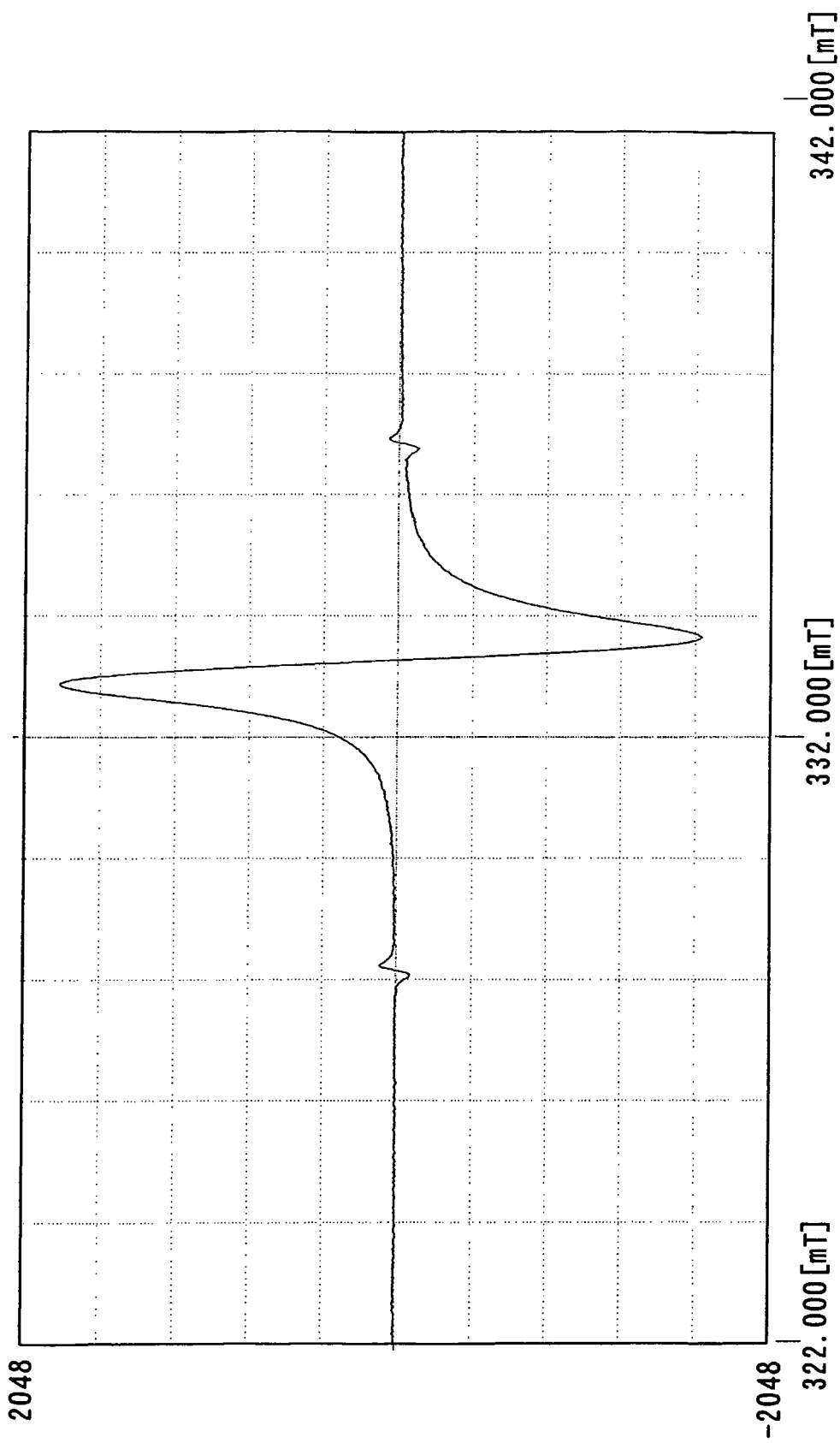
FIG. 27 is a graph showing an ESR measurement result of a layer containing DNTPD and molybdenum oxide.

A layer containing DNTPD and molybdenum oxide was formed over a quartz substrate by co-evaporation to have a thickness of 200 nm. In this case, the co-evaporation was carried out such that a weight ratio between DNTPD and molybdenum oxide was 1:0.5. An ESR (electron spin resonance) measurement of the layer containing DNTPD and molybdenum oxide was performed. The ESR measurement is a measurement method in which by applying strong magnetic field to a sample having unpaired electrons, energy levels of unpaired electrons cause Zeeman splitting, and a measurement is performed while utilizing resonance absorption transition of a microwave, which is a difference in energy between the energy levels. In the ESR measurement, by measuring frequency at the time of causing absorption and the intensity of the magnetic field, presence or absence of unpaired electrons and a spin condition can be known. In addition, from the absorption intensity, a concentration of electron spin can be obtained. The measurement of this embodiment was carried out under a condition where the resonance frequency was 9.3 GHz; modulation frequency, 100 kHz; modulation width, 0.63 mT; amplification degree, 50; time constant, 0.1 sec; microwave input, 1 mW; sweep time, 4 min; and measurement temperature, room temperature, while employing electron spin resonance analysis equipment (# JES-TE200, Hitachi, Ltd.). As a sample for correcting magnetic field, manganese supported by magnesium oxide was used. An ESR measurement result is shown in FIG. 27. In addition, as a comparative example, an ESR measurement was also performed to a film only including DNTPD (with a thickness of 200 nm) and a film only including molybdenum oxide (200 nm). An ESR measurement result of the film only including DNTPD is shown in FIG. 28, and an ESR measurement result of the film only including molybdenum oxide is shown in FIG. 29.

Figure 28:
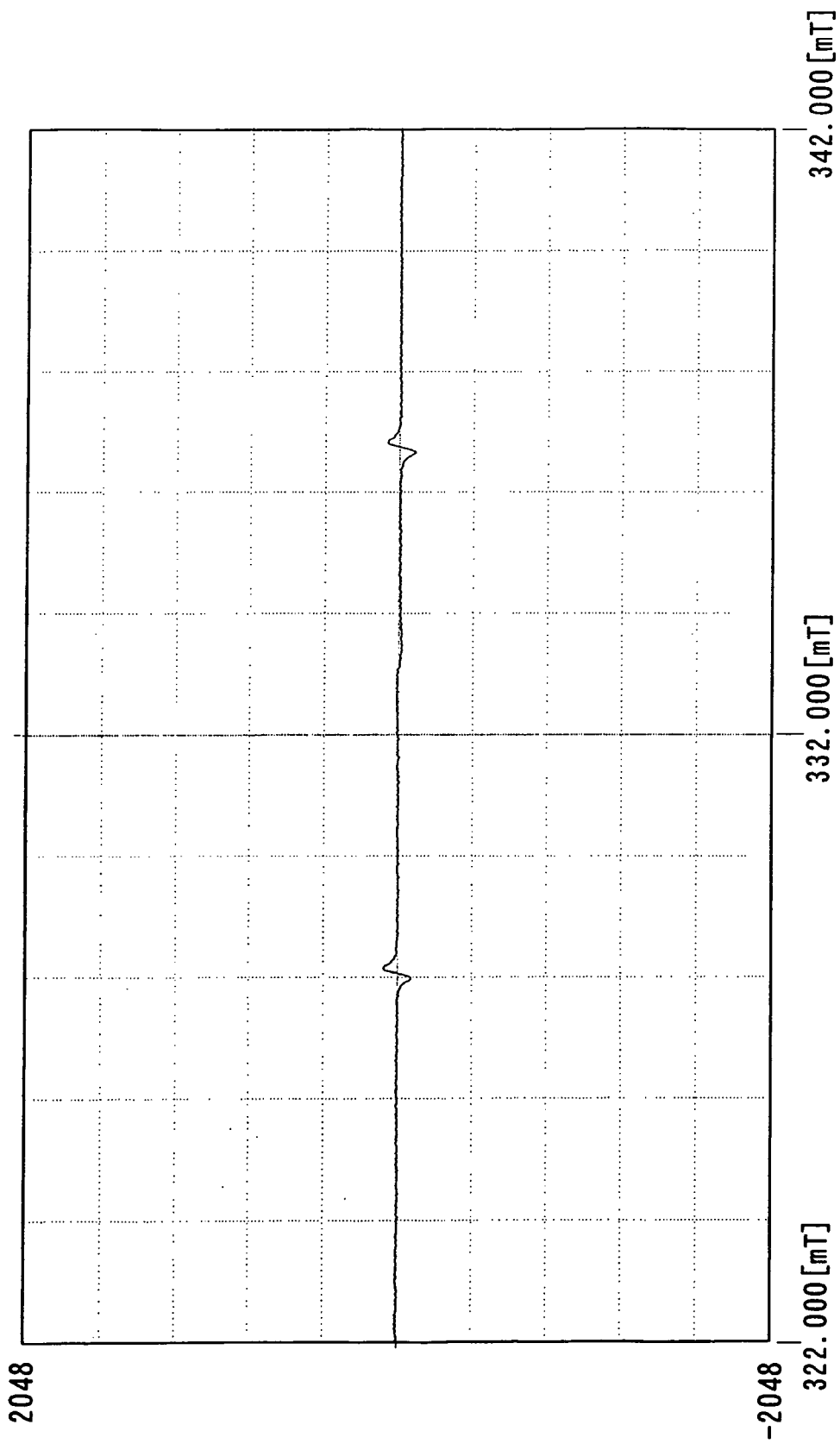
FIG. 28 is a graph showing an ESR measurement result of a singe film of DNTPD.
Figure 29:
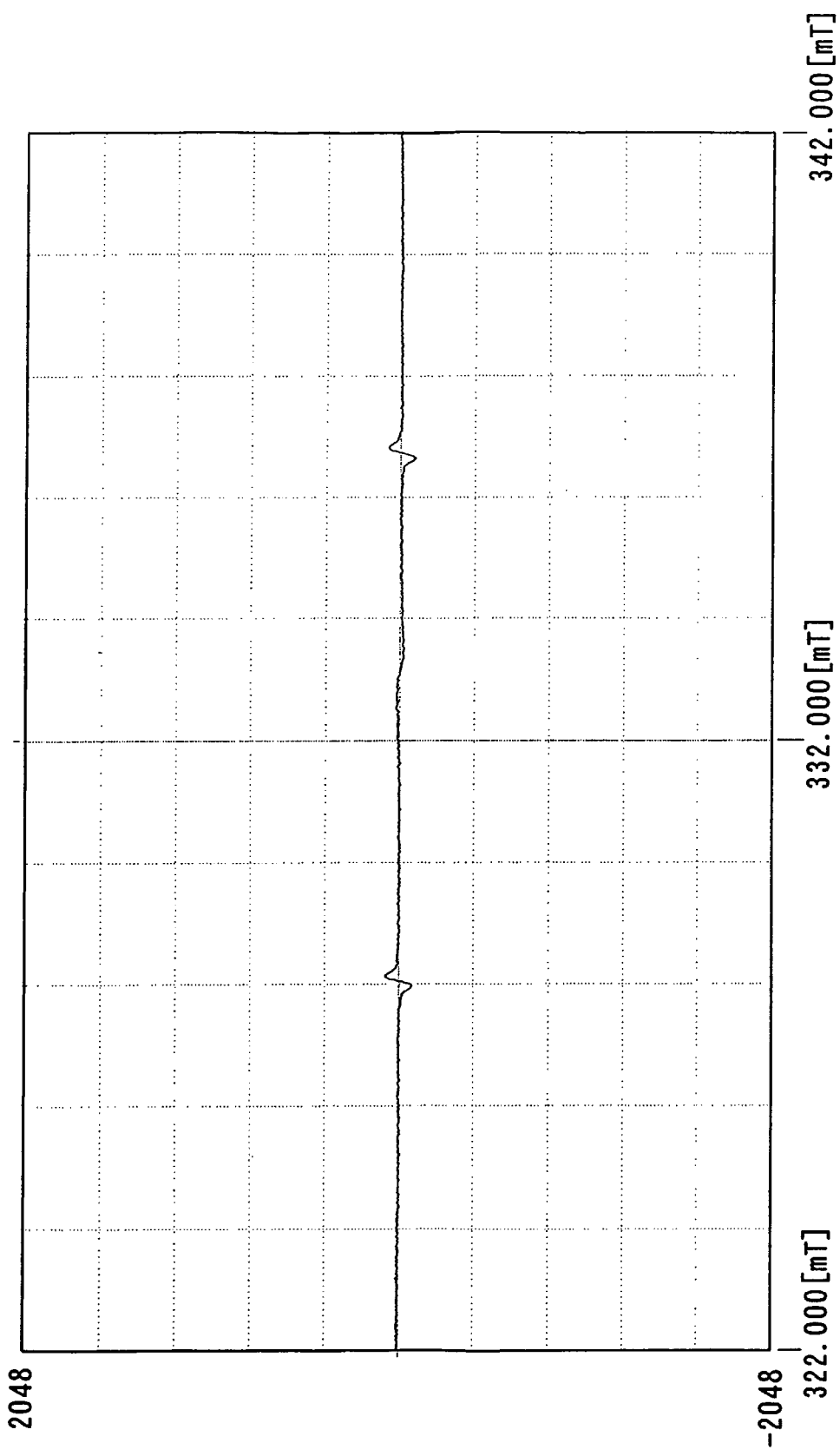
FIG. 29 is a graph showing an ESR measurement result of a single film of molybdenum oxide.

In FIGS. 27 to 29, an ESR signal was not detected in the film only including DNTPD and the film only including molybdenum oxide. However, an ESR signal was detected in the layer containing DNTPD and molybdenum oxide. Accordingly, it is known that the layer containing DNTPD and molybdenum oxide had unpaired electrons. That is, it is known that the layer containing DNTPD and molybdenum oxide was in a different electronic state from those of the film only including DNTPD and the film only including molybdenum oxide. Further, as from FIG. 27, the value of "g" of the layer containing DNTPD and molybdenum oxide is obtained as 2.0025, and it is known that this value is extremely close to 2.0023, which is the value of "g" of a free electron. On the other hand, it is known that the line width is as extremely as narrow as 0.77 mT.

Embodiment 6

A measurement of a combined state of a layer containing a composite material of the present invention was performed in this embodiment.

Figure 30:
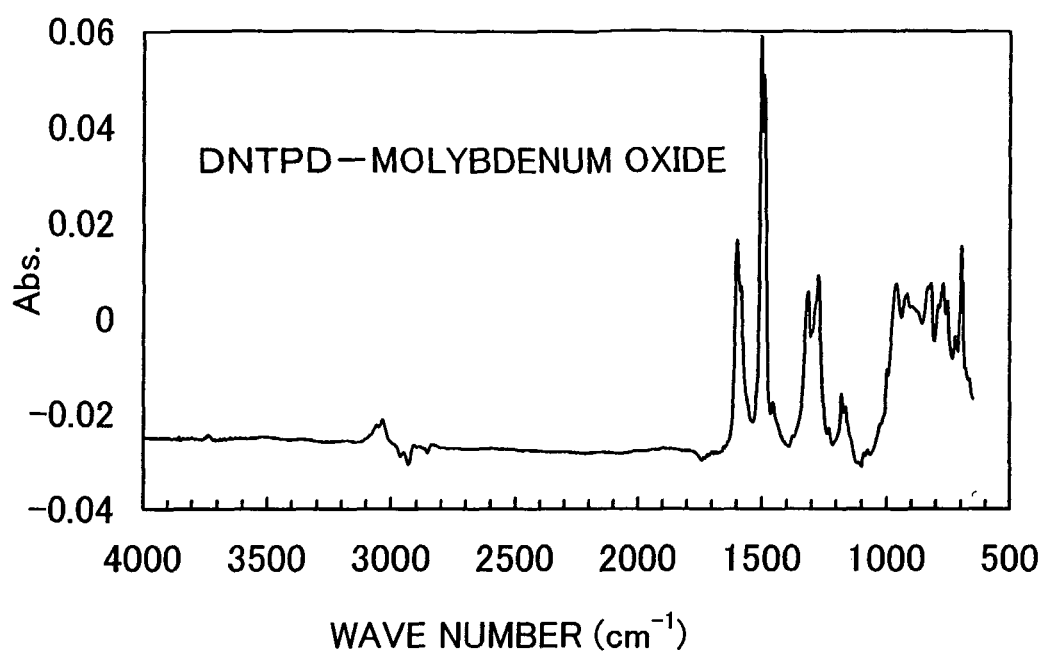
FIG. 30 is a graph showing an IR measurement result of a layer containing DNTPD and molybdenum oxide.

A film was formed using aluminum over a glass substrate to have a thickness of 200 nm. A layer containing DNTPD and molybdenum oxide was formed thereover to have a thickness of 100 nm by co-evaporation. Thus, a sample was manufactured. In this case, the co-evaporation was performed such that a weight ratio between DNTPD and molybdenum oxide was set to be 1 (DNTPD): 0.5 (molybdenum oxide). The layer containing DNTPD and molybdenum oxide was measured by using an infrared (IR) spectroscopy method. This measurement was carried out under a condition of room temperature, P polarized incidence, and reflection absorption spectroscopy while utilizing Fourier transform infrared absorption spectrophotometer (# NEXUS 670 FT-IR, Thermo Nicolet Corporation). An IR measurement result is shown in FIG. 30. Moreover, as a comparative example, an IR measurement was also performed to a film only including molybdenum oxide (with a thickness of 50 nm), and a film only including DNTPD (with a thickness of 50 nm). An IR measurement result of the film only including molybdenum oxide was shown in FIG. 31, and an IR measurement result of the film only including DNTPD was shown in FIG. 32.

Figure 31:
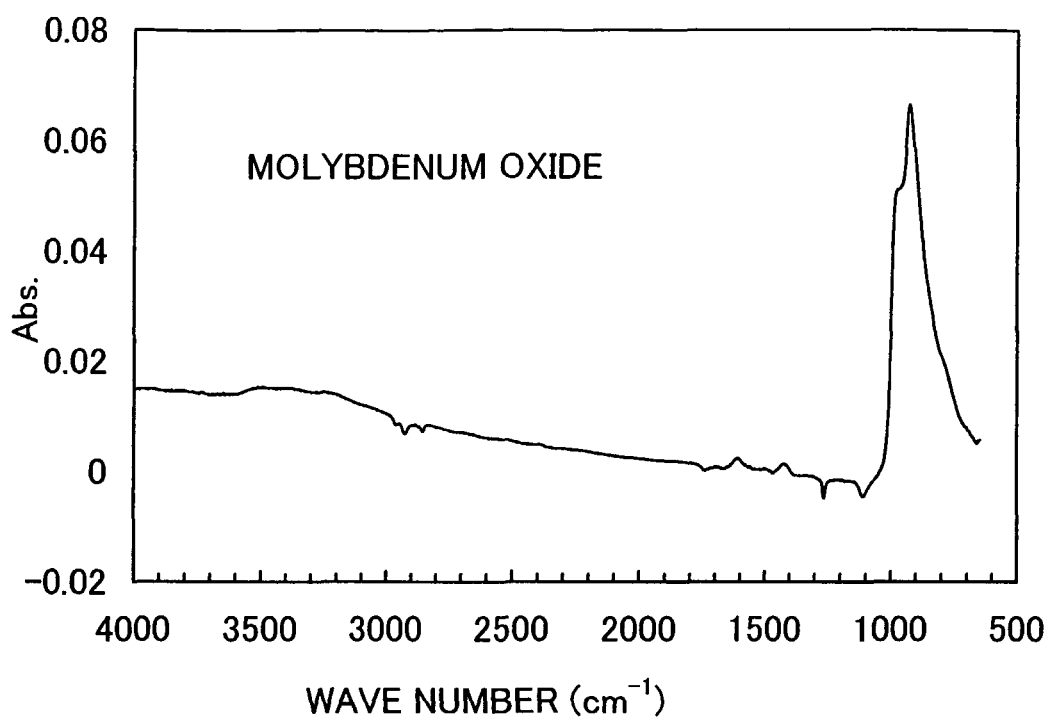
FIG. 31 is a graph showing an IR measurement result of a single film of molybdenum oxide.
Figure 32:
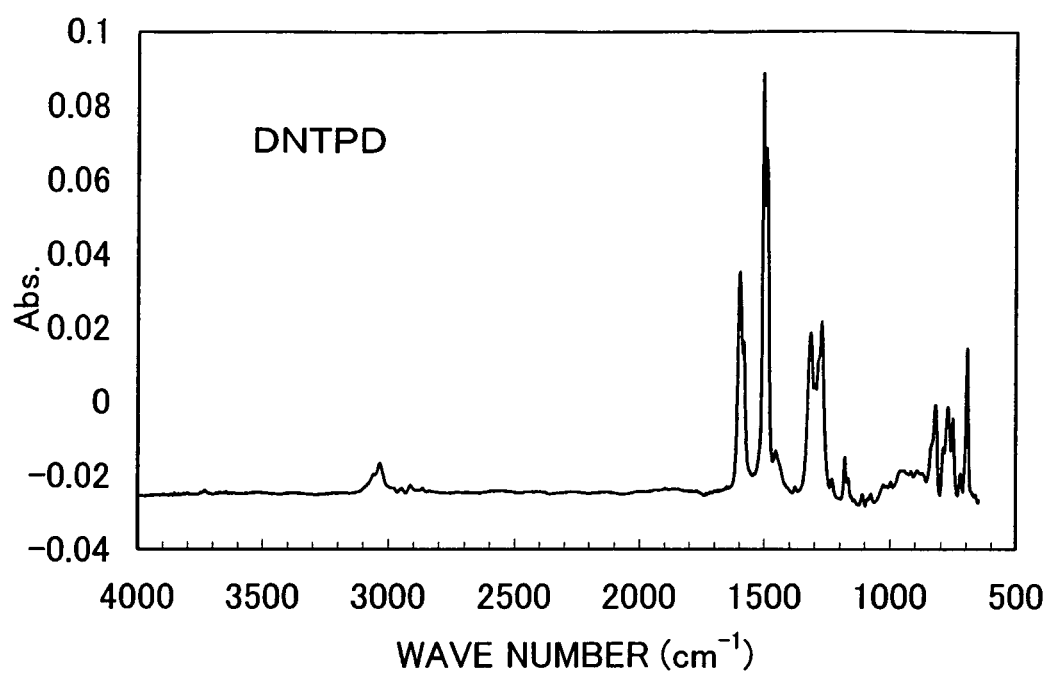
FIG. 32 is a graph showing an IR measurement result of a single film of DNTPD.

In accordance with FIGS. 30 to 32, an IR spectrum of the layer containing DNTPD and molybdenum oxide is almost overlapped with an spectrum of the film only including molybdenum oxide and an spectrum of the film only including DNTPD. Consequently, it is thought that formation of new covalent bonds or disconnection were not caused.

Embodiment 7

A method for manufacturing a light emitting element of the present invention, and a characteristic of the light emitting element will be described. In this embodiment, light emitting elements 11, 12, 13, 14, 15, 16, 17, 18, 19, and 20 having first electrodes formed using different materials, were manufactured.

A first electrode of the light emitting element 11 was formed by using aluminum containing several % of silicon (Al—Si), over a glass substrate. A first electrode of the light emitting element 12 was formed by using aluminum containing several % of titanium (Al—Ti), over another glass substrate. A first electrode of the light emitting element 13 was formed by using titanium (Ti), over another glass substrate. A first electrode of the light emitting element 14 was formed by using titanium nitride (TiN), over another glass substrate. A first electrode of the light emitting element 15 was formed by using tantalum (Ta), over another glass substrate. A first electrode of the light emitting element 16 was formed by using tantalum nitride (TaN), over another glass substrate. A first electrode of the light emitting element 17 was formed by using tungsten (W), over another glass substrate. A first electrode of the light emitting element 18 was formed by using chromium (Cr), over another glass substrate. A first electrode of the light emitting element 19 was formed by using molybdenum (Mo), over another glass substrate. A first electrode of the light emitting element 20 was formed by using indium tin oxide containing silicon oxide (ITSO), over another glass substrate.

Thereafter, the glass substrates were washed and dried. Then, each of the substrates was set in an evaporation apparatus, and the evaporation apparatus was evacuated to be vacuum of $1 \times 10^{-4}$ or less. Under a vacuum atmosphere, the glass substrates over which the first electrodes were provided, were subjected to a baking treatment at 150° C. for 30 minutes, respectively.

Next, a layer containing a composite material of the present invention was formed over each first electrode by co-evaporation of DNTPD, molybdenum oxide, and rubrene. Further, a weight ratio between DNTPD, molybdenum oxide, and rubrene was set to be 1 (DNTPD):0.15 (molybdenum oxide):0.04 (rubrene). Further, the thickness of each layer containing the composite material was set to be 60 nm.

Next, a hole transporting layer was formed over each layer containing the composite material of the present invention by evaporation of NPB. The thickness of each hole transporting layer was set to be 10 nm.

Subsequently, a light emitting layer was formed over each hole transporting layer by co-evaporation of $Alq_3$ and coumarin 6. Further, a weight ratio between $Alq_3$ and coumarin 6 was set to be 1:0.005. Further, the thickness of each light emitting layer was set to be 40 nm.

An electron transporting layer was formed over each light emitting layer by evaporation of $Alq_3$. The thickness of each electron transporting layer was set to be 20 nm.

Next, an electron injecting layer was formed over each electron transporting layer by co-evaporation of lithium (Li) and 4,4'-bis(5-methylbenzoxazole-2-yl) stilbene (abbreviation: BzOS). A weight ratio between Li and BzOS was set to be 0.02 (Li):1 (BzOS). Further, the thickness of each electron injecting layer was set to be 20 nm.

Next, a second electrode was formed over each electron injecting layer by using indium tin oxide. The thickness of each second electrode was set to be 60 nm.

Figure 33:
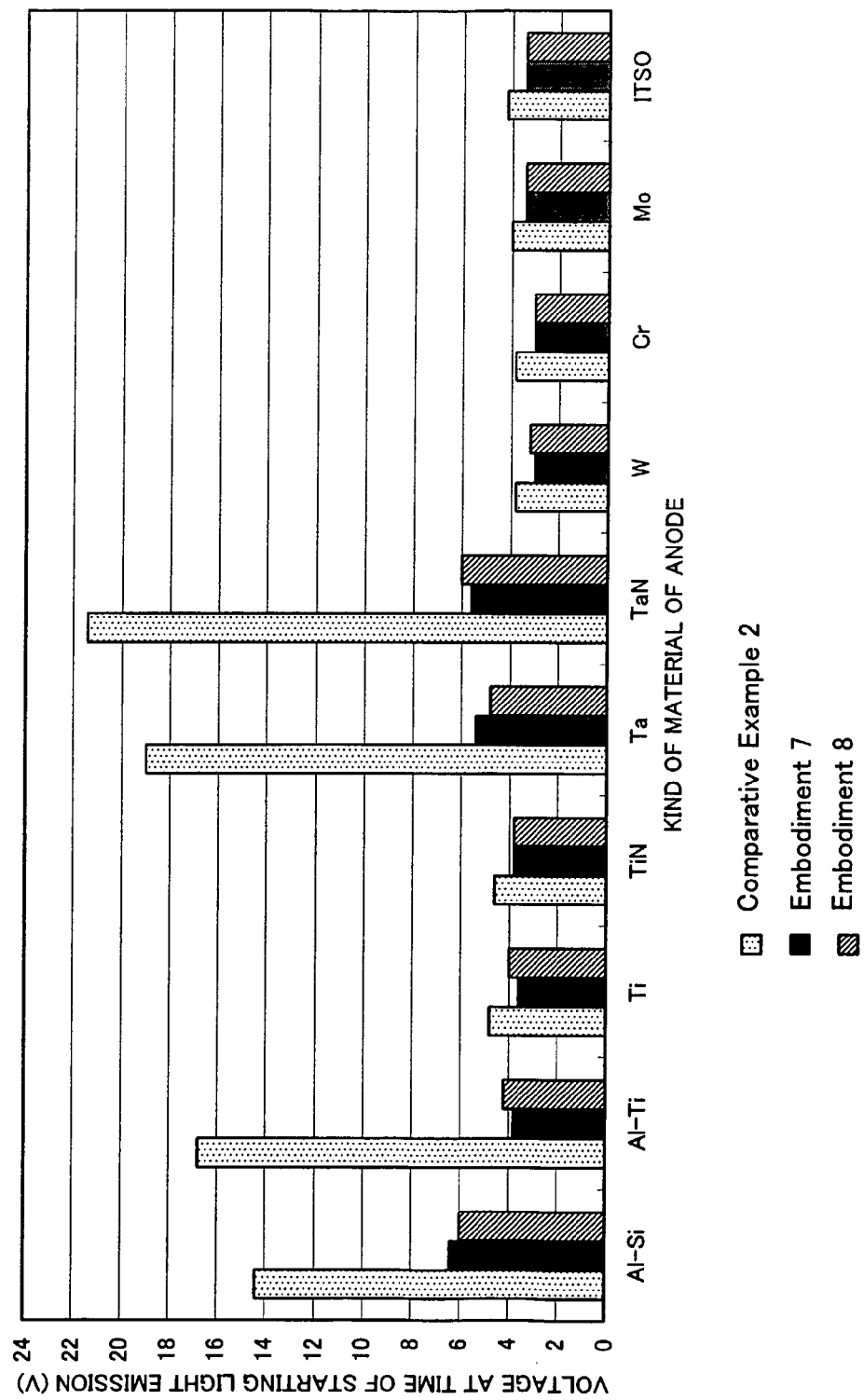
FIG. 33 is a graph showing dependence on an anode at the time of starting light emission.

The respective light emitting elements manufactured above were driven by applying voltage such that potential of the first electrodes was higher than that of the second electrodes, and then voltage at the time of starting light emission was measured. Further, the voltage at the time of starting light emission was assumed as voltage when light emission of 1 $cd/m^2$ or more was observed. Measurement results are shown in FIG. 33. In FIG. 33, a horizontal axis represents the materials of the first electrodes while a longitudinal axis represents voltage (V) at the time of starting light emission.

Embodiment 8

A method for manufacturing a light emitting element of the present invention, and a characteristic of the light emitting element will be described. In his embodiment, light emitting elements 21, 22, 23, 24, 25, 26, 27, 28, 29, and 30 having first electrodes formed using different materials, were manufactured.

A first electrode of a light emitting element 21 was formed by using aluminum containing several % of silicon (Al—Si), over a glass substrate. A first electrode of the light emitting element 22 was formed by using aluminum containing several % of titanium (Al—Ti), over another glass substrate. A first electrode of the light emitting element 23 was formed by using titanium (Ti), over another glass substrate. A first electrode of the light emitting element 24 was formed by using titanium nitride (TiN), over another glass substrate. A first electrode of the light emitting element 25 was formed by using tantalum (Ta), over another glass substrate. A first electrode of the light emitting element 26 was formed by using tantalum nitride (TaN), over another glass substrate. A first electrode of the light emitting element 27 was formed by using tungsten (W), over another glass substrate. A first electrode of the light emitting element 28 was formed by using chromium (Cr), over another glass substrate. A first electrode of the light emitting element 29 was formed by using molybdenum (Mo), over another glass substrate. A first electrode of the light emitting element 30 was formed by using indium tin oxide containing silicon oxide (ITSO), over another glass substrate.

Thereafter, the glass substrates were washed and dried. Then, each of the substrates was set in an evaporation apparatus, and the evaporation apparatus was evacuated to be vacuum of $1 \times 10^{-4}$ or less. Under a vacuum atmosphere, the glass substrates over which the first electrodes were provided, were subjected to a baking treatment at 150° C. for 30 minutes, respectively.

Next, a layer containing a composite material of the present invention was formed over each first electrode by co-evaporation of DNTPD, molybdenum oxide, and rubrene. Further, a weight ratio between DNTPD, molybdenum oxide, and rubrene was set to be 1 (DNTPD):0.15 (molybdenum oxide):0.04 (rubrene). Further, each layer containing the composite material was set to be 80 nm.

Next, a hole transporting layer was formed over each layer containing the composite material of the present invention by evaporation of NPB. The thickness of each hole transporting layer was set to be 10 nm.

Subsequently, a light emitting layer was formed over each hole transporting layer by co-evaporation of Alq$_3$ and coumarin 6. Further, a weight ratio between Alq$_3$ and coumarin 6 was set to be 1:0.005. Further, the thickness of each light emitting layer was set to be 40 nm.

An electron transporting layer was formed over each light emitting layer by evaporation of Alq$_3$. The thickness of each electron transporting layer was set to be 20 nm.

Next, an electron injecting layer was formed over each electron transporting layer by co-evaporation of lithium (Li) and 4,4'-bis(5-methylbenzoxazole-2-yl) stilbene (abbreviation: BzOS). A weight ratio between Li and BzOS was set to be 0.02 (Li):1 (BzOS). Further, the thickness of each electron injecting layer was set to be 20 nm.

Next, a second electrode was formed over each electron injecting layer by using indium tin oxide. The thickness of each second electrode was set to be 60 nm.

The respective light emitting elements manufactured above were driven by applying voltage such that potential of the first electrodes was higher than that of the second electrodes, and then voltage at the time of starting light emission was measured. Measurement results are shown in FIG. 33. In FIG. 33, a horizontal axis represents the materials of the first electrodes while a longitudinal axis represents voltage (V) at the time of starting light emission.

Comparative Example 2

Light emitting elements 31, 32, 33, 34, 35, 36, 37, 38, 39, and 40, which are comparative examples with respect to the light emitting elements described in Embodiment 7 and Embodiment 8, will be described in Comparative Example 2.

A first electrode of a light emitting element 31 was formed by using aluminum containing several % of silicon (Al—Si), over a glass substrate. A first electrode of the light emitting element 32 was formed by using aluminum containing several % of titanium (Al—Ti), over another glass substrate. A first electrode of the light emitting element 33 was formed by using titanium (Ti), over another glass substrate. A first electrode of the light emitting element 34 was formed by using titanium nitride (TiN), over another glass substrate. A first electrode of the light emitting element 35 was formed by using tantalum (Ta), over another glass substrate. A first electrode of the light emitting element 36 was formed by using tantalum nitride (TaN), over another glass substrate. A first electrode of the light emitting element 37 was formed by using tungsten (W), over another glass substrate. A first electrode of the light emitting element 38 was formed by using chromium (Cr), over another glass substrate. A first electrode of the light emitting element 39 was formed by using molybdenum (Mo), over another glass substrate. A first electrode of the light emitting element 40 was formed by using indium tin oxide containing silicon oxide (ITSO), over another glass substrate.

Thereafter, the glass substrates were washed and dried. Then, each of the substrates was set in an evaporation apparatus, and the evaporation apparatus was evacuated to be vacuum of $1 \times 10^{-4}$ or less. Under a vacuum atmosphere, the glass substrates over which the first electrodes were provided, were subjected to a baking treatment at 150° C. for 30 minutes, respectively.

Nest, a hole injecting layer was formed over each first electrode by evaporation of copper phthalocyanine (abbreviation: CuPc). The thickness of each hole injecting layer was set to be 20 nm.

Next, a hole transporting layer was formed over each hole injecting layer by evaporation of NPB. The thickness of each hole transporting layer was set to be 40 nm.

Subsequently, a light emitting layer was formed over each hole transporting layer by co-evaporation of Alq$_3$ and coumarin 6. Further, a weight ratio between Alq$_3$ and coumarin 6 was set to be 1:0.005. Further, the thickness of each light emitting layer was set to be 40 nm.

An electron transporting layer was formed over each light emitting layer by evaporation of Alq$_3$. The thickness of each electron transporting layer was set to be 20 nm.

Next, an electron injecting layer was formed over each electron transporting layer by co-evaporation of lithium (Li) and 4,4'-bis(5-methylbenzoxazole-2-yl) stilbene (abbreviation: BzOS). A weight ratio between Li and BzOS was set to be 0.02 (Li):1 (BzOS). Further, the thickness of each electron injecting layer was set to be 20 nm.

Next, a second electrode was formed over each electron injecting layer by using indium tin oxide. The thickness of each second electrode was set to be 60 nm.

The respective light emitting elements manufactured above were driven by applying voltage such that potential of the first electrodes was higher than that of the second electrodes, and then voltage at the time of starting light emission was measured. Measurement results are shown in FIG. 33. In FIG. 33, a horizontal axis represents the materials of the first electrodes while a longitudinal axis represents voltage (V) at the time of starting light emission.

From FIG. 33, it is known that voltage at the time of starting light emission is greatly differed depending on the types of the light emitting elements 31 to 40 as the comparative examples in each of which the layer being in contact with the first electrode was formed using copper phthalocyanine, i.e., depending on the materials of the first electrodes for each light emitting element. On the other hand, it is known that there is almost no changes in voltage at the time of starting light emission of the light emitting elements 11 to 30 manufactured in accordance with the present invention. Accordingly, it is known that the light emitting elements of the present invention are difficult to be influenced by the kinds of materials of the electrodes. Therefore, when manufacturing a light emitting element which utilizes an electrode as an reflecting surface, by applying the present invention, the electrode can be formed by selecting a material having more superior reflectance.

Figure 34:
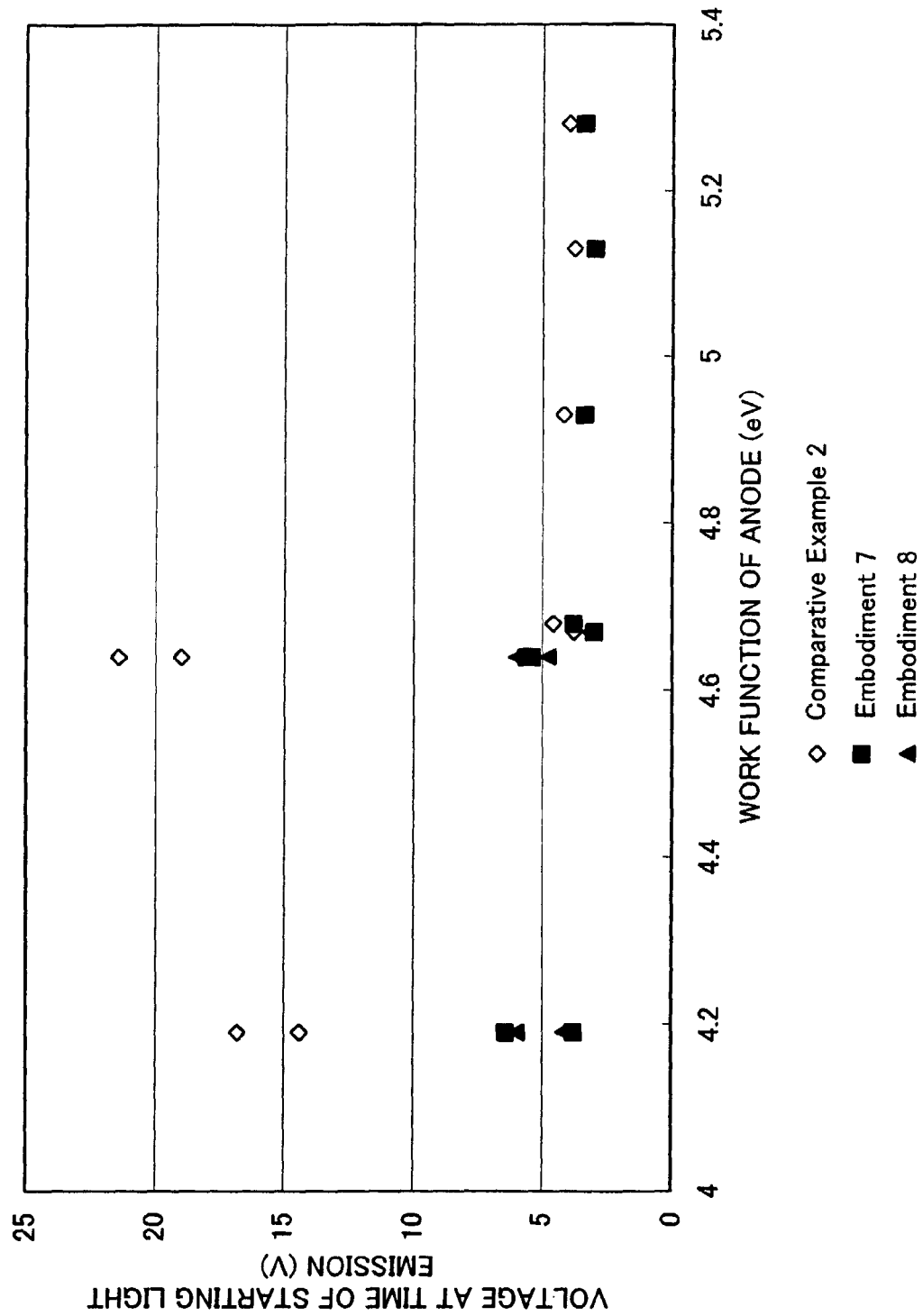
FIG. 34 is a graph showing a relation between a work function and voltage at the time of starting light emission.

Further, correlations between work functions and voltage at the time of starting light emission of the first electrodes (anodes) are shown in FIG. 34. In a usual light emitting element, metal having a low work function does not serve as an anode, and specifically, a work function of 4.6 to 4.7 eV or more is required. Meanwhile, the voltage at the time of starting light emission of the light emitting elements manufactured in accordance with the present invention is not dependent on the work functions. Accordingly, by adapting the present invention, a material of an electrode can be selected regardless of a work function. Therefore, a material with high reflectance having a low fork function can be used for an anode.

Figure 42:
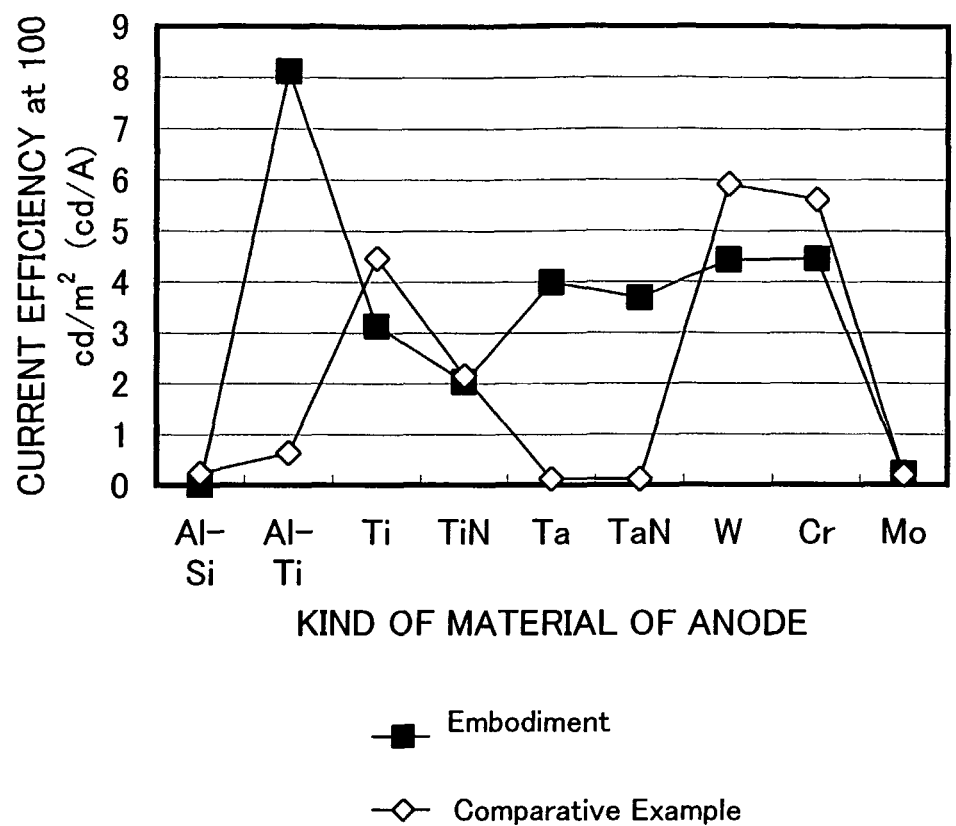
FIG. 42 is a graph showing a correlation between current efficiency and a reflecting electrode.

Furthermore, correlations between current efficiency and reflecting electrodes are shown in FIG. 42. The organization of the element of FIG. 42 is shown in the following table:

| mode of element | MoOx layer | hole transporting layer | light emitting layer | electron transporting layer | electron injecting layer | cathode |
|---|---|---|---|---|---|---|
| Embodiment | DNTPD:MoOx:Ruburene (1:0.15:0.04 wt/wt/wt) 60 nm | NPB 10 nm | Alq:C6 (1:0.015 wt/wt) 40 nm | Alq 20 nm | BzOs 20 nm | ITO 60 nm |
| comparative example | CuPc (layer for comparing) 20 nm | NPB 40 nm | Alq:C6 (1:0.015 wt/wt) 40 nm | Alq 20 nm | BzOs 20 nm | ITO 60 nm |

In a light emitting element in which light is emitted through a substrate and an opposite side of the substrate, when an electrode having high reflectance is used as a first electrode serving as a reflecting electrode, high efficiency can be obtained. Among the light emitting elements using the composite material of the present invention, highest current efficiency is realized in the light emitting element having the first electrode made from Al—Ti, which has extremely high reflectance. Meanwhile, with respect to the light emitting element of the comparative example, in which the layer being in contact with the first electrode was formed using copper phthalocyanine, when the first electrode is formed using Al—Ti, current efficiency of this light emitting element is less than 1%.

By utilizing the composite material of the present invention, a material for a electrode can be selected regardless of a carrier injecting property of the electrode. Therefore, a material with high reflectance can be used as a first electrode regardless of a carrier injecting property of the electrode.

Embodiment 9

In this embodiment, a case where aluminum having high reflectance was used as an electrode and a layer containing a composite material of the present invention was used as a layer being in contact with the electrode, will be described.

First, a first electrode was formed using aluminum (Al) over a glass substrate by sputtering. The size of the electrode was 2 mm×2 mm.

Next, the substrate over which the first electrode was formed was set to a substrate holder provided inside of a vacuum evaporation apparatus such that a surface of the first electrode faced downward.

A layer including a composite material of the present invention was formed over the first electrode by co-evaporation of DNTPD and molybdenum oxide (valence of molybdenum: VI). The film thickness was set to be 200 nm. Further, the co-evaporation is an evaporation method in which evaporation is performed simultaneously from a plurality of evaporation sources in one processing chamber. A weight ratio between DNTPD and molybdenum oxide (valence of molybdenum: VI) was adjusted to be 1 (DNTPD):0.5 (molybdenum oxide). Furthermore, the layer containing the composite material of the present invention was formed without exposing it to atmospheric air after forming the first electrode under reduced pressure.

A second electrode was formed using aluminum (Al) on the layer containing the composite material of the present invention by evaporation using resistance heating. Thus, a light emitting element 41 of the present invention was manufactured.

Further, an element 42 was formed as follows. An first electrode was formed over a substrate using aluminum, and was exposed to atmospheric air. This first electrode is subjected to an UV-ozone treatment for 30 minutes, and thereafter, a layer containing a composite material of the present invention was formed over the first electrode by co-evaporation of DNTPD and molybdenum oxide (valence of molybdenum: VI). The element 42 was manufactured in the same manner as the element 41, with the exception that the UV-ozone treatment was performed for 30 minutes.

In addition, an element 43 was manufactured by using a first electrode which was formed of indium tin oxide containing silicon oxide (ITSO). The element 43 was formed in the same manner as the element 41, with the exception that ITSO was used as a material for the first electrode.

A measurement of current-voltage characteristics was performed by a two terminal method under a condition where a case in which each first electrode was an anode and each second electrode was a cathode, was set to be a forward direction.

Figure 35:
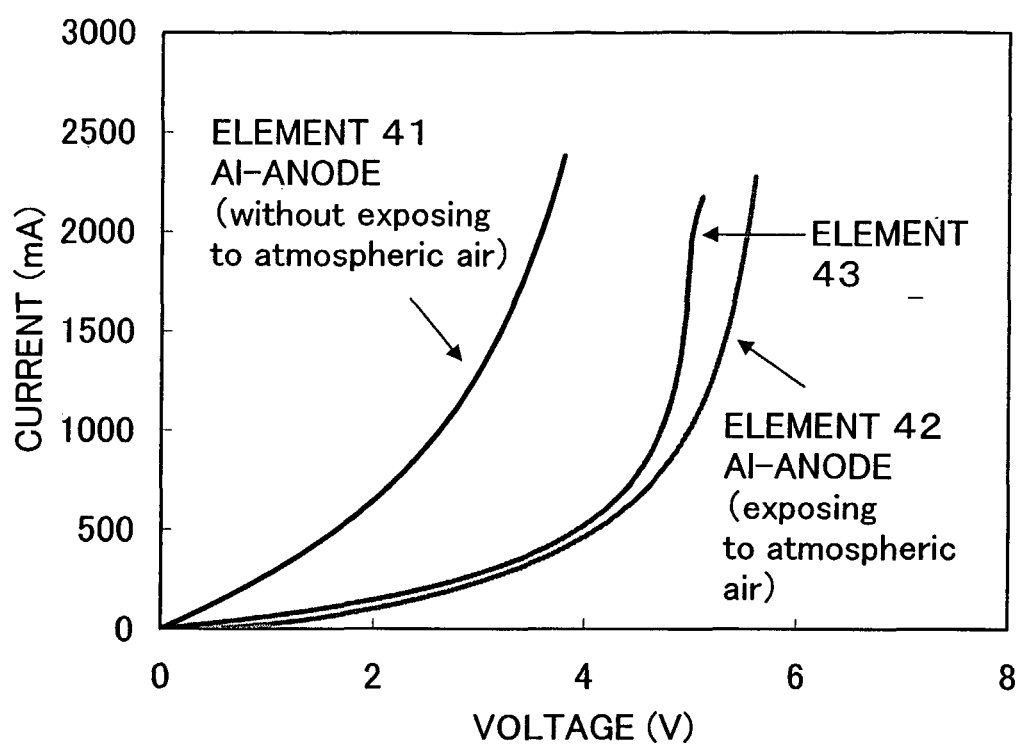
FIG. 35 is a graph showing a current-voltage characteristic of a layer containing a composite material of the present invention.

Measurement results of the current-voltage characteristics of the elements 31 to 33 at room temperature (25° C.) are shown in FIG. 35. As known from FIG. 35, even in the case where aluminum was used as the first electrode (element 41), a favorable current-voltage characteristic was obtained by successively forming the layer containing the composite material of the present invention without exposing the first electrode to the atmospheric air. Further, the current-voltage characteristic of the element 42 exposed to the atmospheric air, in which aluminum was used as the first electrode, was shifted to a high voltage side. The current-voltage characteristic of the element 43 having the first electrode made from ITSO, which has been normally used as an anode, was shifted to a high voltage side, as compared to the element 41.

As compared to ITSO which has been conventionally used as an anode, aluminum has a lower work function, and therefore, when aluminum had been used as an anode, a favorable characteristic could not be obtained. However, by using a composite material of the present invention, a material for an electrode can be selected regardless of a work function.

Moreover, aluminum has high reflectance. Therefore, an aluminum material having high reflectance can be used as an anode, making it possible to improve extraction efficiency of light emission to an external portion.

Embodiment 10

A light emitting element using a composite material of the present invention will be described in this embodiment.

First, a first electrode was formed over a glass substrate using indium tin oxide containing silicon oxide by sputtering. The thickness of the first electrode was set to be 110 nm, and area thereof was set to be 2 mm$^2$.

Next, a layer containing a composite material of the present invention was formed over the first electrode by co-evaporation of DNTPD and molybdenum oxide. Further, this layer containing the composite material of the present invention was formed such that a volume ratio of molybdenum oxide was 13 vol %. The film thickness was set to be 150 nm.

A hole transporting layer was formed using NPB by evaporation using resistance heating to have a thickness of 10 nm.

Further, a light emitting layer with a thickness of 40 nm was formed over the hole transporting layer by co-evaporation of Alq$_3$ and N,N'-diphenylquinacridone (abbreviation: DPQd). Here, a weight ratio between Alq$_3$ and DPQd was adjusted to be 1:0.005 (=Alq$_3$:DPQd).

Thereafter, an electron transporting layer with a thickness of 30 nm was formed over the light emitting layer using Alq$_3$ by evaporation using resistance heating.

In addition, an electron injecting layer with a thickness of 1 nm was formed using lithium fluoride by evaporation using resistance heating.

A second electrode with a thickness of 200 nm was formed over the electron injecting layer by evaporation using resistance heating. Thus, a light emitting element 51 of the present invention was manufactured.

Comparative Example 3

A light emitting element, which is a comparative example with respect to the light emitting element described in Embodiment 10, was manufactured.

First, a first electrode was formed over a glass substrate using indium tin oxide containing silicon oxide by sputtering. The thickness of the first electrode was set to be 110 nm, and an area thereof was set to be 2 mm$^2$.

Next, a film was formed over the first electrode using DNTPD by evaporation to have a thickness of 50 nm.

A hole transporting layer was formed using NPB by evaporation using resistance heating to have a thickness of 10 nm.

Further, a light emitting layer with a thickness of 40 nm was formed over the hole transporting layer by co-evaporation of Alq$_3$ and N,N'-diphenylquinacridone (abbreviation: DPQd). Here, a weight ratio between Alq$_3$ and DPQd was adjusted to be 1:0.005 (=Alq$_3$:DPQd).

Thereafter, an electron transporting layer with a thickness of 30 nm was formed over the light emitting layer using Alq$_3$ by evaporation using resistance heating.

In addition, an electron injecting layer with a thickness of 1 nm was formed using lithium fluoride by evaporation using resistance heating.

A second electrode with a thickness of 200 nm was formed over the electron injecting layer by evaporation using resistance heating. Thus, a comparative light emitting element 52 was manufactured.

Comparative Example 4

A light emitting element, which is a comparative example of the light emitting element described in Embodiment 10, was manufactured.

First, a first electrode was formed over a glass substrate using indium tin oxide containing silicon oxide by sputtering. The thickness of the first electrode was set to be 110 nm, and an area thereof was set to be 2 mm$^2$.

Next, a film was formed over the first electrode using copper phthalocyanine (CuPc) by evaporation to have a thickness of 20 nm.

A hole transporting layer was formed using NPB by evaporation using resistance heating to have a thickness of 40 nm.

Further, a light emitting layer with a thickness of 40 nm was formed over the hole transporting layer by co-evaporation of Alq$_3$ and N,N'-diphenylquinacridone (abbreviation: DPQd). Here, a weight ratio between Alq$_3$ and DPQd was adjusted to be 1:0.005 (=Alq$_3$:DPQd).

Thereafter, an electron transporting layer with a thickness of 30 nm was formed over the light emitting layer using Alq$_3$ by evaporation using resistance heating.

In addition, an electron injecting layer with a thickness of 1 nm was formed using lithium fluoride by evaporation using resistance heating.

A second electrode with a thickness of 200 nm was formed over the electron injecting layer by evaporation using resistance heating. Thus, a comparative light emitting element 53 was manufactured.

Figure 36:
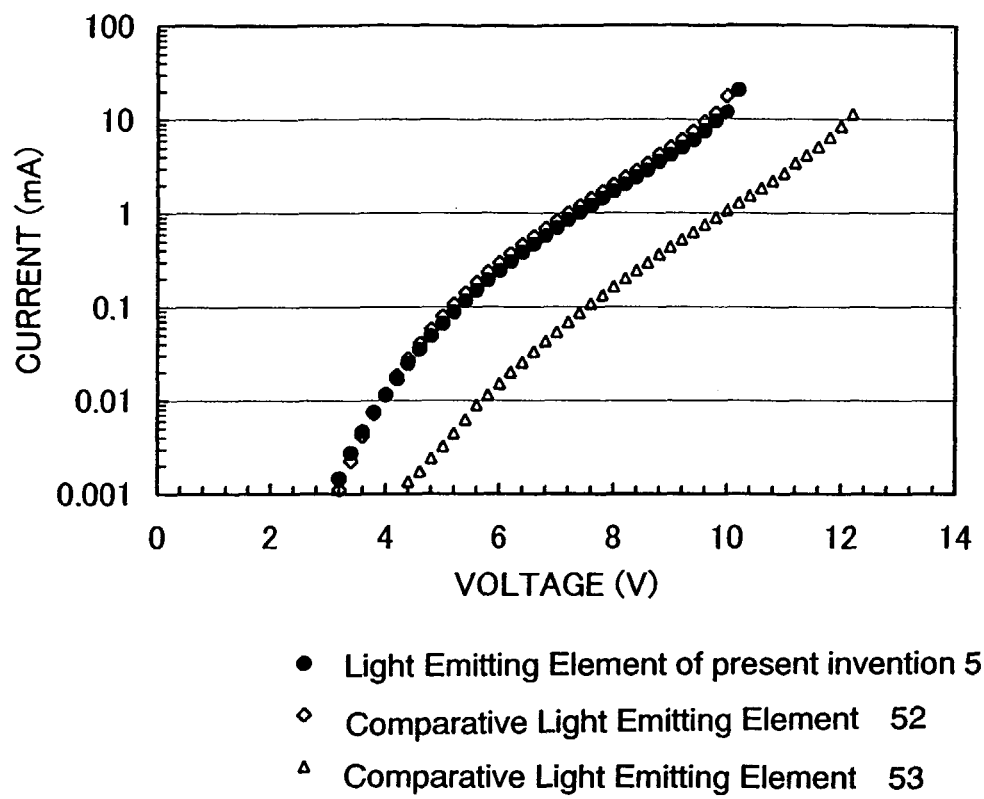
FIG. 36 is a graph showing current-voltage characteristics of light emitting elements.
Figure 37:
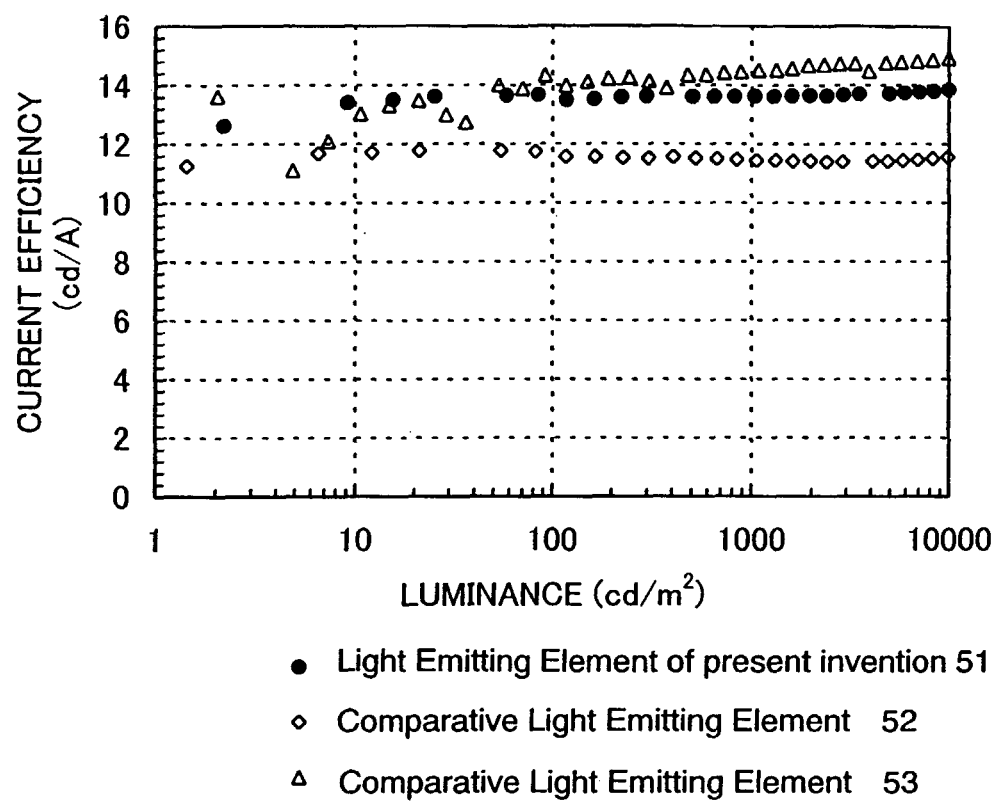
FIG. 37 is a graph showing luminance-current efficiency characteristics of light emitting elements.
Figure 38:
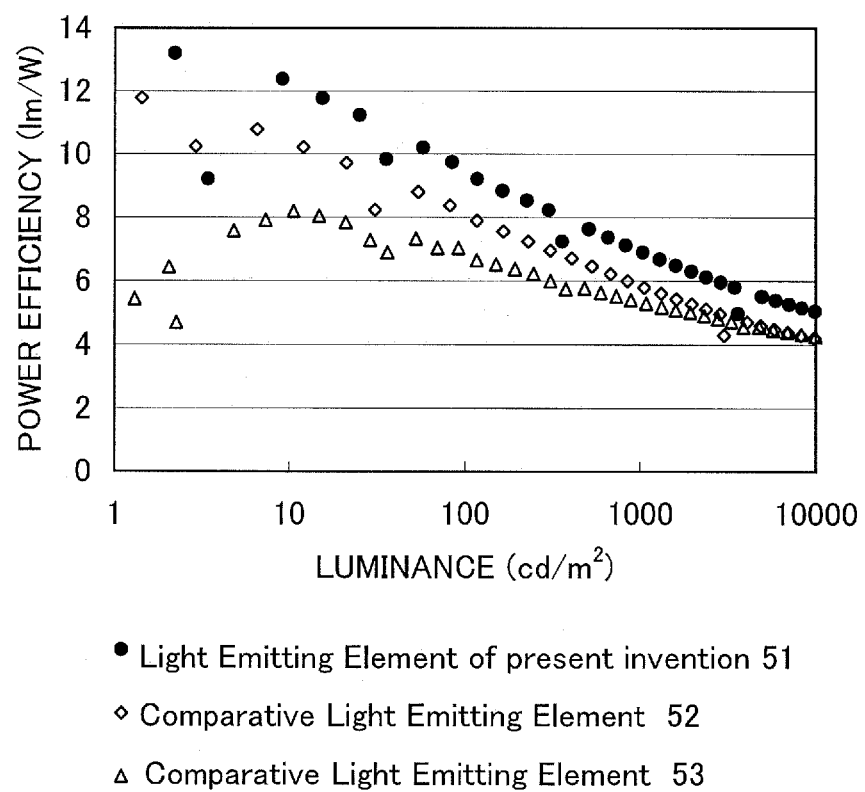
FIG. 38 is a graph showing luminance-power efficiency characteristics of light emitting elements.

Current-voltage characteristics of the light emitting element 51 of the present invention manufactured in Embodiment 10, the comparative light emitting element 52 manufactured in Comparative Example 3, and the comparative light emitting element 53 manufactured in Comparative Example 4, are shown in FIG. 36. Further, luminance-current efficiency characteristics thereof are shown in FIG. 37. Furthermore, luminance-power efficiency characteristics thereof are shown in FIG. 38.

As from FIG. 36, it is known that the comparative light emitting element 52 using DNTPD and the light emitting element 51 of the present invention exhibited more favorable current-voltage characteristics as compared to the comparative light emitting element 53 using CuPc. That is, an amount of current, which flows through the comparative light emitting element 52 and the light emitting element 51 of the present invention when applying constant voltage, is larger than that of the comparative light emitting element 53.

On the other hand, as from FIG. 37, it is known that the comparative light emitting element 53 and the light emitting element 51 of the present invention exhibited more favorable luminance-current efficiency characteristics as compared to the comparative light emitting element 52. That is, the comparative light emitting element 53 and the light emitting element 51 of the present invention require less amount of current to obtain constant luminance.

The light emitting element 51 of the present invention exhibits both favorable current-voltage characteristic and favorable luminance-current efficiency characteristic, and therefore, the light emitting element 51 consumes less power. As shown in FIG. 38, the light emitting element 51 of the present invention exhibits a more favorable luminance-power efficiency characteristic as compared to the comparative light emitting elements 52 and 53, and thus the light emitting element 51 consumes less power.

As a consequence, by using a layer containing a composite material of the present invention, a light emitting element consuming less power can be obtained.

Embodiment 11

A light emitting element using a composite material of the present invention will be described in this embodiment.

First, a first electrode was formed over a glass substrate using indium tin oxide containing silicon oxide by sputtering. The thickness of the first electrode was set to be 110 nm, and an area thereof was set to be 2 mm$^2$.

Next, a layer containing a composite material of the present invention was formed over the first electrode by co-evaporation of DNTPD and molybdenum oxide. Further, this layer containing the composite material of the present invention was formed such that a volume ratio of molybdenum oxide was 13 vol %. The film thickness was set to be 150 nm.

A hole transporting layer was formed using NPB by evaporation using resistance heating to have a thickness of 10 nm.

Further, a light emitting layer with a thickness of 30 nm was formed over the hole transporting layer by co-evaporation of NPB and bis[2,3-bis(4-fluorophenyl) quinoxalinato] iridium (acetylacetonato) (abbreviation: Ir(Fdpq)$_2$(acac)). Here, a weight ratio between NPB and Ir(Fdpq)$_2$(acac) was adjusted to be 1:0.08 (=NPB:Ir(Fdpq)$_2$(acac)).

Thereafter, an electron transporting layer with a thickness of 60 nm was formed using Alq$_3$ over the light emitting layer by evaporation using resistance heating.

In addition, an electron injecting layer with a thickness of 1 nm was formed using lithium fluoride over the electron transporting layer by evaporation using resistance heating.

A second electrode with a thickness of 200 nm was formed over the electron injecting layer by evaporation using resistance heating. Thus, a light emitting element 61 of the present invention was manufactured.

Comparative Example 5

A comparative light emitting element, which is a comparative example with respect to the light emitting element described in Embodiment 11, was manufactured.

First, a first electrode was formed using indium tin oxide containing silicon oxide over a glass substrate by sputtering. The thickness of the first electrode was set to be 110 nm, and an area thereof was set to be 2 mm$^2$.

Next, a film including DNTPD was formed over the first electrode by evaporation to have a thickness of 50 nm.

A hole transporting layer was formed using NPB by evaporation using resistance heating to have a thickness of 10 nm.

Further, a light emitting layer with a thickness of 30 nm was formed over the hole transporting layer by co-evaporation of NPB and bis[2,3-bis(4-fluorophenyl) quinoxalinato] iridium (acetylacetonato) (abbreviation: Ir(Fdpq)$_2$(acac)). Here, a weight ratio between NPB and Ir(Fdpq)$_2$(acac) was adjusted to be 1:0.08 (=NPB:Ir(Fdpq)$_2$(acac)).

Thereafter, an electron transporting layer with a thickness of 60 nm was formed using Alq$_3$ over the light emitting layer by evaporation using resistance heating.

In addition, an electron injecting layer with a thickness of 1 nm was formed using lithium fluoride by evaporation using resistance heating.

A second electrode with a thickness of 200 nm was formed using aluminum over the electron injecting layer by evaporation using resistance heating. Thus, a comparative light emitting element 62 was manufactured.

Comparative Example 6

A comparative light emitting element, which is a comparative example with respect to the light emitting element described in Embodiment 11, was manufactured.

First, a first electrode was formed using indium tin oxide containing silicon oxide over a glass substrate by sputtering. The thickness of the first electrode was set to be 110 nm, and an area thereof was set to be 2 mm$^2$.

Next, a film including copper phthalocyanine (CuPc) was formed over the first electrode by evaporation to have a thickness of 20 nm.

A hole transporting layer was formed using NPB by evaporation using resistance heating to have a thickness of 40 nm.

Further, a light emitting layer with a thickness of 30 nm was formed over the hole transporting layer by co-evaporation of NPB and bis[2,3-bis(4-fluorophenyl) quinoxalinato] iridium (acetylacetonato) (abbreviation: Ir(Fdpq)$_2$(acac)). Here, a weight ratio between NPB and Ir(Fdpq)$_2$(acac) was adjusted to be 1:0.08 (=NPB:Ir(Fdpq)$_2$(acac)).

Thereafter, an electron transporting layer with a thickness of 60 nm was formed using Alq$_3$ over the light emitting layer by evaporation using resistance heating.

In addition, an electron injecting layer with a thickness of 1 nm was formed using lithium fluoride by evaporation using resistance heating.

A second electrode with a thickness of 200 nm was formed over the electron injecting layer by evaporation using resistance heating. Thus, a comparative light emitting element 63 was manufactured.

Figure 39:
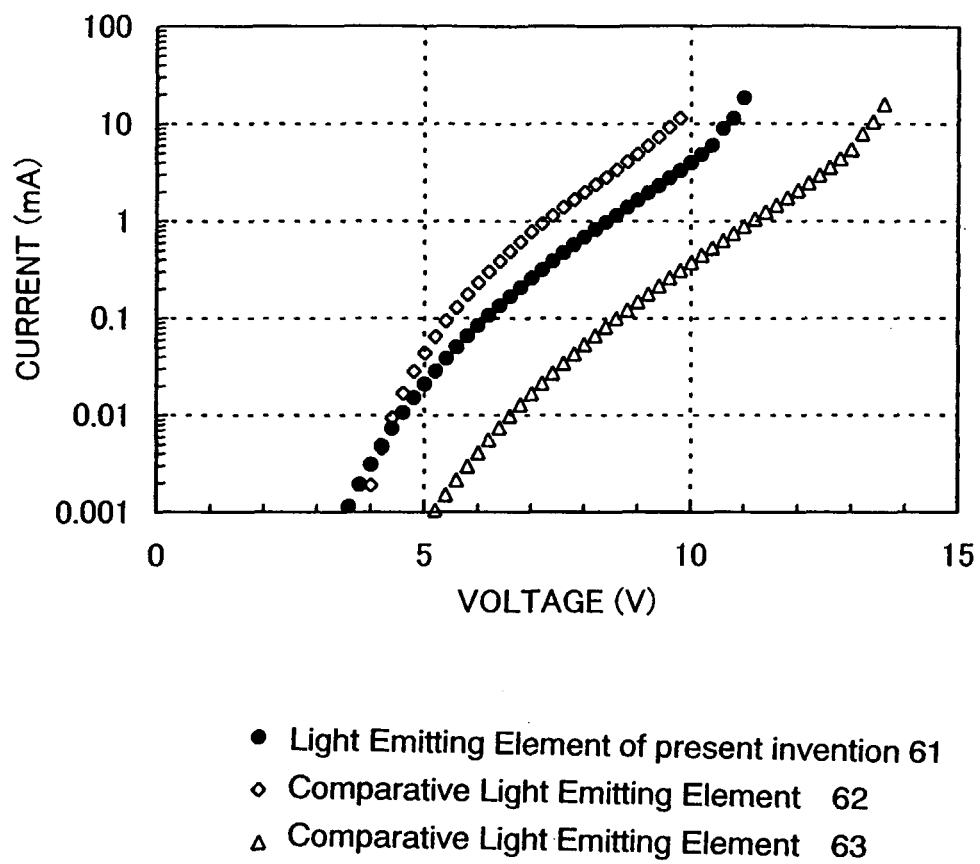
FIG. 39 is a graph showing current-voltage characteristics of light emitting elements.
Figure 40:
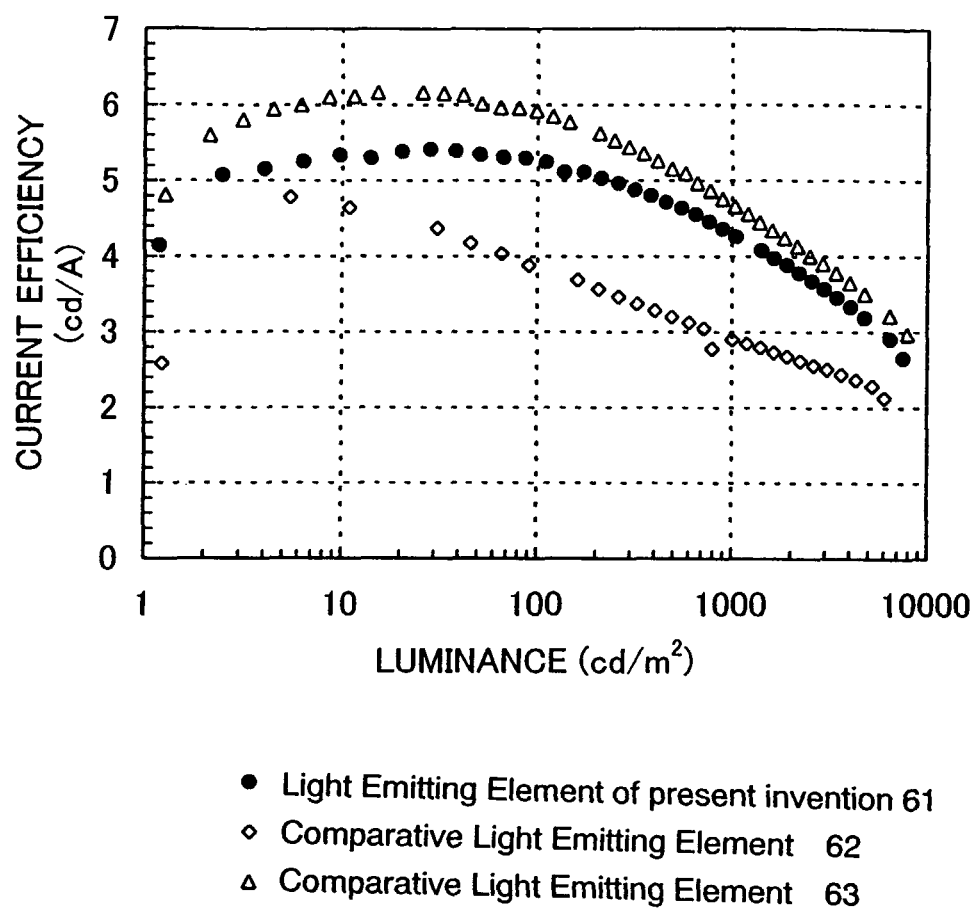
FIG. 40 is a graph showing luminance-current efficiency characteristics of light emitting elements.
Figure 41:
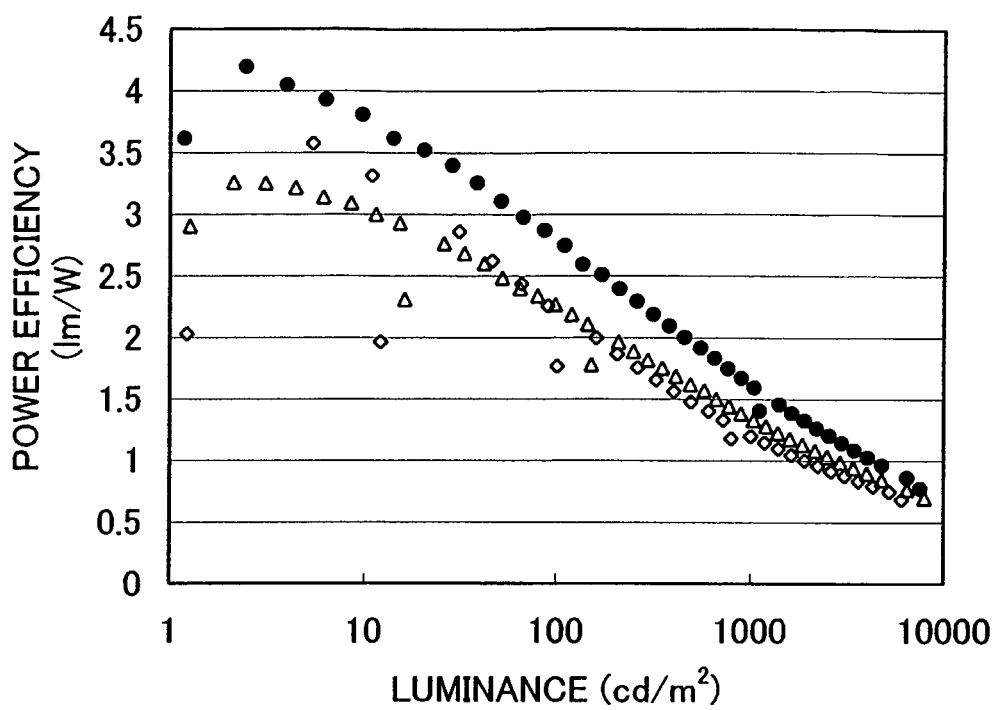
FIG. 41 is a graph showing luminance-power efficiency characteristics of light emitting elements.

Current-voltage characteristics of the light emitting element 61 of the present invention manufactured in Embodiment 11, the comparative light emitting element 62 manufactured in Comparative Example 5, and the comparative light emitting element 63 manufactured in Comparative Example 6, are shown in FIG. 39. Also, luminance-current efficiency characteristics thereof are shown in FIG. 40. In addition, luminance-power efficiency characteristics thereof are shown in FIG. 41.

As from FIG. 39, it is known that the comparative light emitting element 62 using DNTPD and the light emitting element 61 of the present invention exhibit more favorable current-voltage characteristics as compared to the comparative light emitting element 63 using CuPc. That is, an amount of current, which flows through the comparative light emitting element 62 and the light emitting element 61 of the present invention when applying constant voltage to them, is larger than that of the comparative light emitting element 63.

On the other hand, as from FIG. 40, it is known that the comparative light emitting element 63 and the light emitting element 61 of the present invention exhibit more favorable luminance-current efficiency characteristics as compared to the comparative light emitting element 62. That is, the comparative light emitting element 63 and the light emitting element 61 of the present invention require less amount of current to obtain constant luminance.

The light emitting element 61 of the present invention exhibits both favorable current-voltage characteristic and favorable luminance-current efficiency characteristic, and therefore, the light emitting element 61 consumes less power. As shown in FIG. 41, the light emitting element 61 of the present invention exhibits a more favorable luminance-power efficiency characteristic as compared to the comparative light emitting elements 62 and 63, and thus the light emitting element 61 consumes less power.

As a consequence, by using a layer containing a composite material of the present invention, a light emitting element consuming less power can be obtained.

Embodiment 12

A light emitting element using a composite material of the present invention will be described in this embodiment. The light emitting element described in this embodiment emits light through an opposite side of a substrate.

First, a first electrode was formed using titanium (Ti) over a glass substrate. The thickness of the first electrode was set to be 110 nm and an area thereof was set to be 2 mm$^2$.

Next, a layer containing a composite material of the present invention was formed over the first electrode by co-evaporation of DNTPD, molybdenum oxide, and rubrene. Further, a weight ratio between DNTPD, molybdenum oxide, and rubrene was set to be 1:0.15:0.04 (DNTPD:molybdenum oxide:rubrene). Further, the thickness of the layer containing the composite material was set to be 40 nm.

Next, a hole transporting layer was formed over the layer containing the composite material of the present invention by evaporation of NPB to have a thickness of 10 nm.

Subsequently, a light emitting layer was formed over the hole transporting layer by co-evaporation of $Alq_3$ and coumarin 6 to have a thickness of 40 nm. Further, a weight ratio between $Alq_3$ and coumarin 6 was set to be 1:0.015 ($Alq_3$:coumarin 6).

An electron transporting layer was formed using $Alq_3$ over the light emitting layer by evaporation using resistance heating to have a thickness of 20 nm.

Next, an electron injecting layer was formed over the electron transporting layer by co-evaporation of lithium (Li) and 4,4'-bis(5-methylbenzoxazole-2-yl) stilbene (abbreviation: BzOS). A weight ratio between Li and BzOS was set to be 0.02:1 (=Li:BzOS). Further, the thickness of the electron injecting layer was set to be 20 nm.

Next, a second electrode was formed using ITO over the electron injecting layer by sputtering to have a thickness of 110 nm. Thus, a light emitting element 71 of the present invention was manufactured.

Comparative Example 7

A comparative light emitting element, which is a comparative example with respect to the light emitting element described in Embodiment 12, was manufactured.

First, a first electrode was formed using titanium (Ti) over a glass substrate. The thickness of the first electrode was set to be 110 nm and an area thereof was set to be 2 mm$^2$.

Next, a hole injecting layer was formed using copper phthalocyanine (CuPc) over the first electrode by evaporation using resistance heating to have a thickness of 20 nm.

Next, a hole transporting layer was formed using NPB by evaporation using resistance heating to have a thickness of 40 nm.

Subsequently, a light emitting layer was formed over the hole transporting layer by co-evaporation of $Alq_3$ and coumarin 6 to have a thickness of 40 nm. Further, a weight ratio between $Alq_3$ and coumarin 6 was set to be 1:0.015 ($Alq_3$:coumarin 6).

An electron transporting layer was formed using $Alq_3$ over the light emitting layer by evaporation using resistance heating to have a thickness of 20 nm.

Next, an electron injecting layer was formed over the electron transporting layer by co-evaporation of lithium (Li) and 4,4'-bis(5-methylbenzoxazole-2-yl) stilbene (abbreviation: BzOS). A weight ratio between Li and BzOS was set to be 0.02:1 (=Li:BzOS). Further, the thickness of the electron injecting layer was set to be 20 nm.

Next, a second electrode was formed using ITO over the electron injecting layer by sputtering to have a thickness of 110 nm. Thus, a comparative light emitting element 72 was manufactured.

Figure 43:
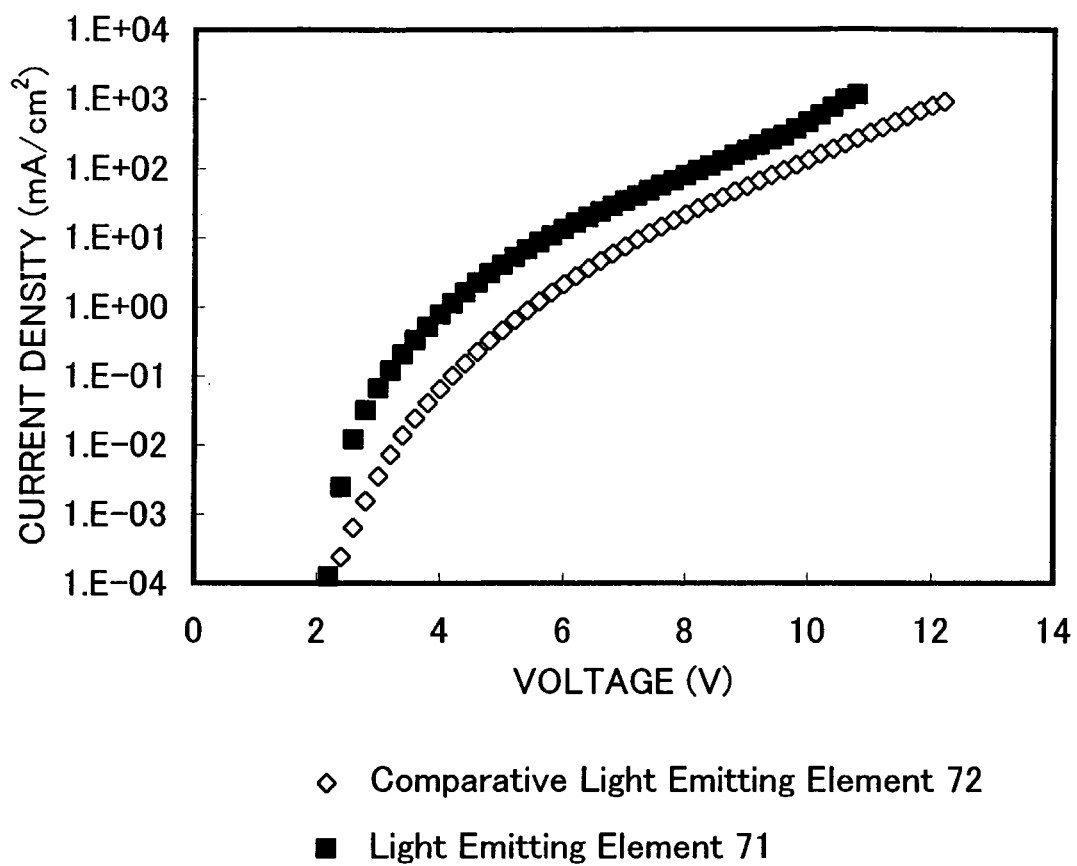
FIG. 43 is a graph showing current-voltage characteristics of light emitting elements.

Current-voltage characteristics of the light emitting element 71 of the present invention manufactured in Embodiment 12 and the comparative light emitting element 72 manufactured in Comparative Example 7 are shown in FIG. 43. The organization of the element of FIG. 43 is shown in the following table,

| mode of element | anode | MoOx layer | hole transporting layer | light emitting layer | electron transporting layer | electron injecting layer | cathode |
|---|---|---|---|---|---|---|---|
| embodiment | Ti | DNTPD:MoOx:Ruburene (1:0.15:0.04 wt/wt/wt) 40 nm | NPB 10 nm | Alq:C6 (1:0.015 wt/wt) 40 nm | Alq 20 nm | BzOs 20 nm | ITO 110 nm |
| comparative example | Ti | CuPc (layer for comparing) 20 nm | NPB 40 nm | Alq:C6 (1:0.015 wt/wt) 40 nm | Alq 20 nm | BzOs 20 nm | ITO 110 nm |

C6 = Coumarin6

Figure 44:
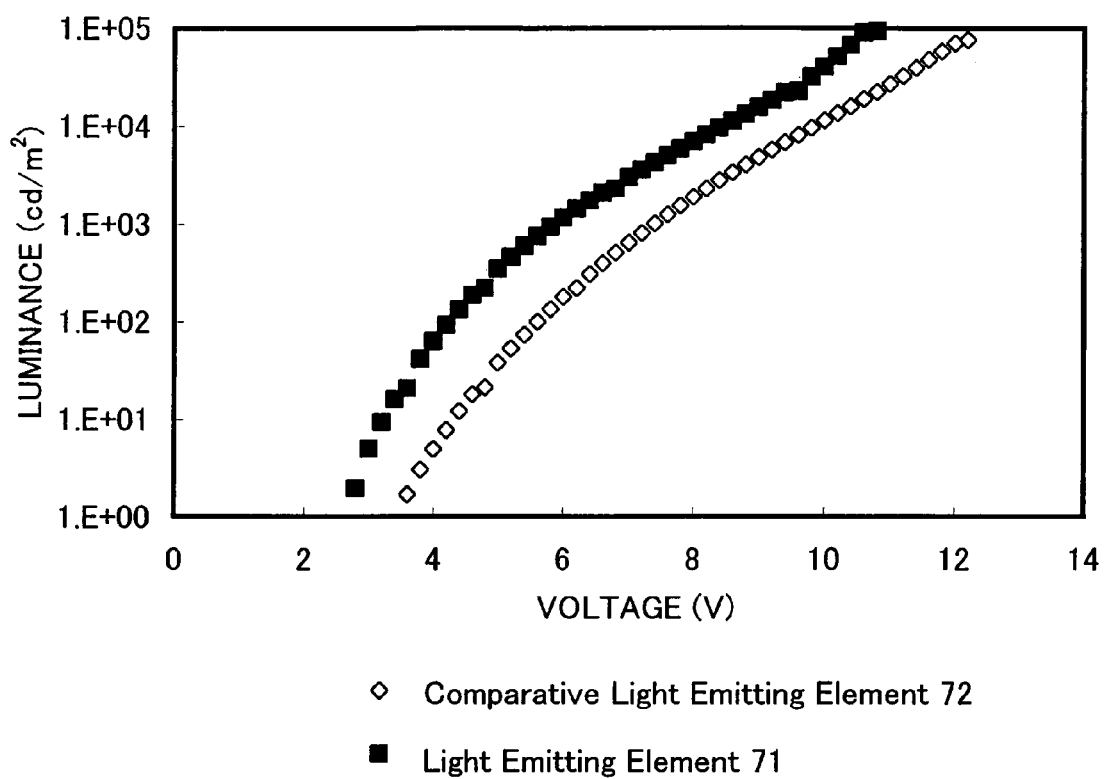
FIG. 44 is a graph showing voltage-luminance characteristics of light emitting elements.

Further, voltage-luminance characteristics thereof are shown in FIG. 44. The organization of the element of FIG. 44 is shown in the following table,

| mode of element | anode | MoOx layer | hole transporting layer | light emitting layer | electron transporting layer | electron injecting layer | cathode |
|---|---|---|---|---|---|---|---|
| embodiment | Ti | DNTPD:MoOx:Ruburene (1:0.15:0.04 wt/wt/wt) 40 nm | NPB 10 nm | Alq:C6 (1:0.015 wt/wt) 40 nm | Alq 20 nm | BzOs 20 nm | ITO 110 nm |
| comparative example | Ti | CuPc 20 nm | NPB 40 nm | Alq:C6 (1:0.015 wt/wt) 40 nm | Alq 20 nm | BzOs 20 nm | ITO 110 nm |

C6 = Coumarin6

Figure 45:
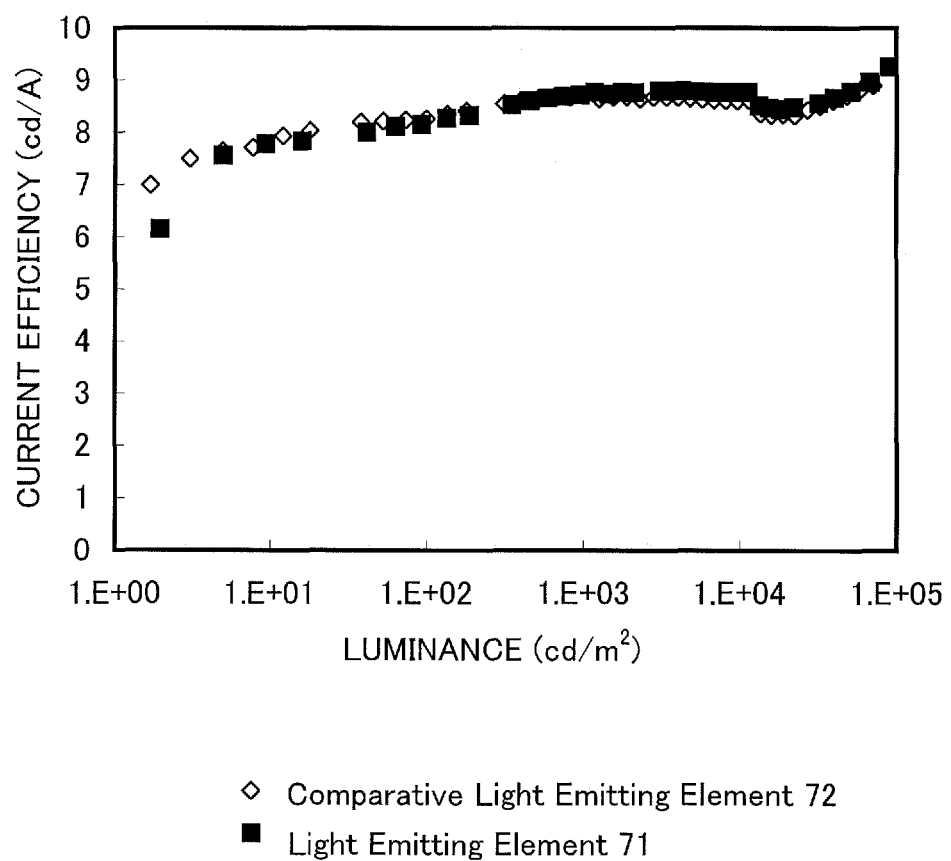
FIG. 45 is a graph showing current efficiency-luminance characteristics of light emitting elements.

Furthermore, current efficiency-luminance characteristics thereof are shown in FIG. 45. The organization of the element of FIG. 45 is shown in the following table,

| mode of element | anode | MoOx layer | hole transporting layer | light emitting layer | electron transporting layer | electron injecting layer | cathode |
|---|---|---|---|---|---|---|---|
| embodiment | Ti | DNTPD:MoOx:Ruburene (1:0.15:0.04 wt/wt/wt) 40 nm | NPB 10 nm | Alq:C6 (1:0.015 wt/wt) 40 nm | Alq 20 nm | BzOs 20 nm | ITO 110 nm |
| comparative example | Ti | CuPc (layer for comparing) 20 nm | NPB 40 nm | Alq:C6 (1:0.015 wt/wt) 40 nm | Alq 20 nm | BzOs 20 nm | ITO 110 nm |

C6 = Coumarin6

As from FIG. 43, it is known that the current-voltage characteristic of the light emitting element 71 of the present invention is more improved as compared to that of the comparative light emitting element 72. Further, as from FIGS. 44 and 45, it is known that voltage at the time of starting light emission of the light emitting element 71 is reduced about 1 V as compared to the comparative light emitting element 72. In addition, the amount of voltage at the luminance of 1,000 cd/m$^2$ was reduced about 2V. With respect to the current efficiency-luminance characteristics, the light emitting element 71 of the present invention and the comparative light emitting element 72 both exhibit favorable current efficiency-luminance characteristics.

As a consequence, by using a layer containing a composite material of the present invention, a light emitting element consuming less power can be obtained.

Embodiment 13

An optical design of a light emitting element using a layer containing a composite material of the present invention, will be described in this embodiment.

A layer containing a composite material of the present invention has higher conductivity as compared to that of an organic compound used in a conventional light emitting element such as Alq$_3$ and NPB. Therefore, even if the thickness of the layer containing the composite material of the present invention is increased, the current-voltage characteristic (I-V characteristic) thereof is not changed and driving voltage of the light emitting element does not increase. Accordingly, a distance between a light-emitting layer and a reflecting electrode, i.e., a thickness of the layer containing the composite material of the present invention can be arbitrarily controlled, making it possible to control an optical interference of light emission. That is, color purity or efficiency of light emission can be adjusted.

Results of changing a thickness of each layer containing a composite material of the present invention included in respective green, blue, red, and yellow light emitting elements are shown in FIGS. 46 to 49, as specific examples.

As a structure of each green light emitting element, a first electrode with a thickness of 20 nm was formed using indium tin oxide containing silicon oxide over titanium (Ti), and a layer containing a composite material of the present invention was formed over the first electrode. Specifically, the layer containing the composite material of the present invention was formed by co-evaporation of DNTPD, molybdenum oxide, and rubrene such that a weight ratio between DNTPD, molybdenum oxide, and rubrene was set to be 1:0.15:0.04 (=DNTPD:molybdenum oxide:rubrene). The thicknesses of the layers containing the composite material of the present invention included in each green light emitting element were set to be 20 nm, 40 nm, 60 nm, 80 nm, 100 nm, 120 nm, 140 nm, and 160 nm. Over each layer containing the composite material of the present invention, a hole transporting layer was formed using NPB with a thickness of 10 nm, and a light emitting layer was formed with a thickness of 40 nm using Alq$_3$ and coumarin 6 such that a weight ratio between Alq$_3$ and coumarin 6 was set to be 1:0.015 (=Alq$_3$: coumarin 6). Next, an electron transporting layer was formed with a thickness of 15 nm using Alq$_3$, and an electron injecting layer was formed with a thickness of 15 nm by co-evaporation of lithium (Li) and 4,4'-bis(5-methylbenzoxazole-2-yl) stilbene (abbreviation: BzOS) such that a weight ratio between Li and BzOS was set to be 0.01:1 (Li:BzOS). A second electrode was formed using ITO to have a thickness of 110 nm.

As a structure of each blue light emitting element, a first electrode was formed using indium tin oxide containing silicon oxide to have a thickness of 20 nm over titanium (Ti), and a layer containing a composite material of the present invention was formed over the first electrode. Specifically, the layer containing the composite material of the present invention was formed by co-evaporation of DNTPD, molybdenum oxide, and rubrene such that a weight ratio between DNTPD, molybdenum oxide, and rubrene was set to be 1:0.15:0.04 (=DNTPD:molybdenum oxide:rubrene). The thicknesses of the layers containing the composite material of the present invention included in each blue light emitting element were set to be 20 nm, 40 nm, 60 nm, 80 nm, 100 nm, 120 nm, 140 nm, and 160 nm. Over each layer containing the composite material of the present invention, a hole transporting layer was formed using NPB with a thickness of 10 nm, and a light emitting layer was formed with a thickness of 30 nm using 9,10-di(naphthalene-2-yl)-2-tert-buthylanthracene (abbreviation: TBDNA) and 2,5,8,11-tetra(tert-buthyl) perylene (abbreviation: TBP) such that a weight ratio between TBDNA and TBP was set to be 1:0.02 (=TBDNA:TBP). Next, an electron transporting layer was formed with a thickness of 15 nm using $Alq_3$, and an electron injecting layer was formed with a thickness of 15 nm by co-evaporation of lithium (Li) and 4,4'-bis(5-methylbenzoxazole-2-yl) stilbene (abbreviation: BzOS) such that a weight ratio between Li and BzOS was set to be 0.01:1 (Li:BzOS). A second electrode was formed with a thickness of 110 nm using ITO.

As a structure of each red light emitting element, a first electrode was formed using indium tin oxide containing silicon oxide to have a thickness of 20 nm over titanium (Ti), and a layer containing a composite material of the present invention was formed over the first electrode. Specifically, the layer containing the composite material of the present invention was formed by co-evaporation of DNTPD, molybdenum oxide, and rubrene such that a weight ratio between DNTPD, molybdenum oxide, and rubrene was set to be 1:0.15:0.04 (=DNTPD:molybdenum oxide:rubrene). The thicknesses of the layers containing the composite material of the present invention included in each red light emitting element were set to be 20 nm, 40 nm, 60 nm, 80 nm, 100 nm, 120 nm, 140 nm, and 160 nm, respectively. Over each layer containing the composite material of the present invention, a hole transporting layer was formed using NPB with a thickness of 10 nm, and a light emitting layer was formed with a thickness of 60 nm using $Alq_3$, rubrene, and 4-dicyanomethylene-2-isopropyl-6-[2-(1,1,7,7-tetramethyljulolidine-9-yl)ethenyl]-4H-pyran (abbreviation: DCJTI) such that a weight ratio between $Alq_3$, rubrene, and DCJTI was 1:1:0.032 (=$Alq_3$:rubrene:DCJTI). Next, an electron transporting layer was formed with a thickness of 15 nm using $Alq_3$, and an electron injecting layer was formed with a thickness of 15 nm by co-evaporation of lithium (Li) and 4,4'-bis(5-methylbenzoxazole-2-yl) stilbene (abbreviation: BzOS) such that a weight ratio between Li and BzOS was set to be 0.01:1 (Li:BzOS). A second electrode was formed with a thickness of 110 nm using ITO.

As a structure of each yellow light emitting element, a first electrode was formed using indium tin oxide containing silicon oxide to have a thickness of 20 nm over titanium (Ti), and a layer containing a composite material of the present invention was formed over the first electrode. Specifically, the layer containing the composite material of the present invention was formed by co-evaporation of DNTPD, molybdenum oxide, and rubrene such that a weight ratio between DNTPD, molybdenum oxide, and rubrene was set to be 1:0.15:0.04 (=DNTPD:molybdenum oxide:rubrene). The thicknesses of the layers containing the composite material of the present invention included in each yellow light emitting element were set to be 20 nm, 40 nm, 60 nm, 80 nm, 100 nm, 120 nm, 140 nm, and 160 nm, respectively. Over each layer containing the composite material of the present invention, a hole transporting layer was formed using NPB with a thickness of 10 nm, and a light emitting layer was formed with a thickness of 60 nm using $Alq_3$ and rubrene such that a weight ratio between $Alq_3$ and rubrene was 1:0.02 (=$Alq_3$:rubrene). Next, an electron transporting layer was formed with a thickness of 15 nm using $Alq_3$, and an electron injecting layer was formed with a thickness of 15 nm by co-evaporation of lithium (Li) and 4,4'-bis(5-methylbenzoxazole-2-yl) stilbene (abbreviation: BzOS) such that a weight ratio between Li and BzOS was set to be 0.01:1 (Li:BzOS). A second electrode was formed with a thickness of 110 nm using ITO.

As from FIGS. 46 to 49, it is known that current efficiency is sensitive to the thickness of each layer containing the composite material of the present invention.

Figure 46:
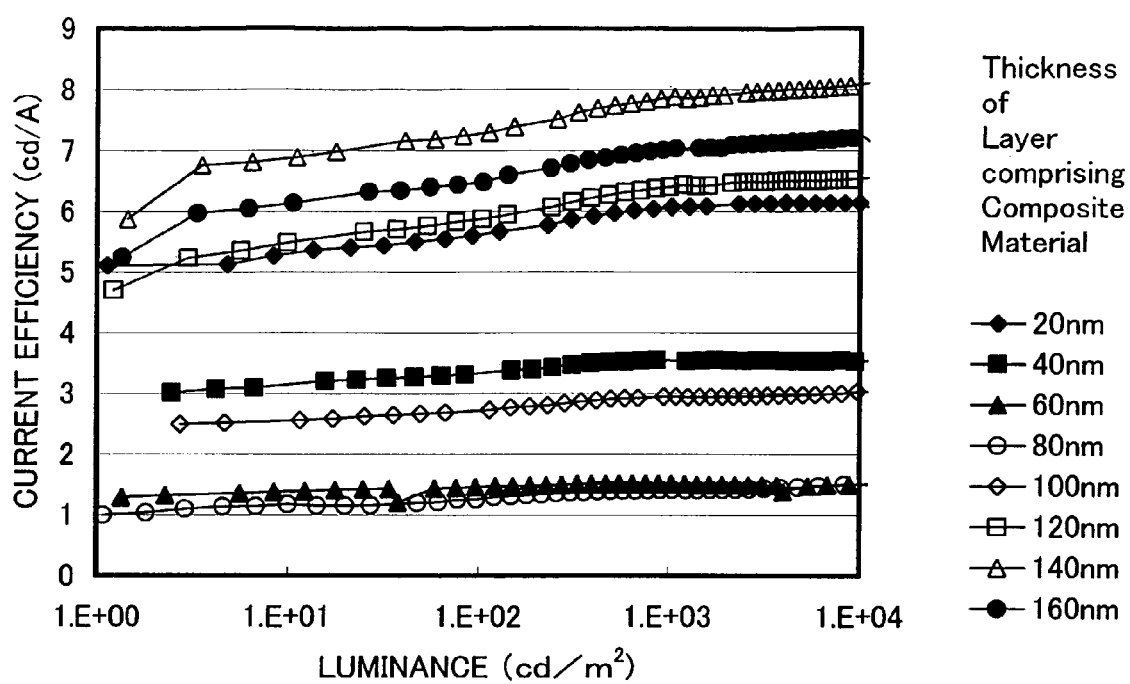
FIG. 46 is a graph showing current efficiency of green light emitting elements.

The organization of the element of FIG. 46 is shown in the following table,

| anode | MoOx layer | hole transporting layer | light emitting layer | electron transporting layer | electron injecting layer | cathode |
|---|---|---|---|---|---|---|
| Ti\ITSO (ITSO = 20 nm) | DNTPD:MoOx:Ruburene (1:0.15:0.04 wt/wt/wt) X nm | NPB 10 nm | Alq:C6 (1:0.015 wt/wt) 40 nm | Alq 15 nm | BzOs 15 nm | ITO 110 nm |

C6 = Coumarin6

Figure 47:
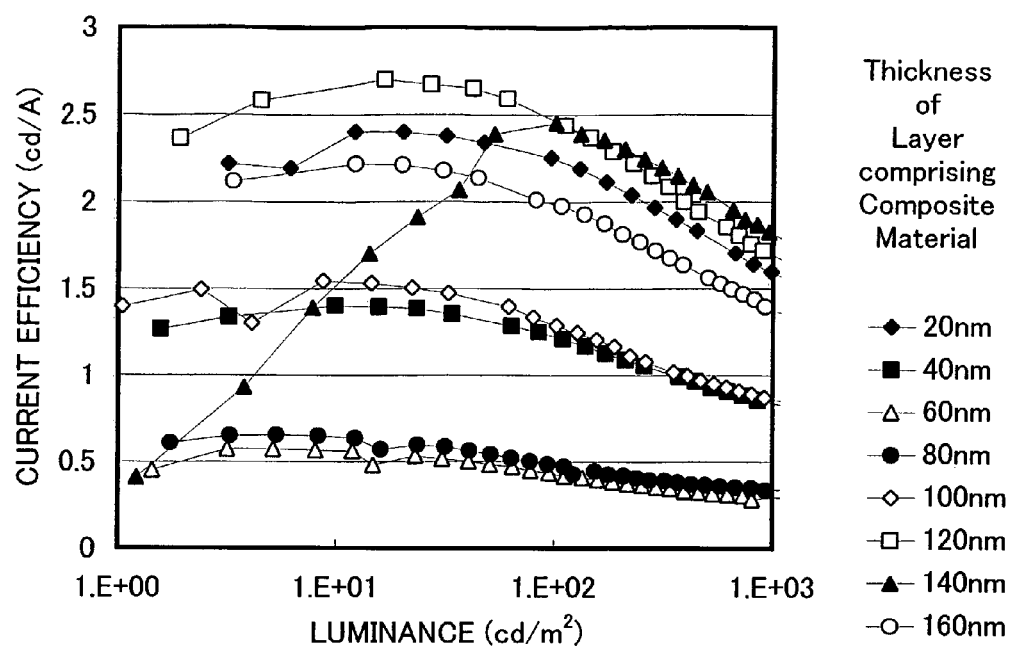
FIG. 47 is a graph showing current efficiency of blue light emitting elements.

The organization of the element of FIG. 47 is shown in the following table,

| anode | MoOx layer | hole transporting layer | light emitting layer | electron transporting layer | electron injecting layer | cathode |
|---|---|---|---|---|---|---|
| Ti\ITSO (ITSO = 20 nm) | DNTPD:MoOx:Ruburene (1:0.15:0.04 wt/wt/wt) X nm | NPB 10 nm | BEmL 30 nm | Alq 15 nm | BzOs 15 nm | ITO 110 nm |

Figure 48:
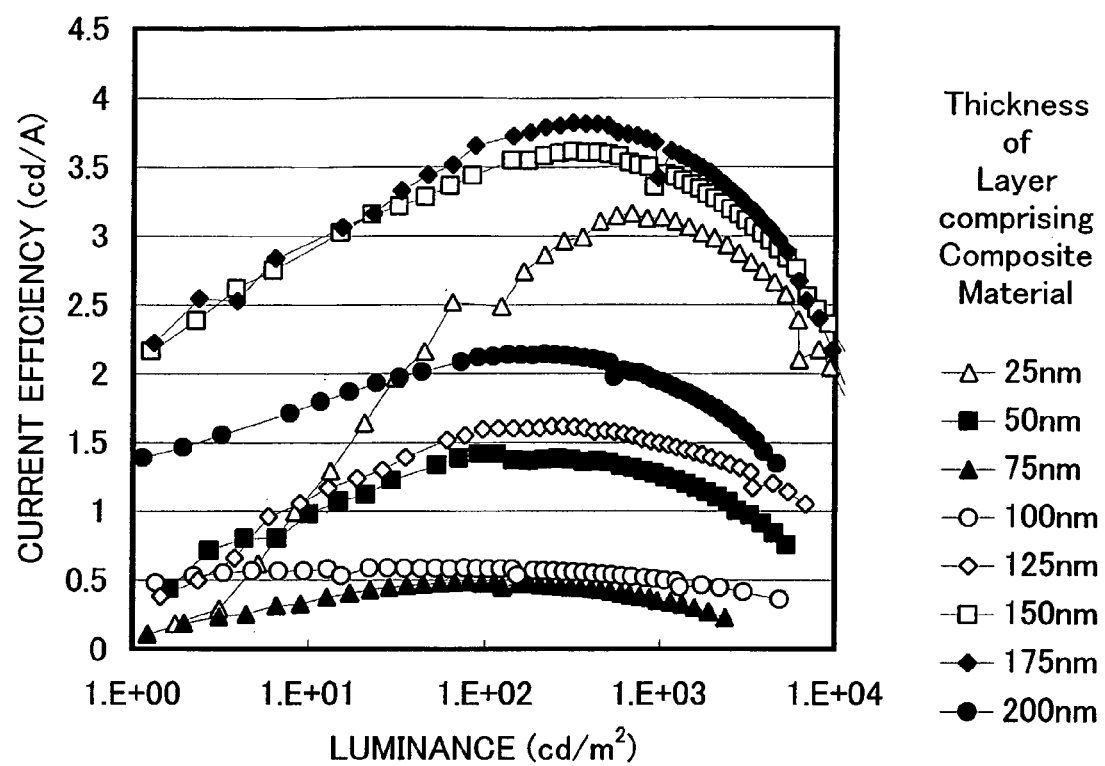
FIG. 48 is a graph showing current efficiency of red light emitting elements.

The organization of the element of FIG. 48 is shown in the following table,

| anode | MoOx layer | hole transporting layer | light emitting layer | electron transporting layer | electron injecting layer | cathode |
|---|---|---|---|---|---|---|
| Ti\ITSO (ITSO = 20 nm) | DNTPD:MoOx:Ruburene (1:0.15:0.04 wt/wt/wt) X nm | NPB 10 nm | REmL 60 nm | Alq 15 nm | BzOs 15 nm | ITO 110 nm |

Figure 49:
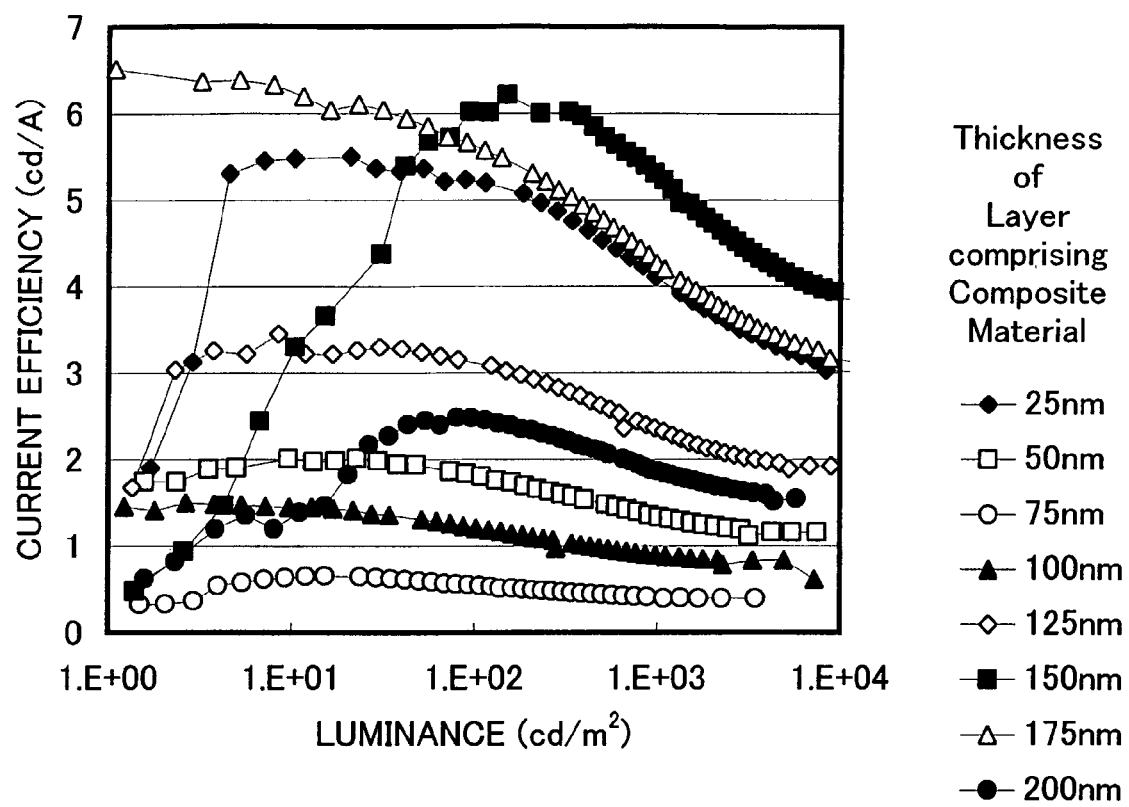
FIG. 49 is a graph showing current efficiency of yellow light emitting elements.

The organization of the element of FIG. 49 is shown in the following table,

| anode | MoOx layer | hole transporting layer | light emitting layer | electron transporting layer | electron injecting layer | cathode |
|---|---|---|---|---|---|---|
| Ti\ITSO (NITO = 20 nm) | DNTPD:MoOx:Ruburene (1:0.15:0.04 wt/wt/wt) X nm | NPB 10 nm | YEmL 60 nm | Alq 15 nm | BzOs 15 nm | ITO 110 nm |

This result is caused by an optical interference of light. Therefore, the changes in film thickness of the layer containing the composite material of the present invention affect not only the change in efficiency but also a shape of spectrum, chromaticity, and viewing-angle dependence. As a specific example, correlations between the viewing-angle dependence of spectrums for green, blue, and red light emitting elements and the thicknesses of the layers containing the composite material of the present invention, are shown in FIGS. 50A to 73B.

Figure 50A:
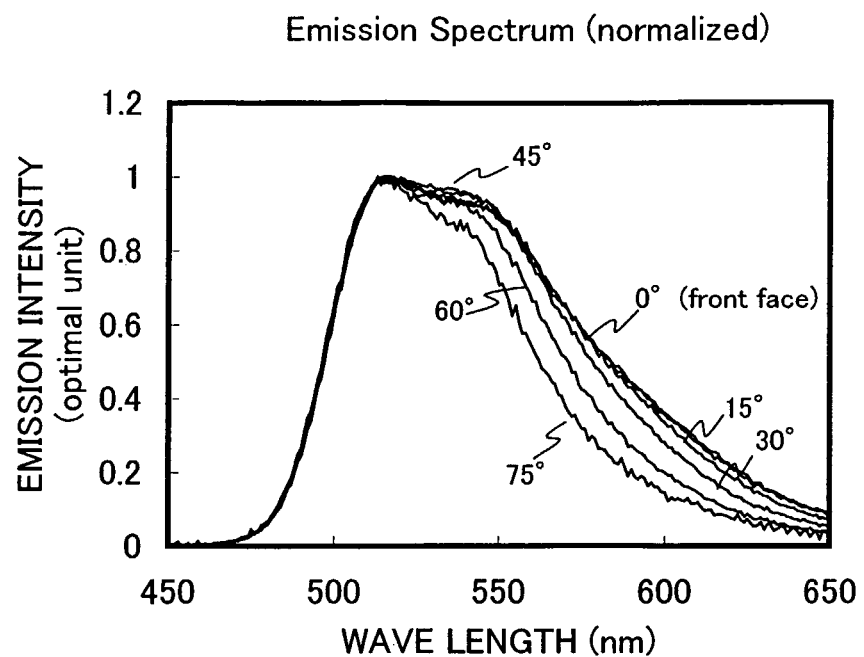
FIGS. 50A and 50B are graphs showing influence of a thickness of a layer containing a composite material on an emission spectrum of a green light emitting element.
Figure 50B:
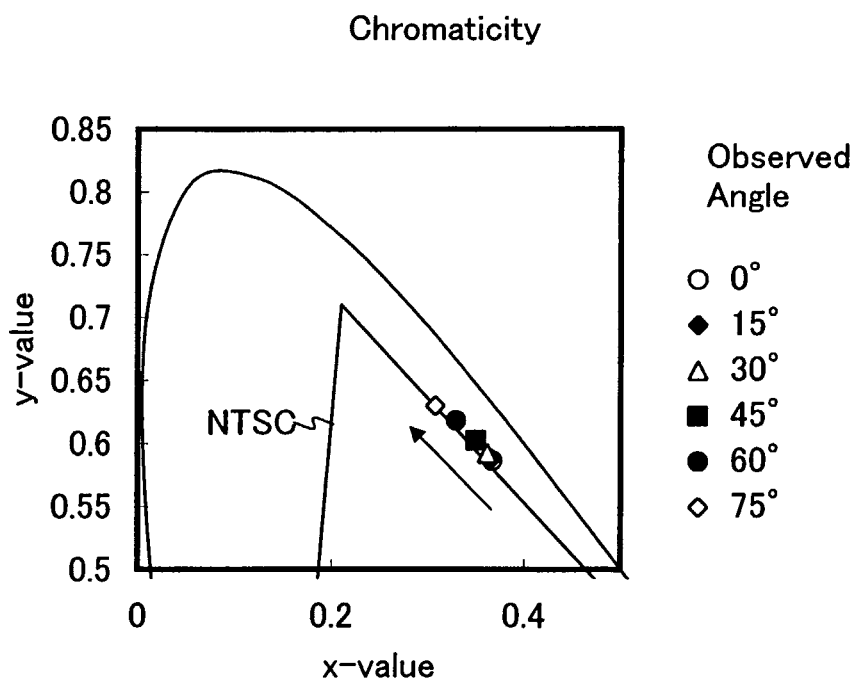

The organization of the element of FIGS. 50A and 50B is shown in the following table,

| anode | MoOx layer | hole transporting layer | light emitting layer | electron transporting layer | electron injecting layer | cathode |
|---|---|---|---|---|---|---|
| Ti\ITSO ITSO = 20 nm | DNTPD:MoOx:Ruburene (1:0.15:0.04 wt/wt/wt) 20 nm | NPB 10 nm | Alq:C6 (1:0.015 wt/wt) 40 nm | Alq 15 nm | BzOs 15 nm | ITO 110 nm |

C6 = Coumarin6

Figure 51A:
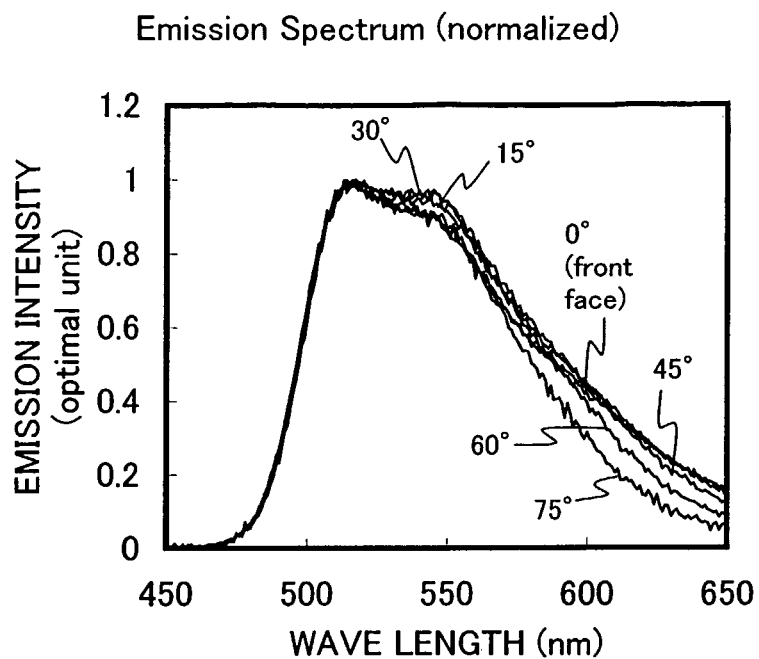
FIGS. 51A and 51B are graphs showing influence of a thickness of a layer containing a composite material on an emission spectrum of a green light emitting element.
Figure 51B:
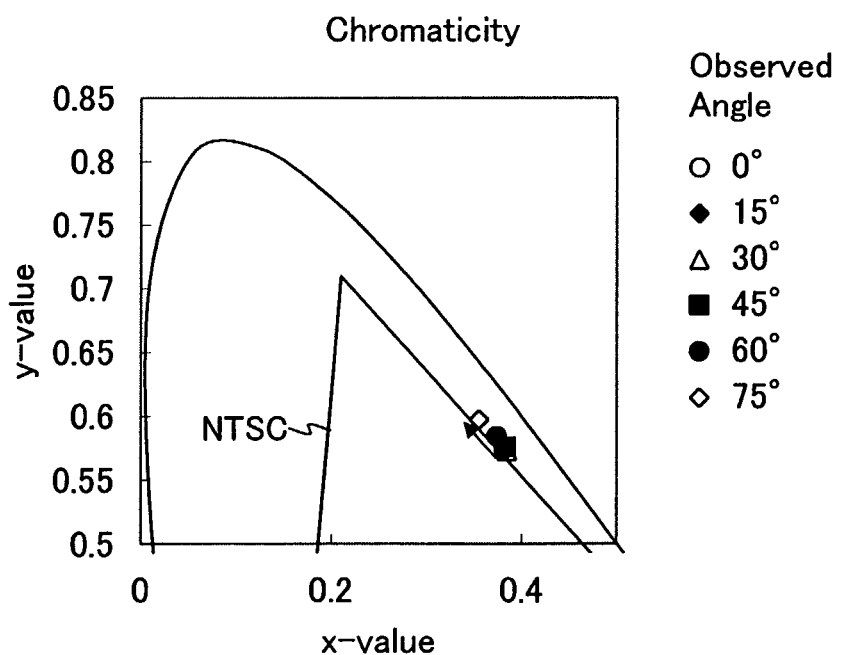

The organization of the element of FIGS. 51A and 51B is shown in the following table,

| anode | MoOx layer | hole transporting layer | light emitting layer | electron transporting layer | electron injecting layer | cathode |
|---|---|---|---|---|---|---|
| Ti\ITSO ITSO = 20 nm | DNTPD:MoOx:Ruburene (1:0.15:0.04 wt/wt/wt) 40 nm | NPB 10 nm | Alq:C6 (1:0.015 wt/wt) 40 nm | Alq 15 nm | BzOs 15 nm | ITO 110 nm |

C6 = Coumarin6

Figure 52A:
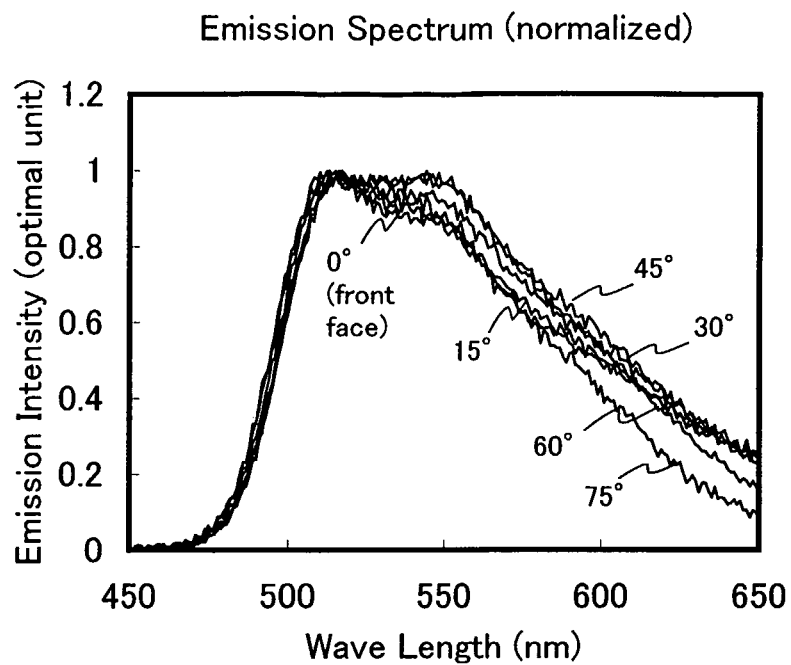
FIGS. 52A and 52B are graphs showing influence of a thickness of a layer containing a composite material on an emission spectrum of a green light emitting element.
Figure 52B:
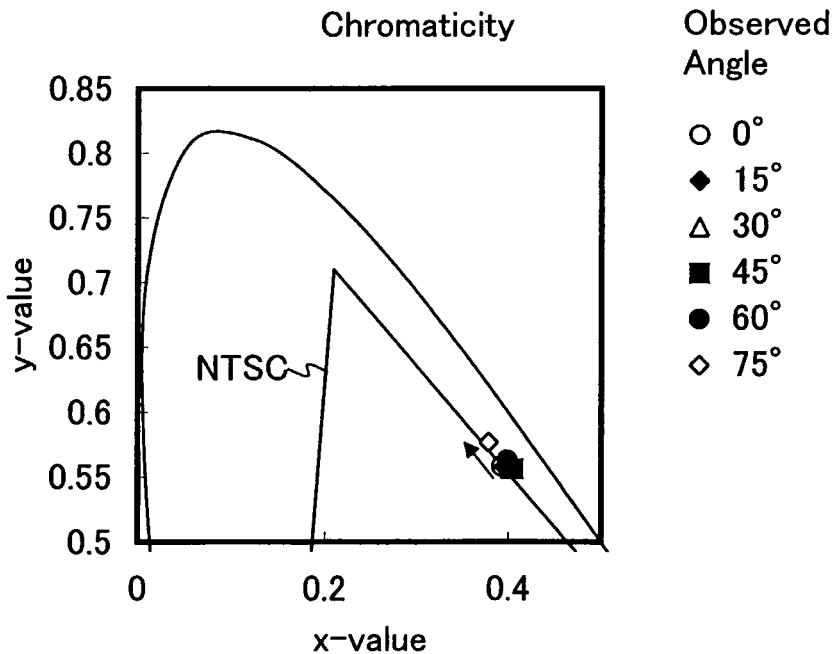

The organization of the element of FIGS. 52A and 52B is shown in the following table,

| anode | MoOx layer | hole transporting layer | light emitting layer | electron transporting layer | electron injecting layer | cathode |
|---|---|---|---|---|---|---|
| Ti\ITSO ITSO = 20 nm | DNTPD:MoOx:Ruburene (1:0.15:0.04 wt/wt/wt) 60 nm | NPB 10 nm | Alq:C6 (1:0.015 wt/wt) 40 nm | Alq 15 nm | BzOs 15 nm | ITO 110 nm |

C6 = Coumarin6

Figure 53A:
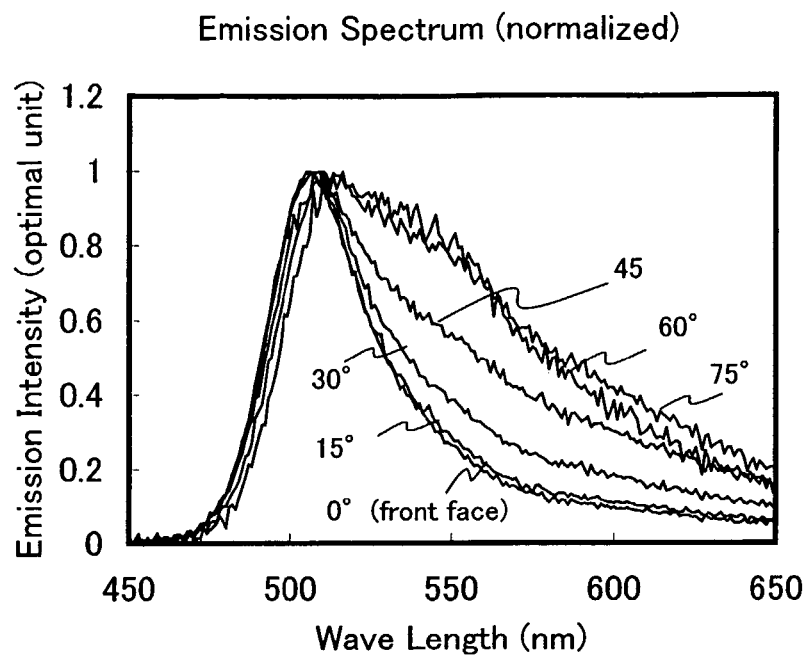
FIGS. 53A and 53B are graphs showing influence of a thickness of a layer containing a composite material on an emission spectrum of a green light emitting element.
Figure 53B:
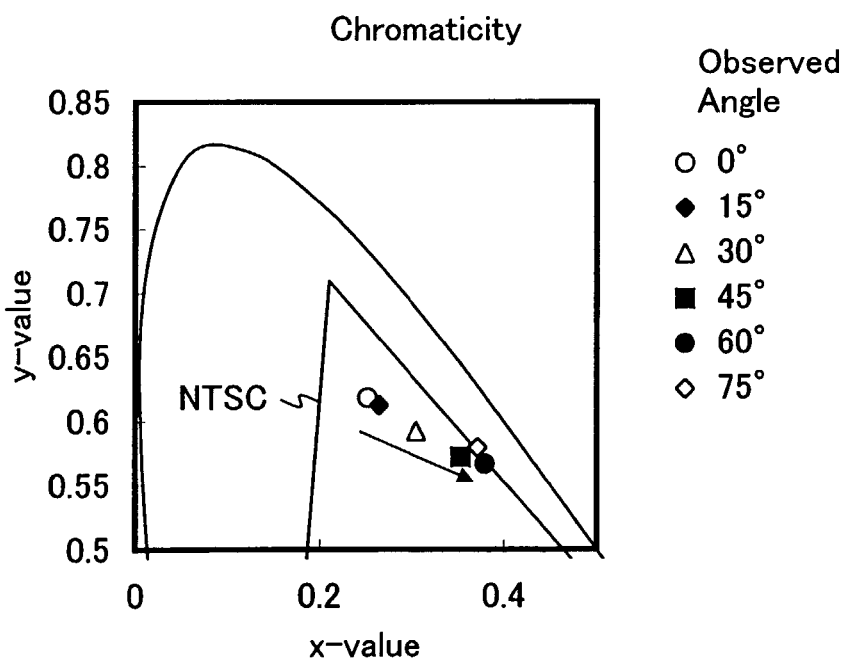

The organization of the element of FIGS. 53A and 53B is shown in the following table,

| anode | MoOx layer | hole transporting layer | light emitting layer | electron transporting layer | electron injecting layer | cathode |
|---|---|---|---|---|---|---|
| Ti\ITSO ITSO = 20 nm | DNTPD:MoOx:Ruburene (1:0.15:0.04 wt/wt/wt) 80 nm | NPB 10 nm | Alq:C6 (1:0.015 wt/wt) 40 nm | Alq 15 nm | BzOs 15 nm | ITO 110 nm |

C6 = Coumarin6

Figure 54A:
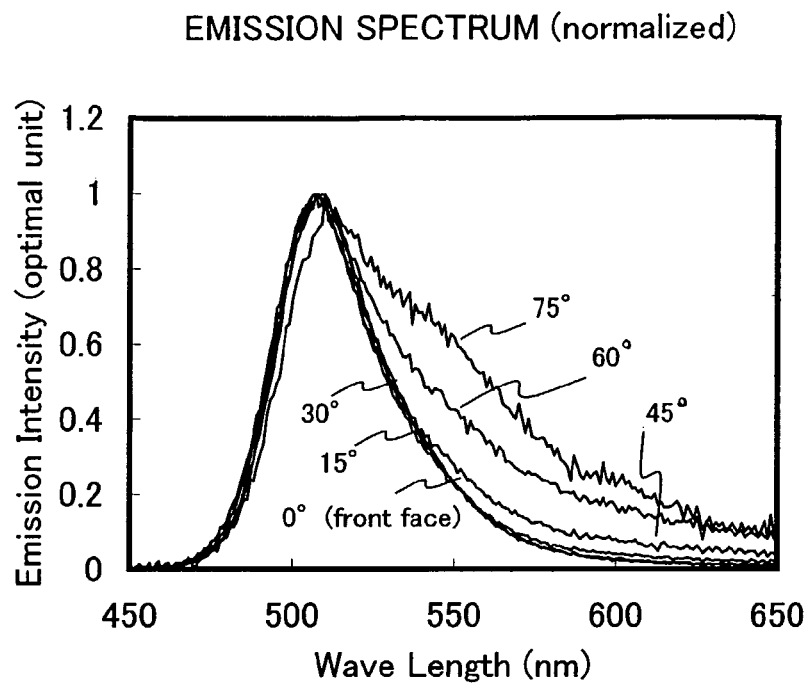
FIGS. 54A and 54B are graphs showing influence of a thickness of a layer containing a composite material on an emission spectrum of a green light emitting element.
Figure 54B:
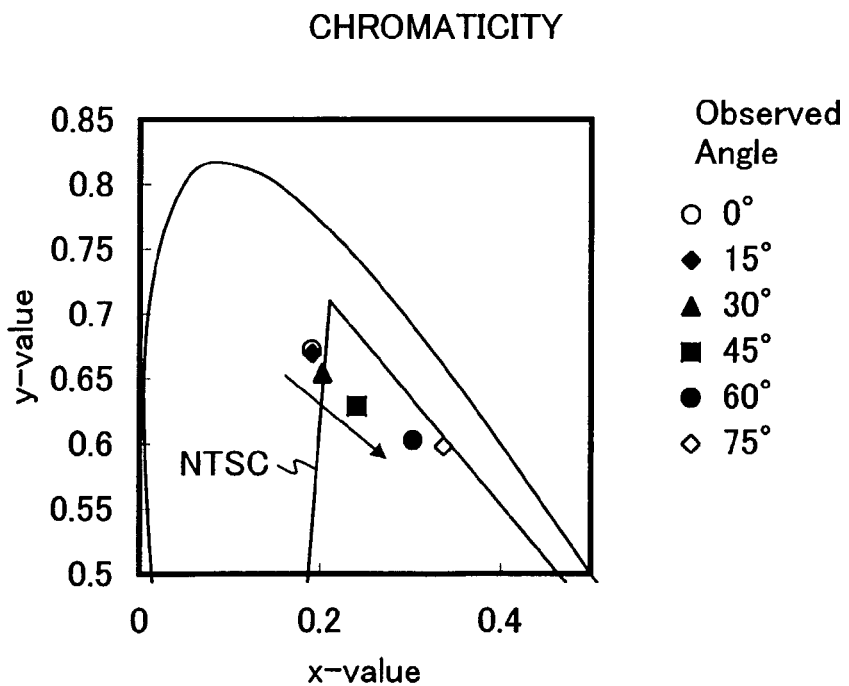

The organization of the element of FIGS. 54A and 54B is shown in the following table,

| anode | MoOx layer | hole transporting layer | light emitting layer | electron transporting layer | electron injecting layer | cathode |
|---|---|---|---|---|---|---|
| Ti\ITSO ITSO = 20 nm | DNTPD:MoOx:Ruburene (1:0.15:0.04 wt/wt/wt) 100 nm | NPB 10 nm | Alq:C6 (1:0.015 wt/wt) 40 nm | Alq 15 nm | BzOs 15 nm | ITO 110 nm |

C6 = Coumarin6

Figure 55A:
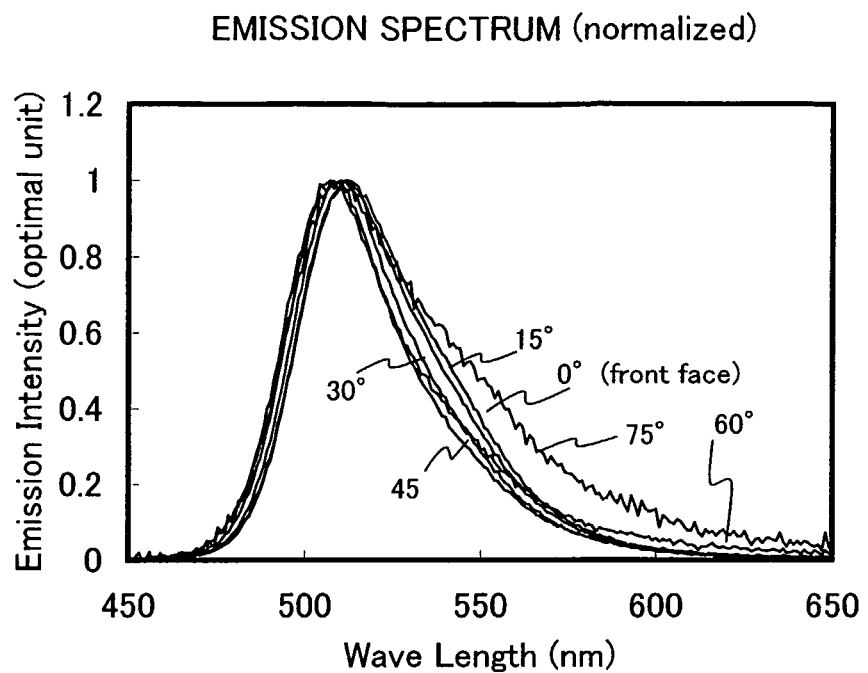
FIGS. 55A and 55B are graphs showing influence of a thickness of a layer containing a composite material on an emission spectrum of a green light emitting element.
Figure 55B:
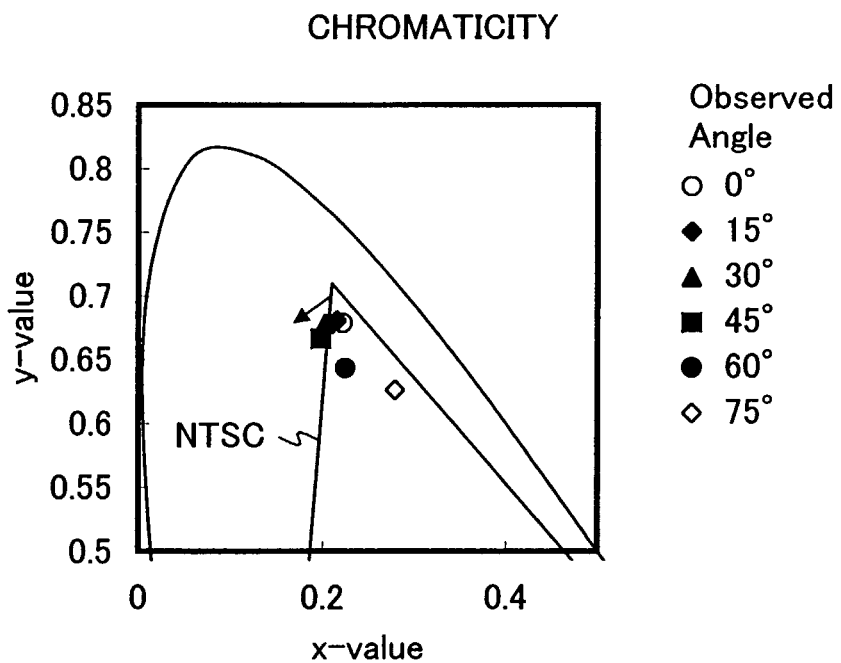

The organization of the element of FIGS. 55A and 55B is shown in the following table,

| anode | MoOx layer | hole transporting layer | light emitting layer | electron transporting layer | electron injecting layer | cathode |
|---|---|---|---|---|---|---|
| Ti\ITSO ITSO = 20 nm | DNTPD:MoOx:Ruburene (1:0.15:0.04 wt/wt/wt) 120 nm | NPB 10 nm | Alq:C6 (1:0.015 wt/wt) 40 nm | Alq 15 nm | BzOs 15 nm | ITO 110 nm |

C6 = Coumarin6

Figure 56A:
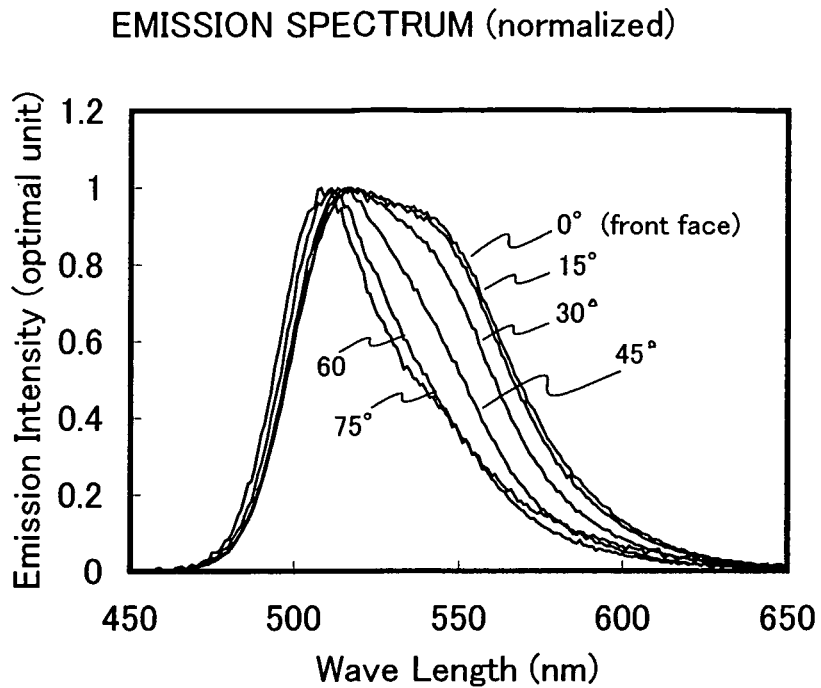
FIGS. 56A and 56B are graphs showing influence of a thickness of a layer containing a composite material on an emission spectrum of a green light emitting element.
Figure 56B:
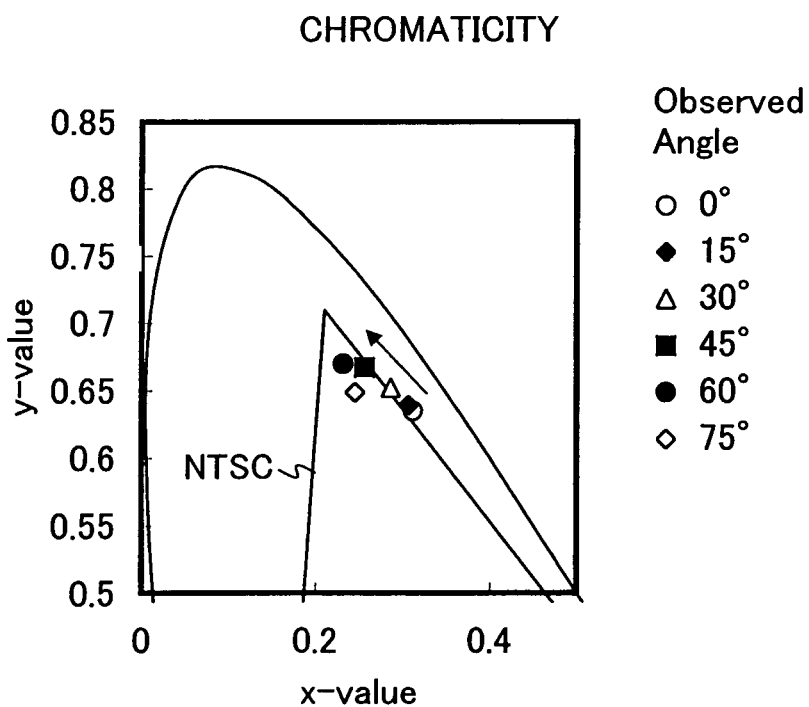

The organization of the element of FIGS. 56A and 56B is shown in the following table,

| anode | MoOx layer | hole transporting layer | light emitting layer | electron transporting layer | electron injecting layer | cathode |
|---|---|---|---|---|---|---|
| Ti\ITSO ITSO = 20 nm | DNTPD:MoOx:Ruburene (1:0.15:0.04 wt/wt/wt) 140 nm | NPB 10 nm | Alq:C6 (1:0.015 wt/wt) 40 nm | Alq 15 nm | BzOs 15 nm | ITO 110 nm |

C6 = Coumarin6

Figure 57A:
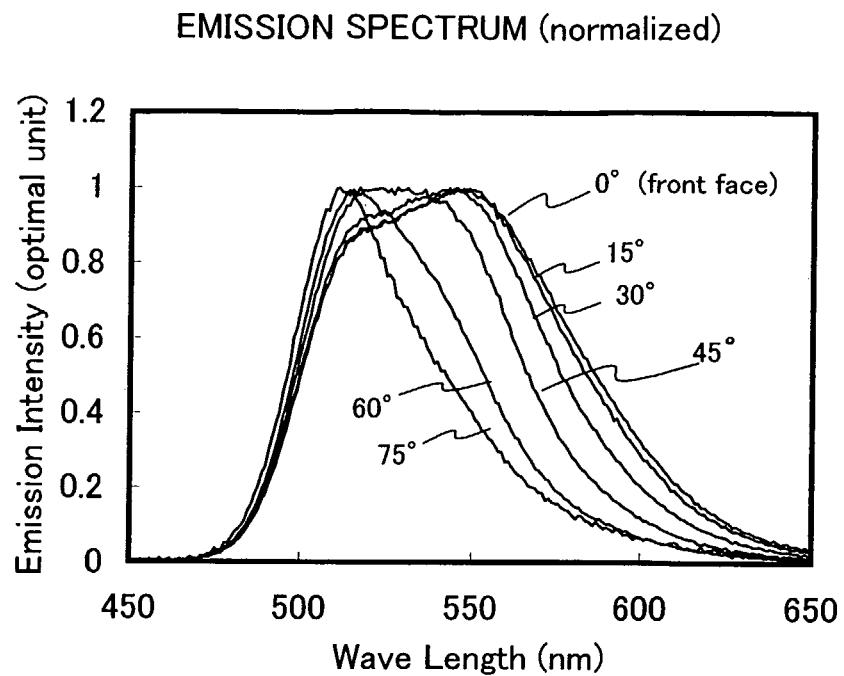
FIGS. 57A and 57B are graphs showing influence of a thickness of a layer containing a composite material on an emission spectrum of a green light emitting element.
Figure 57B:
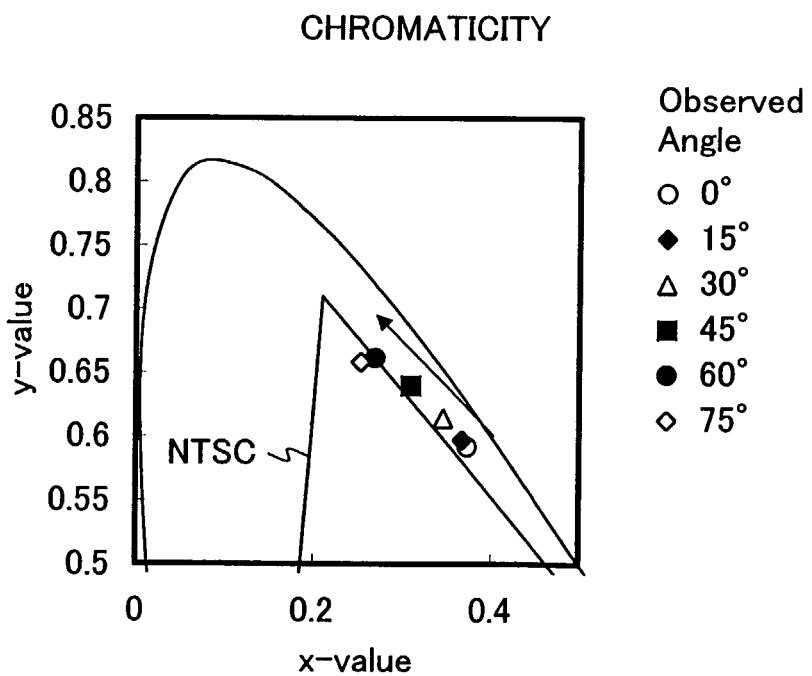

The organization of the element of FIGS. 57A and 57B is shown in the following table,

| anode | MoOx layer | hole transporting layer | light emitting layer | electron transporting layer | electron injecting layer | cathode |
|---|---|---|---|---|---|---|
| Ti\ITSO ITSO = 20 nm | DNTPD:MoOx:Ruburene (1:0.15:0.04 wt/wt/wt) 160 nm | NPB 10 nm | Alq:C6 (1:0.015 wt/wt) 40 nm | Alq 15 nm | BzOs 15 nm | ITO 110 nm |

C6 = Coumarin6

Figure 58A:
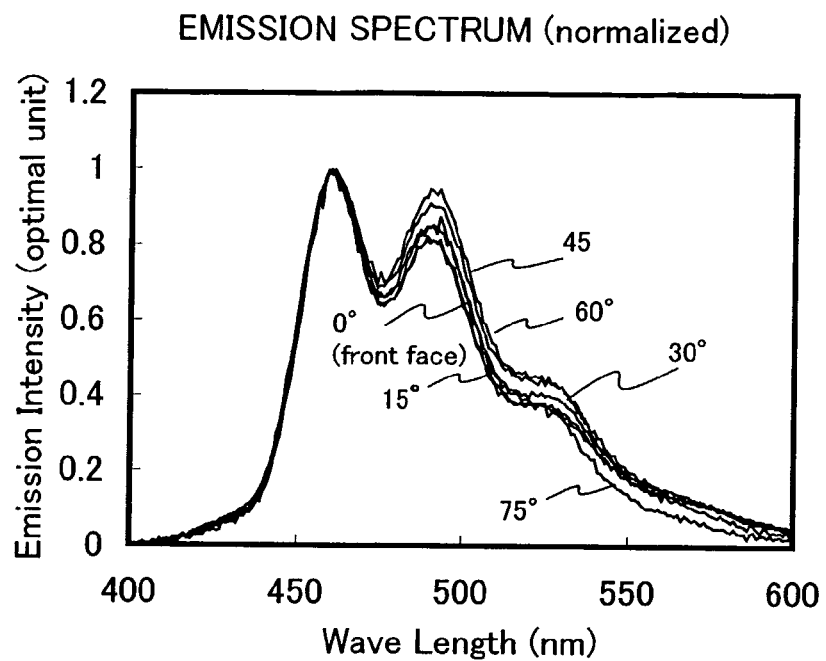
FIGS. 58A and 58B are graphs showing influence of a thickness of a layer containing a composite material on an emission spectrum of a blue light emitting element.
Figure 58B:
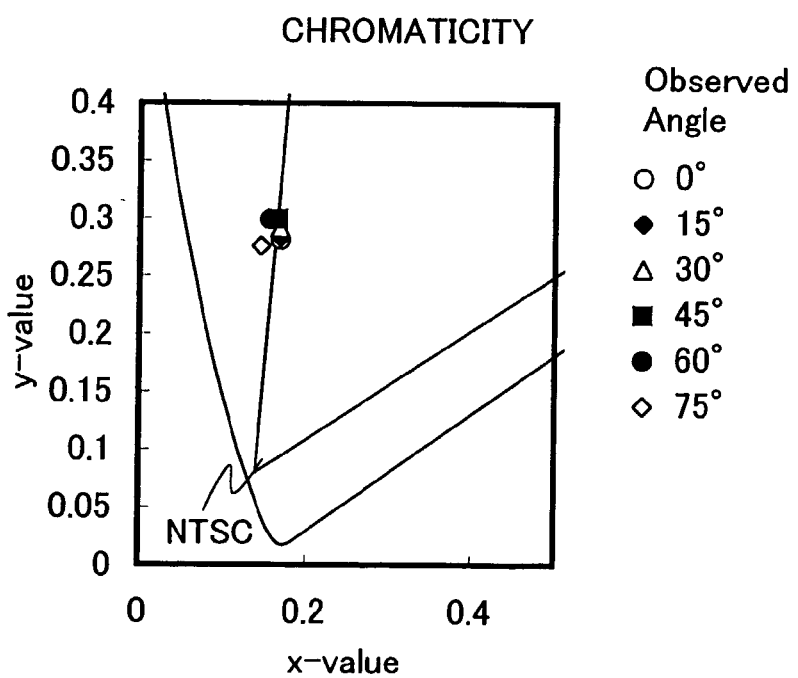

The organization of the element of FIGS. 58A and 58B is shown in the following table,

| anode | MoOx layer | hole transporting layer | light emitting layer | electron transporting layer | electron injecting layer | cathode |
|---|---|---|---|---|---|---|
| Ti\ITSO ITSO = 20 nm | DNTPD:MoOx:Ruburene (1:0.15:0.04 wt/wt/wt) 20 nm | NPB 10 nm | BEmL 15 nm | Alq 15 nm | BzOs 15 nm | ITO 110 nm |

Figure 59A:
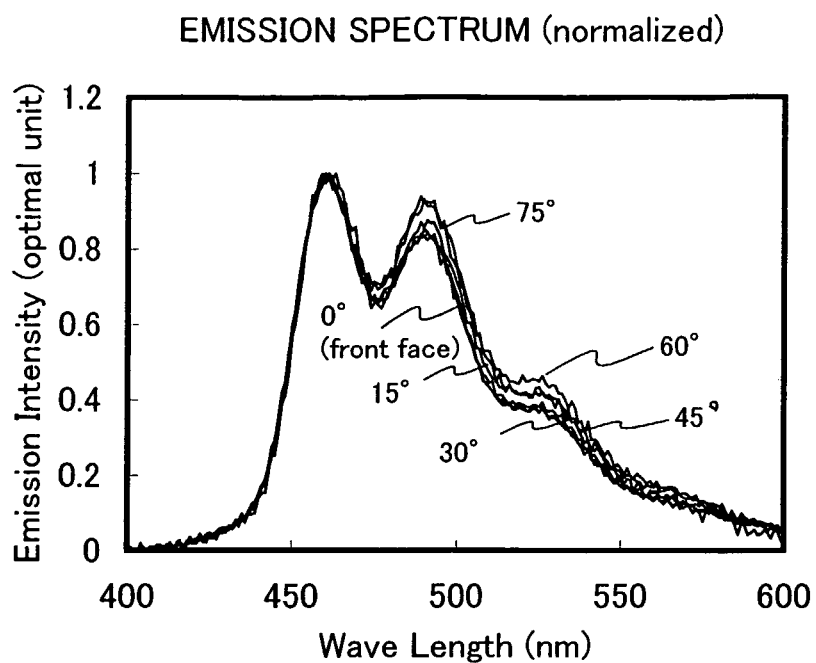
FIGS. 59A and 59B are graphs showing influence of a thickness of a layer containing a composite material on an emission spectrum of a blue light emitting element.
Figure 59B:
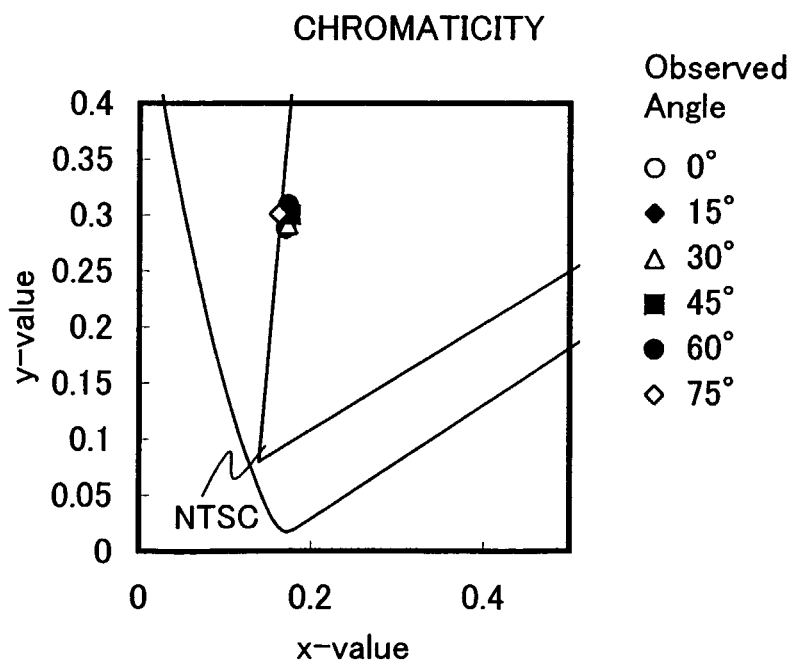

The organization of the element of FIGS. 59A and 59B is shown in the following table,

| anode | MoOx layer | hole transporting layer | light emitting layer | electron transporting layer | electron injecting layer | cathode |
|---|---|---|---|---|---|---|
| Ti\ITSO ITSO = 20 nm | DNTPD:MoOx:Ruburene (1:0.15:0.04 wt/wt/wt) 40 nm | NPB 10 nm | BEmL 15 nm | Alq 15 nm | BzOs 15 nm | ITO 110 nm |

Figure 60A:
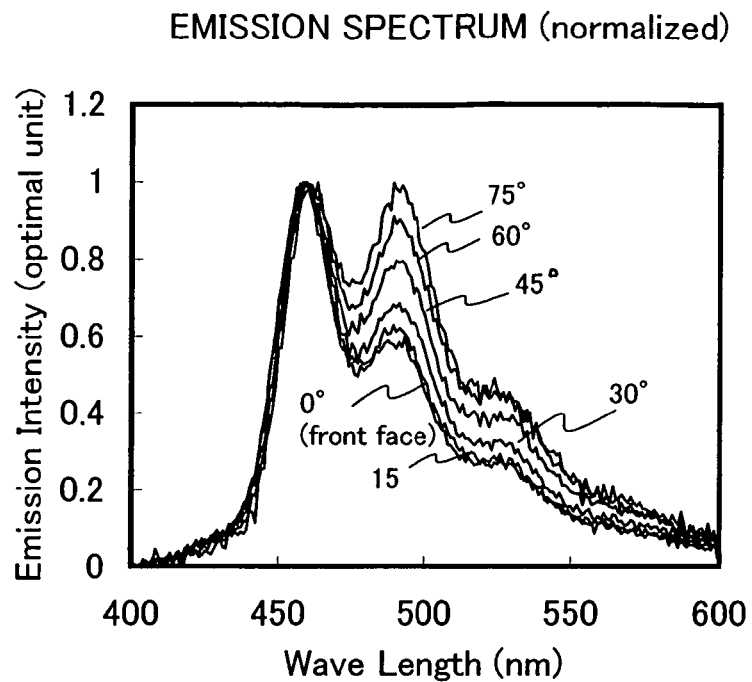
FIGS. 60A and 60B are graphs showing influence of a thickness of a layer containing a composite material on an emission spectrum of a blue light emitting element.
Figure 60B:
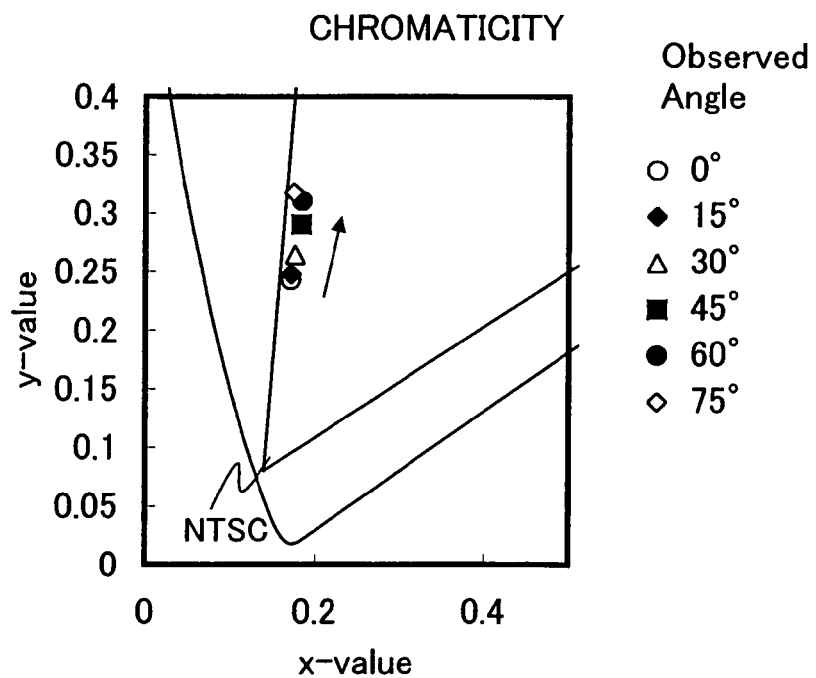

The organization of the element of FIGS. 60A and 60B is shown in the following table,

| anode | MoOx layer | hole transporting layer | light emitting layer | electron transporting layer | electron injecting layer | cathode |
|---|---|---|---|---|---|---|
| Ti\ITSO ITSO = 20 nm | DNTPD:MoOx:Ruburene (1:0.15:0.04 wt/wt/wt) 60 nm | NPB 10 nm | BEmL 15 nm | Alq 15 nm | BzOs 15 nm | ITO 110 nm |

Figure 61A:
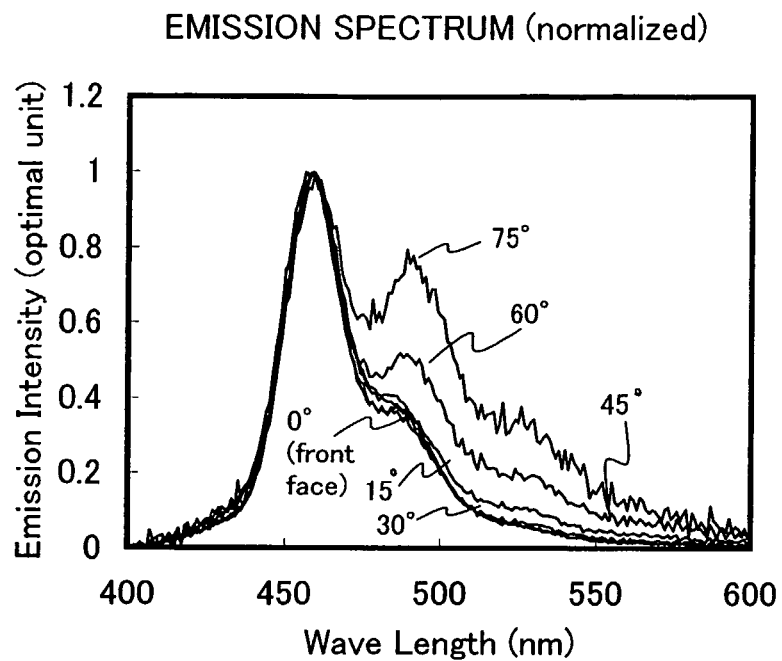
FIGS. 61A and 61B are graphs showing influence of a thickness of a layer containing a composite material on an emission spectrum of a blue light emitting element.
Figure 61B:
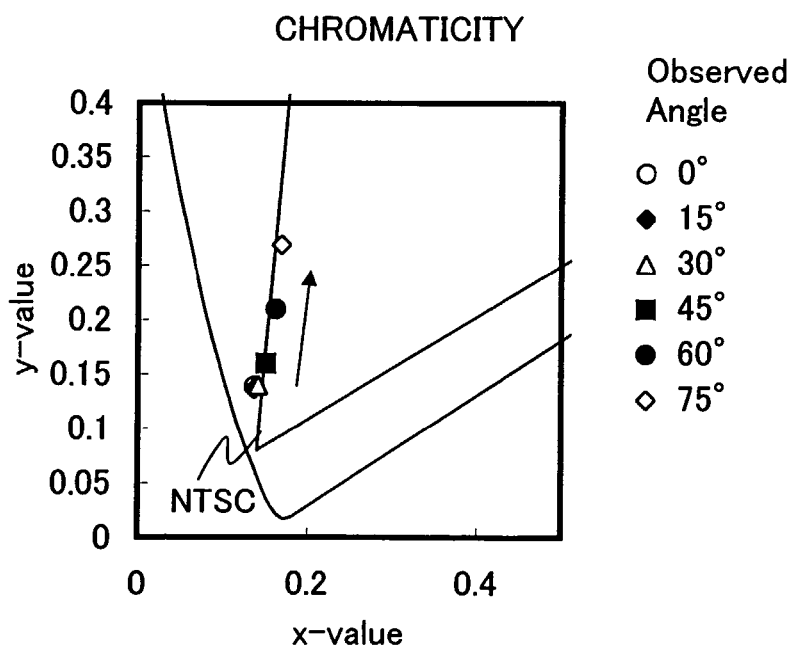

The organization of the element of FIGS. 61A and 61B is shown in the following table,

| anode | MoOx layer | hole transporting layer | light emitting layer | electron transporting layer | electron injecting layer | cathode |
|---|---|---|---|---|---|---|
| Ti\ITSO ITSO = 20 nm | DNTPD:MoOx:Ruburene (1:0.15:0.04 wt/wt/wt) 80 nm | NPB 10 nm | BEmL 15 nm | Alq 15 nm | BzOs 15 nm | ITO 110 nm |

Figure 62A:
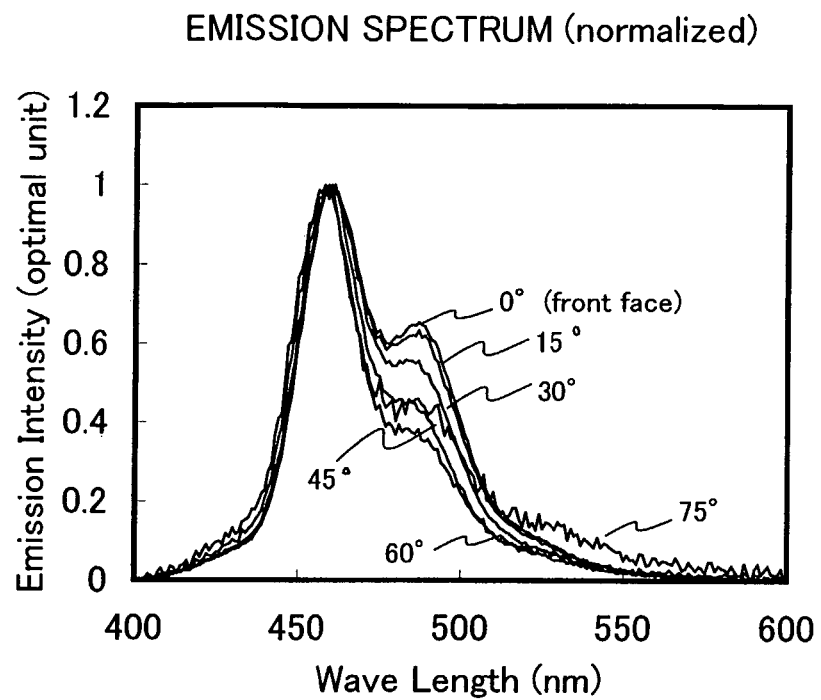
FIGS. 62A and 62B are graphs showing influence of a thickness of a layer containing a composite material on an emission spectrum of a blue light emitting element.
Figure 62B:
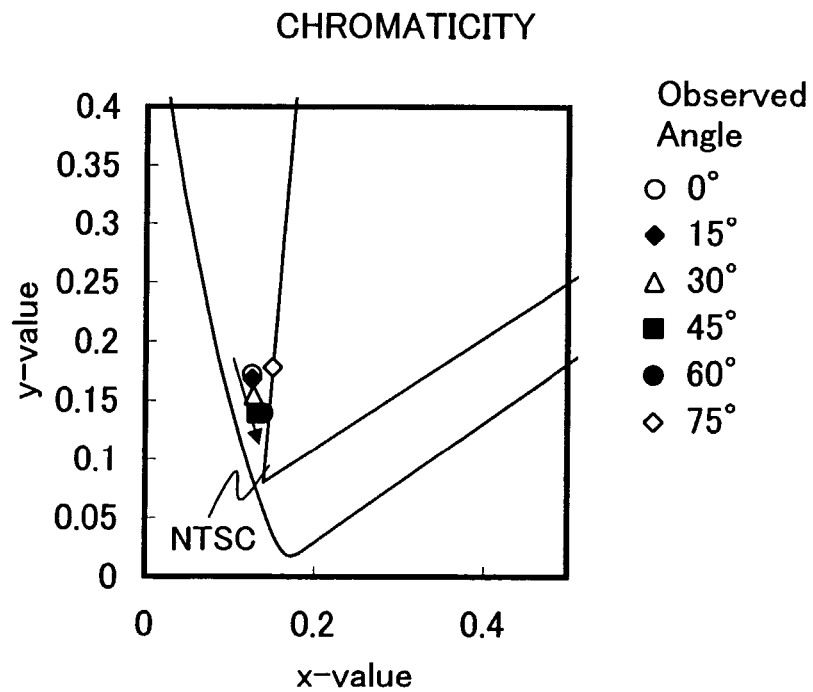

The organization of the element of FIGS. 62A and 62B is shown in the following table,

| anode | MoOx layer | hole transporting layer | light emitting layer | electron transporting layer | electron injecting layer | cathode |
|---|---|---|---|---|---|---|
| Ti\ITSO ITSO = 20 nm | DNTPD:MoOx:Ruburene (1:0.15:0.04 wt/wt/wt) 100 nm | NPB 10 nm | BEmL 15 nm | Alq 15 nm | BzOs 15 nm | ITO 110 nm |

Figure 63A:
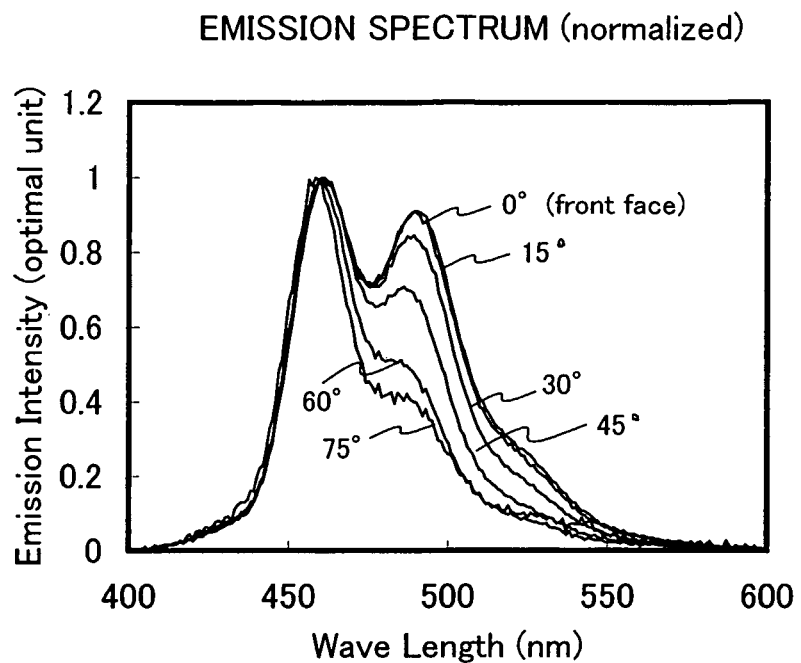
FIGS. 63A and 63B are graphs showing influence of a thickness of a layer containing a composite material on an emission spectrum of a blue light emitting element.
Figure 63B:
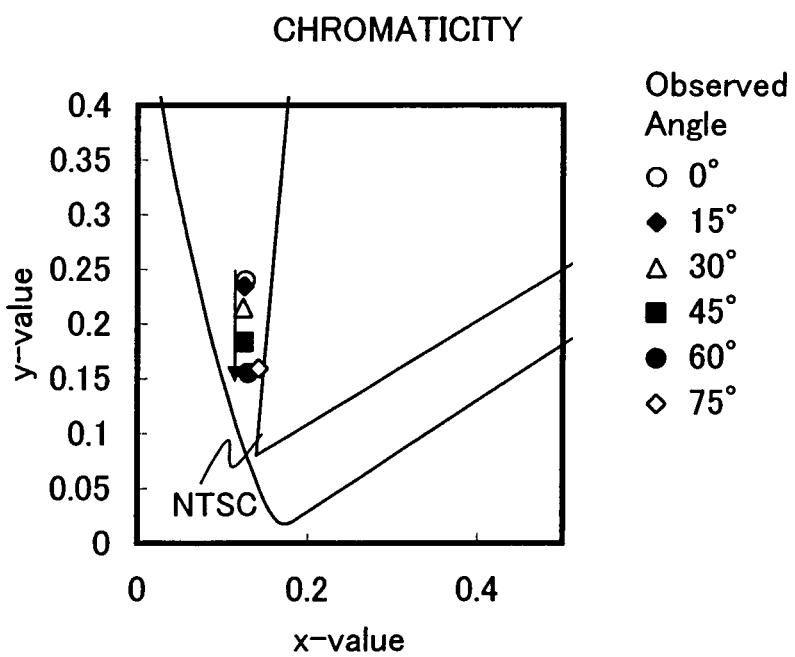

The organization of the element of FIGS. 63A and 63B is shown in the following table,

| anode | MoOx layer | hole transporting layer | light emitting layer | electron transporting layer | electron injecting layer | cathode |
|---|---|---|---|---|---|---|
| Ti\ITSO ITSO = 20 nm | DNTPD:MoOx:Ruburene (1:0.15:0.04 wt/wt/wt) 120 nm | NPB 10 nm | BEmL 15 nm | Alq 15 nm | BzOs 15 nm | ITO 110 nm |

Figure 64A:
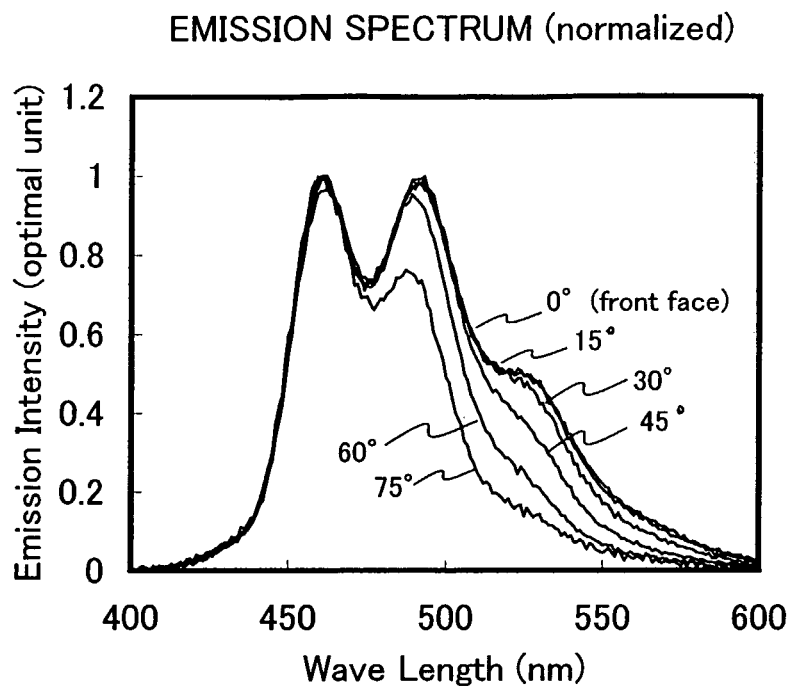
FIGS. 64A and 64B are graphs showing influence of a thickness of a layer containing a composite material on an emission spectrum of a blue light emitting element.
Figure 64B:
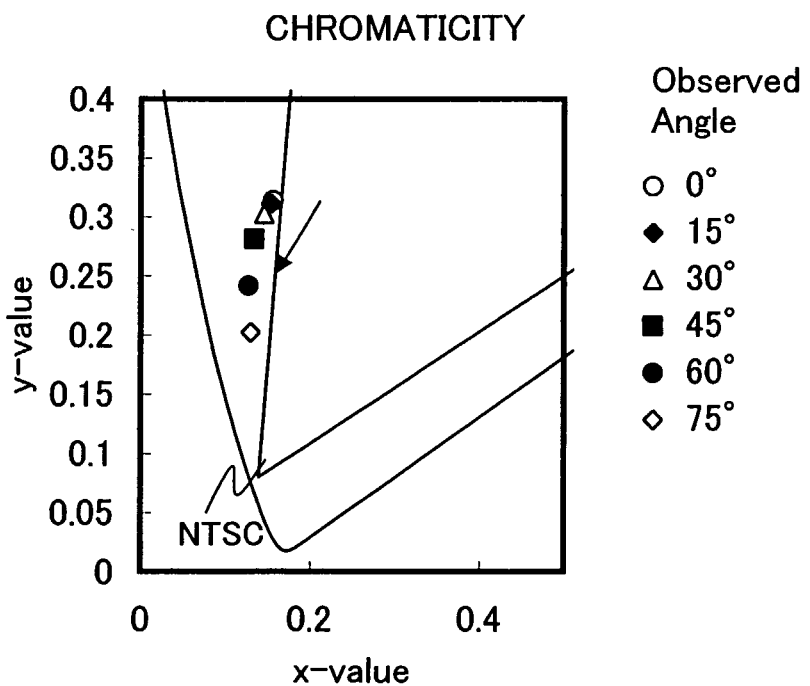

The organization of the element of FIGS. 64A and 64B is shown in the following table,

| anode | MoOx layer | hole transporting layer | light emitting layer | electron transporting layer | electron injecting layer | cathode |
|---|---|---|---|---|---|---|
| Ti\ITSO ITSO = 20 nm | DNTPD:MoOx:Ruburene (1:0.15:0.04 wt/wt/wt) 140 nm | NPB 10 nm | BEmL 15 nm | Alq 15 nm | BzOs 15 nm | ITO 110 nm |

Figure 65A:
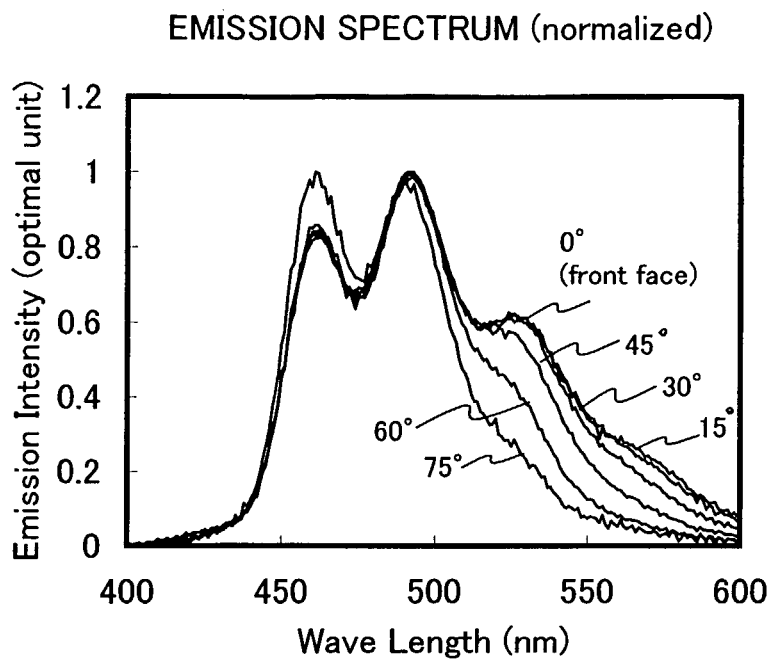
FIGS. 65A and 65B are graphs showing influence of a thickness of a layer containing a composite material on an emission spectrum of a blue light emitting element.
Figure 65B:
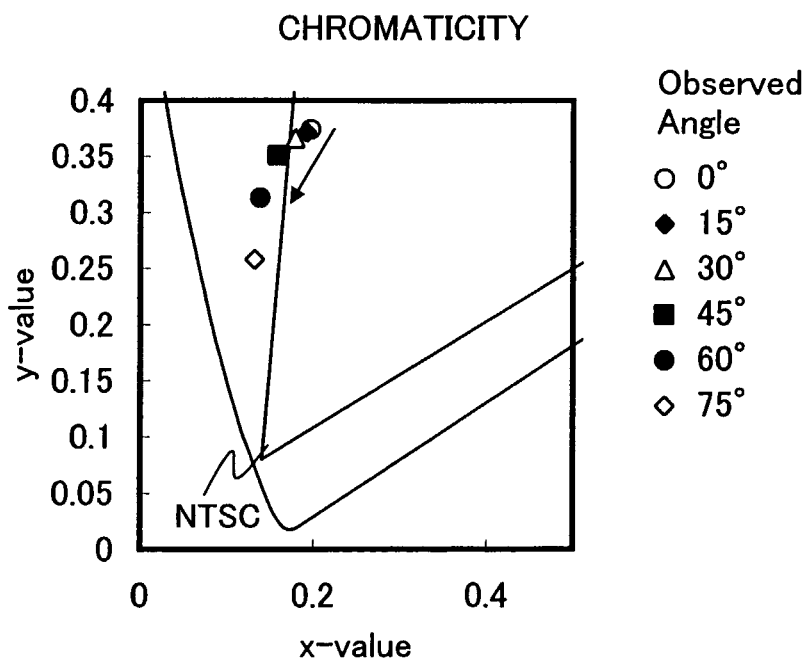

The organization of the element of FIGS. 65A and 65B is shown in the following table,

| anode | MoOx layer | hole transporting layer | light emitting layer | electron transporting layer | electron injecting layer | cathode |
|---|---|---|---|---|---|---|
| Ti\ITSO ITSO = 20 nm | DNTPD:MoOx:Ruburene (1:0.15:0.04 wt/wt/wt) 160 nm | NPB 10 nm | BEmL 15 nm | Alq 15 nm | BzOs 15 nm | ITO 110 nm |

Figure 66A:
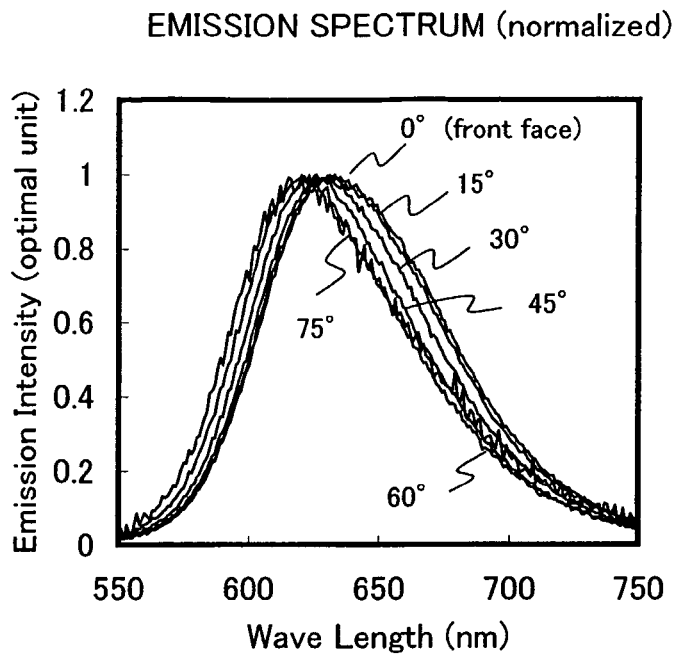
FIGS. 66A and 66B are graphs showing influence of a thickness of a layer containing a composite material on an emission spectrum of a red light emitting element.
Figure 66B:
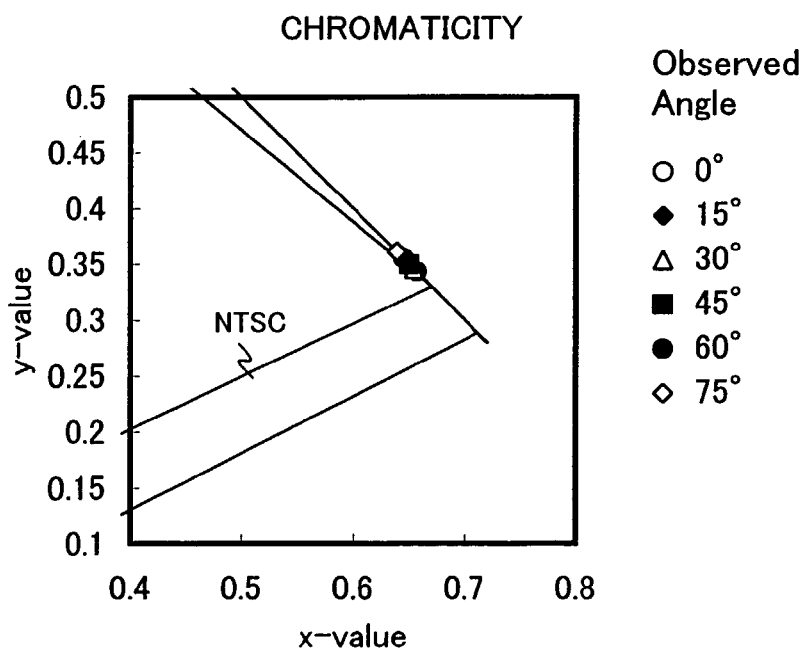

The organization of the element of FIGS. 66A and 66B is shown in the following table,

| anode | MoOx layer | hole transporting layer | light emitting layer | electron transporting layer | electron injecting layer | cathode |
|---|---|---|---|---|---|---|
| Ti\ITSO ITSO = 20 nm | DNTPD:MoOx:Ruburene (1:0.15:0.04 wt/wt/wt) 25 nm | NPB 10 nm | REmL 60 nm | Alq 15 nm | BzOs 15 nm | ITO 110 nm |

Figure 67A:
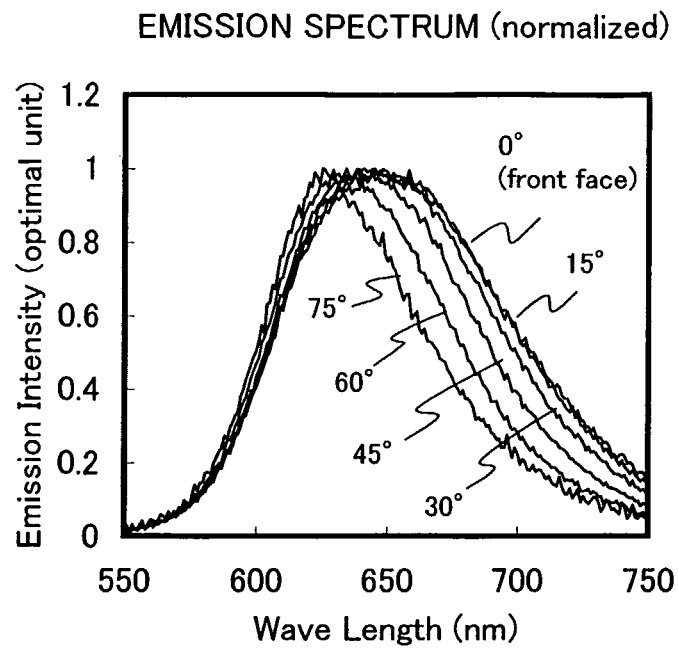
FIGS. 67A and 67B are graphs showing influence of a thickness of a layer containing a composite material on an emission spectrum of a red light emitting element.
Figure 67B:
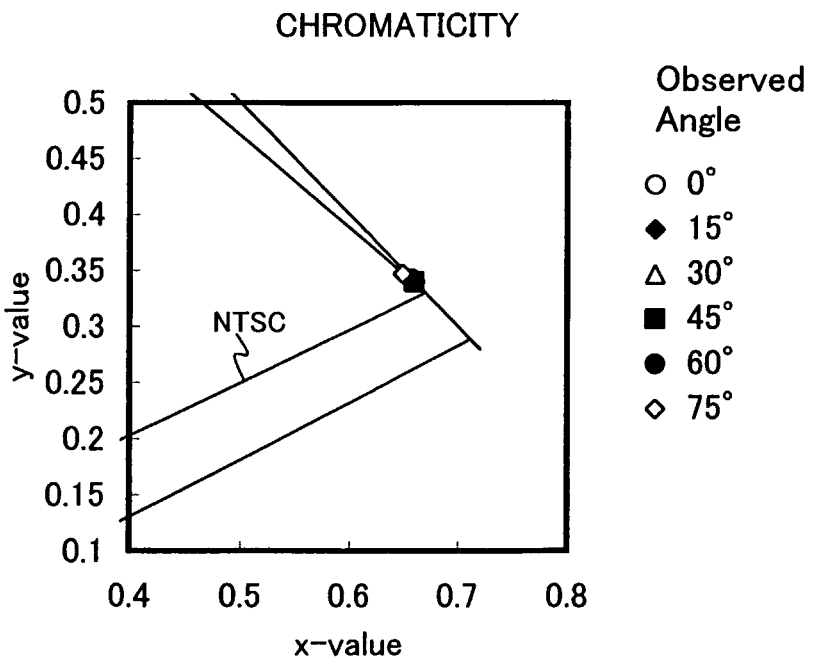

The organization of the element of FIGS. 67A and 67B is shown in the following table,

| anode | MoOx layer | hole transporting layer | light emitting layer | electron transporting layer | electron injecting layer | cathode |
|---|---|---|---|---|---|---|
| Ti\ITSO ITSO = 20 nm | DNTPD:MoOx:Ruburene (1:0.15:0.04 wt/wt/wt) 50 nm | NPB 10 nm | REmL 60 nm | Alq 15 nm | BzOs 15 nm | ITO 110 nm |

Figure 68A:
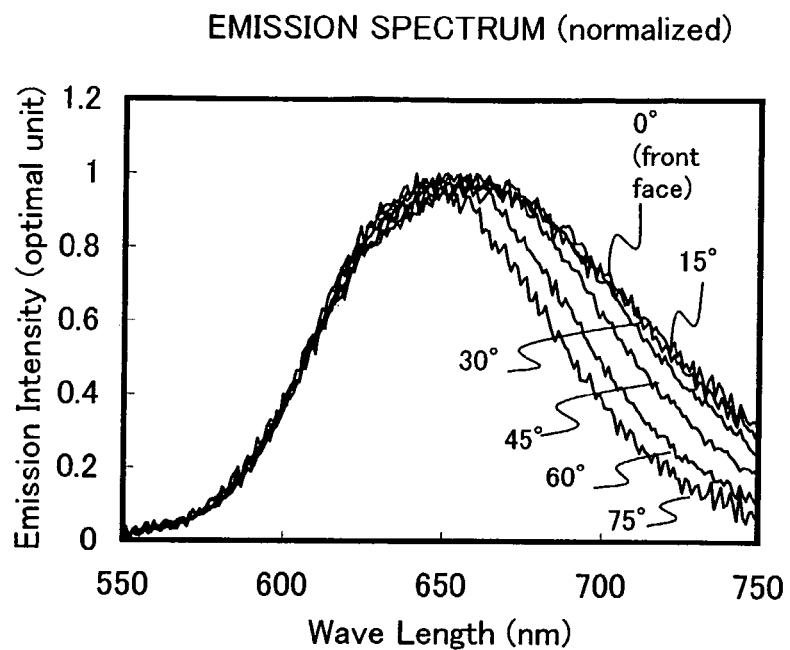
FIGS. 68A and 68B are graphs showing influence of a thickness of a layer containing a composite material on an emission spectrum of a red light emitting element.
Figure 68B:
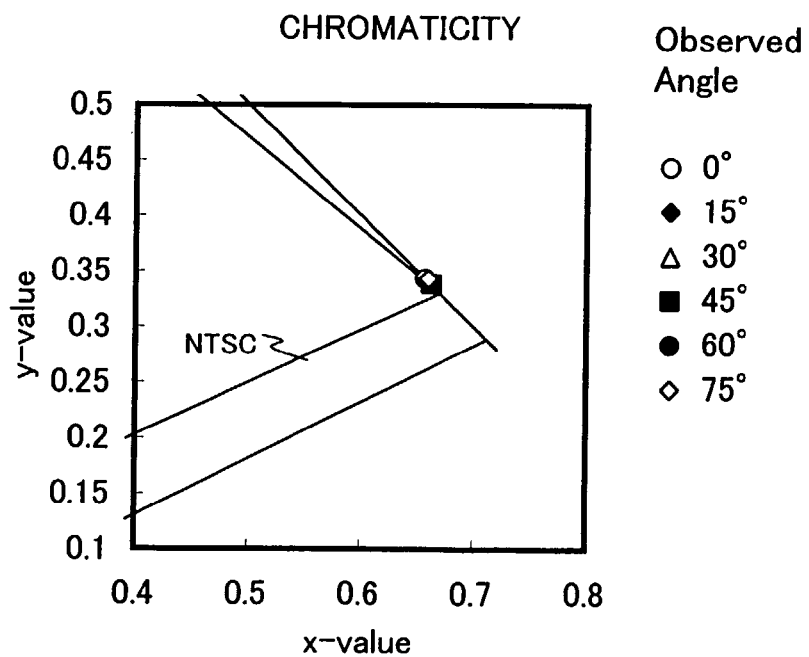

The organization of the element of FIGS. 68A and 68B is shown in the following table,

| anode | MoOx layer | hole transporting layer | light emitting layer | electron transporting layer | electron injecting layer | cathode |
|---|---|---|---|---|---|---|
| Ti\ITSO ITSO = 20 nm | DNTPD:MoOx:Ruburene (1:0.15:0.04 wt/wt/wt) 75 nm | NPB 10 nm | REmL 60 nm | Alq 15 nm | BzOs 15 nm | ITO 110 nm |

Figure 69A:
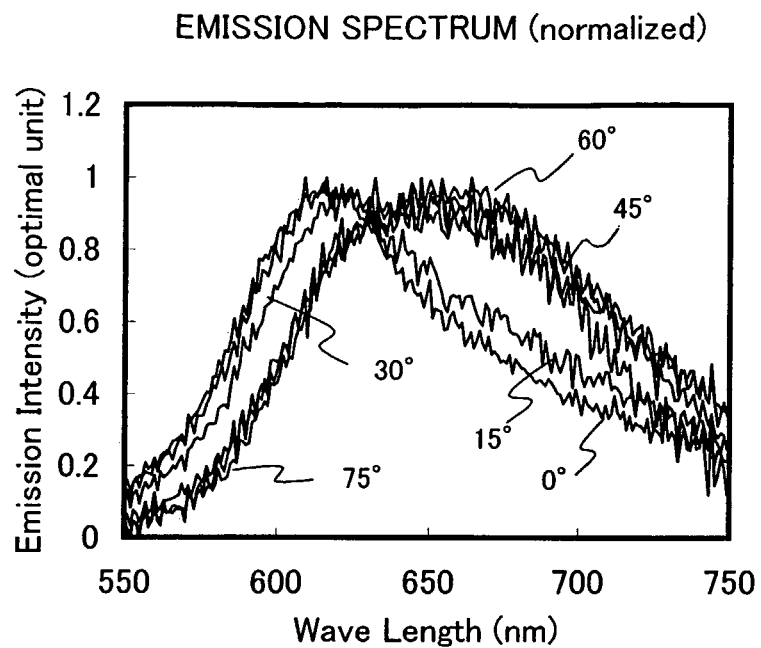
FIGS. 69A and 69B are graphs showing influence of a thickness of a layer containing a composite material on an emission spectrum of a red light emitting element.
Figure 69B:
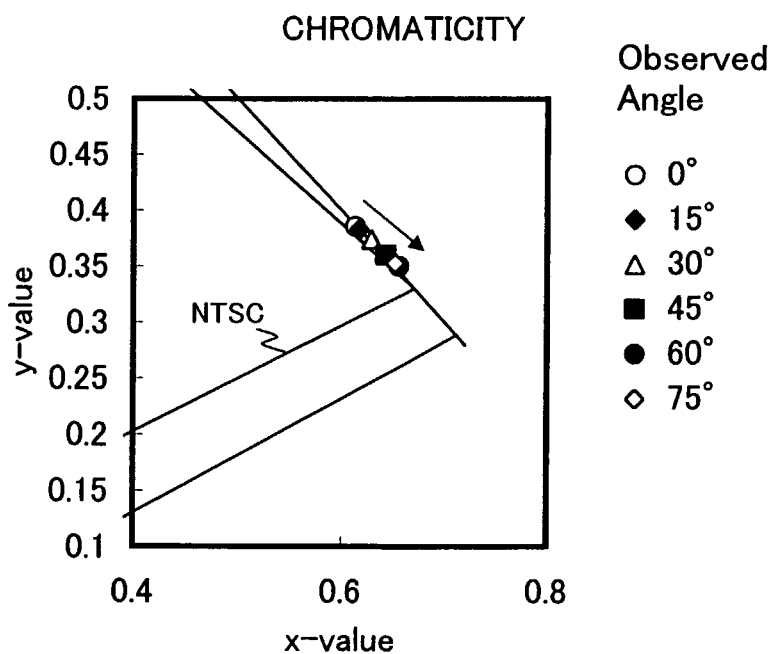

The organization of the element of FIGS. 69A and 69B is shown in the following table,

| anode | MoOx layer | hole transporting layer | light emitting layer | electron transporting layer | electron injecting layer | cathode |
|---|---|---|---|---|---|---|
| Ti\ITSO ITSO = 20 nm | DNTPD:MoOx:Ruburene (1:0.15:0.04 wt/wt/wt) 100 nm | NPB 10 nm | REmL 60 nm | Alq 15 nm | BzOs 15 nm | ITO 110 nm |

Figure 70A:
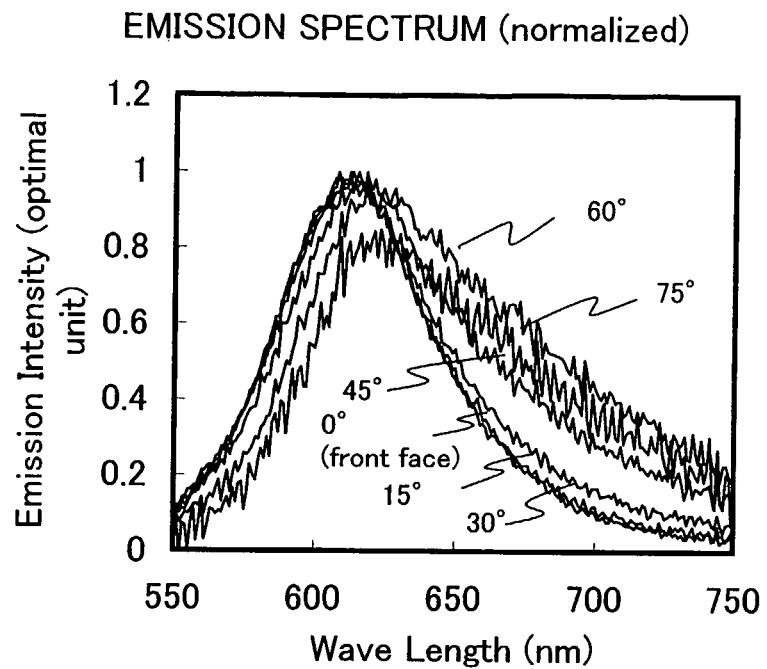
FIGS. 70A and 70B are graphs showing influence of a thickness of a layer containing a composite material on an emission spectrum of a red light emitting element.
Figure 70B:
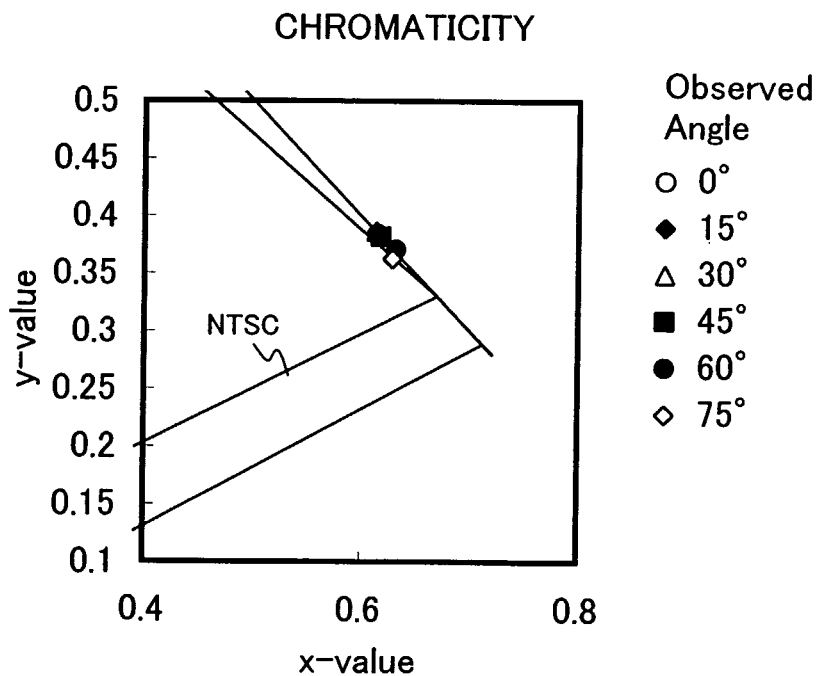

The organization of the element of FIGS. 70A and 70B is shown in the following table,

| anode | MoOx layer | hole transporting layer | light emitting layer | electron transporting layer | electron injecting layer | cathode |
|---|---|---|---|---|---|---|
| Ti\ITSO ITSO = 20 nm | DNTPD:MoOx:Ruburene (1:0.15:0.04 wt/wt/wt) 125 nm | NPB 10 nm | REmL 60 nm | Alq 15 nm | BzOs 15 nm | ITO 110 nm |

Figure 71A:
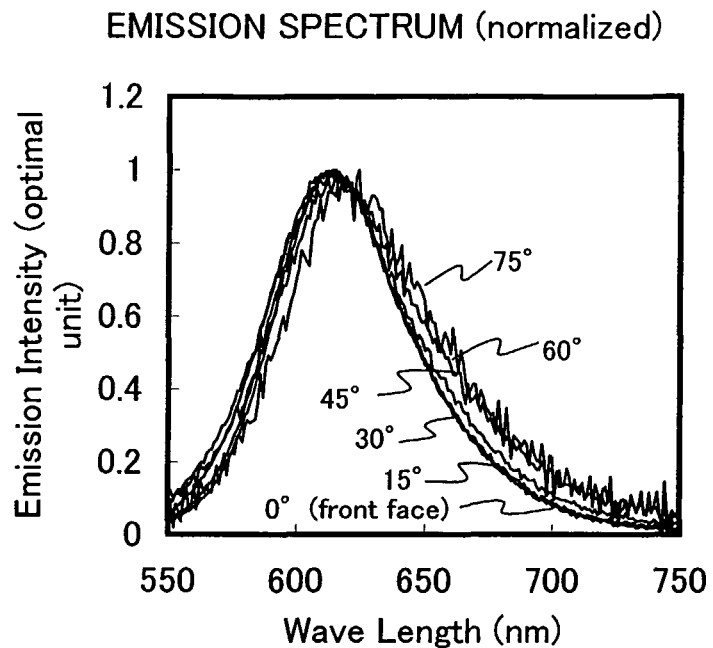
FIGS. 71A and 71B are graphs showing influence of a thickness of a layer containing a composite material on an emission spectrum of a red light emitting element.
Figure 71B:
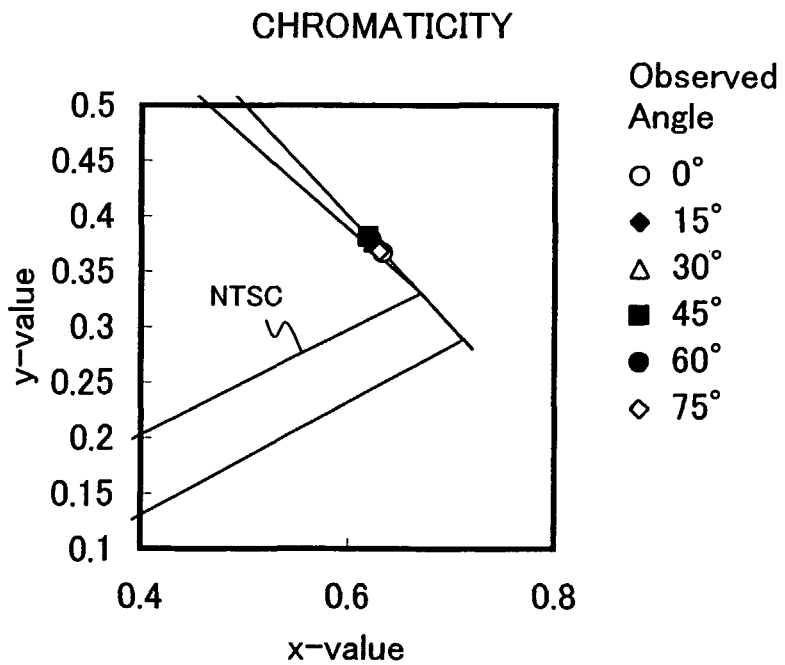

The organization of the element of FIGS. 71A and 71B is shown in the following table,

| anode | MoOx layer | hole transporting layer | light emitting layer | electron transporting layer | electron injecting layer | cathode |
|---|---|---|---|---|---|---|
| Ti\ITSO ITSO = 20 nm | DNTPD:MoOx:Ruburene (1:0.15:0.04 wt/wt/wt) 150 nm | NPB 10 nm | REmL 60 nm | Alq 15 nm | BzOs 15 nm | ITO 110 nm |

Figure 72A:
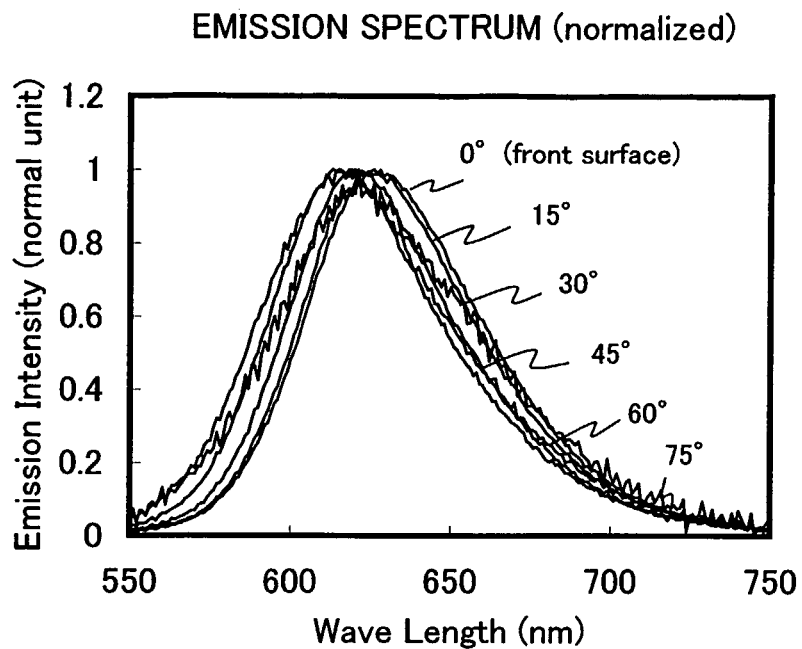
FIGS. 72A and 72B are graphs showing influence of a thickness of a layer containing a composite material on an emission spectrum of a red light emitting element.
Figure 72B:
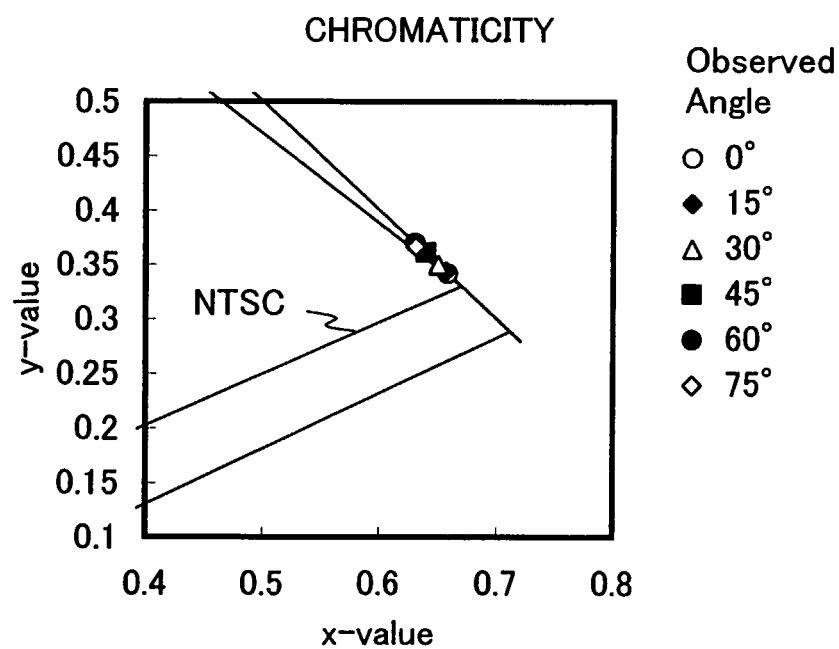

The organization of the element of FIGS. 72A and 72B is shown in the following table,

| anode | MoOx layer | hole transporting layer | light emitting layer | electron transporting layer | electron injecting layer | cathode |
|---|---|---|---|---|---|---|
| Ti\ITSO ITSO = 20 nm | DNTPD:MoOx:Ruburene (1:0.15:0.04 wt/wt/wt) 175 nm | NPB 10 nm | REmL 60 nm | Alq 15 nm | BzOs 15 nm | ITO 110 nm |

Figure 73A:
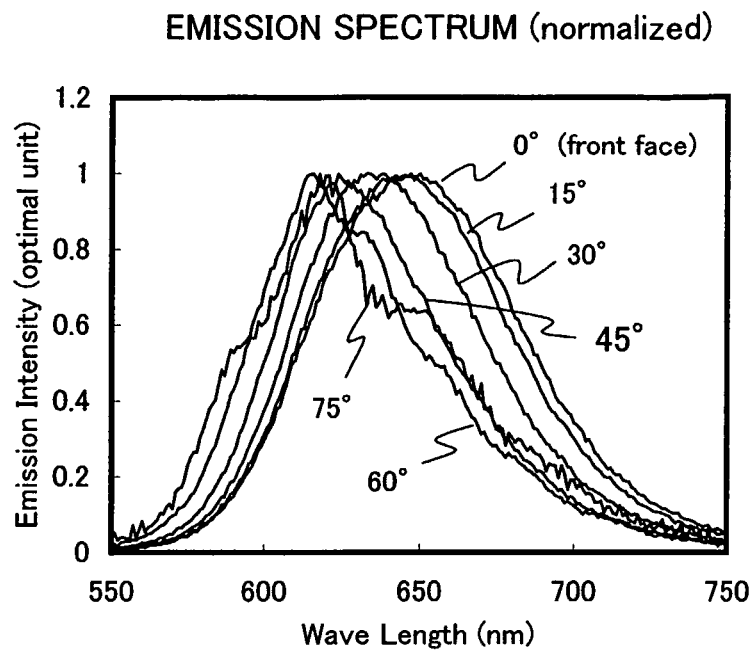
FIGS. 73A and 73B are graphs showing influence of a thickness of a layer containing a composite material on an emission spectrum of a red light emitting element.
Figure 73B:
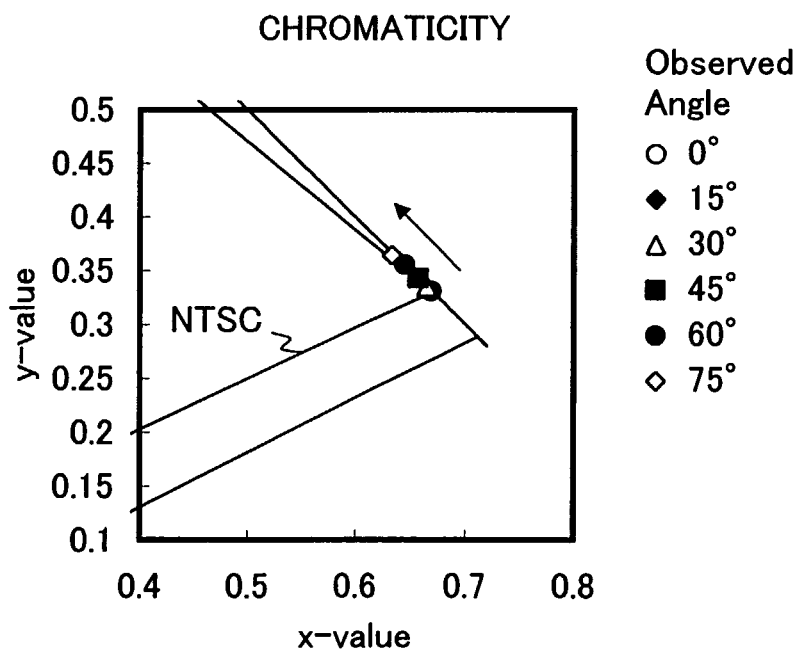

The organization of the element of FIGS. 73A and 73B is shown in the following table,

| anode | MoOx layer | hole transporting layer | light emitting layer | electron transporting layer | electron injecting layer | cathode |
|---|---|---|---|---|---|---|
| Ti\ITSO ITSO = 20 nm | DNTPD:MoOx:Ruburene (1:0.15:0.04 wt/wt/wt) 200 nm | NPB 10 nm | REmL 60 nm | Alq 15 nm | BzOs 15 nm | ITO 110 nm |

Figure 74:
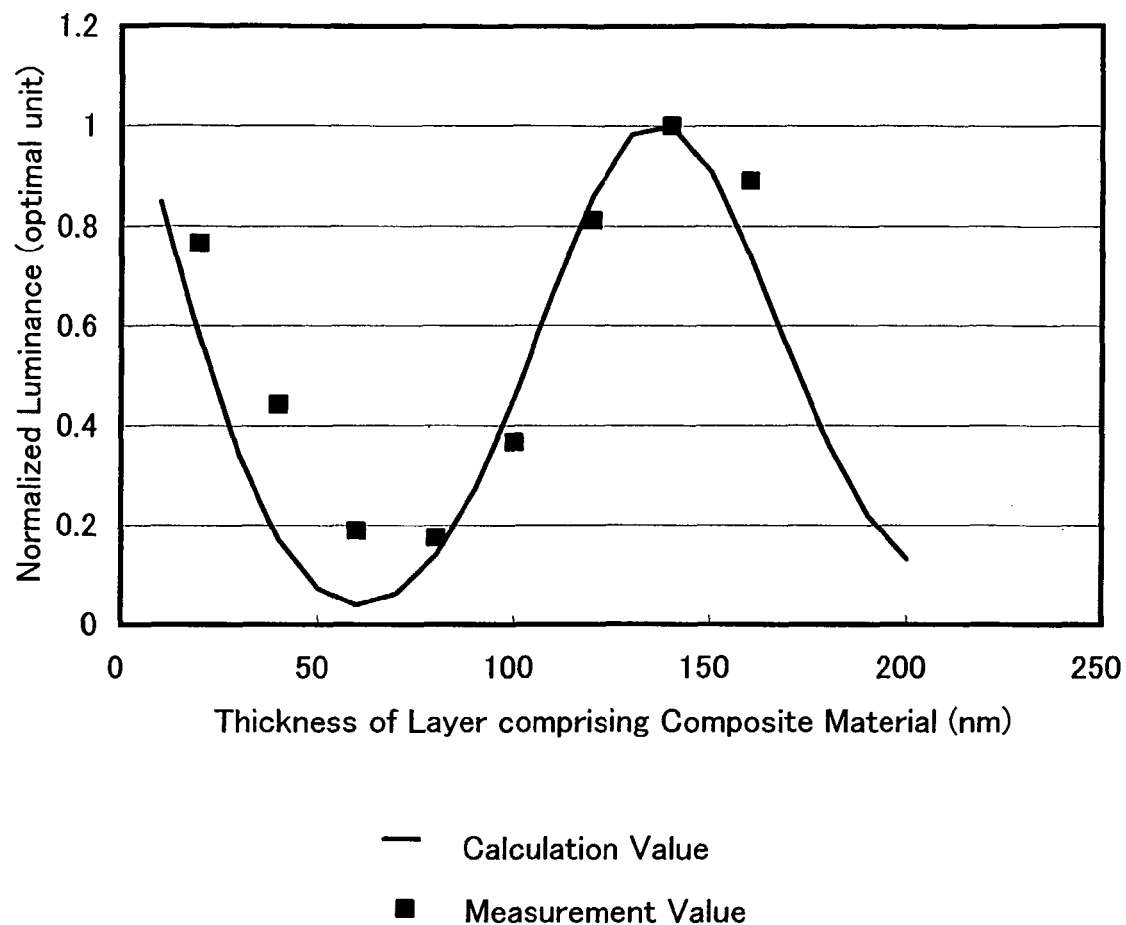
FIG. 74 is a graph showing a result of calculating influence of a thickness of a layer containing a composite material on an emission spectrum of a green light emitting element.
Figure 75:
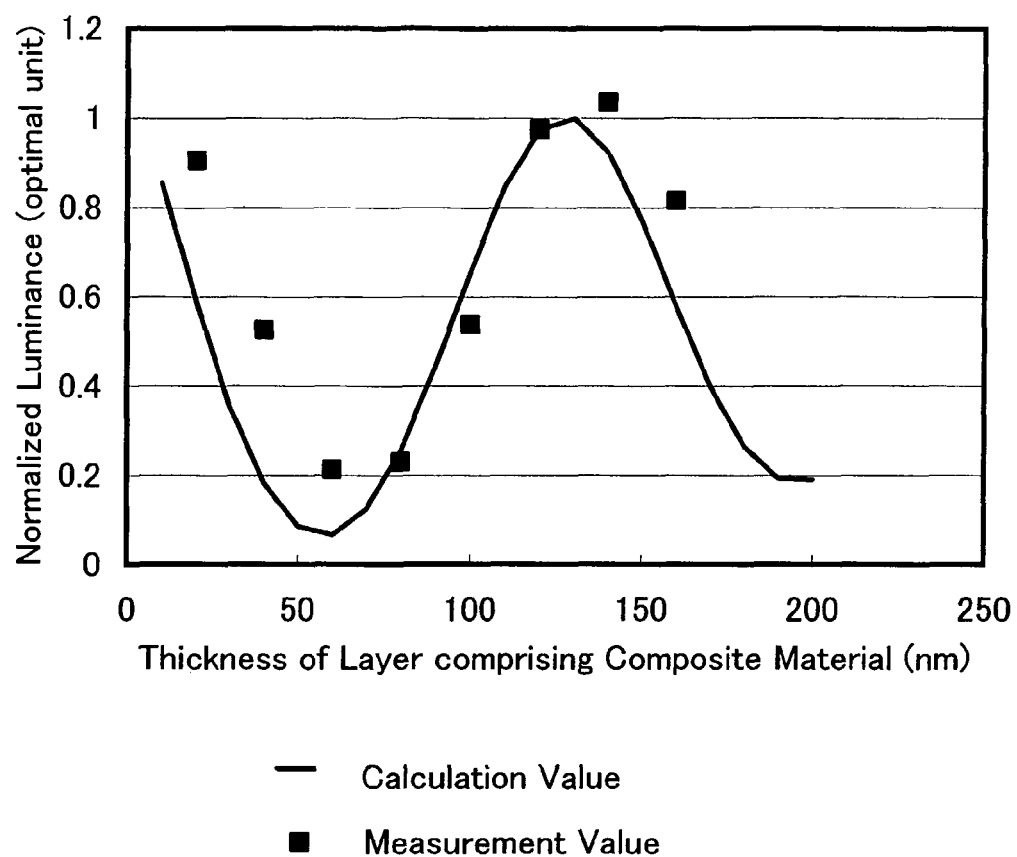
FIG. 75 is a graph showing a result of calculating influence of a thickness of a layer containing a composite material on an emission spectrum of a blue light emitting element.
Figure 76:
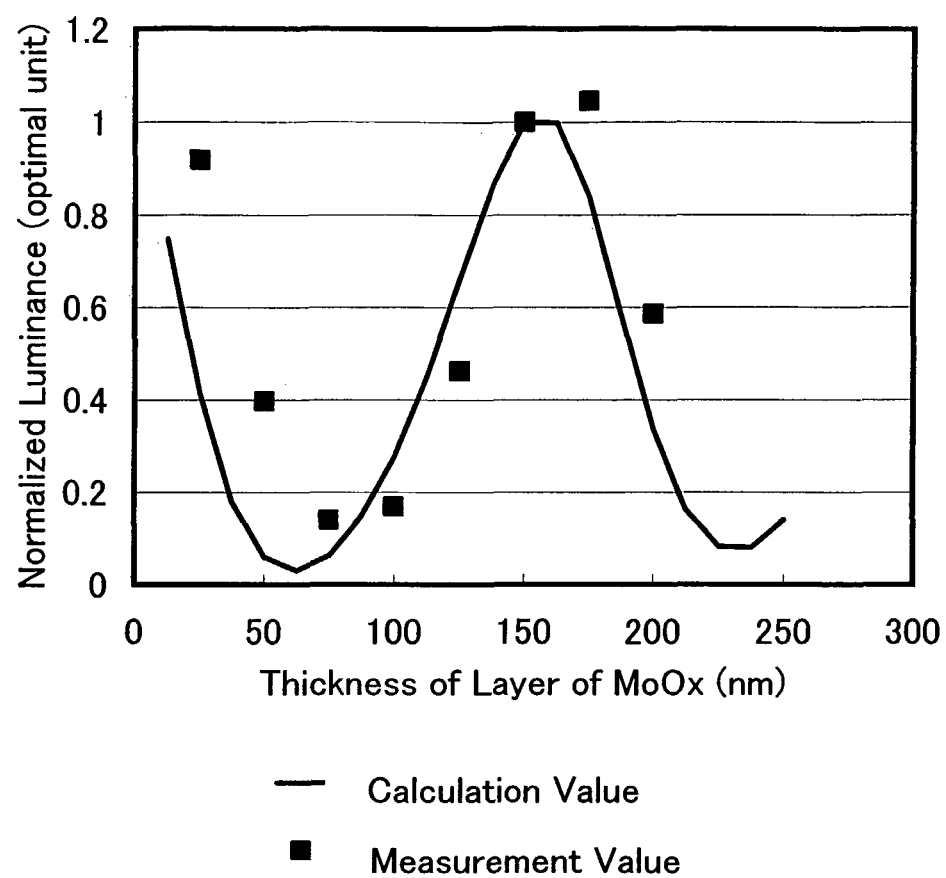
FIG. 76 is a graph showing a result of calculating influence of a thickness of a layer containing a composite material on an emission spectrum of a red light emitting element.

These experimental results (FIGS. 50A to 73B) favorably correspond to calculation results (FIGS. 74 to 76). The organization of the element of FIG. 74 is shown in the following table,

| anode | MoOx layer | hole transporting layer | light emitting layer | electron transporting layer | electron injecting layer | cathode |
|---|---|---|---|---|---|---|
| Ti\ITSO ITSO = 20 nm | DNTPD:MoOx:Ruburene (1:0.15:0.04 wt/wt/wt) X nm | NPB 10 nm | Alq:C6 (1:0.015 wt/wt) 40 nm | Alq 15 nm | BzOs 20 nm | ITO 110 nm |

C6 = Coumarin6

The organization of the element of FIG. 75 is shown in the following table,

| anode | MoOx layer | hole transporting layer | light emitting layer | electron transporting layer | electron injecting layer | cathode |
|---|---|---|---|---|---|---|
| Ti\ITSO ITSO = 20 nm | DNTPD:MoOx:Ruburene (1:0.15:0.04 wt/wt/wt) X nm | NPB 10 nm | BEmL 30 nm | Alq 15 nm | BzOs 15 nm | ITO 110 nm |

The organization of the element of FIG. 76 is shown in the following table,

| anode | MoOx layer | hole transporting layer | light emitting layer | electron transporting layer | electron injecting layer | cathode |
|---|---|---|---|---|---|---|
| Ti\ITSO ITSO = 20 nm | DNTPD:MoOx:Ruburene (1:0.15:0.04 | NPB | REmL | Alq | BzOs | ITO |

| anode | MoOx layer wt/wt/wt) X nm | hole transporting layer 10 nm | light emitting layer 60 nm | electron transporting layer 15 nm | electron injecting layer 15 nm | cathode 110 nm |
|---|---|---|---|---|---|---|

For example, in the case of the green light emitting elements, as shown in FIGS. 74A and 74B, an actual measurement value of luminance (that is, light emitting efficiency) when changing the thickness of the layer containing the composite material of the present invention, replicates the result obtained by calculation.

As set forth above, by simply adjusting the thickness of the layer containing the composite material of the present invention regardless of driving voltage, a spectrum, i.e., color purity can be easily controlled. Moreover, a thickness of the layer containing the composite material of the present invention, which is suitable for an efficient element, can be calculated.

This application is based on Japanese Patent Application serial no. 2005-053297 filed in Japan Patent Office on Feb. 28, 2005, on Japanese Patent Application serial no. 2005-167624 filed in Japan Patent Office on Jun. 8, 2005, and on Japanese Patent Application serial no. 2005-194497 filed in Japan Patent Office on Jul. 4, 2005, the entire contents of which are hereby incorporated by reference.

EXPLANATION OF REFERENCE

101: substrate, 102: first electrode, 103: first layer, 104: second layer, 105: third layer, 106: fourth layer, 107: second electrode, 400: substrate, 401: first electrode, 402: second electrode, 411: first layer, 412: second layer, 413: third layer, 200: substrate, 201: first electrode, 202: second electrode, 211: first layer, 212: second layer, 213: third layer, 214: fourth layer, 301: substrate, 302: first electrode, 303: first layer, 304: second layer, 305: third layer, 306: fourth layer, 307: second electrode, 501: first electrode, 502: second electrode, 511: first light emitting unit, 512: second light emitting unit, 513: charge generating layer, 601: source signal line driver circuit, 602: pixel portion, 603: gate signal line driver circuit, 604: sealing substrate, 605: sealing material, 607: interspace, 608: wiring, 609: FPC (flexible printed circuit), 610: element substrate, 611: switching TFT, 612: current controlling TFT, 613: first electrode, 614: insulator, 616: layer containing light emitting substance, 617: second electrode, 618: light emitting element, 623: n-channel TFT, 624: p-channel TFT 951: substrate, 952: electrode, 953: insulating layer, 954: partition wall layer, 955: layer containing light emitting substance, 956: electrode

The invention claimed is:

1. A composite material comprising:
an organic compound represented by the following general formula (1); and
an inorganic compound,

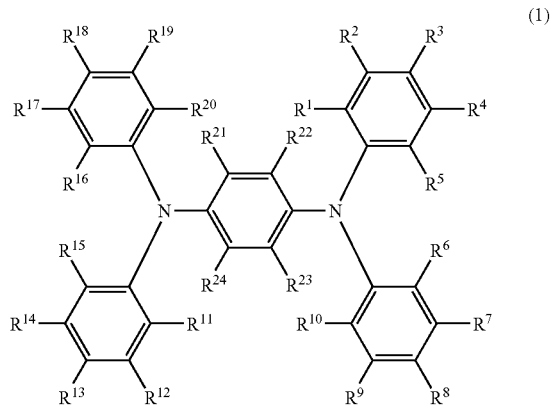

where, in the general formula (1), each of $R^1$ to $R^{20}$ represents any of hydrogen, an alkyl group, and a phenyl group, and each of $R^{21}$ to $R^{24}$ represents hydrogen,
wherein a concentration of the inorganic compound is equal to or larger than 7 vol % and equal to or smaller than 16 vol % in the composite material.

2. A composite material comprising:
an organic compound represented by the following general formula (2); and
an inorganic compound,

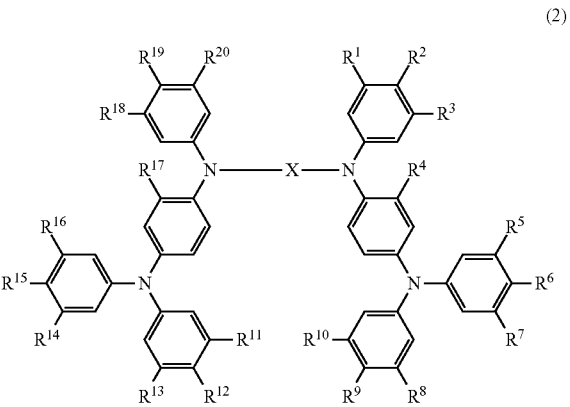

where, in the general formula (2), X represents an aromatic hydrocarbon group represented by structural formula (2-4):

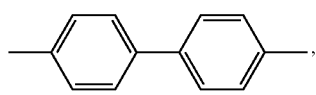
(2-4)

wherein each of $R^1$ to $R^{20}$ represents any of hydrogen, an alkyl group, and a phenyl group, and wherein a concentration of the inorganic compound is equal to or larger than 7 vol % and equal to or smaller than 16 vol % in the composite material.

3. A composite material comprising:

an organic compound represented by the following general formula (3); and an inorganic compound,

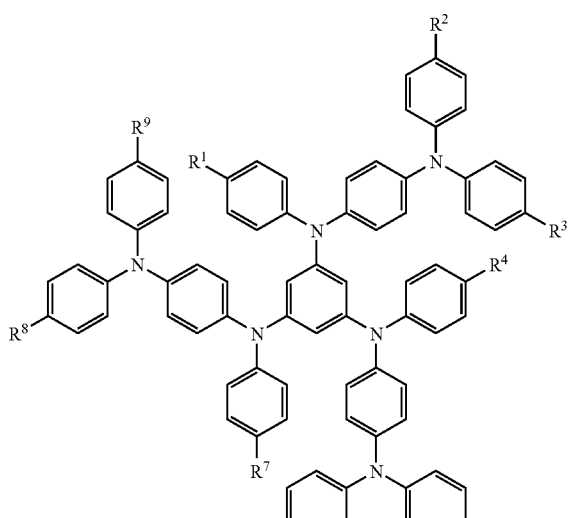
(3)

where, in the general formula (3), each of $R^1$ to $R^9$ represents any of hydrogen, an alkyl group, and a phenyl group, and wherein a concentration of the inorganic compound is equal to or larger than 7 vol % and equal to or smaller than 16 vol % in the composite material.

4. A light emitting element comprising a layer containing the composite material according to any one of claim 1 through claim 3.

5. A light emitting element comprising:

a layer containing the composite material according to any one of claim 1 through claim 3 between a pair of electrodes, wherein the layer containing the composite material is in contact with one or both of the pair of electrodes.

6. A light emitting element comprising:

a layer containing the composite material according to any one of claim 1 through claim 3 between a pair of electrodes; and a plurality of light emitting units, wherein the layer containing the composite material is provided between the plurality of light emitting units.

7. A light emitting device comprising a light emitting element comprising a layer containing the composite material according to any one of claim 1 through claim 3.

8. A light emitting device comprising:

a substrate;

a thin film transistor over the substrate; and a light emitting element over the thin film transistor electrically connected to the thin film transistor, the light emitting element comprising a layer containing the composite material according to any one of claim 1 through claim 3.

9. A light emitting device comprising:

a substrate; and a light emitting element comprising:

a first electrode over the substrate;

a layer containing the composite material according to any one of claim 1 through claim 3; and a second electrode over the layer containing the composite material, wherein the first electrode has a light shielding property, and wherein the second electrode has a light transmitting property.

10. An electronic appliance comprising the light emitting device according to claim 7.

11. A composite material comprising:

an organic compound represented by the following general formula (1); and an inorganic compound,

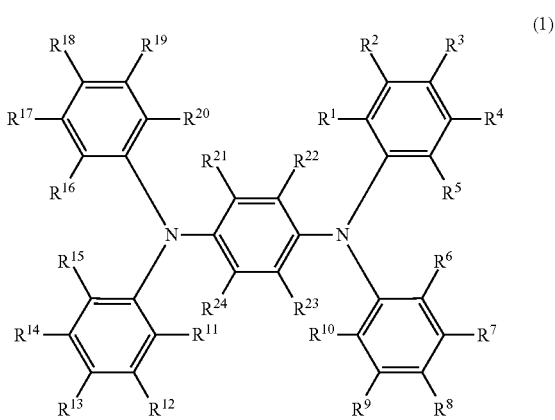
(1)

where, in the general formula (1), each of $R^1$ to $R^{20}$ represents any of hydrogen, an alkyl group, and a phenyl group, and each of $R^{21}$ to $R^{24}$ represents hydrogen.

12. A composite material comprising:

an organic compound represented by the following general formula (2); and an inorganic compound,

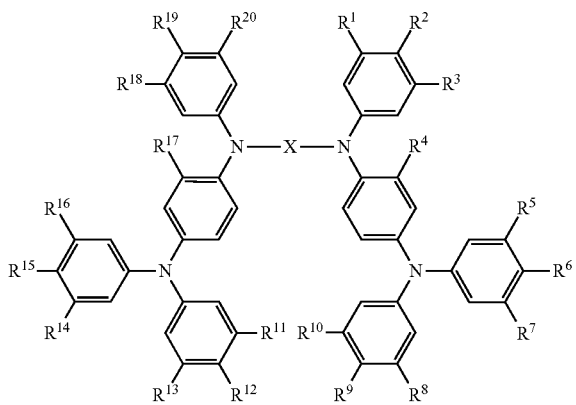

where, in the general formula (2), X represents an aromatic hydrocarbon group represented by structural formula (2-4):

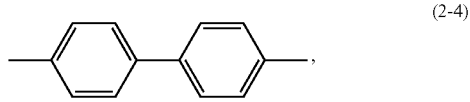

wherein each of $R^1$ to $R^{20}$ represents any of hydrogen, an alkyl group, and a phenyl group.

13. A composite material comprising:
an organic compound represented by the following general formula (3); and
an inorganic compound,

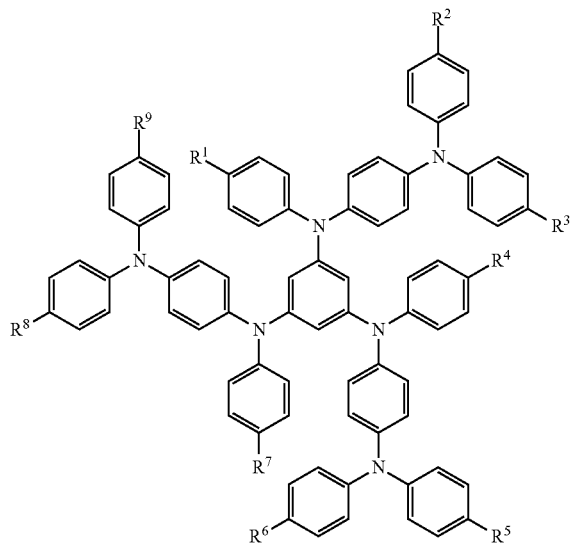

where, in the general formula (3), each of $R^1$ to $R^9$ represents any of hydrogen, an alkyl group, and a phenyl group.

14. The composite material according to claim 1, wherein the inorganic compound is molybdenum oxide.

15. The composite material according to claim 2, wherein the inorganic compound is molybdenum oxide.

16. The composite material according to claim 3, wherein the inorganic compound is molybdenum oxide.

17. The composite material according to claim 11, wherein the inorganic compound is molybdenum oxide.

18. The composite material according to claim 12, wherein the inorganic compound is molybdenum oxide.

19. The composite material according to claim 13, wherein the inorganic compound is molybdenum oxide.

20. The composite material according to claim 11, wherein the inorganic compound is vanadium oxide.

21. The composite material according to claim 12, wherein the inorganic compound is vanadium oxide.

22. The composite material according to claim 13, wherein the inorganic compound is vanadium oxide.

23. A light emitting device comprising:
a substrate; and
a light emitting element comprising:
a first electrode over the substrate;
a layer containing the composite material according to claim 11; and
a second electrode over the layer containing the composite material.

24. A light emitting device comprising:
a substrate; and
a light emitting element comprising:
a first electrode over the substrate;
a layer containing the composite material according to claim 12; and
a second electrode over the layer containing the composite material.

25. A light emitting device comprising:
a substrate; and
a light emitting element comprising:
a first electrode over the substrate;
a layer containing the composite material according to claim 13; and
a second electrode over the layer containing the composite material.

* * * * *